US012767680B2

(12) United States Patent
Shin et al.

(10) Patent No.: US 12,767,680 B2
(45) Date of Patent: Oct. 20, 2026

(54) LIGHT-EMITTING DEVICE INCLUDING ORGANOMETALLIC COMPOUND, ELECTRONIC APPARATUS INCLUDING THE LIGHT-EMITTING DEVICE, AND THE ORGANOMETALLIC COMPOUND

(71) Applicant: Samsung Display Co., Ltd., Yongin-si (KR)

(72) Inventors: Sujin Shin, Yongin-si (KR); Iljoon Kang, Yongin-si (KR); Sungbum Kim, Yongin-si (KR); Eunyoung Lee, Yongin-si (KR); Hyunjung Lee, Yongin-si (KR); Jinhee Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 524 days.

(21) Appl. No.: 18/453,425

(22) Filed: Aug. 22, 2023

(65) Prior Publication Data

US 2024/0309033 A1 Sep. 19, 2024

(30) Foreign Application Priority Data

Feb. 21, 2023 (KR) ........................ 10-2023-0023154

(51) Int. Cl.

*C07F 15/00* (2006.01)
*H10K 50/12* (2023.01)
*H10K 85/30* (2023.01)

(52) U.S. Cl.

CPC ......... *C07F 15/0086* (2013.01); *H10K 50/12* (2023.02); *H10K 85/346* (2023.02); *C07B 2200/09* (2013.01)

(58) Field of Classification Search

CPC ................ C07F 15/0086; H10K 50/12; H10K 85/6572; C09K 2211/185

See application file for complete search history.

(56) References Cited

U.S. PATENT DOCUMENTS

| | | | |
|---|---|---|---|
| 7,381,479 | B2 | 6/2008 | Lamansky et al. |
| 7,393,599 | B2 | 7/2008 | Thompson et al. |
| 7,585,573 | B2 | 9/2009 | Lee et al. |
| 7,776,458 | B2 | 8/2010 | Ragini et al. |
| 8,106,199 | B2 | 1/2012 | Jabbour et al. |
| 8,389,725 | B2 | 3/2013 | Li et al. |
| 8,669,364 | B2 | 3/2014 | Li et al. |
| 8,680,760 | B2 | 3/2014 | Cheng et al. |
| 8,816,080 | B2 | 8/2014 | Li et al. |
| 8,846,940 | B2 | 9/2014 | Li et al. |
| 8,883,322 | B2 | 11/2014 | Wu et al. |
| 8,946,417 | B2 | 2/2015 | Jian et al. |

(Continued)

FOREIGN PATENT DOCUMENTS

| | | |
|---|---|---|
| CN | 104370974 | 2/2015 |
| JP | 2007-45742 | 2/2007 |

(Continued)

OTHER PUBLICATIONS

C-F. Liu, et al. 30.52, Advanced Materials 1802466 (2018)("Liu"). (Year: 2018).*

*Primary Examiner* — Alexander R Pagano
*Assistant Examiner* — Frank S. Hou
(74) *Attorney, Agent, or Firm* — Womble Bond Dickinson (US) LLP

(57) ABSTRACT

Embodiments provide an organometallic compound, a light-emitting device including the organometallic compound, and an electronic apparatus including the light-emitting device. The organometallic compound is represented by Formula 1, which is explained in the specification:

[Formula 1]

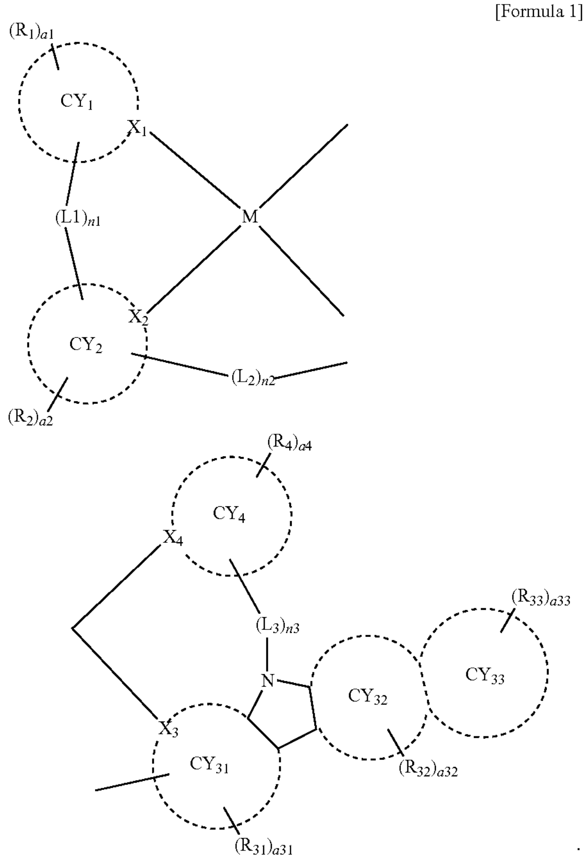

.

20 Claims, 8 Drawing Sheets

(56) References Cited

U.S. PATENT DOCUMENTS

| | | | | |
|---|---|---|---|---|
| 9,051,344 | B2 | 6/2015 | Lin et al. | |
| 9,076,974 | B2 | 7/2015 | Li et al. | |
| 9,203,039 | B2 | 12/2015 | Li et al. | |
| 9,221,857 | B2 | 12/2015 | Li et al. | |
| 9,224,963 | B2 | 12/2015 | Li et al. | |
| 9,238,668 | B2 | 1/2016 | Li et al. | |
| 9,312,502 | B2 | 4/2016 | Li et al. | |
| 9,324,957 | B2 | 4/2016 | Li et al. | |
| 9,382,273 | B2 | 7/2016 | Li et al. | |
| 9,425,415 | B2 | 8/2016 | Li et al. | |
| 9,698,359 | B2 | 7/2017 | Li et al. | |
| 9,899,614 | B2 | 2/2018 | Li et al. | |
| 11,101,435 | B2 | 8/2021 | Li et al. | |
| 2005/0287394 | A1 | 12/2005 | Yang et al. | |
| 2008/0018221 | A1 | 1/2008 | Egen et al. | |
| 2012/0121936 | A1 | 5/2012 | Baek et al. | |
| 2014/0309428 | A1 | 10/2014 | Egen et al. | |
| 2015/0162552 | A1 | 6/2015 | Li et al. | |
| 2015/0380666 | A1 | 12/2015 | Szigethy et al. | |
| 2018/0151816 | A1 | 5/2018 | Xia et al. | |
| 2019/0119312 | A1 | 4/2019 | Chen et al. | |
| 2020/0099001 | A1* | 3/2020 | Kim | H10K 85/346 |
| 2023/0165136 | A1* | 5/2023 | Kim | C09K 11/06<br>257/40 |

FOREIGN PATENT DOCUMENTS

| | | |
|---|---|---|
| KR | 10-0730115 | 6/2007 |
| KR | 10-2020-0034900 | 4/2020 |
| WO | 2012/121936 | 9/2012 |

* cited by examiner

LIGHT-EMITTING DEVICE INCLUDING ORGANOMETALLIC COMPOUND, ELECTRONIC APPARATUS INCLUDING THE LIGHT-EMITTING DEVICE, AND THE ORGANOMETALLIC COMPOUND

CROSS-REFERENCE TO RELATED APPLICATION(S)

This application claims priority to and benefits of Korean Patent Application No. 10-2023-0023154 under 35 U.S.C. § 119, filed on Feb. 21, 2023, in the Korean Intellectual Property Office, the entire contents of which are incorporated herein by reference.

BACKGROUND

1. Technical Field

Embodiments relate to a light-emitting device including an organometallic compound, an electronic apparatus including the light-emitting device, and the organometallic compound.

2. Description of the Related Art

Light devices are self-emissive devices that, as compared with devices of the related art, have wide viewing angles, high contrast ratios, short response times, and excellent characteristics in terms of luminance, driving voltage, and response speed.

In a light-emitting device, a first electrode may be located on a substrate, and a hole transport region, an emission layer, an electron transport region, and a second electrode may be sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

SUMMARY

Embodiments include a light-emitting device including an organometallic compound, an electronic apparatus including the light-emitting device, and the organometallic compound.

Additional aspects will be set forth in part in the description which follows and, in part, will be apparent from the description, or may be learned by practice of the embodiments of the disclosure.

Embodiments provide a light-emitting device which may include a first electrode, a second electrode facing the first electrode, an interlayer located between the first electrode and the second electrode and including an emission layer, and an organometallic compound represented by Formula 1:

[Formula 1]

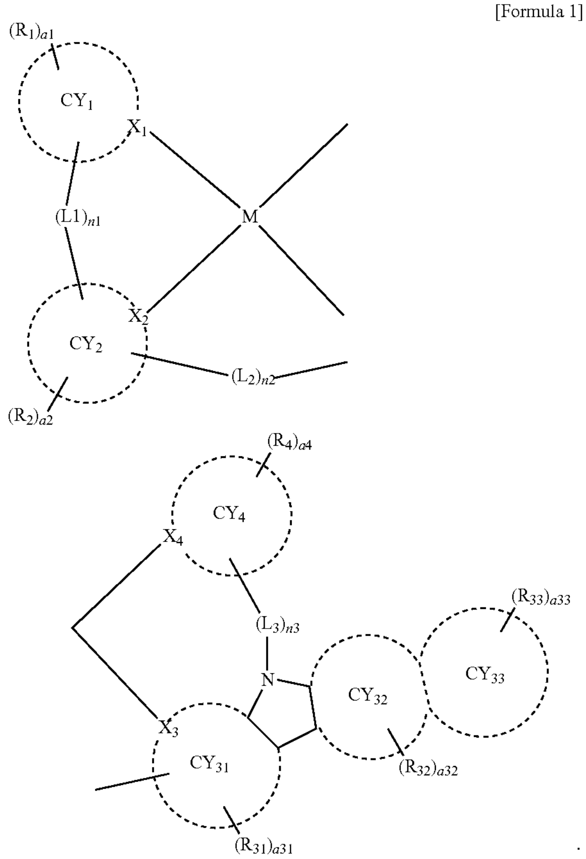

In Formula 1,

M may be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $X_1$ to $X_4$ may each independently be C or N, rings $CY_1$, $CY_2$, $CY_{31}$ to $CY_{33}$, and $CY_4$ may each independently be a $C_5$-$C_{30}$ carbocyclic group or a $C_1$-$C_{30}$ heterocyclic group, ring $CY_{33}$ may be a 5-membered or greater non-aromatic $C_4$-$C_8$ monocyclic group, rings $CY_{32}$ and $CY_{33}$ may be condensed with each other to form a $C_5$-$C_{30}$ polycyclic group, $L_1$ to $L_3$ may each independently be a single bond, *—$C(R_{1a})(R_{1b})$—*', *—$C(R_{1a})$=*', *=$C(R_{1a})$—*', *—$C(R_{1a})$=$C(R_{1b})$—*', *—C(=O)—*', *—C(=S)—*', *—C≡C—*', *—$B(R_{1a})$—*', *—$N(R_{1a})$—*', *—O—*', *—$P(R_{1a})$—*', *—$Al(R_{1a})$—*, *—$Si(R_{1a})(R_{1b})$—*', *—P(=O)$(R_{1a})$—*', *—S—*', *—S(=O)—*', *—$S(=O)_2$—*', or *—$Ge(R_{1a})(R_{1b})$—*', and * and *' may be a binding site to an adjacent atom, n1 to n3 may each independently be an integer from 1 to 5, $R_1$, $R_2$, $R_{31}$ to $R_{33}$, $R_4$, $R_{1a}$, and $R_{1b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a1, a2, a31 to a33, and a4 may each independently be an integer from 1 to 20, $R_{10a}$ may be:

hydrogen, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or $Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —$C_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

In an embodiment, the emission layer may include a host and a dopant, and the dopant may include the organometallic compound.

In an embodiment, the light-emitting device may further include a second compound including at least one π electron-deficient nitrogen-containing $C_1$-$C_{60}$ heterocyclic group, a third compound including a group represented by Formula 3, a fourth compound that is a delayed fluorescence compound, or a combination thereof, wherein the organometallic compound, the second compound, the third compound, and the fourth compound may be different from each other, and wherein Formula 3 is explained below.

In an embodiment, the second compound may include a pyridine group, a pyrimidine group, a pyrazine group, a pyridazine group, a triazine group, or a combination thereof; and the fourth compound may be a compound include at least one cyclic group comprising boron (B) and nitrogen (N) as ring-forming atoms.

In an embodiment, the emission layer may include: the organometallic compound; and the second compound, the third compound, the fourth compound, or a combination thereof, and the emission layer may emit blue light.

Embodiments provide an electronic apparatus which may include the light-emitting device.

In an embodiment, the electronic apparatus may further include a thin-film transistor, wherein the thin-film transistor may include a source electrode and a drain electrode, and the first electrode of the light-emitting device may be electrically connected to at least one of the source electrode and the drain electrode.

In an embodiment, the electronic apparatus may further include a color filter, a color conversion layer, a touch screen layer, a polarizing layer, or a combination thereof.

Embodiments provide an electronic equipment which may include the light-emitting device.

In an embodiment, the electronic equipment may be a flat panel display, a curved display, a computer monitor, a medical monitor, a television, a billboard, an indoor light, an outdoor light, a signal light, a head-up display, a fully transparent display, a partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a microdisplay, a three-dimensional (3D) display, a virtual reality display, an augmented reality display, a vehicle, a video wall with multiple displays tiled together, a theater screen, a stadium screen, a phototherapy device, or a signboard.

Embodiments provide an organometallic compound which may be represented by Formula 1, which is explained herein.

In an embodiment, $X_1$ may be a carbon atom of a carbene moiety.

In an embodiment, ring $CY_{33}$ may be a cyclopropane group, a cyclobutane group, a cyclopentane group, a cyclohexane group, a cycloheptane group, a cyclooctane group, a cyclobutane group, a cyclopentene group, a cyclohexene group, a cycloheptane group, a tetrahydrofuran group, a tetrahydropyran group, a tetrahydrothiophene group, a tetrahydrothiopyran group, a pyrrolidine group, or a piperidine group.

In an embodiment, $R_1$, $R_2$, $R_{31}$ to $R_{33}$, and $R_4$ may each independently be:

hydrogen, deuterium, a cyano group, or a $C_1$-$C_{20}$ alkyl group;

a $C_1$-$C_{20}$ alkyl group substituted with deuterium, —$CD_3$, —$CD_2H$, —$CDH_2$, a cyano group, a $C_1$-$C_{10}$ alkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, or a combination thereof;

a cyclopentyl group, a cyclohexyl group, a cycloheptyl group, a cyclopentenyl group, a cyclohexenyl group, a cycloheptenyl group, a phenyl group, a biphenyl group, a $C_1$-$C_{10}$ alkylphenyl group, or a naphthyl group, each unsubstituted or substituted with deuterium, —$CD_3$, —$CD_2H$, —$CDH_2$, a cyano group, a $C_1$-$C_{20}$ alkyl group, a cyclopentyl group, a cyclohexyl group, a cycloheptyl group, a cyclopentenyl group, a cyclohexenyl group, a cycloheptenyl group, a phenyl group, a biphenyl group, a $C_1$-$C_{10}$ alkylphenyl group, a naphthyl group, —$Si(Q_{31})(Q_{32})(Q_{33})$, or a combination thereof; or $-C(Q_1)(Q_2)(Q_3)$, $-Si(Q_1)(Q_2)(Q_3)$, and $Q_1$ to $Q_3$ and $Q_{31}$ to $Q_{33}$ may each independently be: hydrogen; deuterium; a cyano group; a $C_1$-$C_{60}$ alkyl group; a $C_2$-$C_{60}$ alkenyl group; a $C_2$-$C_{60}$ alkynyl group; or a $C_3$-$C_{60}$ carbocyclic group unsubstituted or substituted with deuterium, a cyano group, a $C_1$-$C_{60}$ alkyl group, a phenyl group, a biphenyl group, or a combination thereof.

In an embodiment, $R_{33}$ may be hydrogen, deuterium, $-CH_3$, $-CDH_2$, $-CD_2H$, or $-CD_3$.

In an embodiment, in Formula 1, a moiety represented by

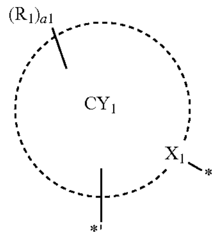

may be a moiety represented by one of Formulae CY1-1 to CY1-7; a moiety represented by

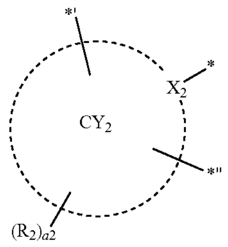

may be a moiety represented by one of Formulae CY2-1 to CY2-6; a moiety represented by

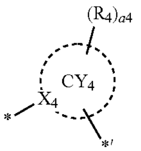

may be a moiety represented by one of Formulae CY4-1 to CY4-6; and $R_{11}$ in Formulae CY1-1 to CY1-7 may be $-CD_3$ or a group represented by Formula S1, wherein Formulae CY1-1 to CY1-7, CY2-1 to CY2-6, CY4-1 to CY4-6, and S1 are explained below.

In an embodiment, in Formula 1, a moiety represented by

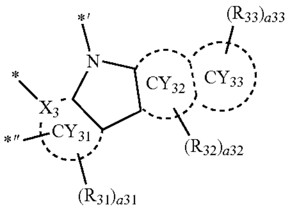

may be a moiety represented by one of Formulae CY3-1 to CY3-12, which are explained below.

In an embodiment, $Z_1$ and $Z_2$ may each independently be hydrogen, deuterium, or $-CH_3$.

In an embodiment, $Y_2$ to $Y_4$ may each independently be $C(Z_1)(Z_2)$.

In an embodiment, the organometallic compound may be represented by Formula 1-1, which is explained below.

It is to be understood that the embodiments above are described in a generic and explanatory sense only and not for the purposes of limitation, and the disclosure is not limited to the embodiments described above.

BRIEF DESCRIPTION OF THE DRAWINGS

The above and other aspects and features of the disclosure will be more apparent by describing in detail embodiments thereof with reference to the accompanying drawings, in which.

DETAILED DESCRIPTION OF THE EMBODIMENTS

Figure 1:
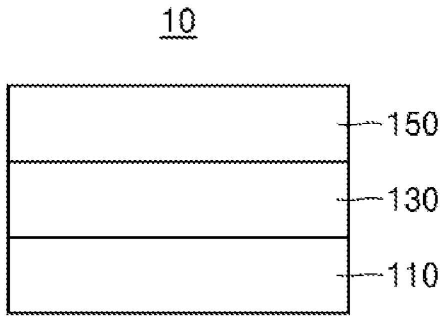
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being “on”, “connected to”, or “coupled to” another element, it can be directly on, connected to, or coupled to the other element, or one or more intervening elements may be present therebetween. In a similar sense, when an element (or region, layer, part, etc.) is described as “covering” another element, it can directly cover the other element, or one or more intervening elements may be present therebetween.

In the specification, when an element is “directly on,” “directly connected to,” or “directly coupled to” another element, there are no intervening elements present. For example, “directly on” may mean that two layers or two elements are disposed without an additional element such as an adhesion element therebetween.

In the specification, the expressions used in the singular such as “a,” “an,” and “the,” are intended to include the plural forms as well, unless the context clearly indicates otherwise.

In the specification, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group consisting of" for the purpose of its meaning and interpretation. For example, "at least one of A, B, and C" may be understood to mean A only, B only, C only, or any combination of two or more of A, B, and C, such as ABC, ACC, BC, or CC. When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element.

Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, 10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

According to embodiments, a light-emitting device may include:

a first electrode;

a second electrode facing the first electrode;

an interlayer between the first electrode and the second electrode and including an emission layer; and an organometallic compound is represented by Formula 1:

[Formula 1]

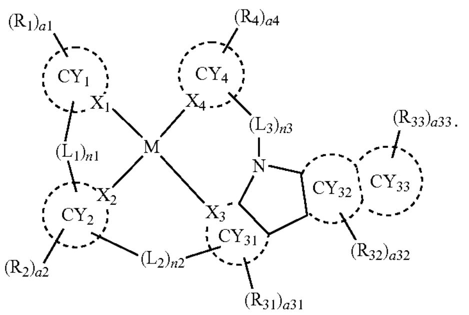

The detailed description of Formula 1 is explained below.

In embodiments, the first electrode of the light-emitting device may be an anode, the second electrode of the light-emitting device may be a cathode, the interlayer may further include a hole transport region between the first electrode and the emission layer, and an electron transport region between the emission layer and the second electrode, the hole transport region may include a hole injection layer, a hole transport layer, an emission auxiliary layer, an electron blocking layer, or a combination thereof, and the electron transport region may include a hole blocking layer, an electron transport layer, an electron injection layer, or a combination thereof.

In embodiments, the interlayer of the light-emitting device may include the organometallic compound represented by Formula 1.

In embodiments, the emission layer of the light-emitting device may include the organometallic compound represented by Formula 1.

In embodiments, the emission layer of the light-emitting device may include a dopant and a host, and the dopant may include the organometallic compound represented by Formula 1. For example, the organometallic compound may serve as a dopant. For example, the emission layer may emit blue light, and the blue light may have a maximum emission wavelength in a range of about 430 nm to about 470 nm.

In embodiments, the electron transport region of the light-emitting device may include a hole blocking layer, and the hole blocking layer may include a phosphine oxide-containing compound, a silicon-containing compound, or a combination thereof.

In an embodiment, the hole blocking layer may directly contact the emission layer.

In an embodiment, the light-emitting device may further include a second compound including at least one π electron-deficient nitrogen-containing $C_1$-$C_{60}$ heterocyclic group, a third compound including a group represented by Formula 3, a fourth compound capable of emitting delayed fluorescence (e.g., a delayed fluorescence compound), or a combination thereof, and the organometallic compound, the second compound, the third compound, and the fourth compound in the light-emitting device may be different from each other:

[Formula 3]

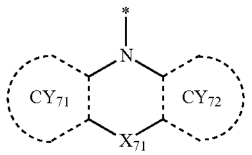

In Formula 3, rings $CY_{71}$ and $CY_{72}$ may each independently be a π electron-rich $C_3$-$C_{60}$ cyclic group or a pyridine group, $X_{71}$ may be: a single bond; or a linking group including O, S, N, B, C, Si, or a combination thereof, and

* indicates a binding site to an atom included in the remaining portion other than the group represented by Formula 3 in the third compound.

In an embodiment, the organometallic compound may include at least one deuterium atom.

In an embodiment, the second compound, the third compound, and the fourth compound may each independently include at least one deuterium atom.

In embodiments, the second compound may include at least one silicon atom.

In embodiments, the third compound may include at least one silicon atom.

In embodiments, the light-emitting device may further include the second compound and the third compound, in addition to the organometallic compound represented by Formula 1, and at least one of the second compound and the third compound may each independently include at least one deuterium atom, at least one silicon atom, or a combination thereof.

In an embodiment, the light-emitting device (e.g., the emission layer of the light-emitting device) may further include the second compound, in addition to the organometallic compound. At least one of the organometallic compound and the second compound may each independently include at least one deuterium atom.

In an embodiment, the light-emitting device (for example, the emission layer in the light-emitting device) may further include the third compound, the fourth compound, or a combination thereof, in addition to the organometallic compound and the second compound.

In embodiments, the light-emitting device (e.g., the emission layer of the light-emitting device) may further include the third compound, in addition to the organometallic compound. At least one of the organometallic compound and the third compound may each independently include at least one deuterium atom.

In an embodiment, the light-emitting device (for example, the emission layer in the light-emitting device) may further include the second compound, the fourth compound, or a combination thereof, in addition to the organometallic compound and the third compound.

In embodiments, the light-emitting device (e.g., the emission layer of the light-emitting device) may further include the fourth compound, in addition to the organometallic compound. At least one of the organometallic compound and the fourth compound may each independently include at least one deuterium atom. The fourth compound may improve color purity, luminescence efficiency, and lifespan characteristics of the light-emitting device.

In an embodiment, the light-emitting device (for example, the emission layer in the light-emitting device) may further include the second compound, the third compound, or a combination thereof, in addition to the organometallic compound and the fourth compound.

In embodiments, the light-emitting device (e.g., the emission layer of the light-emitting device) may further include the second compound and the third compound, in addition to the organometallic compound. The second compound and the third compound may form an exciplex. At least one of the organometallic compound, the second compound, and the third compound may each independently include at least one deuterium atom.

In an embodiment, the emission layer of the light-emitting device may include: the organometallic compound; and the second compound, the third compound, the fourth compound, or a combination thereof, and the emission layer may emit blue light.

In embodiments, a maximum emission wavelength of blue light may be in a range of about 430 nm to about 475 nm. For example, the maximum emission wavelength of blue light may be in a range of about 440 nm to about 475 nm. For example, the maximum emission wavelength of blue light may be in a range of about 450 nm to about 475 nm. For example, the maximum emission wavelength of blue light may be in a range of about 430 nm to about 470 nm. For example, the maximum emission wavelength of blue light may be in a range of about 440 nm to about 470 nm. For example, the maximum emission wavelength of blue light may be in a range of about 450 nm to about 470 nm. For example, the maximum emission wavelength of blue light may be in a range of about 430 nm to about 465 nm. For example, the maximum emission wavelength of blue light may be in a range of about 440 nm to about 465 nm. For example, the maximum emission wavelength of blue light may be in a range of about 450 nm to about 465 nm. For example, the maximum emission wavelength of blue light may be in a range of about 430 nm to about 460 nm. For example, the maximum emission wavelength of blue light may be in a range of about 440 nm to about 460 nm. For example, the maximum emission wavelength of blue light may be in a range of about 450 nm to about 460 nm.

In an embodiment, the second compound may include a pyridine group, a pyrimidine group, a pyrazine group, a pyridazine group, a triazine group, or a combination thereof.

In an embodiment, CBP and mCBP may be excluded from the third compound:

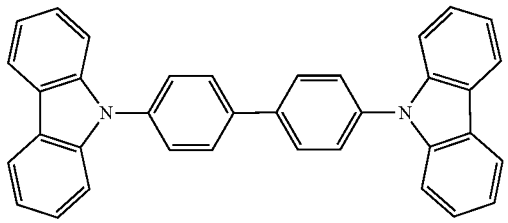

CBP

-continued

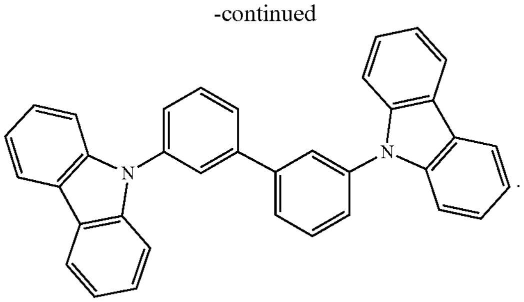

mCBP

In an embodiment, the third compound may not include a compound represented by Formula 3-1, as described in the specification.

In an embodiment, a difference between a triplet energy level (eV) of the fourth compound and a singlet energy level (eV) of the fourth compound may be in a range of about 0 eV to about 0.5 eV (for example, in a range of about 0 eV to about 0.3 eV).

In an embodiment, the fourth compound may be a compound including at least one cyclic group including boron (B) and nitrogen (N) as ring-forming atoms.

In an embodiment, the fourth compound may be a $C_8$-$C_{60}$ polycyclic group-containing compound including at least two condensed cyclic groups that share a boron atom (B).

In an embodiment, the fourth compound may include a condensed ring in which at least one third ring may be condensed with at least one fourth ring, the third ring may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norbornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring may be a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In embodiments, the second compound may include a compound represented by Formula 2:

[Formula 2]

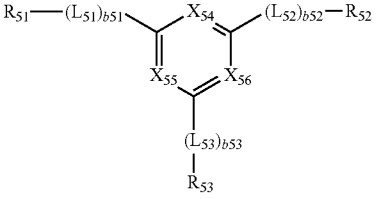

In Formula 2, $L_{51}$ to $L_{53}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b51 to b53 may each independently be an integer from 1 to 5, $X_{54}$ may be N or $C(R_{54})$, $X_{55}$ may be N or $C(R_{55})$, $X_{56}$ may be N or $C(R_{56})$, and at least one of $X_{54}$ to $X_{56}$ may each be N, $R_{51}$ to $R_{56}$ and $R_{10a}$ are respectively the same as described herein.

In embodiments, the third compound may include a compound represented by Formula 3-1, a compound represented by Formula 3-2, a compound represented by Formula 3-3, a compound represented by Formula 3-4, a compound represented by Formula 3-5, or a combination thereof:

[Formula 3-1]

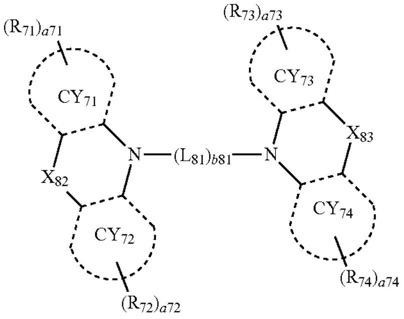

[Formula 3-2]

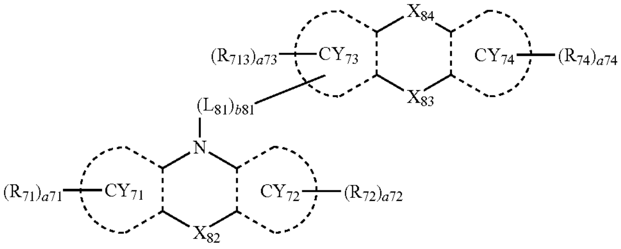

-continued

[Formula 3-3]

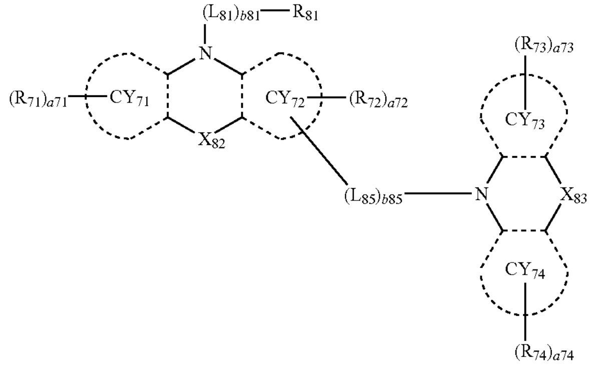

[Formula 3-4]

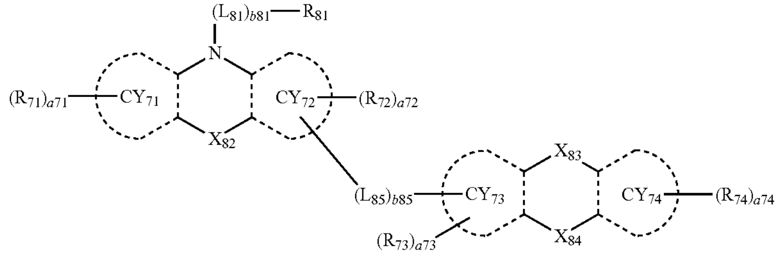

[Formula 3-5]

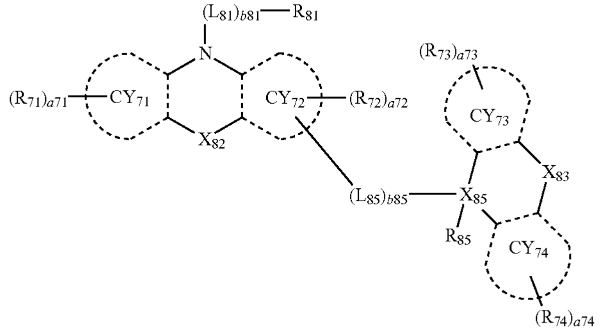

In Formulae 3-1 to 3-5, rings CY71 to CY74 may each independently be a π electron-rich $C_3$-$C_{60}$ cyclic group or a pyridine group, $X_{82}$ may be a single bond, O, S, N-[$(L_{82})_{b82}$-$R_{82}$], C($R_{82a}$)($R_{82b}$), or Si($R_{82a}$)($R_{82b}$), $X_{83}$ may be a single bond, O, S, N-[$(L_{83})_{b83}$-$R_{83}$], C($R_{83a}$)($R_{83b}$), or Si($R_{83a}$)($R_{83b}$), $X_{84}$ may be O, S, N-[$(L_{84})_{b84}$-$R_{84}$], C($R_{84a}$)($R_{84b}$), or Si($R_{84a}$)($R_{84b}$), $X_{85}$ may be C or Si, $L_{81}$ to $L_{85}$ may each independently be a single bond, *—C($Q_4$)($Q_5$)-*', *—Si($Q_4$)($Q_5$)-*', a π electron-rich $C_3$-$C_{60}$ cyclic group that is unsubstituted or substituted with at least one $R_{10a}$, or a pyridine group that is unsubstituted or substituted with at least one $R_{10a}$, wherein $Q_4$ and $Q_5$ may each independently be the same as described herein in connection with $Q_1$, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ are respectively the same as described herein, a71 to a74 may each independently be an integer from 0 to 20, and $R_{10a}$ may be the same as described herein.

In embodiments, the fourth compound may be a compound represented by Formula 502, a compound represented by Formula 503, or a combination thereof:

[Formula 502]

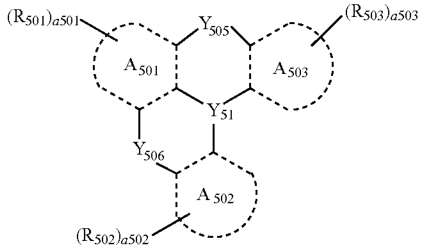

-continued

[Formula 503]

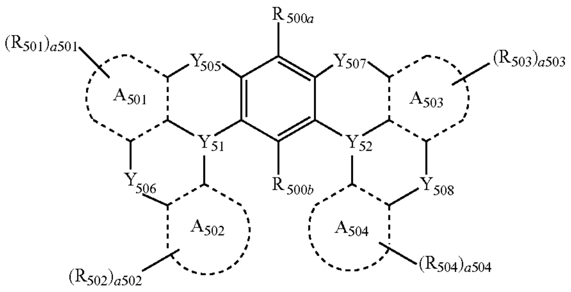

In Formulae 502 and 503, rings $A_{501}$ to $A_{504}$ may each independently be a $C_3$-$C_{60}$ carbocyclic group or a $C_1$-$C_{60}$ heterocyclic group, $Y_{505}$ may be O, S, $N(R_{505})$, $B(R_{505})$, $C(R_{505a})(R_{505b})$, or $Si(R_{505a})(R_{505b})$, $Y_{506}$ may be O, S, $N(R_{506})$, $B(R_{506})$, $C(R_{506a})(R_{506b})$, or $Si(R_{506a})(R_{506b})$, $Y_{507}$ may be O, S, $N(R_{507})$, $B(R_{507})$, $C(R_{507a})(R_{507b})$, or $Si(R_{507a})(R_{507b})$, $Y_{508}$ may be O, S, $N(R_{508})$, $B(R_{508})$, $C(R_{508a})(R_{508b})$, or $Si(R_{508a})(R_{508b})$, $Y_{51}$ and $Y_{52}$ may each independently be B, P(=O), or S(=O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ are respectively the same as described herein, and a501 to a504 may each independently be an integer from 0 to 20.

In embodiments, the light-emitting device may satisfy at least one of Conditions 1 to 4:

[Condition 1]

LUMO energy level (eV) of the third compound>LUMO energy level (eV) of the organometallic compound

[Condition 2]

LUMO energy level (eV) of the organometallic compound>LUMO energy level (eV) of the second compound

[Condition 3]

HOMO energy level (eV) of the organometallic compound>HOMO energy level (eV) of the third compound

[Condition 4]

HOMO energy level (eV) of the third compound>HOMO energy level (eV) of the second compound A highest occupied molecular orbital (HOMO) energy level and a lowest unoccupied molecular orbital (LUMO) energy level of the organometallic compound, the second compound, and the third compound may each be a negative value. The HOMO energy levels and the LUMO energy levels may each be measured according to any suitable method of the related art.

In an embodiment, an absolute value of a difference between a LUMO energy level of the organometallic compound and a LUMO energy level of the second compound may be in a range of about 0.1 eV to about 1.0 eV; an absolute value of a difference between a LUMO energy level of the organometallic compound and a LUMO energy level of the third compound may be in a range of about 0.1 eV to about 1.0 eV; an absolute value of a difference between a HOMO energy level of the organometallic compound and a HOMO energy level of the second compound may be less than or equal to about 1.25 eV (for example, in a range of about 0.2 eV to about 1.25 eV); or an absolute value of a difference between a HOMO energy level of the organometallic compound and a HOMO energy level of the third compound may be less than or equal to about 1.25 eV (for example, in a range of about 0.2 eV to about 1.25 eV).

When the relationships between LUMO energy level and HOMO energy level satisfy the conditions as described above, a balance between holes and electrons injected into the emission layer can be achieved.

The light-emitting device may have a structure of a first embodiment or a second embodiment.

First Embodiment

According to a first embodiment, the organometallic compound may be included in the emission layer in the interlayer of the light-emitting device, wherein the emission layer may further include a host, the organometallic compound may be different from the host, and the emission layer may emit phosphorescence or fluorescence emitted from the organometallic compound. Thus, according to the first embodiment, the organometallic compound may be a dopant or an emitter. In an embodiment, the organometallic compound may be a phosphorescent dopant or a phosphorescent emitter.

Phosphorescence or fluorescence emitted from the organometallic compound may be blue light.

The emission layer may further include an auxiliary dopant. The auxiliary dopant may effectively transfer energy to the organometallic compound which serves as a dopant or as an emitter, so as to improve luminescence efficiency of the organometallic compound.

The auxiliary dopant may be different from the organometallic compound and the host.

In embodiments, the auxiliary dopant may be a delayed fluorescence-emitting compound.

In embodiments, the auxiliary dopant may be a compound including at least one cyclic group including boron (B) and nitrogen (N) as ring-forming atoms.

Second Embodiment

According to a second embodiment, the organometallic compound may be included in the emission layer in the interlayer of the light-emitting device, wherein the emission layer may further include a host and a dopant, the organometallic compound, the host, and the dopant may be different from one another, and the emission layer may emit phosphorescence or fluorescence (e.g., delayed fluorescence) from the dopant.

In an embodiment, the organometallic compound in the second embodiment may serve as an auxiliary dopant that transfers energy to a dopant (or to an emitter), and may not serve as a dopant.

In an embodiment, the organometallic compound in the second embodiment may serve as an emitter and as an auxiliary dopant that transfers energy to a dopant (or to an emitter).

For example, phosphorescence or fluorescence emitted from the dopant (or from the emitter) in the second embodiment may be blue phosphorescence or blue fluorescence (e.g., blue delayed fluorescence).

The dopant (or the emitter) in the second embodiment may be a phosphorescent dopant material (e.g., an organometallic compound represented by Formula 1, an organometallic compound represented by Formula 401, or a combination thereof) or any fluorescent dopant material (e.g., a compound represented by Formula 501, a compound represented by Formula 502, a compound represented by Formula 503, or a combination thereof).

In the first embodiment and the second embodiment, the blue light may be blue light having a maximum emission wavelength in a range of about 390 nm to about 500 nm. For example, the blue light may have a maximum emission wavelength in a range of about 410 nm to about 490 nm. For example, the blue light may have a maximum emission wavelength in a range of about 430 nm to about 480 nm. For example, the blue light may have a maximum emission wavelength in a range of about 440 nm to about 475 nm. For example, the blue light may have a maximum emission wavelength in a range of about 455 nm to about 470 nm.

The auxiliary dopant in the first embodiment may include, for example, the fourth compound represented by Formula 502 or Formula 503.

The host in the first embodiment and in the second embodiment may be any host material (e.g., a compound represented by Formula 301, a compound represented by 301-1, a compound represented by Formula 301-2, or a combination thereof).

In embodiments, the host in the first embodiment and in the second embodiment may be the second compound, the third compound, or a combination thereof.

In an embodiment, the light-emitting device may further include a capping layer outside the first electrode and/or outside the second electrode.

In an embodiment, the light-emitting device may further include at least one of a first capping layer located outside the first electrode and a second capping layer located outside the second electrode, and the organometallic compound represented by Formula 1 may be included in at least one of the first capping layer and the second capping layer. Further details on the first capping layer and the second capping layer are as described herein.

In an embodiment, the light-emitting device may further include:

- a first capping layer located outside the first electrode and including the organometallic compound represented by Formula 1;
- a second capping layer located outside the second electrode and including the organometallic compound represented by Formula 1; or the first capping layer and the second capping layer.

The expression "(interlayer and/or a capping layer) includes at least one organometallic compound represented by Formula 1" as used herein may be construed as meaning that the "(interlayer and/or the capping layer) may include one type of organometallic compound represented by Formula 1 or two or more different types of organometallic compounds each independently represented by Formula 1."

For example, in an embodiment, the interlayer and/or the capping layer may include Compound 1 only as the organometallic compound. In this regard, Compound 1 may be present in the emission layer of the light-emitting device. For example, in another embodiment, the interlayer may include, as the organometallic compound, Compound 1 and Compound 2. In this regard, Compound 1 and Compound 2 may be present in a same layer (for example, both Compound 1 and Compound 2 may be present in the emission layer), or may be present in different layers (for example, Compound 1 may be present in the emission layer, and Compound 2 may be present in the electron transport region).

The term "interlayer" as used herein refers to a single layer and/or all layers located between the first electrode and the second electrode of the light-emitting device.

Embodiments provide an electronic apparatus which may include the light-emitting device. The electronic apparatus may further include a thin-film transistor. In an embodiment, the electronic apparatus may further include a thin-film transistor, the thin-film transistor may include a source electrode and a drain electrode, and the first electrode of the light-emitting device may be electrically connected to at least one of the source electrode and the drain electrode. In an embodiment, the electronic apparatus may further include a color filter, a color conversion layer, a touch screen layer, a polarizing layer, or a combination thereof. Further details on the electronic apparatus may be understood by referring to the related descriptions provided herein.

Embodiments provide an electronic equipment which may include the light-emitting device.

In an embodiment, the electronic equipment may be a flat panel display, a curved display, a computer monitor, a medical monitor, a television, a billboard, an indoor light, an outdoor light, a signal light, a head-up display, a fully transparent display, a partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a microdisplay, a three-dimensional (3D) display, a virtual reality display, an augmented reality display, a vehicle, a video wall with multiple displays tiled together, a theater screen, a stadium screen, a phototherapy device, or a signboard.

Embodiments provide an organometallic compound which may be represented by Formula 1. The detailed description of Formula 1 is provided below.

Methods of synthesizing the organometallic compound may be readily understood to those of ordinary skill in the art by referring to the Synthesis Examples and/or the Examples described herein.

Description of Formula 1

[Formula 1]

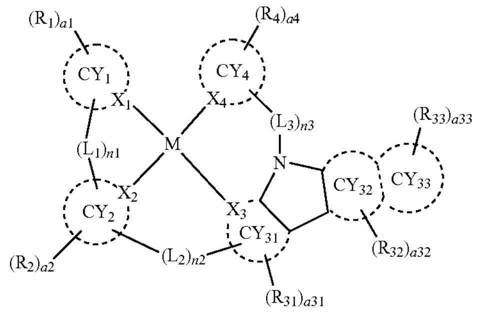

In Formula 1, M may be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm).

In an embodiment, M may be Pt or Pd.

In Formula 1, $X_1$ to $X_4$ may each independently be C or N.

In an embodiment, $X_1$ may be a carbon atom of a carbene moiety.

In an embodiment, $X_2$ and $X_3$ may each be C, and $X_4$ may be N.

In an embodiment, a bond between $X_1$ and M may be a coordinate bond; and one of a bond between $X_2$ and M, a bond between $X_3$ and M, and a bond between $X_4$ and M may be a coordinate bond, and the remaining two thereof may each be a covalent bond.

In an embodiment, a bond between $X_1$ and M and a bond between $X_4$ and M may each be a coordinate bond, and a bond between $X_2$ and M and a bond between $X_3$ and M may each be a covalent bond.

In Formula 1, rings $CY_1$, $CY_2$, $CY_{31}$ to $CY_{33}$, and $CY_4$ may each independently be a $C_5$-$C_{30}$ carbocyclic group or a $C_1$-$C_{30}$ heterocyclic group.

In an embodiment, ring $CY_{33}$ may be a 5-membered or greater non-aromatic $C_4$-$C_8$ monocyclic group.

In an embodiment, rings $CY_{32}$ and $CY_{33}$ may be condensed with each other to form a $C_5$-$C_{30}$ polycyclic group.

In the specification, the term "monocyclic group" refers to a non-condensed cyclic group consisting of only one ring, and a polycyclic group refers to a condensed cyclic group in which two or more rings are condensed with each other.

In an embodiment, rings $CY_1$, $CY_2$, $CY_{31}$, $CY_{32}$, and $CY_4$ may each independently be:

a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxasiline group, a dibenzothiasiline group, a dibenzodihydroazasiline group, a dibenzodihydrodisiline group, a dibenzodihydrosiline group, a dibenzodioxine group, a dibenzooxathiine group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group.

In an embodiment, ring $CY_1$ may be:

an $X_1$-containing 5-membered ring; an $X_1$-containing 5-membered ring to which at least one 6-membered ring is condensed; or an $X_1$-containing 6-membered ring, wherein the $X_1$-containing 5-membered ring may be a pyrrole group, a pyrazole group, an imidazole group, a triazole group, an oxazole group, an iso-oxazole group, a thiazole group, an isothiazole group, an oxadiazole group, or a thiadiazole group, and the $X_1$-containing 6-membered ring or a 6-membered ring that may be condensed to the $X_1$-containing 5-membered ring may each independently be a benzene group, a pyridine group, or a pyrimidine group.

In an embodiment, ring $CY_1$ may be an imidazole group, a triazole group, a benzimidazole group, a naphthoimidazole group, or an imidazopyridine group.

In an embodiment, ring $CY_2$ may be a benzene group, a pyridine group, a pyrimidine group, a naphthalene group, a dibenzofuran group, a dibenzothiophene group, a carbazole group, a fluorene group, a dibenzosilole group, a naphthobenzofuran group, a naphthobenzothiophene group, a benzocarbazole group, a benzofluorene group, a naphthobenzosilole group, a dinaphthofuran group, a dinaphthothiophene group, a dibenzocarbazole group, a dibenzofluorene group, a dinaphthosilole group, an azadibenzofuran group, an azadibenzothiophene group, an azacarbazole group, an azafluorene group, an azadibenzosilole group, an azanaphthobenzofuran group, an azanaphthobenzothiophene group, an azabenzocarbazole group, an azabenzofluorene group, an azanaphthobenzosilole group, an azadinaphthofuran group, an azadinaphthothiophene group, an azadibenzocarbazole group, an azadibenzofluorene group, or an azadinaphthosilole group.

In an embodiment, ring $CY_2$ may be a benzene group, a pyridine group, a pyrimidine group, a naphthalene group, a dibenzofuran group, a dibenzothiophene group, a carbazole group, a fluorene group, or a dibenzosilole group.

In an embodiment, rings $CY_{31}$ and $CY_{32}$ may each independently be a benzene group, a pyridine group, a pyrimidine group, a naphthalene group, a dibenzofuran group, a dibenzothiophene group, a carbazole group, a fluorene group, a dibenzosilole group, a naphthobenzofuran group, a naphthobenzothiophene group, a benzocarbazole group, a benzofluorene group, a naphthobenzosilole group, a dinaphthofuran group, a dinaphthothiophene group, a dibenzocarbazole group, a dibenzofluorene group, a dinaphthosilole group, an azadibenzofuran group, an azadibenzothiophene group, an azacarbazole group, an azafluorene group, an azadibenzosilole group, an azanaphthobenzofuran group, an azanaphthobenzothiophene group, an azabenzocarbazole group, an azabenzofluorene group, an azanaphthobenzosilole group, an azadinaphthofuran group, an azadinaphthothiophene group, an azadibenzocarbazole group, an azadibenzofluorene group, or an azadinaphthosilole group.

In an embodiment, rings $CY_{31}$ and $CY_{32}$ may each independently be a benzene group, a pyridine group, a pyrimidine group, a naphthalene group, a dibenzofuran group, a dibenzothiophene group, a carbazole group, a fluorene group, or a dibenzosilole group.

In an embodiment, ring $CY_4$ may be a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a benzopyrazole group, a benzimidazole group, or a benzothiazole group.

In an embodiment, ring $CY_{33}$ may be a cyclopropane group, a cyclobutane group, a cyclopentane group, a cyclohexane group, a cycloheptane group, a cyclooctane group, a cyclobutane group, a cyclopentene group, a cyclohexene group, a cycloheptane group, a tetrahydrofuran group, a tetrahydropyran group, a tetrahydrothiophene group, a tetrahydrothiopyran group, a pyrrolidine group, or a piperidine group.

In an embodiment, ring $CY_{33}$ may be a cyclohexane group, a tetrahydropyran group, a tetrahydrothiopyran group, or a piperidine group.

In Formula 1, $L_1$ to $L_3$ may each independently be a single bond, $*—C(R_{1a})(R_{1b})—*'$, $*—C(R_{1a})=*'$, $*=C(R_{1a})—*'$, $*—C(R_{1a})=C(R_{1b})—*'$, $*—C(=O)—*'$, $*—C(=S)—*'$, $*—C≡C—*'$, $*—B(R_{1a})—*'$, $*—N(R_{1a})—*'$, $*—O—*'$, $*—P(R_{1a})—*'$, $*—Al(R_{1a})—*'$, $*—Si(R_{1a})(R_{1b})—*'$, $*—P(=O)(R_{1a})—*'$, $*—S—*'$, $*—S(=O)—*'$, $*—S(=O)_2—*'$ or $*—Ge(R_{1a})(R_{1b})—*'$, and *' each indicate a binding site to an adjacent atom, and $R_{1a}$ and $R_{1b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $R_{10a}$ and $Q_1$ to $Q_3$ are each the same as described herein.

In Formula 1, n1 to n3 respectively indicate the number of $L_1$ to $L_3$, and n1 to n3 may each independently be an integer from 1 to 5. When n1 is 2 or more, two or more of $L_1$ may be identical to or different from each other, when n2 is 2 or more, two or more of $L_2$ may be identical to or different from each other, and when n3 is 2 or more, two or more of $L_3$ may be identical to or different from each other.

In an embodiment, $L_1$ and $L_3$ may each be a single bond, $L_2$ may be $*—O—*'$ or $*—S—*'$, and n2 may be 1.

In an embodiment, $R_{1a}$ and $R_{1b}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzothiazolyl group, a benzoisoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or a combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ are each the same as described herein.

In Formula 1, $R_1$, $R_2$, $R_{31}$ to $R_{33}$, and $R_4$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, wherein $R_{10a}$ and $Q_1$ to $Q_3$ are each the same as described herein.

In Formula 1, a1, a2, a31 to a33, and a4 respectively indicate the number of $R_1$, $R_2$, $R_{31}$ to $R_{33}$, and $R_4$, and a1, a2, a31 to a33, and a4 may each independently be an integer from 1 to 20. When a1 is 2 or more, two or more of $R_1$ may be identical to or different from each other, when a2 is 2 or more, two or more of $R_2$ may be identical to or different from each other, when a31 is 2 or more, two or more of $R_{31}$ may be identical to or different from each other, when a32 is 2 or more, two or more of $R_{32}$ may be identical to or different from each other, when a33 is 2 or more, two or more of $R_{33}$ may be identical to or different from each other, and when a4 is 2 or more, two or more of $R_4$ may be identical to or different from each other.

In an embodiment, $R_1$, $R_2$, $R_{31}$ to $R_{33}$, and $R_4$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzothiazolyl group, a benzoisoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or a combination thereof; or —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, wherein $Q_1$ to $Q_3$ and $Q_{31}$ to $Q_{33}$ are each the same as described herein.

In an embodiment, $R_1$, $R_2$, $R_{31}$ to $R_{33}$, and $R_4$ may each independently be:

hydrogen, deuterium, a cyano group, or a $C_1$-$C_{20}$ alkyl group;

a $C_1$-$C_{20}$ alkyl group substituted with deuterium, —$CD_3$, —$CD_2H$, —$CDH_2$, a cyano group, a $C_1$-$C_{10}$ alkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, or a combination thereof;

a cyclopentyl group, a cyclohexyl group, a cycloheptyl group, a cyclopentenyl group, a cyclohexenyl group, a cycloheptenyl group, a phenyl group, a biphenyl group, a $C_1$-$C_{10}$ alkylphenyl group, or a naphthyl group, each unsubstituted or substituted with deuterium, —$CD_3$, —$CD_2H$, —$CDH_2$, a cyano group, a $C_1$-$C_{20}$ alkyl group, a cyclopentyl group, a cyclohexyl group, a cycloheptyl group, a cyclopentenyl group, a cyclohexenyl group, a cycloheptenyl group, a phenyl group, a biphenyl group, a $C_1$-$C_{10}$ alkylphenyl group, a naphthyl group, —$Si(Q_{31})(Q_{32})(Q_{33})$, or a combination thereof; or —$C(Q_1)(Q_2)(Q_3)$, —$Si(Q_1)(Q_2)(Q_3)$, wherein $Q_1$ to $Q_3$ and $Q_{31}$ to $Q_{33}$ may each independently be: hydrogen; deuterium; a cyano group; a $C_1$-$C_{60}$ alkyl group; a $C_2$-$C_{60}$ alkenyl group; a $C_2$-$C_{60}$ alkynyl group; or a $C_3$-$C_{60}$ carbocyclic group unsubstituted or substituted with deuterium, a cyano group, a $C_1$-$C_{60}$ alkyl group, a phenyl group, a biphenyl group, or a combination thereof.

In an embodiment, $R_{33}$ may be hydrogen, deuterium, $-CH_3$, $-CDH_2$, $-CD_2H$, or $-CD_3$.

In an embodiment, the organometallic compound may be substituted with at least one deuterium atom.

In an embodiment, in Formula 1, a moiety represented by

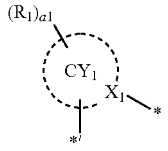

may be a moiety represented by one of Formulae CY1-1 to CY1-7:

CY1-1

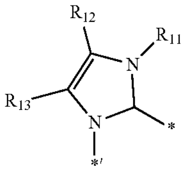

CY1-2

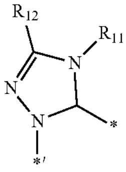

CY1-3

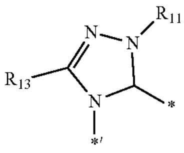

CY1-4

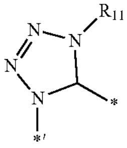

CY1-5

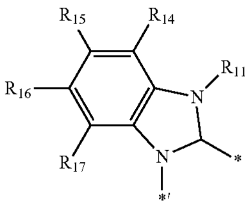

CY1-6

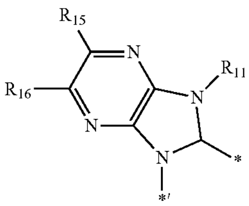

-continued

CY1-7

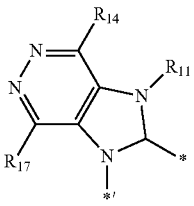

In Formulae CY1-1 to CY1-7, $R_{11}$ to $R_{17}$ may each independently be the same as described in connection with $R_1$ in Formula 1,

*indicates a binding site to M in Formula 1, and

*' indicates a binding site to $L_1$ in Formula 1.

In an embodiment, $R_{11}$ in Formulae CY1-1 to CY1-7 may be $-CD_3$ or a group represented by Formula S1:

S1

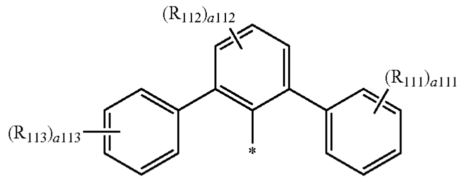

In Formula S1, $R_{111}$ to $R_{113}$ may each independently be the same as described in connection with $R_1$ in Formula 1, a111 may be an integer from 1 to 5, a112 may be an integer from 1 to 3, a113 may be an integer from 1 to 5, and

* indicates a binding site to N among groups represented by Formulae CY1-1 to CY1-7.

In an embodiment, in Formula 1, a moiety represented by

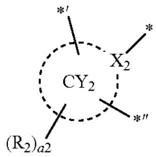

may be a moiety represented by one of Formulae CY2-1 to CY2-6:

CY2-1

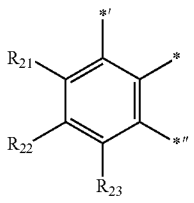

-continued

CY2-2

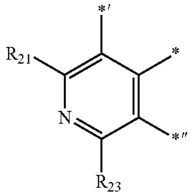

CY2-3

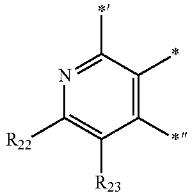

CY2-4

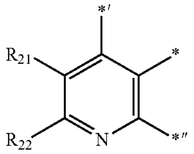

CY2-5

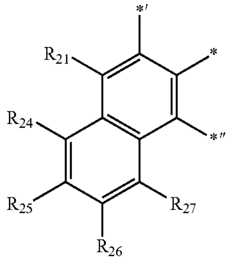

CY2-6

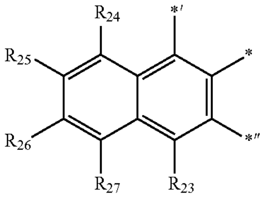

In Formulae CY2-1 to CY2-6, $R_{21}$ to $R_{27}$ may each independently be the same as described in connection with $R_2$ in Formula 1,

* indicates a binding site to M in Formula 1,

*' indicates a binding site to $L_1$ in Formula 1, and

*" indicates a binding site to $L_2$ in Formula 1.

In an embodiment, in Formula 1, a moiety represented by

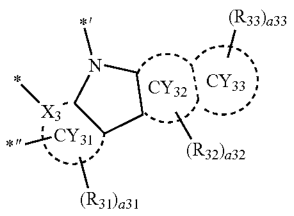

may be a moiety represented by one of Formulae CY3-1 to CY3-12:

CY3-1

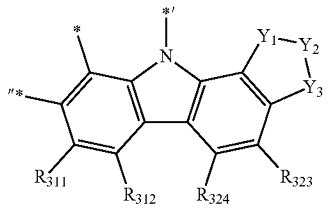

CY3-2

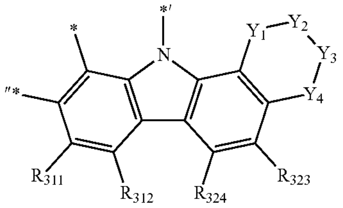

CY3-3

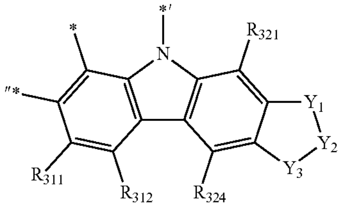

CY3-4

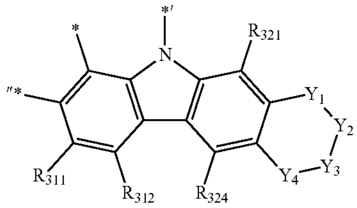

CY3-5

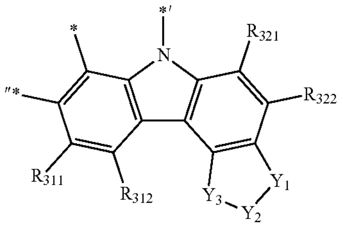

CY3-6

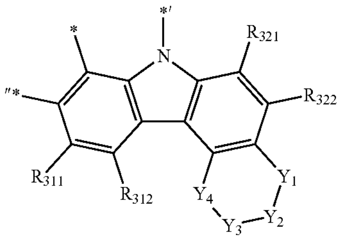

CY3-7

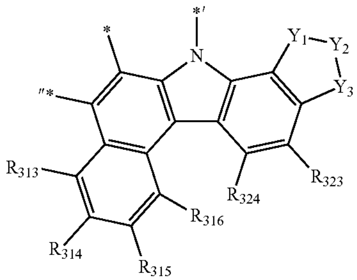

-continued

CY3-8

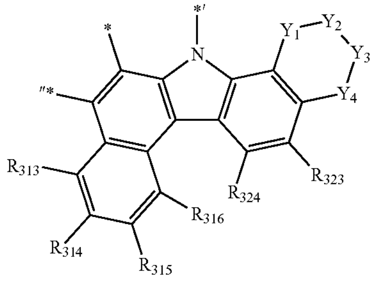

CY3-9

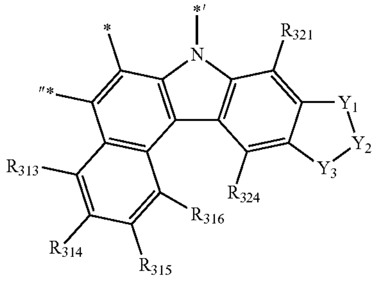

CY3-10

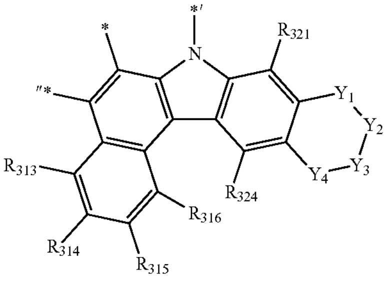

CY3-11

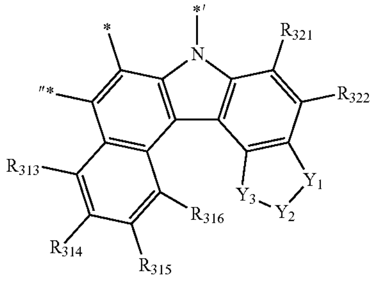

CY3-12

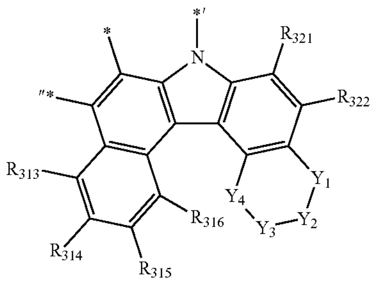

In Formulae CY3-1 to CY3-12, $Y_1$ to $Y_4$ may each independently be O, S, Se, $N(Z_1)$, $C(Z_1)(Z_2)$, or $Si(Z_1)(Z_2)$, $Z_1$ and $Z_2$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, $Q_1$ to $Q_3$ and $R_{10a}$ are each as described herein, $R_{311}$ to $R_{316}$ may each independently be the same as described in connection with $R_{31}$ in Formula 1, $R_{321}$ to $R_{327}$ may each independently be the same as described in connection with $R_{32}$ in Formula 1, indicates a binding site to M in Formula 1,

*' indicates a binding site to $L_3$ in Formula 1, and

*" indicates a binding site to $L_2$ in Formula 1.

In an embodiment, $Z_1$ and $Z_2$ may each independently be hydrogen, deuterium, or $—CH_3$.

In an embodiment, $Y_2$ to $Y_4$ may each independently be $C(Z_1)(Z_2)$.

In an embodiment, in Formula 1, a moiety represented by

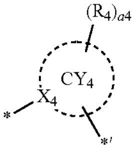

may be a moiety represented by one of Formulae CY4-1 to CY4-6:

CY4-1

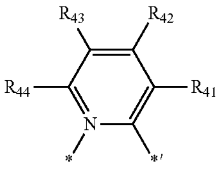

CY4-2

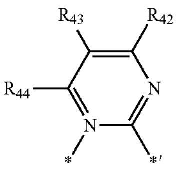

CY4-3

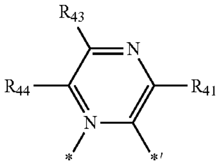

CY4-4

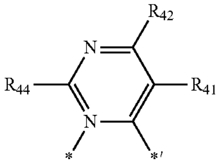

-continued

CY4-5

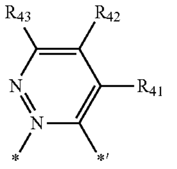

CY4-6

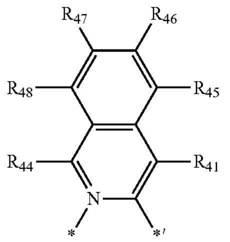

wherein Formula CY4-1 to CY4-6, $R_{41}$ to $R_{48}$ may each independently be the same as described in connection $R_4$ in Formula 1,

* indicates a binding site to M in Formula 1, and

*' indicates a binding site to $L_3$ in Formula 1.

In an embodiment, the organometallic compound may be represented by Formula 1-1:

[Formula 1-1]

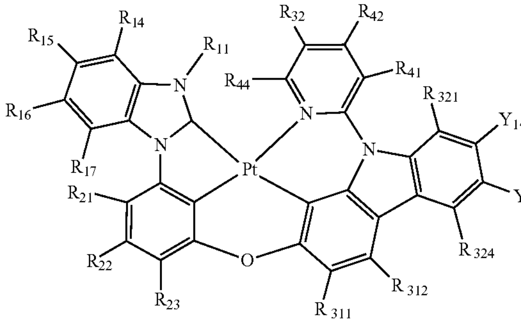

In Formula 1-1, $Y_1$ to $Y_4$ may each independently be O, S, Se, $N(Z_1)$, $C(Z_1)(Z_2)$, or $Si(Z_1)(Z_2)$, $Z_1$ and $Z_2$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, $Q_1$ to $Q_3$ and $R_{10a}$ are each as described herein, $R_{11}$ and $R_{14}$ to $R_{17}$ may each independently be the same as described in connection with $R_1$ in Formula 1, $R_{21}$ to $R_{23}$ may each independently be the same as described in connection with $R_2$ in Formula 1, $R_{311}$ and $R_{312}$ may each independently be the same as described in connection with $R_{31}$ in Formula 1, $R_{321}$ and $R_{324}$ may each independently be the same as described in connection with $R_{32}$ in Formula 1, and $R_{41}$ to $R_{44}$ may each independently be the same as described in connection with $R_4$ in Formula 1.

In an embodiment, $Z_1$ and $Z_2$ may each independently be hydrogen, deuterium, or $—CH_3$.

In an embodiment, $Y_2$ to $Y_4$ may each be $C(Z_1)(Z_2)$.

Unless defined otherwise, $R_{10a}$ in Formula 1 may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, $—C_1$, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or a combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$.

Unless defined otherwise, $Q_1$ to $Q_3$, $Q_{11}$ to $Q_{13}$, $Q_{21}$ to $Q_{23}$, and $Q_{31}$ to $Q_{33}$ in Formula 1 may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

In the organometallic compound represented by Formula 1, because ring $CY_{33}$, which is a 5-membered or greater non-aromatic $C_4$-$C_8$ monocyclic group, is condensed with ring $CY_{32}$ to form a $C_5$-$C_{30}$ polycyclic group, when the organometallic compound represented by Formula 1 is applied to an emission layer of a light-emitting device, driving voltage may be reduced, luminescence efficiency may be improved, and device lifespan may be increased. Accordingly, by the use of the organometallic compound, an electronic device (for example, an organic light-emitting device) having low driving voltage, high efficiency, and long lifespan characteristics may be achieved.

Description of Formulae 2, 3, 3-1 to 3-5, 502, and 503

[Formula 2]

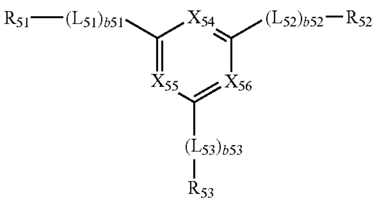

In Formula 2, $L_{51}$ to $L_{53}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$. $R_{10a}$ is the same as described herein.

In Formula 2, b51 to b53 respectively indicate numbers of $L_{51}$ to $L_{53}$, and b51 to b53 may each independently be an integer from 1 to 5. When b51 is 2 or more, two or more of $L_{51}$(s) may be identical to or different from each other, when b52 is 2 or more, two or more of $L_{52}$(s) may be identical to or different from each other, and when b53 is 2 or more, two or more of $L_{53}$(s) may be identical to or different from each other. In an embodiment, b51 to b53 may each independently be 1 or 2.

In an embodiment, in Formula 2, $L_{51}$ to $L_{53}$ may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxasiline group, a dibenzothiasiline group, a dibenzodihydroazasiline group, a dibenzodihydrodihydrodisiline group, a dibenzodihydrosiline group, a dibenzodioxine group, a dibenzooxathiine group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), —P(=O)($Q_{31}$)($Q_{32}$), or a combination thereof, wherein $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In an embodiment, in Formula 2, a bond between $L_{51}$ and $R_{51}$, a bond between $L_{52}$ and $R_{52}$, a bond between $L_{53}$ and $R_{53}$, a bond between two or more $L_{51}$(s), a bond between two or more $L_{52}$(s), a bond between two or more $L_{53}$(s), a bond between $L_{51}$ and a carbon atom between $X_{54}$ and $X_{55}$, a bond between $L_{52}$ and a carbon atom between $X_{54}$ and $X_{56}$, and a bond between $L_{53}$ and a carbon atom between $X_{55}$ and $X_{56}$ may each be a carbon-carbon single bond.

In Formula 2, $X_{54}$ may be N or C($R_{54}$), $X_{55}$ may be N or C($R_{55}$), $X_{56}$ may be N or C($R_{56}$), and at least one of $X_{54}$ to $X_{56}$ may each be N. $R_{54}$ to $R_{56}$ are each the same as described herein. In an embodiment, two or three of $X_{54}$ to $X_{56}$ may each be N.

In Formula 2, $R_{51}$ to $R_{56}$ may each independently be hydrogen, deuterium, —F, —$C_1$, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$). $Q_1$ to $Q_3$ and $R_{10a}$ are each the same as described herein.

In an embodiment, in Formula 2, $R_{51}$ to $R_{56}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzothiazolyl group, a benzoisoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or a combination thereof; or [00310]$—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or a combination thereof:

[Formula 91]

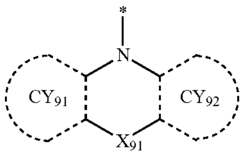

wherein in Formula 91, ring $CY_{91}$ and ring $CY_{92}$ may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ may respectively be the same as defined in connection with $R_{82}$, $R_{82a}$, and $R_{82b}$ provided herein, $R_{10a}$ is the same as defined herein, and

* indicates a binding site to an adjacent atom.

In an embodiment, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, $R_{91}$, $R_{91a}$, and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or a combination thereof.

In an embodiment, in Formula 2, a group represented by $*-(L_{51})_{b51}-R_{51}$ and a group represented by $*-(L_{52})_{b52}-R_{52}$ may each not be a phenyl group.

In an embodiment, in Formula 2, a group represented by $*-(L_{51})_{b51}-R_{51}$ and a group represented by $*-(L_{52})_{b52}-R_{52}$ may be identical to each other.

In an embodiment, in Formula 2, a group represented by $*-(L_{51})_{b51}-R_{51}$ and a group represented by $*-(L_{52})_{b52}-R_{52}$ in Formula 2 may be different from each other.

In an embodiment, in Formula 2, b51 and b52 may each be 1, 2, or 3; and $L_{51}$ and $L_{52}$ may each independently be a benzene group, a pyridine group, a pyrimidine group, a pyridazine group, a pyrazine group, or a triazine group, each unsubstituted or substituted with at least one $R_{10a}$.

In an embodiment, in Formula 2, $R_{51}$ and $R_{52}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, or —$Si(Q_1)(Q_2)(Q_3)$, wherein $Q_1$ to $Q_3$ may each independently be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

In embodiments, in Formula 2, a group represented by *-$(L_{51})_{b51}$-$R_{51}$ may be a group represented by one of Formulae CY51-1 to CY51-26, and/or a group represented by *-$(L_{52})_{b52}$-$R_{52}$ may be a group represented by one of Formulae CY52-1 to CY52-26, and/or a group represented by *-$(L_{53})_{b53}$-$R_{53}$ may be a group represented by one of Formulae CY53-1 to CY53-27, —$C(Q_1)(Q_2)(Q_3)$, or —$Si(Q_1)(Q_2)(Q_3)$:

CY51-1

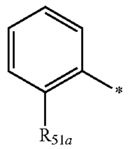

CY51-2

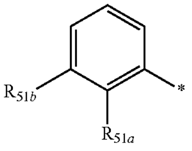

CY51-3

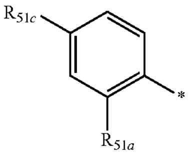

CY51-4

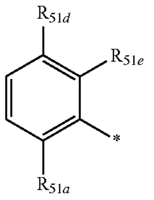

CY51-5

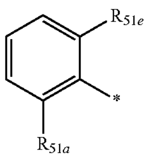

CY51-6

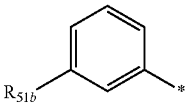

CY51-7

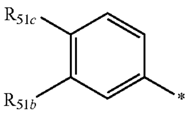

-continued

CY51-8

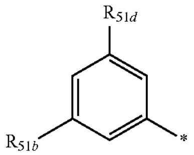

CY51-9

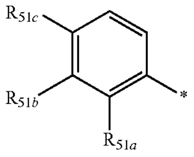

CY51-10

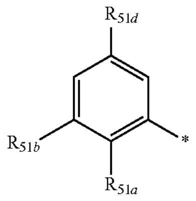

CY51-11

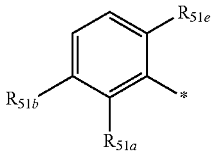

CY51-12

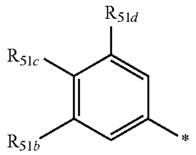

CY51-13

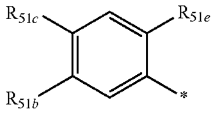

CY51-14

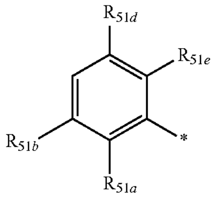

CY51-15

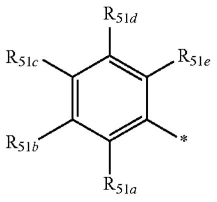

-continued
CY51-16
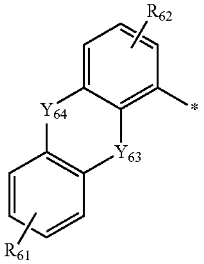
CY51-17
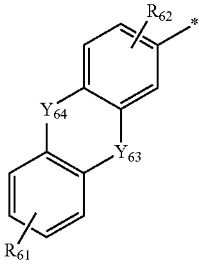
CY51-18
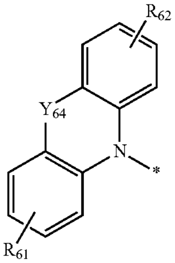
CY51-19
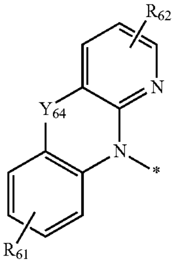
CY51-20
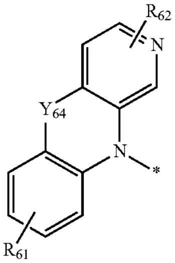
CY51-21
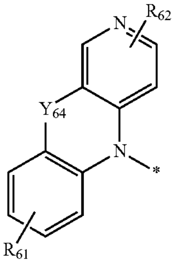
-continued
CY51-22
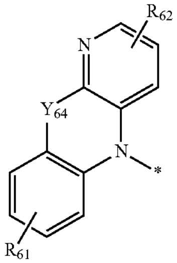
CY51-23
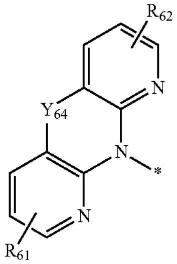
CY51-24
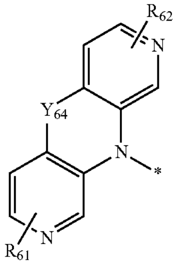
CY51-25
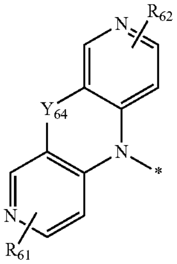
CY51-26
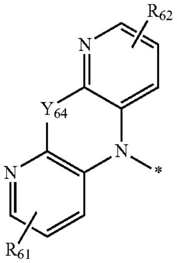
CY52-1
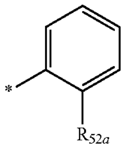

-continued
CY52-2
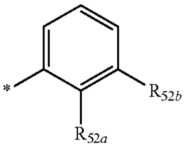
CY52-3
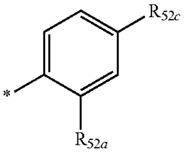
CY52-4
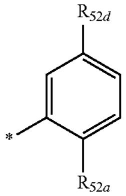
CY52-5
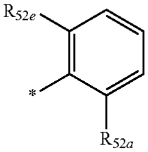
CY52-6
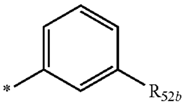
CY52-7
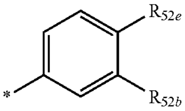
CY52-8
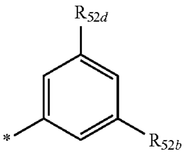
CY52-9
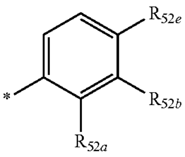
CY52-10
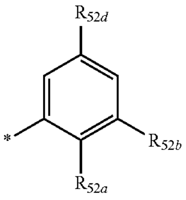
-continued
CY52-11
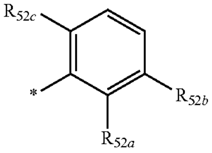
CY52-12
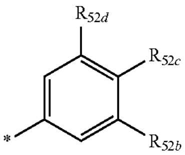
CY52-13
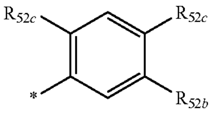
CY52-14
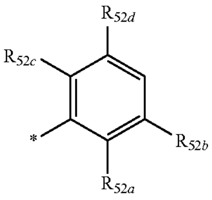
CY52-15
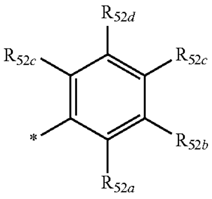
CY52-16
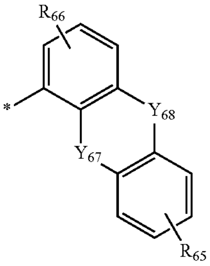
CY52-17
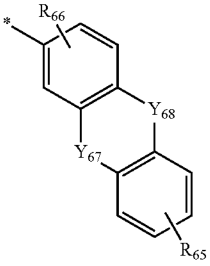

-continued
CY52-18
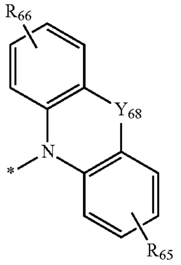
CY52-19
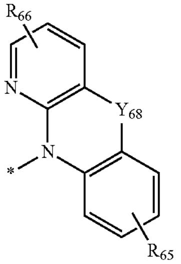
CY52-20
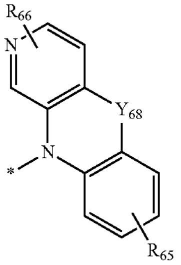
CY52-21
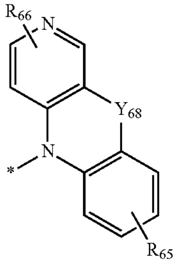
CY52-22
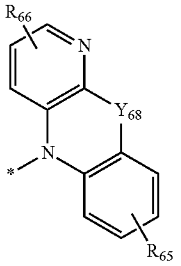
CY52-23
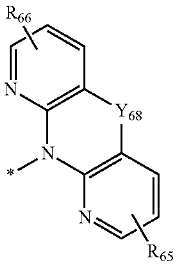
-continued
CY52-24
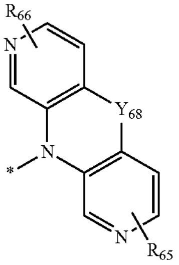
CY52-25
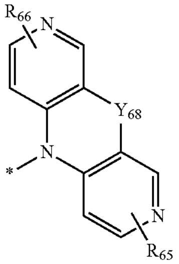
CY52-26
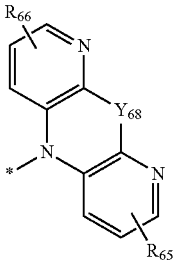
CY53-1
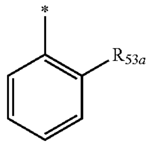
CY53-2
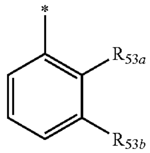
CY53-3
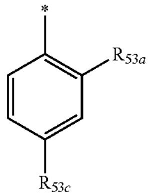
CY53-4
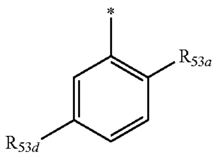

-continued
CY53-5
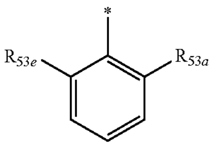
CY53-6
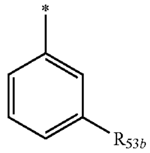
CY53-7
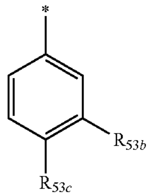
CY53-8
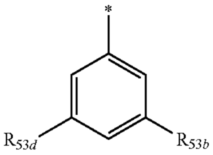
CY53-9
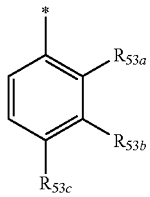
CY53-10
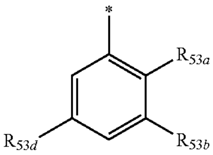
CY53-11
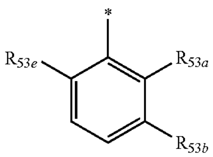
CY53-12
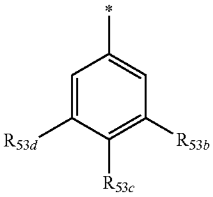
-continued
CY53-13
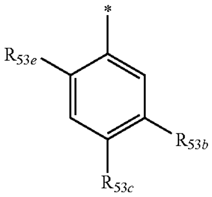
CY53-14
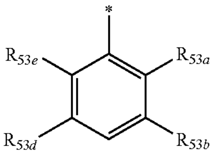
CY53-15
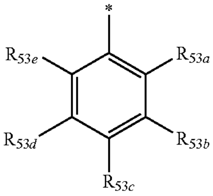
CY53-16
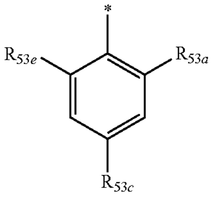
CY53-17
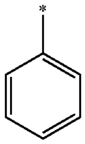
CY53-18
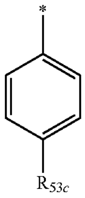
CY53-19
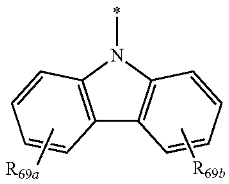
CY53-20
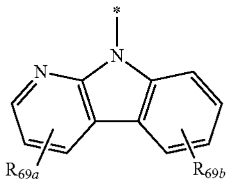

-continued

CY53-21

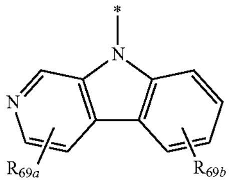

CY53-22

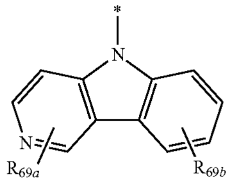

CY53-23

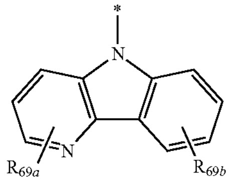

CY53-24

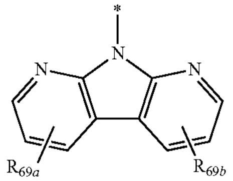

CY53-25

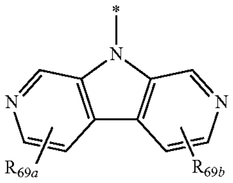

CY53-26

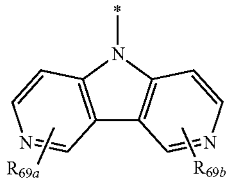

CY53-27

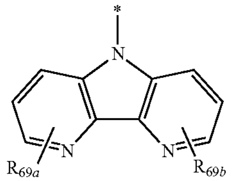

In Formulae CY51-1 to CY51-26, CY52-1 to CY52-26, and CY53-1 to CY53-27, $Y_{63}$ may be a single bond, O, S, N($R_{63}$), B($R_{63}$), C($R_{63a}$)($R_{63b}$), or Si($R_{63a}$)($R_{63b}$), $Y_{64}$ may be a single bond, O, S, N($R_{64}$), B($R_{64}$), C($R_{64a}$)($R_{64b}$), or Si($R_{64a}$)($R_{64b}$), $Y_{67}$ may be a single bond, O, S, N($R_{67}$), B($R_{67}$), C($R_{67a}$)($R_{67b}$), or Si($R_{67a}$)($R_{67b}$), $Y_{68}$ may be a single bond, O, S, N($R_{68}$), B($R_{68}$), C($R_{68a}$)($R_{68b}$), or Si($R_{68a}$)($R_{68b}$), $Y_{63}$ and $Y_{64}$ in Formulae CY51-16 and CY51-17 may not each be a single bond at the same time, $Y_{67}$ and $Y_{68}$ in Formulae CY52-16 and CY52-17 may not each be a single bond at the same time, $R_{51a}$ to $R_{51e}$, $R_{61}$ to $R_{64}$, $R_{63a}$, $R_{63b}$, $R_{64a}$, and $R_{64b}$ may each independently be the same as defined in connection with $R_{51}$; and $R_{51a}$ to $R_{51e}$ may not each be hydrogen, $R_{52a}$ to $R_{52e}$, $R_{65}$ to $R_{68}$, $R_{67a}$, $R_{67b}$, $R_{68a}$, and $R_{68b}$ may each independently be the same as defined in connection with $R_{52}$; and $R_{52a}$ to $R_{52e}$ may not each be hydrogen, $R_{53a}$ to $R_{53e}$, $R_{69a}$, and $R_{69b}$ may each independently be the same as defined in connection with $R_{53}$; and $R_{53a}$ to $R_{53e}$ may not each be hydrogen, and

* indicates a binding site to an adjacent atom.

In embodiments, $R_{51a}$ to $R_{51e}$ and $R_{52a}$ to $R_{52e}$ in Formulae CY51-1 to CY51-26 and Formulae CY52-1 to 52-26 may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or a combination thereof; or —$C(Q_1)(Q_2)(Q_3)$ or —$Si(Q_1)(Q_2)(Q_3)$, wherein $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or a combination thereof, in Formulae CY51-16 and CY51-17, $Y_{63}$ may be O or S and $Y_{64}$ may be $Si(R_{64a})(R_{64b})$; or $Y_{63}$ may be $Si(R_{63a})(R_{63b})$ and $Y_{64}$ may be O or S, and in Formulae CY52-16 and CY52-17, $Y_{67}$ may be O or S, and $Y_{68}$ may be $Si(R_{68a})(R_{68b})$; or $Y_{67}$ may be $Si(R_{67a})(R_{67b})$, and $Y_{68}$ may be O or S.

[Formula 3]

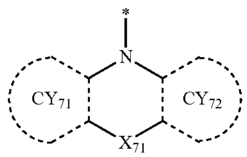

In Formula 3, ring $CY_{71}$ and ring $CY_{72}$ may each independently be a π electron-rich $C_3$-$C_{60}$ cyclic group or a pyridine group, $X_{71}$ may be: a single bond; or a linking group including O, S, N, B, C, Si, or a combination thereof, and

* indicates a binding site to an atom included in the remaining portion other than the group represented by Formula 3 in the third compound.

[Formula 3-1]

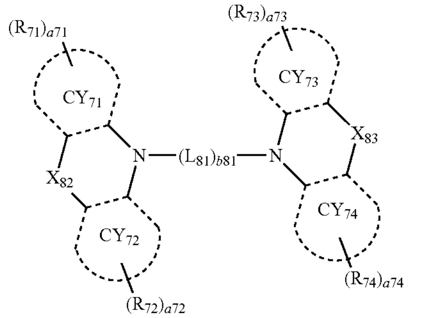

[Formula 3-2]

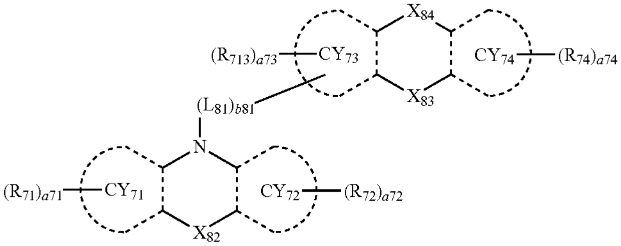

[Formula 3-3]

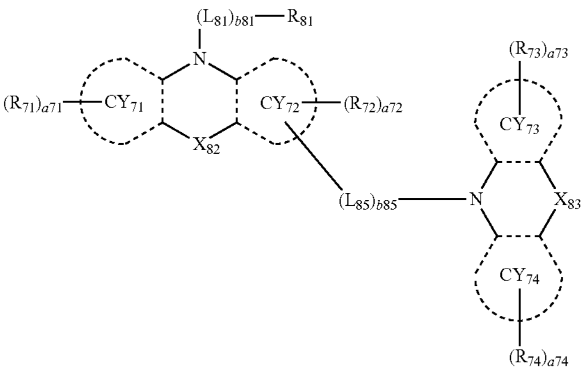

-continued

[Formula 3-4]

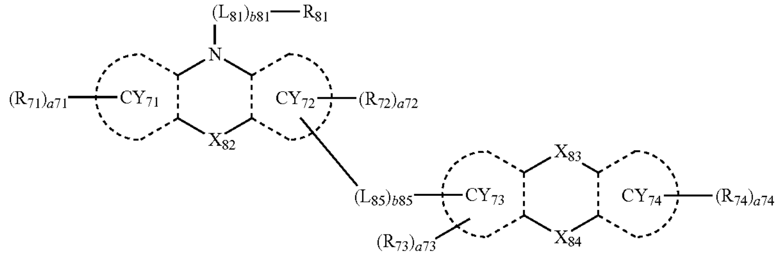

[Formula 3-5]

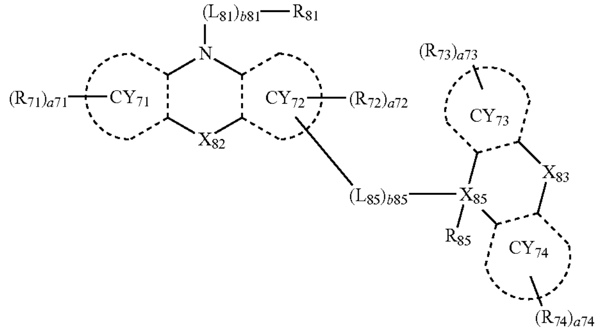

In Formulae 3-1 to 3-5, rings $CY_{71}$ to ring $CY_{74}$ may each independently be a π electron-rich $C_3$-$C_{60}$ cyclic group or a pyridine group, $X_{82}$ may be a single bond, O, S, N-[$(L_{82})_{b82}$-$R_{82}$], C($R_{82a}$)($R_{82b}$), or Si($R_{82a}$)($R_{82b}$), $X_{83}$ may be a single bond, O, S, N-[$(L_{83})_{b83}$-$R_{83}$], C($R_{83a}$)($R_{83b}$), or Si($R_{83a}$)($R_{83b}$), $X_{84}$ may be O, S, N-[$(L_{84})_{b84}$-$R_{84}$], C($R_{84a}$)($R_{84b}$), or Si($R_{84a}$)($R_{84b}$), $X_{85}$ may be C or Si, $L_{81}$ to $L_{85}$ may each independently be a single bond, *—C($Q_4$)($Q_5$)-*', *—Si($Q_4$)($Q_5$)-*', a π electron-rich $C_3$-$C_{60}$ cyclic group unsubstituted or substituted with at least one $R_{10a}$, or a pyridine group unsubstituted or substituted with at least one $R_{10a}$, $Q_4$ and $Q_5$ are each independently the same as described in connection with $Q_1$, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$ and $R_{84b}$ are each as described herein, a71 to a74 respectively indicate the numbers of $R_{71}$ to $R_{74}$, and a71 to a74 may each independently be an integer from 0 to 20, and $R_{10a}$ is the same as described herein.

In Formulae 3-1 to 3-5, when a71 is 2 or more, two or more of $R_{71}$(s) may be identical to or different from each other, when a72 is 2 or more, two or more of $R_{72}$(s) may be identical to or different from each other, when a73 is 2 or more, two or more of $R_{73}$(s) may be identical to or different from each other, and when a74 is 2 or more, two or more of $R_{74}$(s) may be identical to or different from each other. In an embodiment, a71 to a74 may each independently be an integer from 0 to 8.

In an embodiment, in Formulae 3-1 to 3-5, $L_{81}$ to $L_{85}$ may each independently be:

a single bond; or

*—C($Q_4$)($Q_5$)-*' or *—Si($Q_4$)($Q_5$)-*'; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), —P(=O)($Q_{31}$)($Q_{32}$), or a combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In embodiments, in Formulae 3-1 and 3-2, a moiety represented by

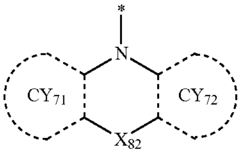

may be a moiety represented by one of Formulae CY71-1(1) to CY71-1(8), and/or in Formulae 3-1 and 3-3, a moiety represented by

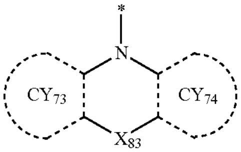

may be a moiety represented by one of Formulae CY71-2(1) to CY71-2(8), and/or in Formulae 3-2 and 3-4, a moiety represented by

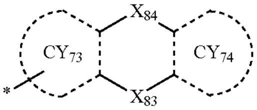

may be a moiety represented by one of Formulae CY71-3(1) to CY71-3(32), and/or in Formulae 3-3 to 3-5, a moiety represented by

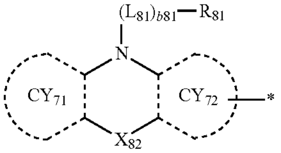

may be a moiety represented by one of Formulae CY71-4(1) to CY71-4(32), and/or in Formula 3-5, a moiety represented by

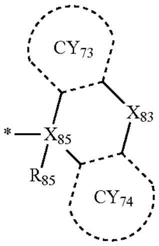

may be a moiety represented by one of Formulae CY71-5(1) to CY71-5(8):

CY71-1(1)

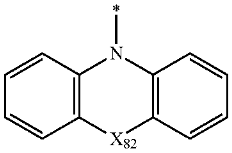

CY71-1(2)

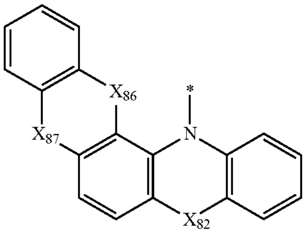

CY71-1(3)

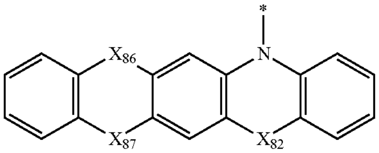

CY71-1(4)

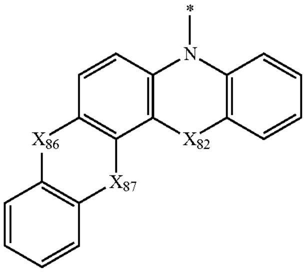

CY71-1(5)

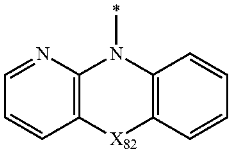

CY71-1(6)

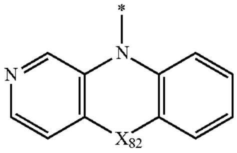

CY71-1(7)

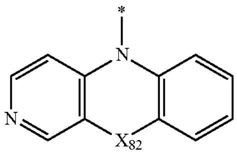

CY71-1(8)

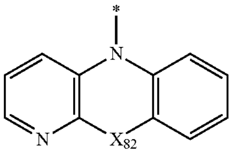

-continued
CY71-2(1)
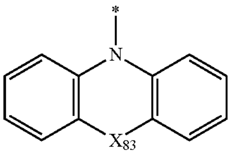
CY71-2(2)
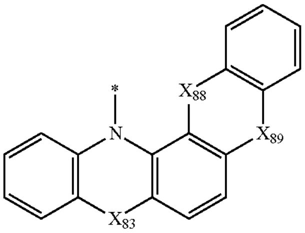
CY71-2(3)
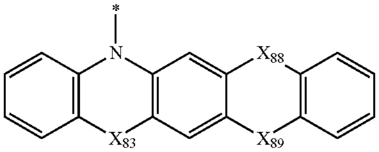
CY71-2(4)
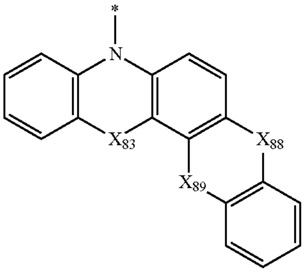
CY71-2(5)
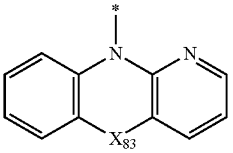
CY71-2(6)
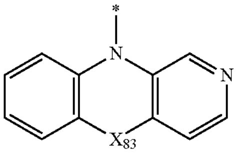
CY71-2(7)
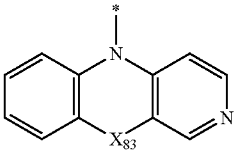
CY71-2(8)
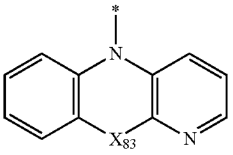
-continued
CY71-3(1)
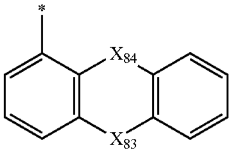
CY71-3(2)
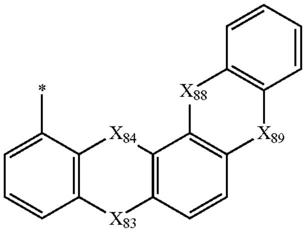
CY71-3(3)
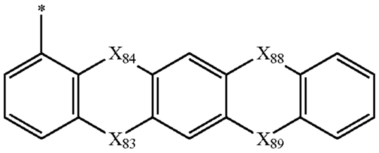
CY71-3(4)
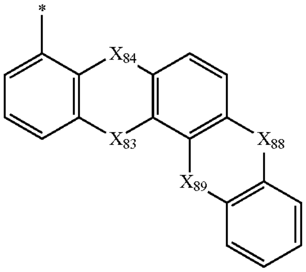
CY71-3(5)
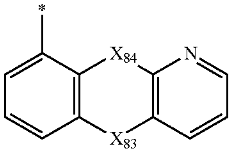
CY71-3(6)
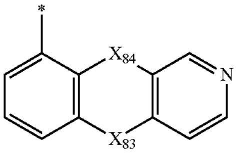
CY71-3(7)
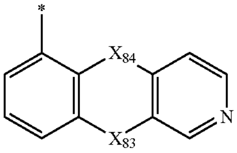
CY71-3(8)
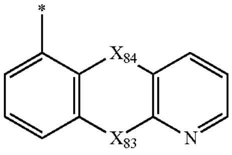

-continued
CY71-3(9)
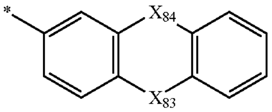
CY71-3(10)
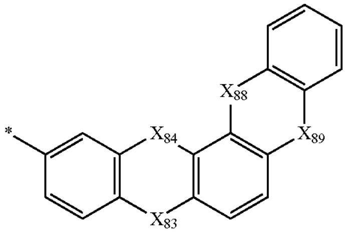
CY71-3(11)
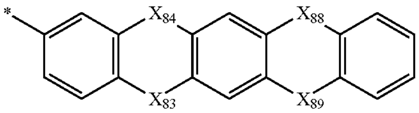
CY71-3(12)
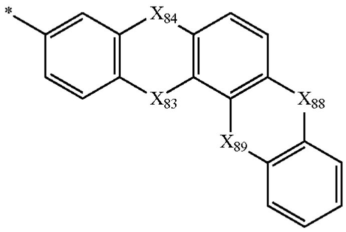
CY71-3(13)
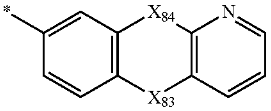
CY71-3(14)
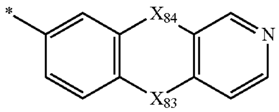
CY71-3(15)
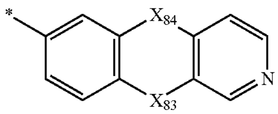
CY71-3(16)
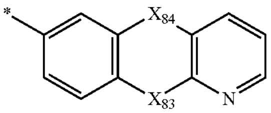
CY71-3(17)
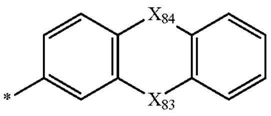
CY71-3(18)
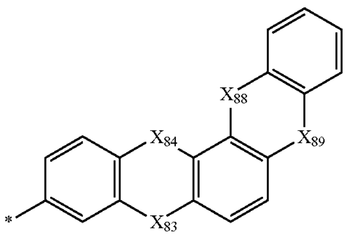
-continued
CY71-3(19)
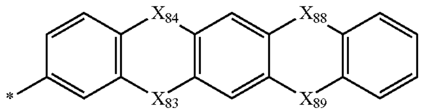
CY71-3(20)
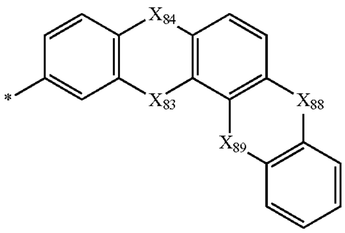
CY71-3(21)
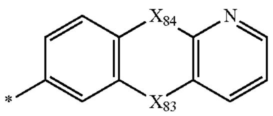
CY71-3(22)
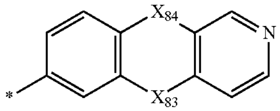
CY71-3(23)
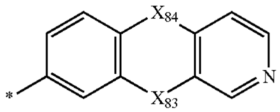
CY71-3(24)
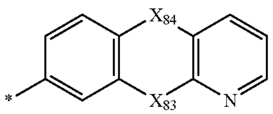
CY71-3(25)
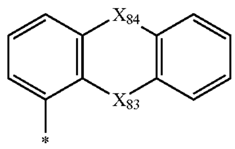
CY71-3(26)
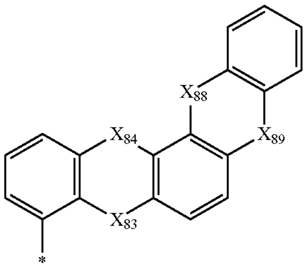
CY71-3(27)
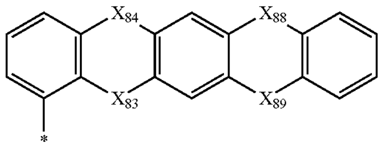

-continued
CY71-3(28)
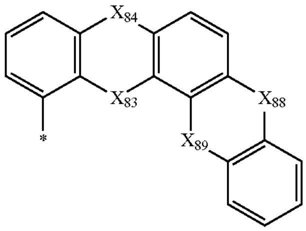
CY71-3(29)
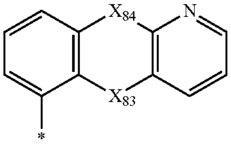
CY71-3(30)
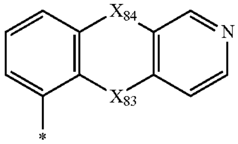
CY71-3(31)
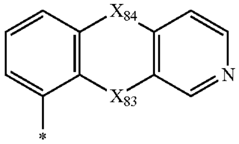
CY71-3(32)
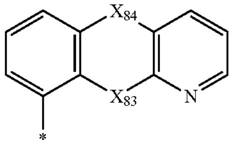
CY71-4(1)
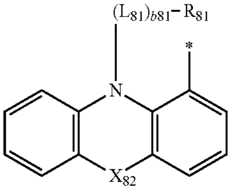
CY71-4(2)
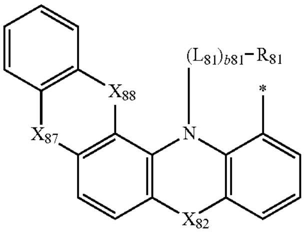
CY71-4(3)
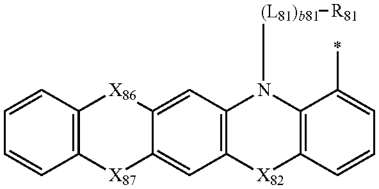
-continued
CY71-4(4)
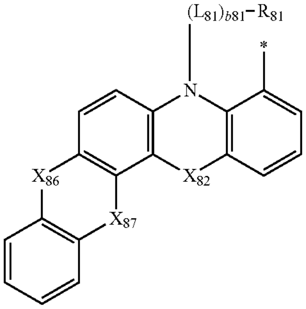
CY71-4(5)
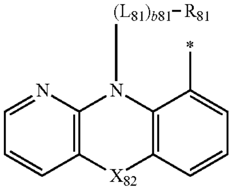
CY71-4(6)
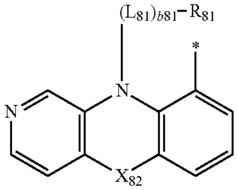
CY71-4(7)
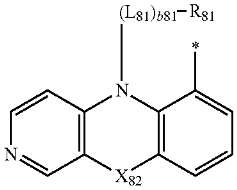
CY71-4(8)
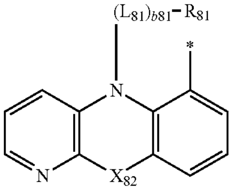
CY71-4(9)
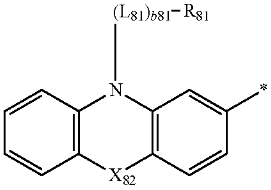
CY71-4(10)
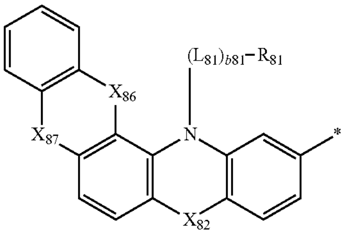

CY10-4(11)
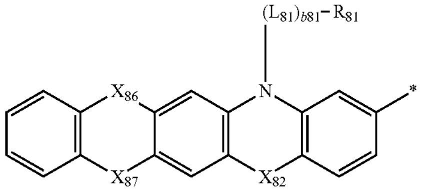
CY71-4(12)
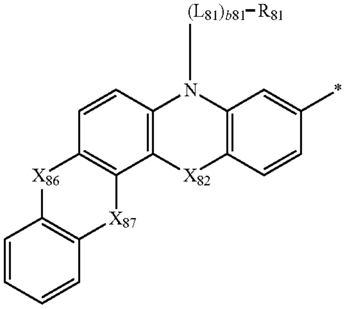
CY71-4(13)
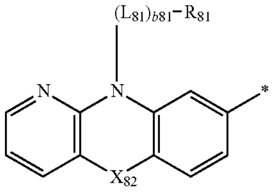
CY71-4(14)
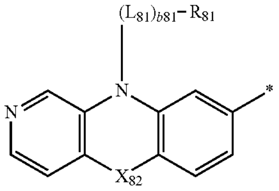
CY71-4(15)
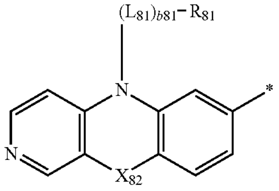
CY71-4(16)
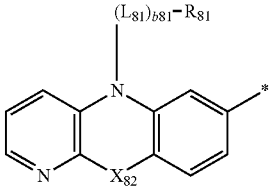
CY71-4(17)
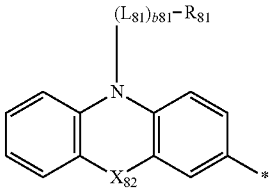
CY71-4(18)
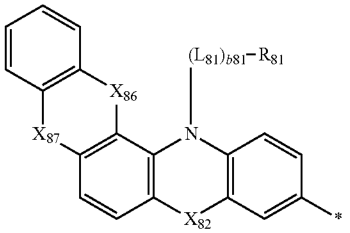
CY71-4(19)
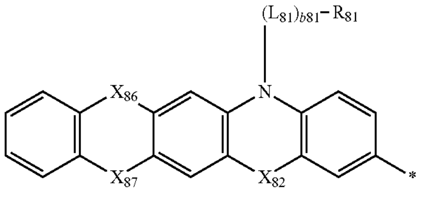
CY71-4(20)
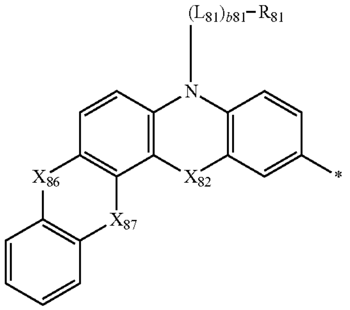
CY71-4(21)
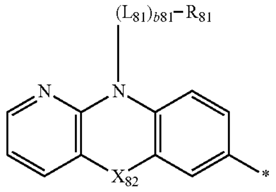
CY71-4(22)
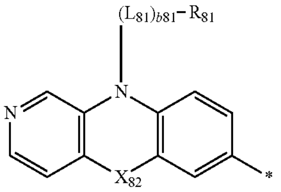
CY71-4(23)
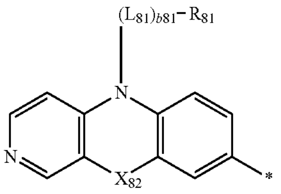
CY71-4(24)
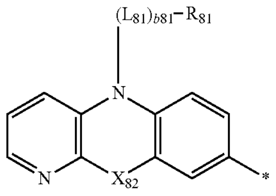

-continued
CY71-4(25)
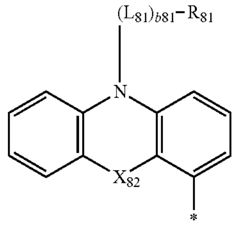
CY71-4(26)
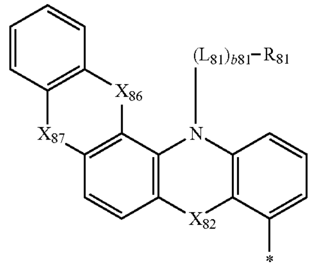
CY71-4(27)
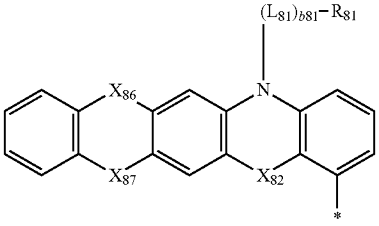
CY71-4(28)
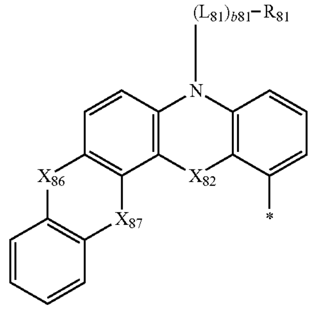
CY71-4(29)
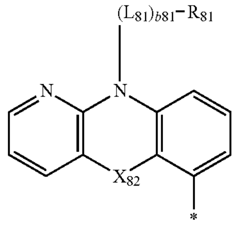
CY71-4(30)
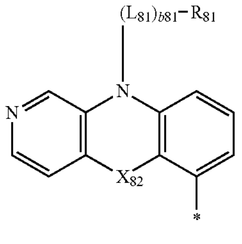
-continued
CY71-4(31)
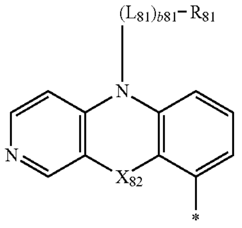
CY71-4(32)
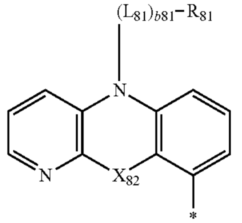
CY71-5(1)
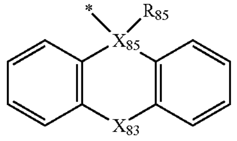
CY71-5(2)
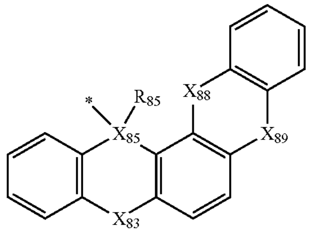
CY71-5(3)
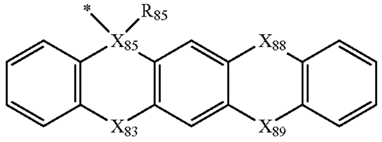
CY71-5(4)
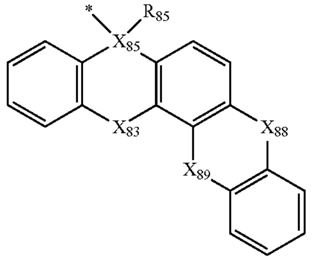
CY71-5(5)
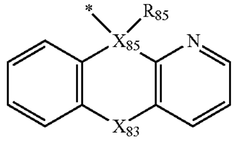
CY71-5(6)
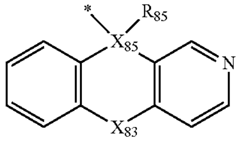

-continued

CY71-5(7)

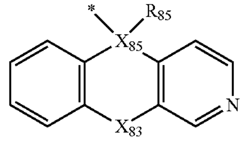

CY71-5(8)

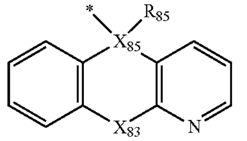

In Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{82}$ to $X_{85}$, $L_{81}$, b81, $R_{81}$, and $R_{85}$ are each the same as described herein, $X_{86}$ may be a single bond, O, S, $N(R_{86})$, $B(R_{86})$, $C(R_{86a})(R_{86b})$, or $Si(R_{86a})(R_{86b})$, $X_{87}$ may be a single bond, O, S, $N(R_{87})$, $B(R_{87})$, $C(R_{87a})(R_{87b})$, or $Si(R_{87a})(R_{87b})$, in Formulae CY71-1(1) to CY71-1(8) and CY71-4(1) to CY71-4(32), $X_{86}$ and $X_{87}$ may not each be a single bond at the same time, $X_{88}$ may be a single bond, O, S, $N(R_{88})$, $B(R_{88})$, $C(R_{88a})(R_{88b})$, or $Si(R_{88a})(R_{88b})$, $X_{89}$ may be a single bond, O, S, $N(R_{89})$, $B(R_{89})$, $C(R_{89a})(R_{89b})$, or $Si(R_{89a})(R_{89b})$, in Formulae CY71-2(1) to CY71-2(8), CY71-3(1) to CY71-3(32), and CY71-5(1) to CY71-5(8), $X_{88}$ and $X_{89}$ may not each be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ are each independently the same as defined in connection with $R_{81}$.

[Formula 502]

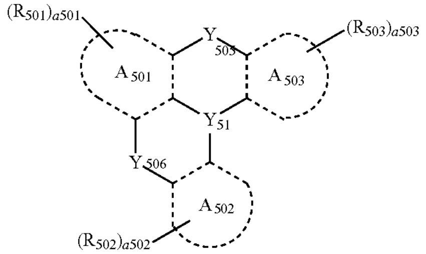

[Formula 503]

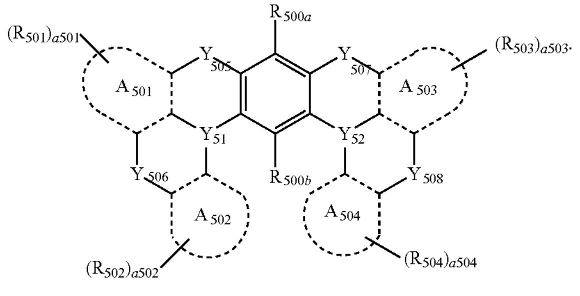

In Formulae 502 and 503, rings $A_{501}$ to $A_{504}$ may each independently be a $C_3$-$C_{60}$ carbocyclic group or a $C_1$-$C_{60}$ heterocyclic group, $Y_{505}$ may be O, S, $N(R_{505})$, $B(R_{505})$, $C(R_{505a})(R_{505b})$, or $Si(R_{505a})(R_{505b})$, $Y_{506}$ may be O, S, $N(R_{506})$, $B(R_{506})$, $C(R_{506a})(R_{506b})$, or $Si(R_{506a})(R_{506b})$, $Y_{507}$ may be O, S, $N(R_{507})$, $B(R_{507})$, $C(R_{507a})(R_{507b})$, or $Si(R_{507a})(R_{507b})$, $Y_{508}$ may be O, S, $N(R_{508})$, $B(R_{508})$, $C(R_{508a})(R_{508b})$, or $Si(R_{508a})(R_{508b})$, $Y_{51}$ and $Y_{52}$ may each independently be B, P(=O), or S(=O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ are each the same as described herein, and a501 to a504 respectively indicate the number of $R_{501}$ to $R_{504}$, and a501 to a504 may each independently be an integer from 0 to 20.

When a501 is 2 or greater, two or more of $R_{501}$ may be identical to or different from each other, when a502 is 2 or greater, two or more of $R_{502}$ may be identical to or different from each other, when a503 is 2 or greater, two or more of $R_{503}$ may be identical to or different from each other, and when a504 is 2 or greater, two or more of $R_{504}$ may be identical to or different from each other. In an embodiment, a501 to a504 may each independently be an integer from 0 to 8.

In the specification, in Formulae 2, 3-1 to 3-5, 502, and 503, $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ are each the same as described herein.

In an embodiment, $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, $R_{508b}$, and $R_{10a}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzothiazolyl group, a benzoisoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{31})$, or a combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or a combination thereof.

In embodiments, $R_1$, $R_2$, $R_{31}$ to $R_{33}$, and $R_4$ in Formula 1; $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503; and $R_{10a}$ may each independently be:

hydrogen, deuterium, —F, a cyano group, a nitro group, $—CH_3$, $—CD_3$, $—CD_2H$, $—CDH_2$, $—CF_3$, $—CF_2H$, $—CFH_2$;

a group represented by one of Formulae 9-1 to 9-19; and a group represented by one of Formulae 10-1 to 10-246, $—C(Q_1)(Q_2)(Q_3)$, $—Si(Q_1)(Q_2)(Q_3)$, or $—P(=O)(Q_1)(Q_2)$ (wherein $Q_1$ to $Q_3$ are each the same as described herein):

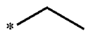
9-1

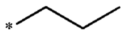
9-2

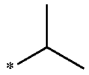
9-3

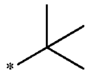
9-4

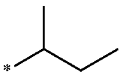
9-5

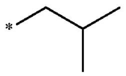
9-6

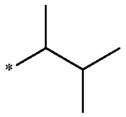
9-7

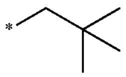
9-8

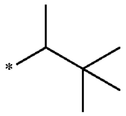
9-9

-continued
9-10
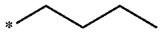
9-11
9-12
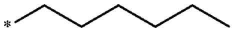
9-13
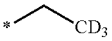
9-14
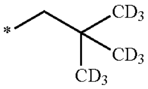
9-15
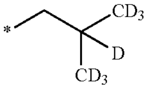
9-16
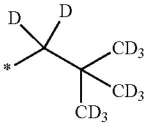
9-17
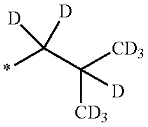
9-18
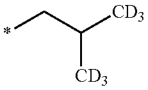
9-19
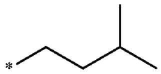
10-1
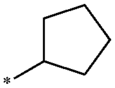
10-2
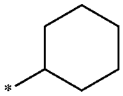
10-3
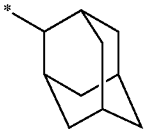
10-4
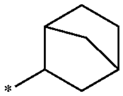
10-5
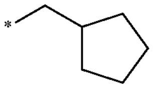
10-6
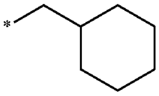
-continued
10-7
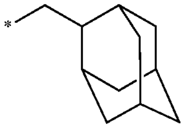
10-8
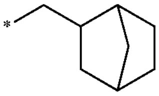
10-9
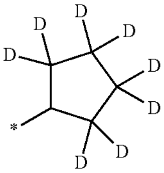
10-10
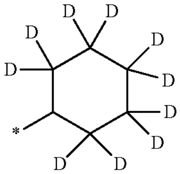
10-11
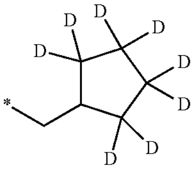
10-12
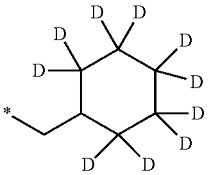
10-13
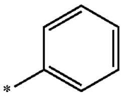
10-14
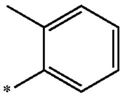
10-15
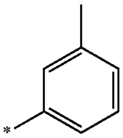
10-16
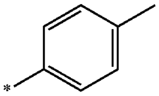
10-17
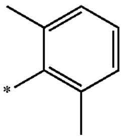

-continued
10-18
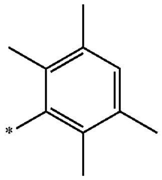
10-19
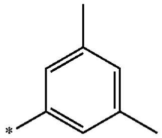
10-20
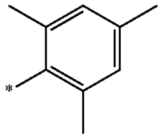
10-21
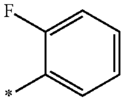
10-22
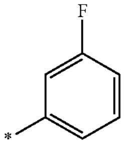
10-23
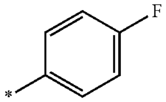
10-24
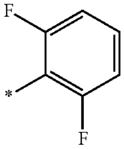
10-25
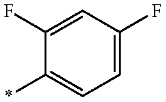
10-26
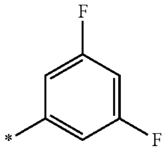
10-27
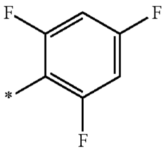
10-28
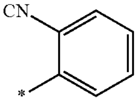
-continued
10-29
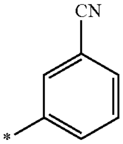
10-30
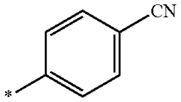
10-31
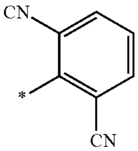
10-32
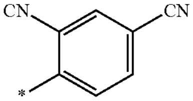
10-33
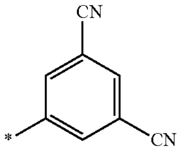
10-34
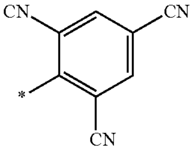
10-35
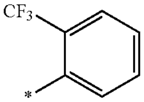
10-36
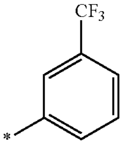
10-37
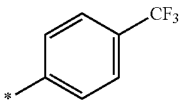
10-38
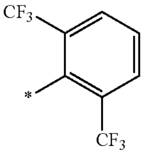
10-39
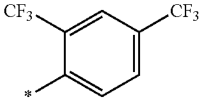

-continued
10-40
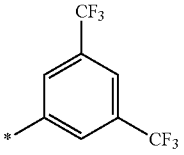
10-41
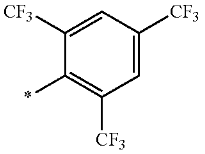
10-42
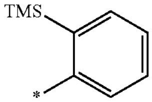
10-43
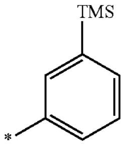
10-44
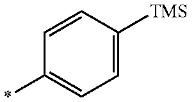
10-45
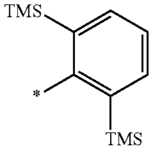
10-46
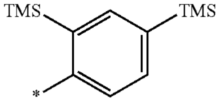
10-47
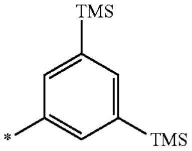
10-48
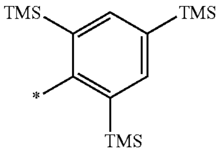
10-49
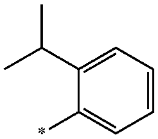
-continued
10-50
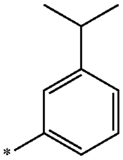
10-51
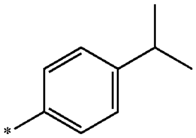
10-52
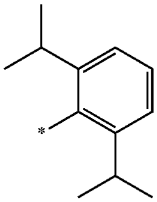
10-53
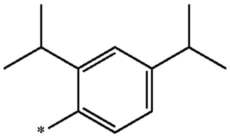
10-54
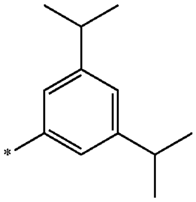
10-55
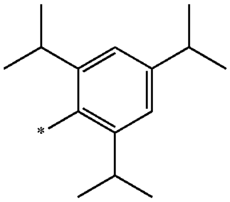
10-56
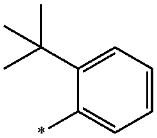
10-57
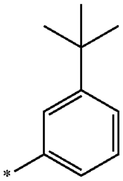
10-58
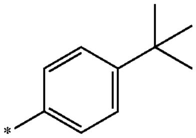

-continued
10-59
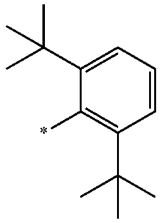
10-60
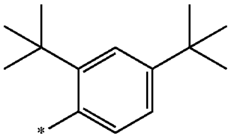
10-61
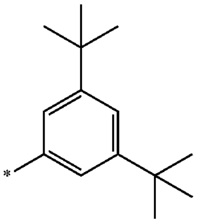
10-62
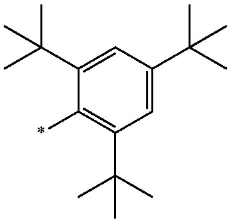
10-63
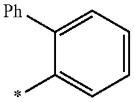
10-64
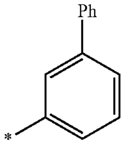
10-65
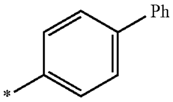
10-66
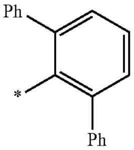
10-67
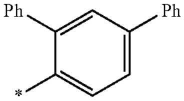
-continued
10-68
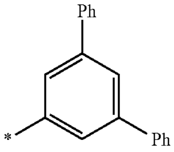
10-69
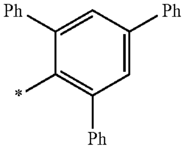
10-70
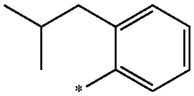
10-71
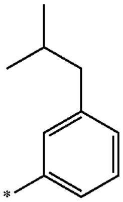
10-72
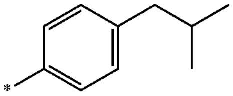
10-73
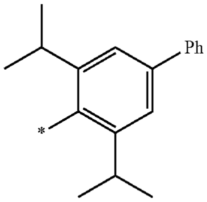
10-74
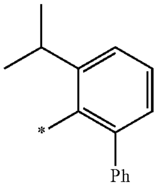
10-75
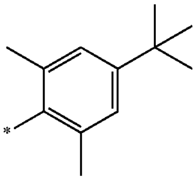

-continued
10-76
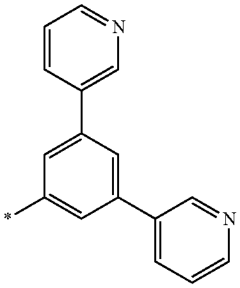
10-77
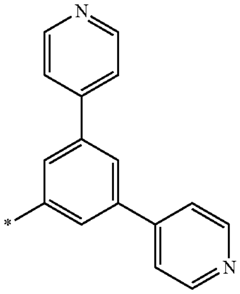
10-78
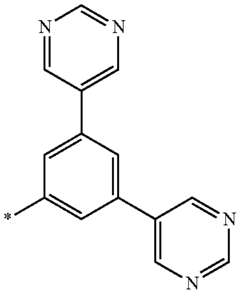
10-79
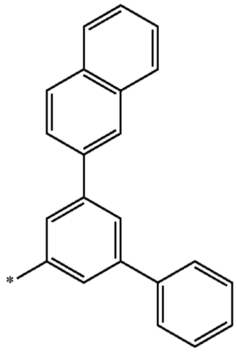
10-80
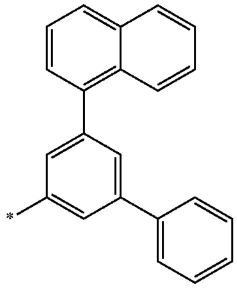
-continued
10-81
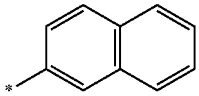
10-82
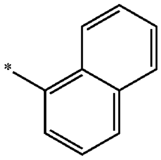
10-83
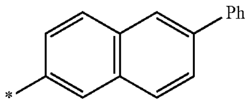
10-84
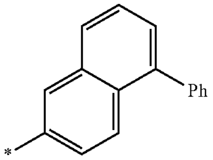
10-85
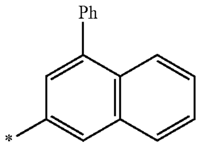
10-86
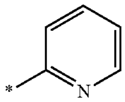
10-87
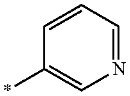
10-88
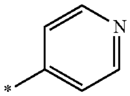
10-89
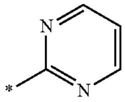
10-90
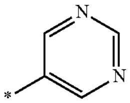
10-91
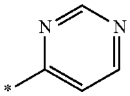
10-92
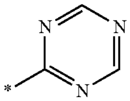

-continued
10-93
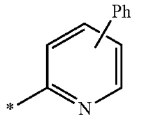
10-94
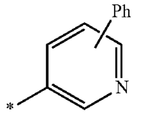
10-95
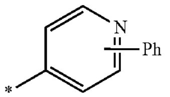
10-96
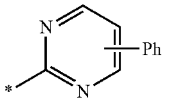
10-97
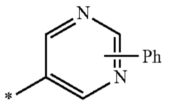
10-98
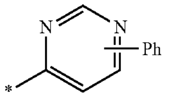
10-99
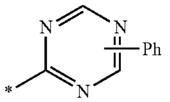
10-100
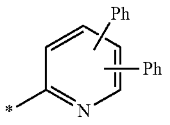
10-101
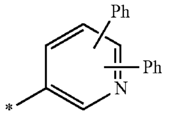
10-102
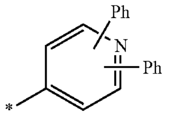
10-103
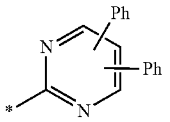
10-104
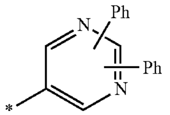
10-105
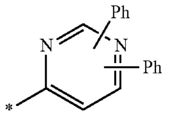
-continued
10-106
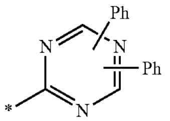
10-107
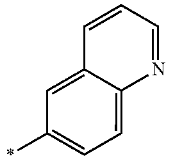
10-108
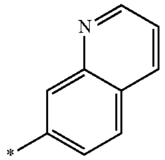
10-109
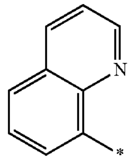
10-110
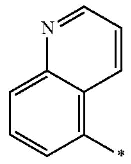
10-111
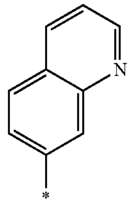
10-112
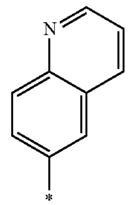
10-113
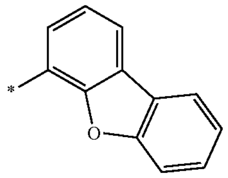
10-114
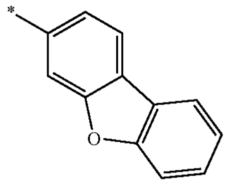

-continued
10-115
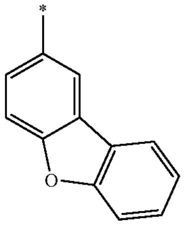
10-116
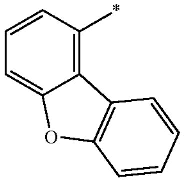
10-117
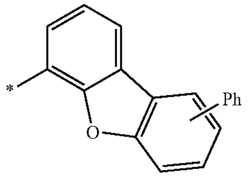
10-118
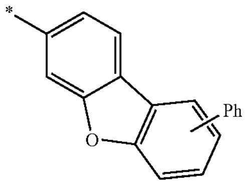
10-119
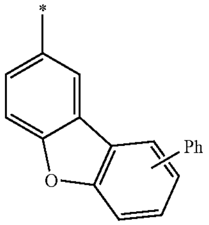
10-120
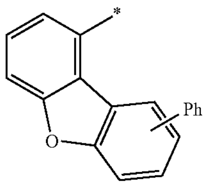
10-121
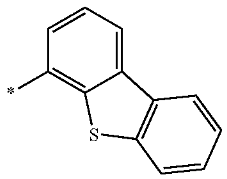
10-122
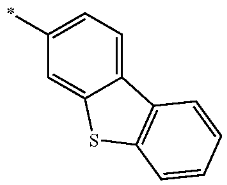
-continued
10-123
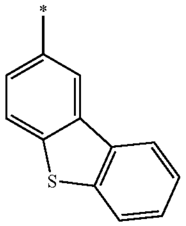
10-124
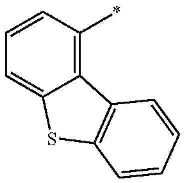
10-125
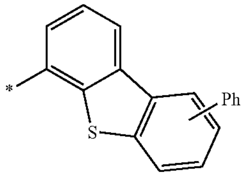
10-126
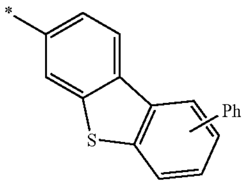
10-127
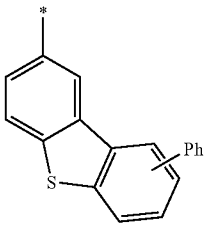
10-128
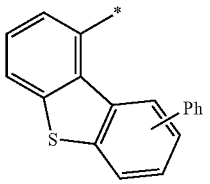
10-129
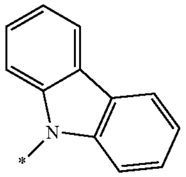
10-130
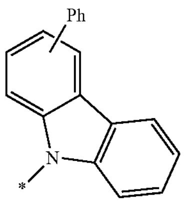

-continued
10-131
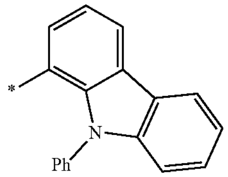
10-132
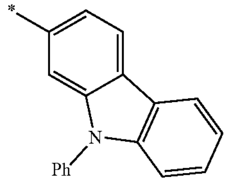
10-133
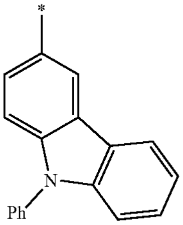
10-134
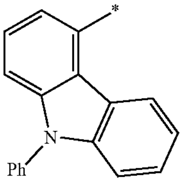
10-135
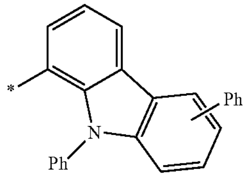
10-136
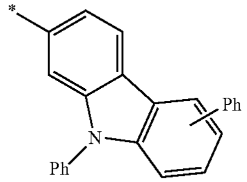
10-137
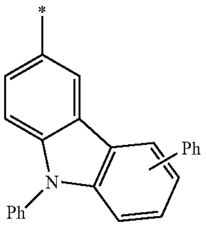
10-138
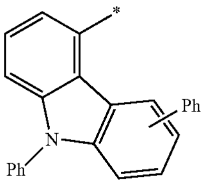
-continued
10-139
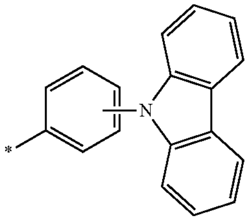
10-140
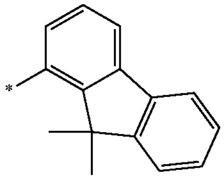
10-141
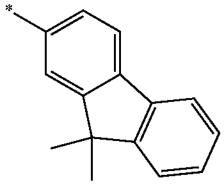
10-142
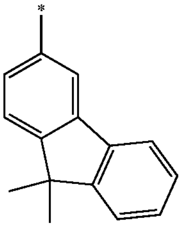
10-143
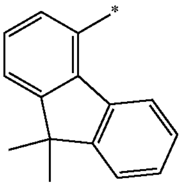
10-144
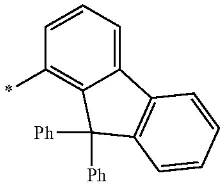
10-145
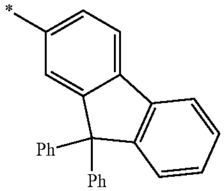

10-146
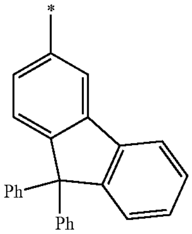
10-147
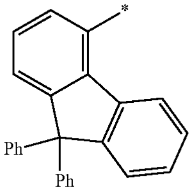
10-148
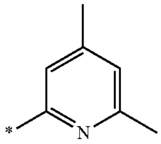
10-149
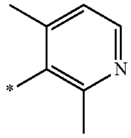
10-150
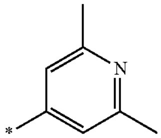
10-151
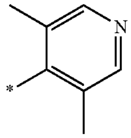
10-152
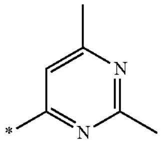
10-153
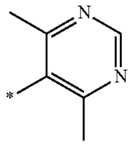
10-154
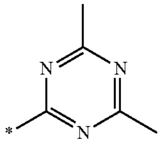
10-155
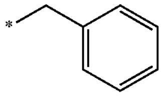
10-156
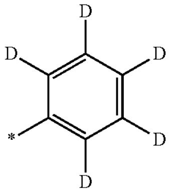
10-157
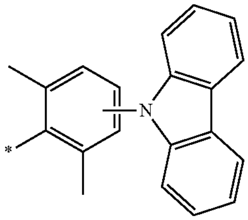
10-158
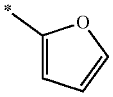
10-159
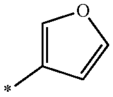
10-160
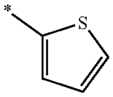
10-161
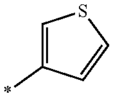
10-162
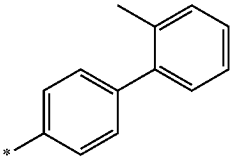
10-163
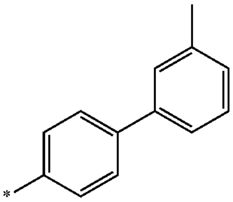
10-164
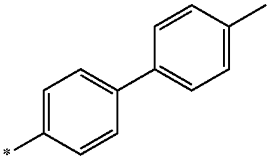
10-165
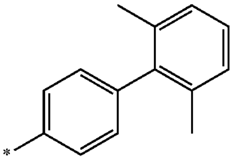

-continued
10-166
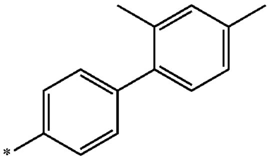
10-167
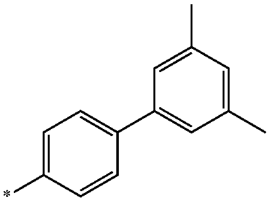
10-168
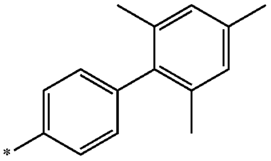
10-169
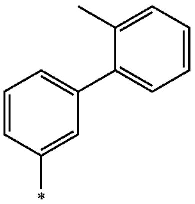
10-170
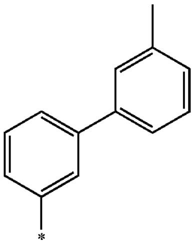
10-171
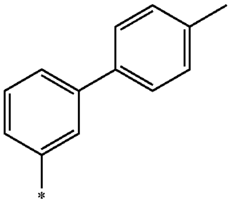
10-172
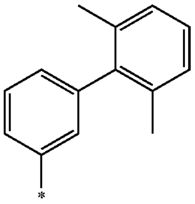
-continued
10-173
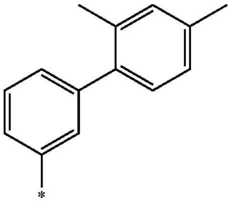
10-174
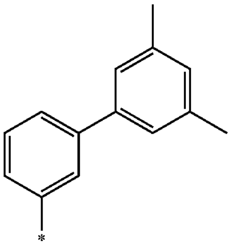
10-175
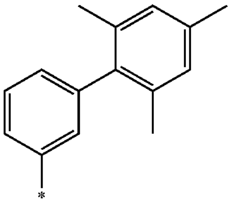
10-176
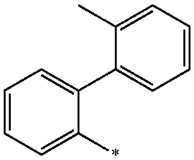
10-177
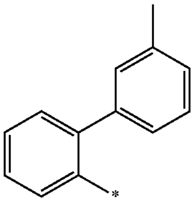
10-178
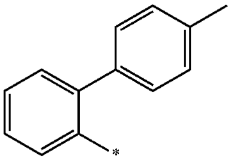
10-179
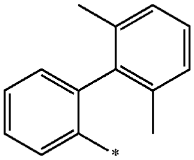
10-180
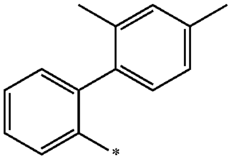

-continued
10-181
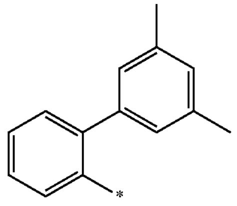
10-182
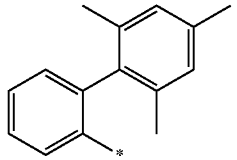
10-183
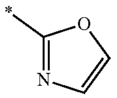
10-184
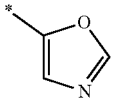
10-185
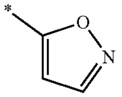
10-186
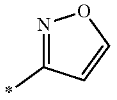
10-187
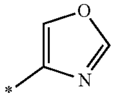
10-188
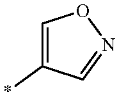
10-189
10-190
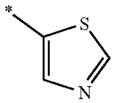
10-191
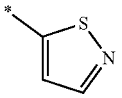
10-192
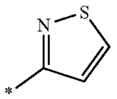
10-193
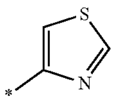
-continued
10-194
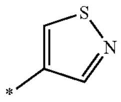
10-195
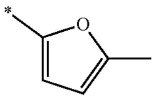
10-196
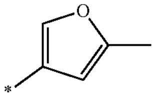
10-197
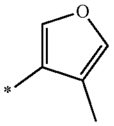
10-198
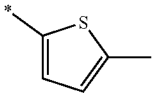
10-199
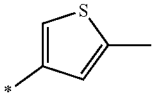
10-200
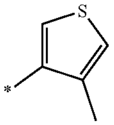
10-201
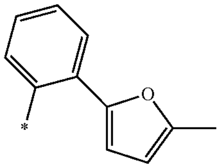
10-202
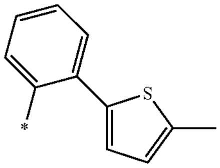
10-203
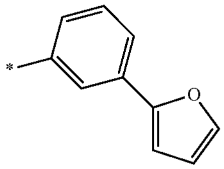
10-204
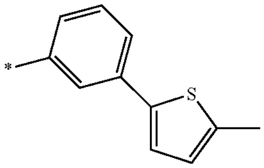

-continued
10-205
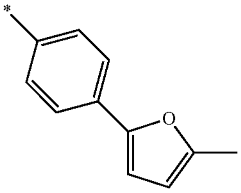
10-206
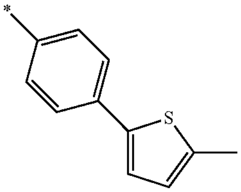
10-207
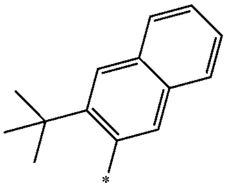
10-208
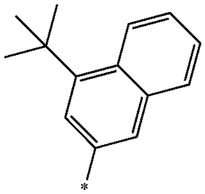
10-209
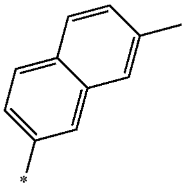
10-210
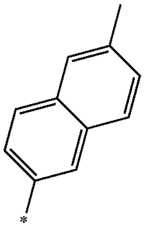
10-211
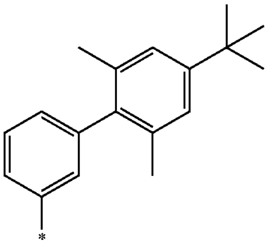
-continued
10-212
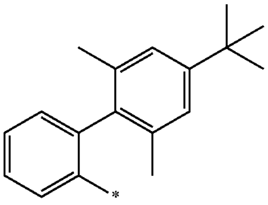
10-213
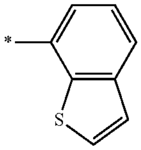
10-214
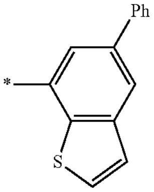
10-215
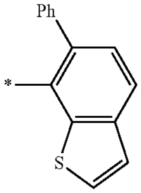
10-216
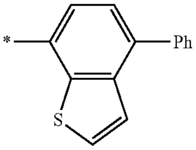
10-217
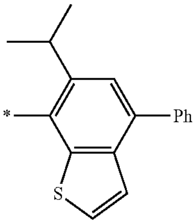
10-218
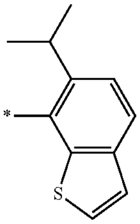
10-219
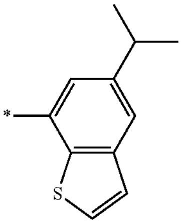

-continued
10-220
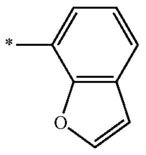
10-221
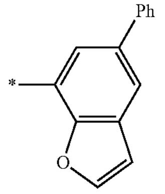
10-222
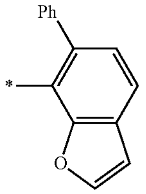
10-223
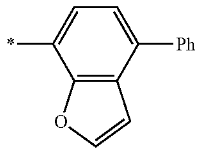
10-224
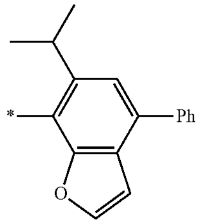
10-225
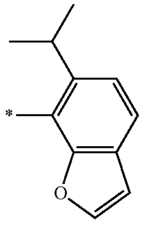
10-226
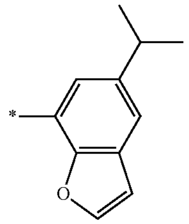
10-227
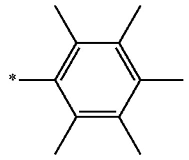
-continued
10-228
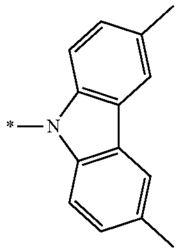
10-229
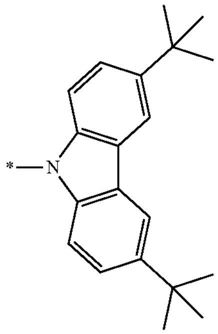
10-230
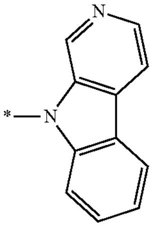
10-231
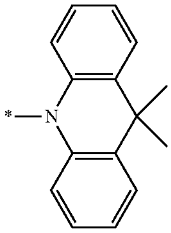
10-232
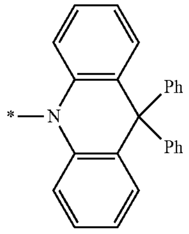
10-233
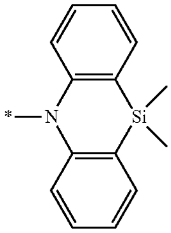

-continued
10-234
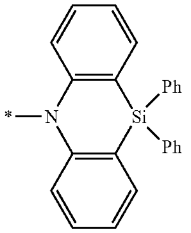
10-235
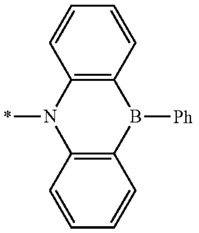
10-236
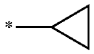
10-237
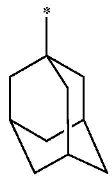
10-238
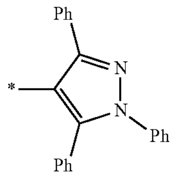
10-239
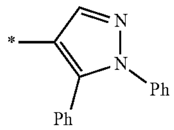
10-240
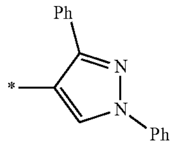
10-241
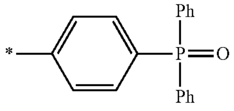
10-242
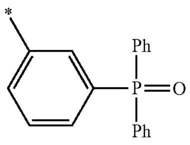
-continued
10-243
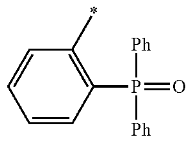
10-244
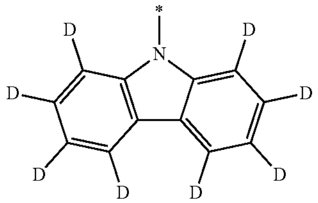
10-245
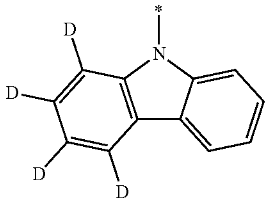
10-246
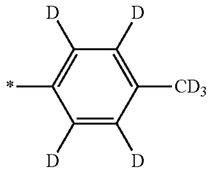
In Formulae 9-1 to 9-19 and 10-1 to 10-246, * indicates a binding site to an adjacent atom, "Ph" represents a phenyl group, and "TMS" represents a trimethylsilyl group.
Examples of Compounds
In an embodiment, the organometallic compound represented by Formula 1 may be one of compounds 1 to 120:
1
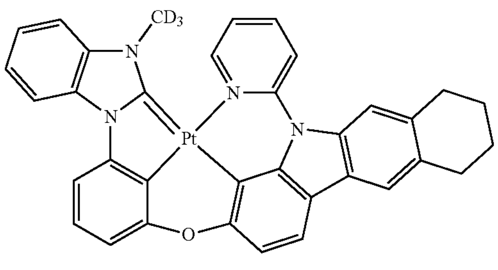
2
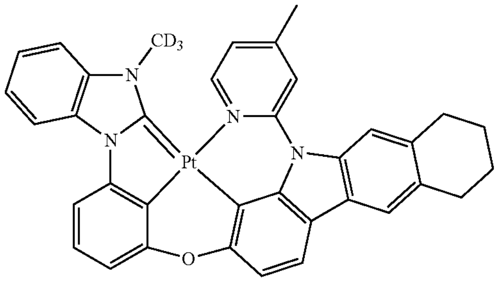

-continued
3
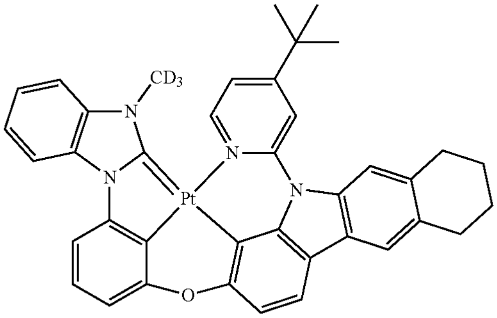
4
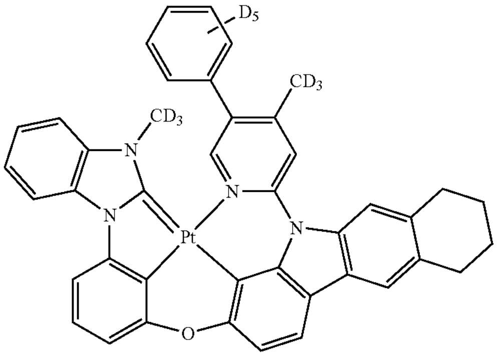
5
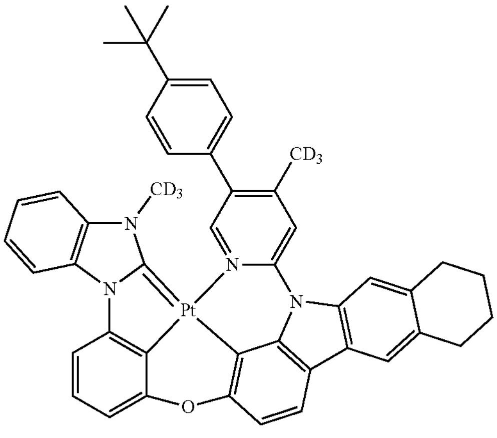
-continued
6
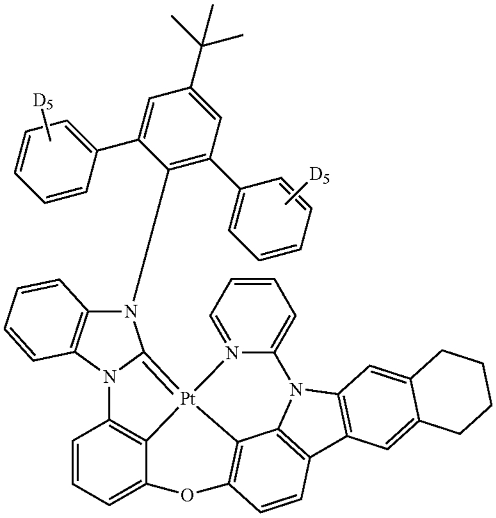
7
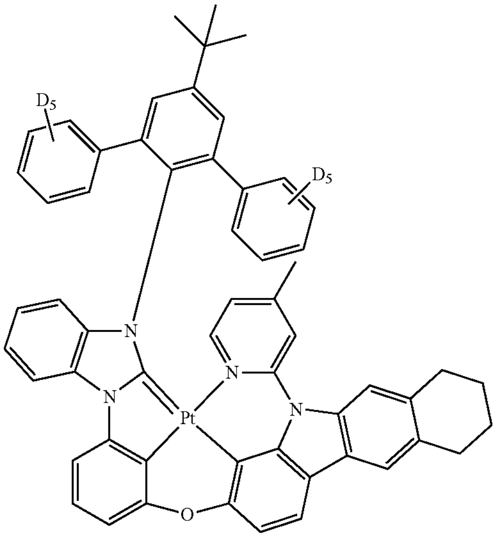
8
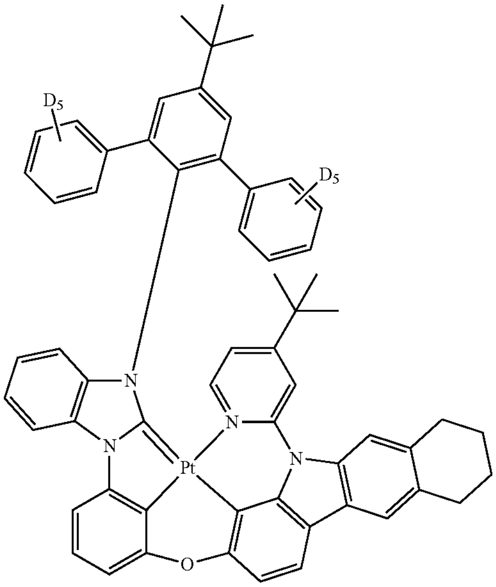

9
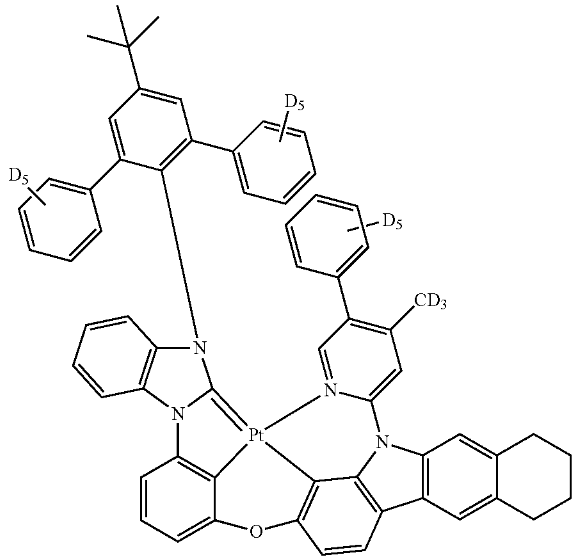
10
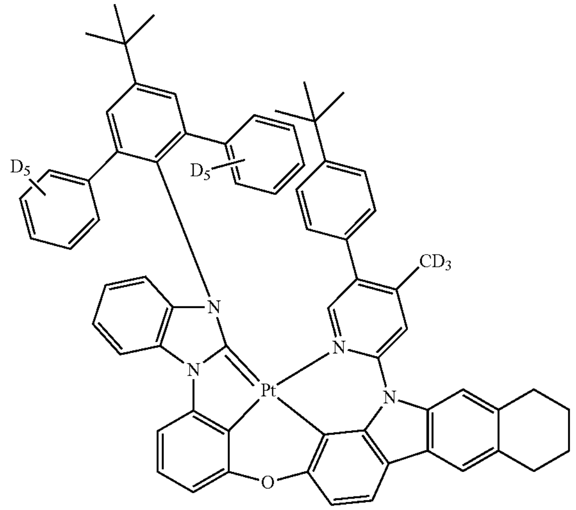
11
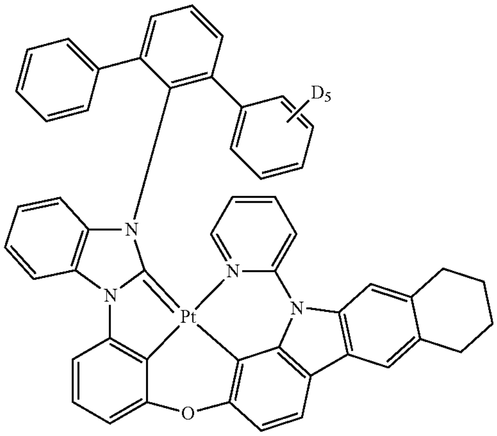
12
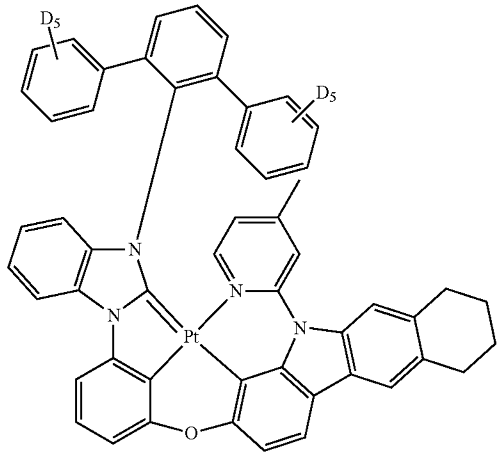
13
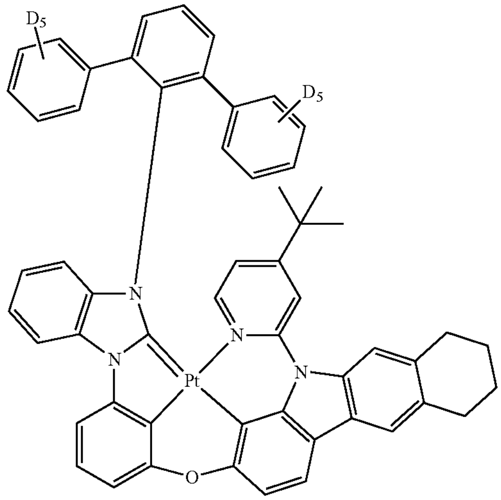
14
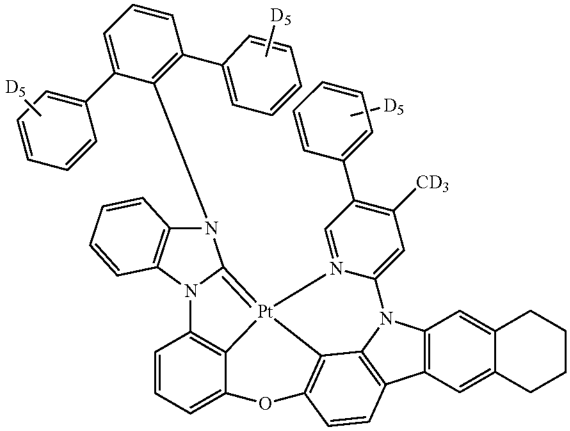

-continued
15
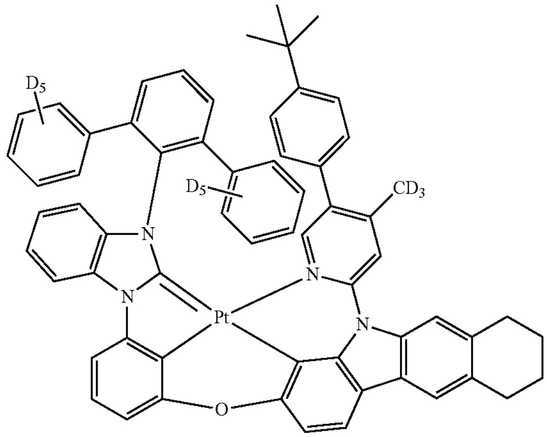
16
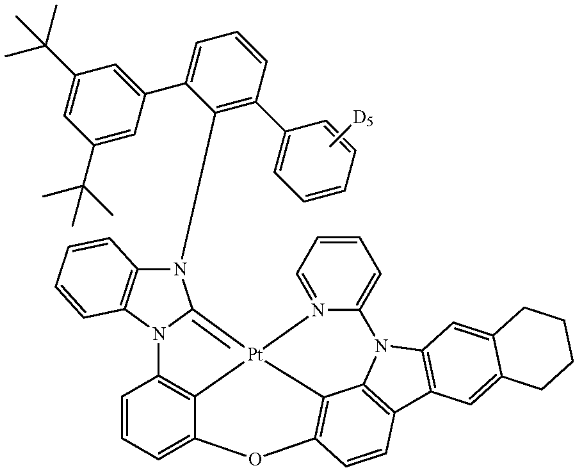
17
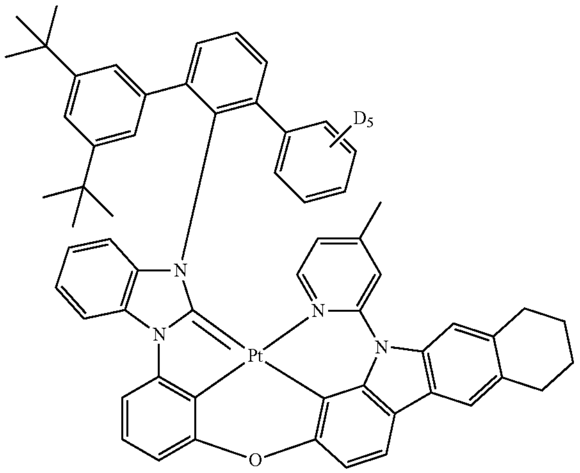
-continued
18
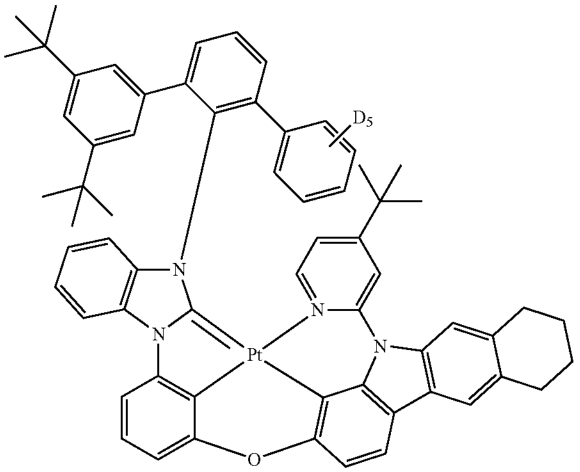
19
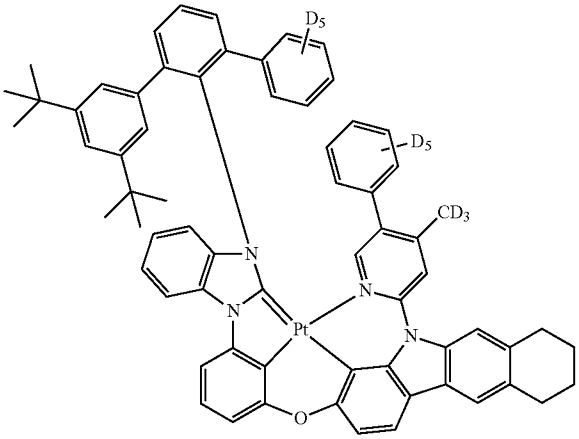
20
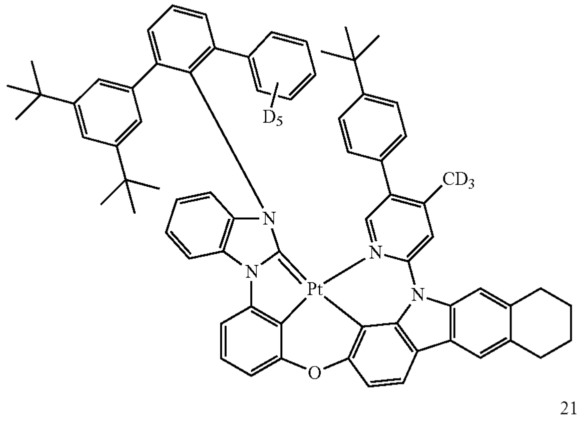
21
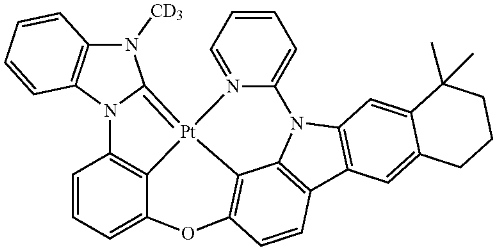

-continued
22
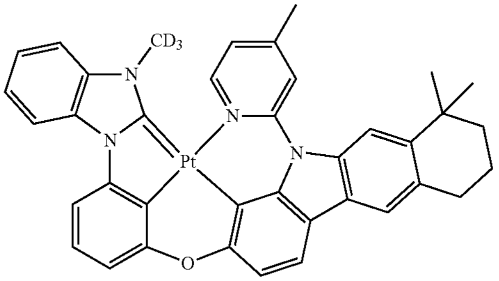
23
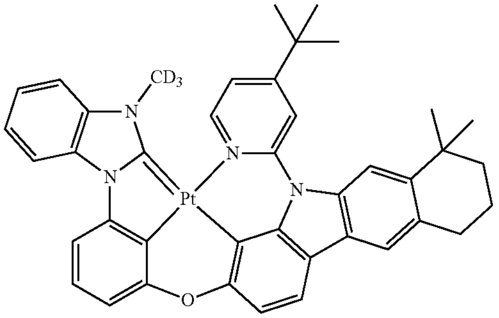
24
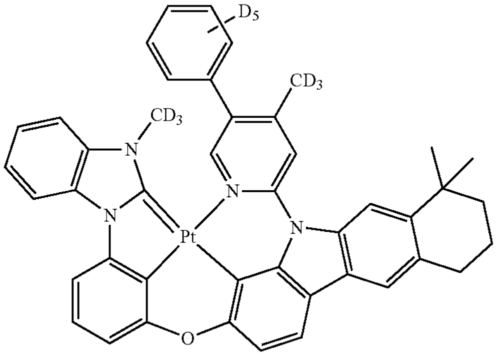
25
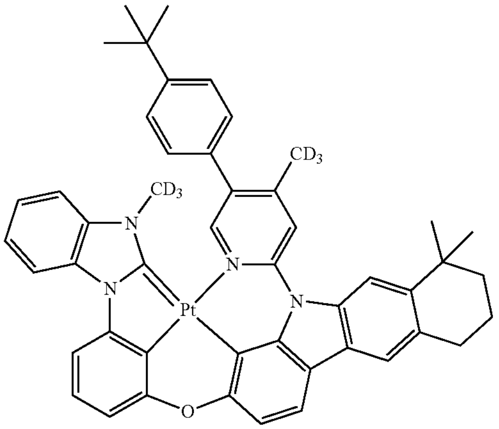
-continued
26
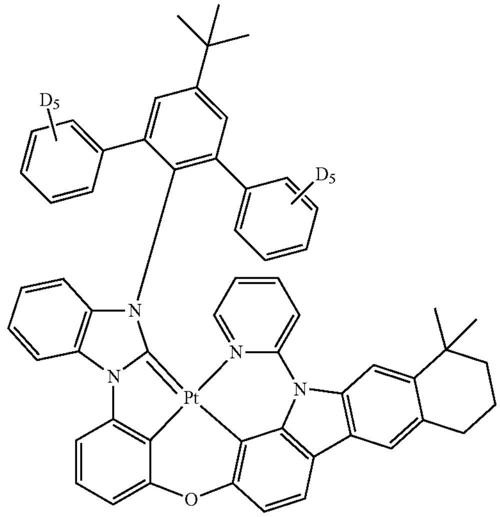
27
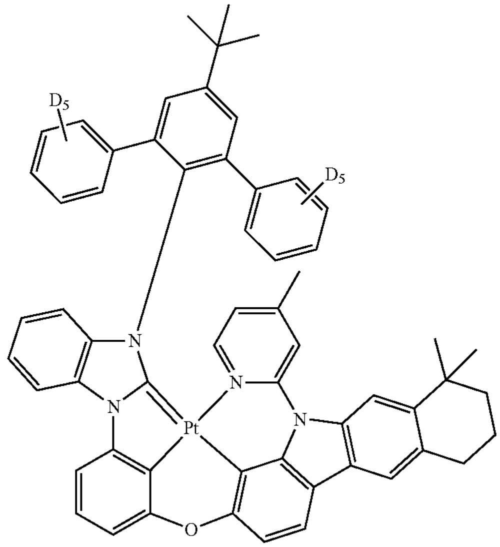
28
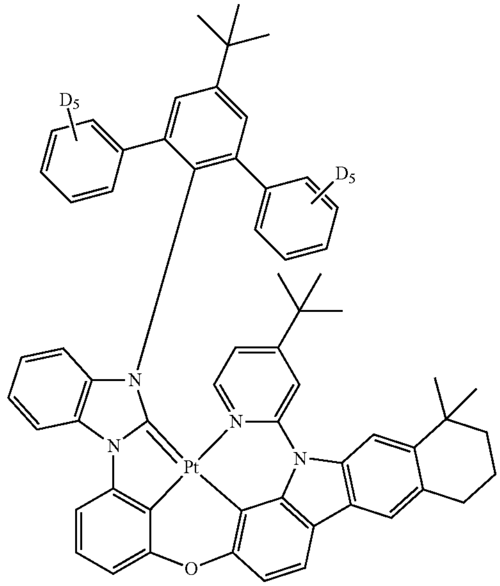

-continued
29
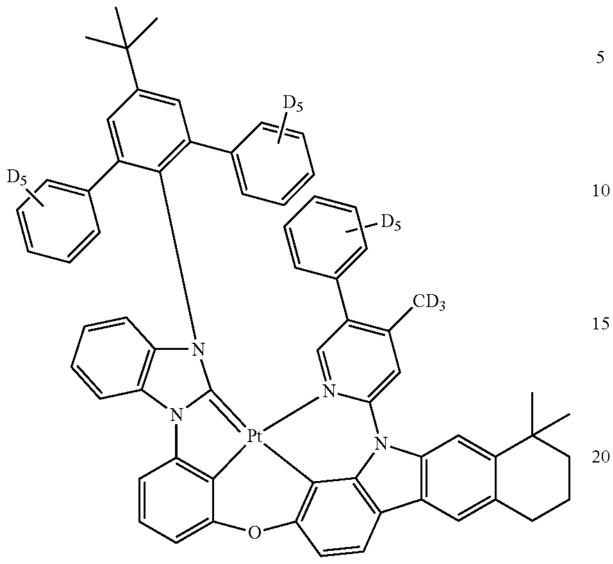
30
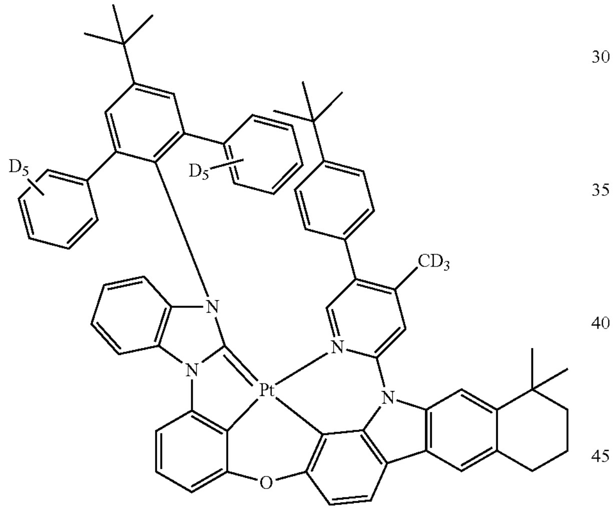
31
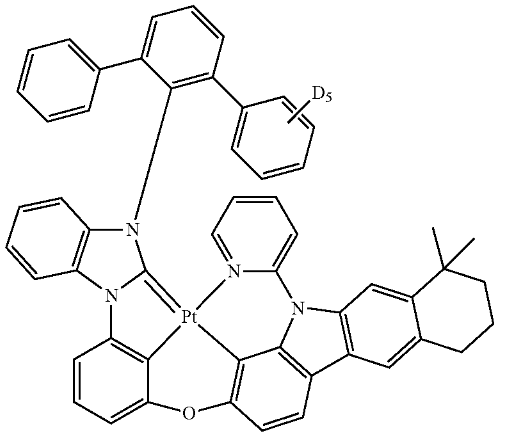
-continued
32
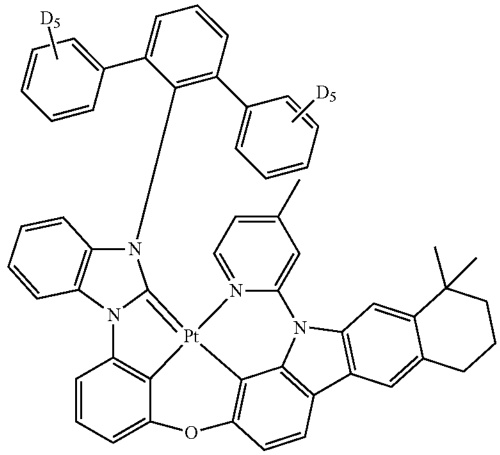
33
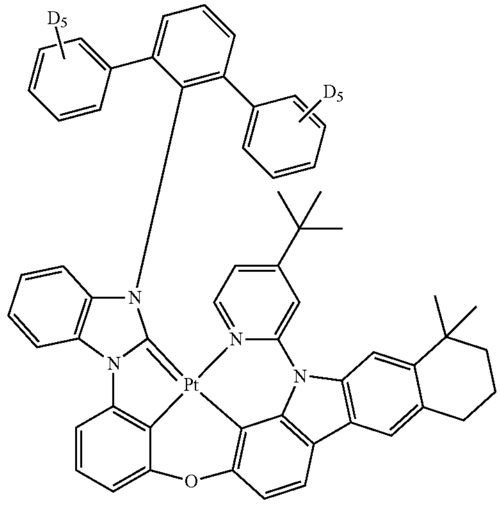
34
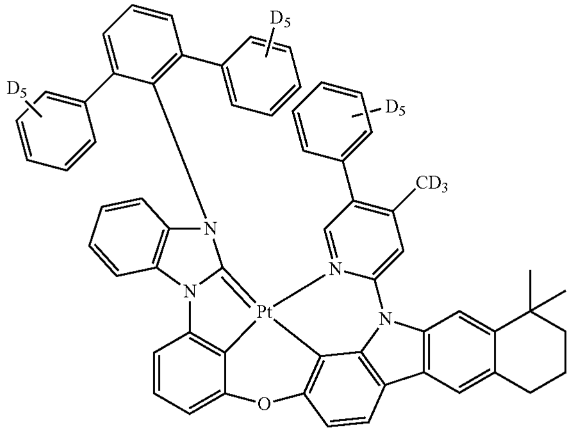

-continued
35
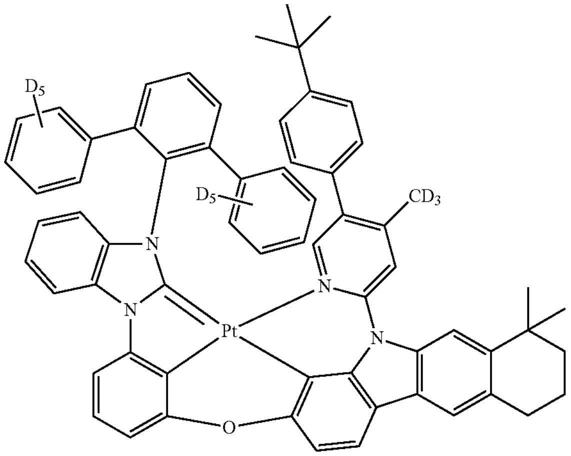
36
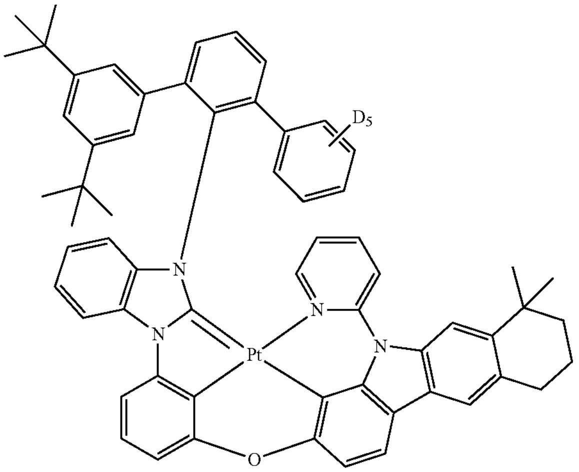
37
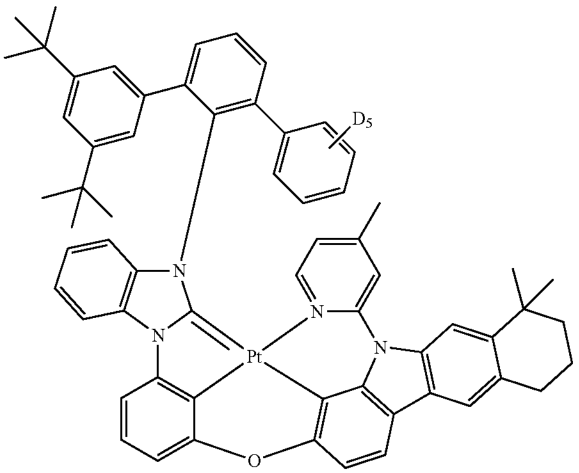
-continued
38
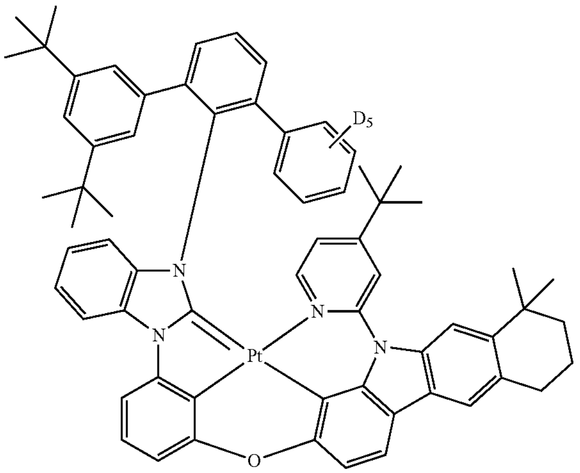
39
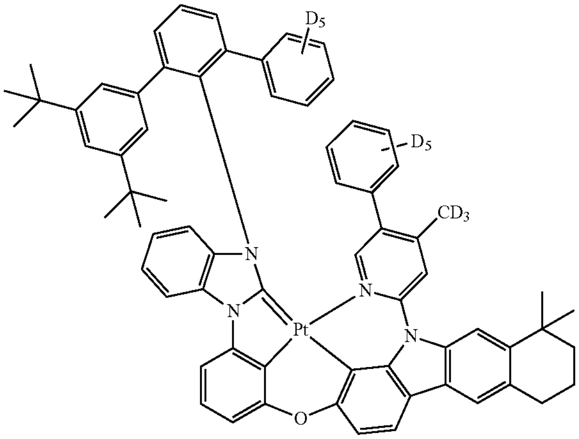
40
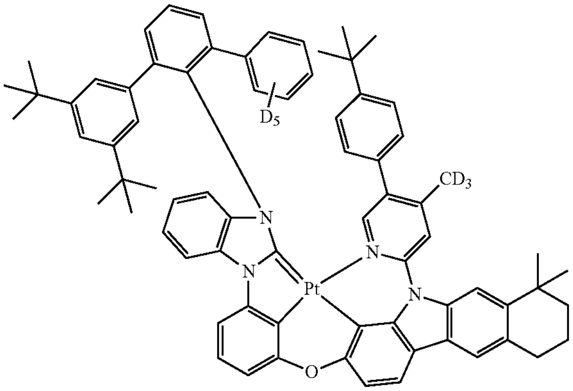
41
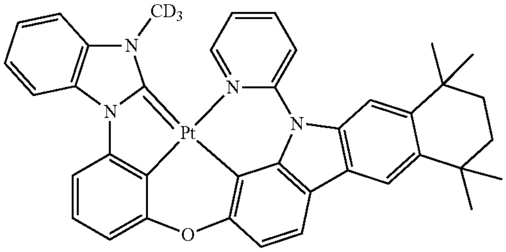

-continued
42
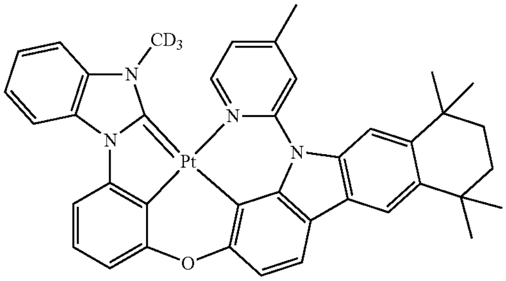
43
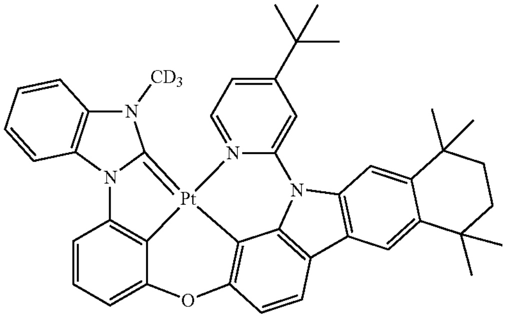
44
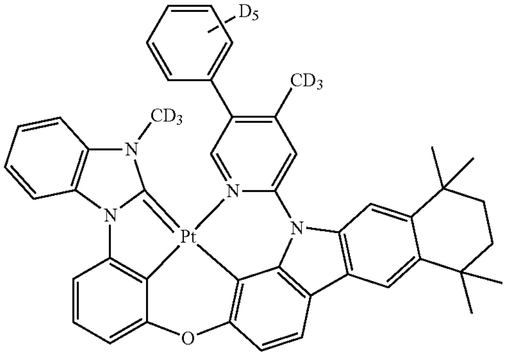
45
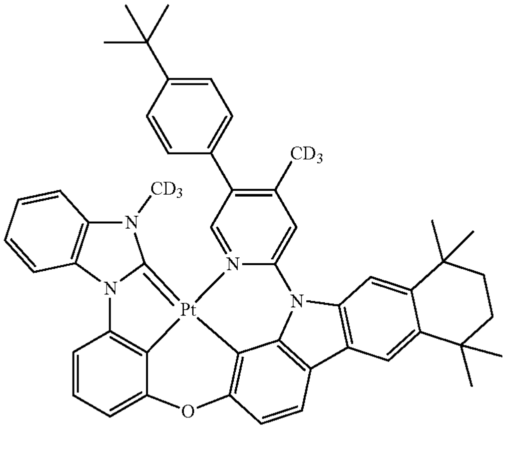
-continued
46
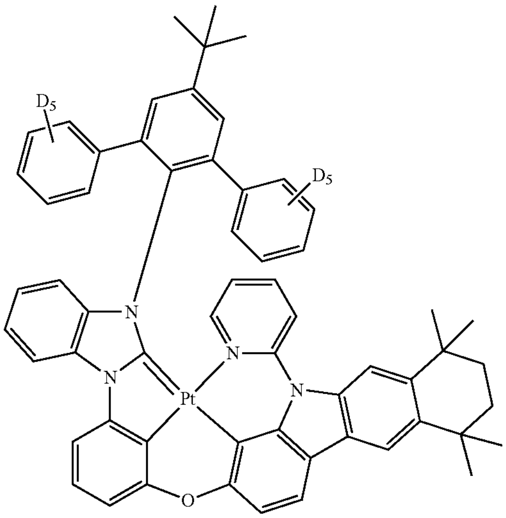
47
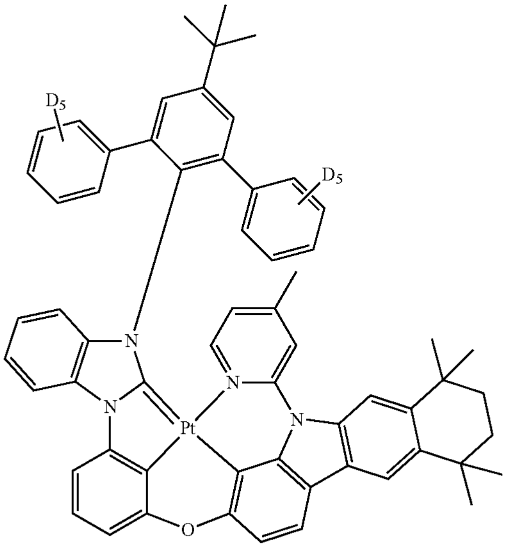
48
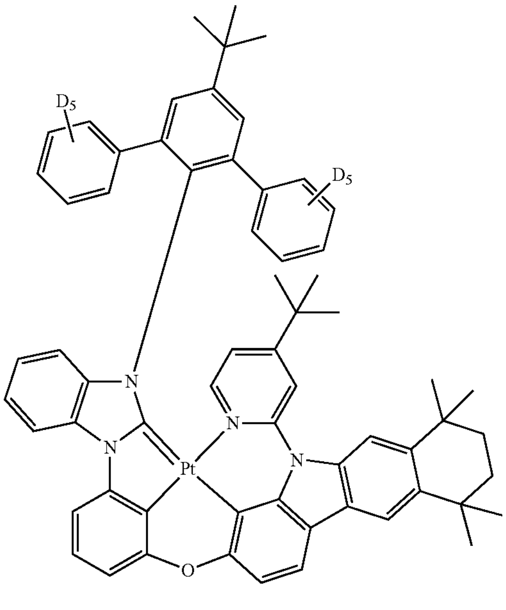

-continued
49
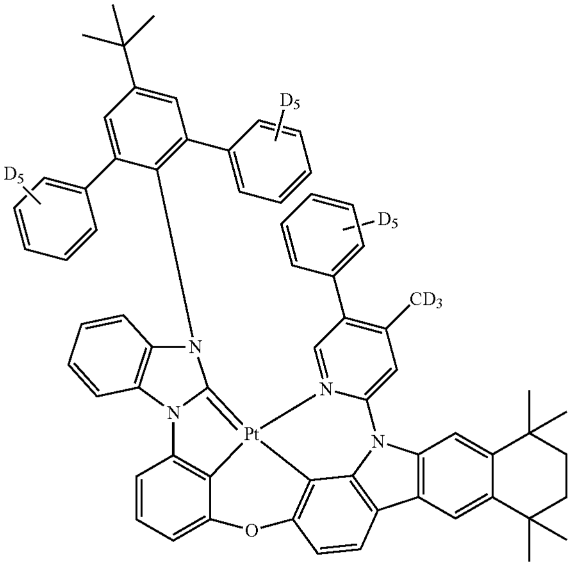
50
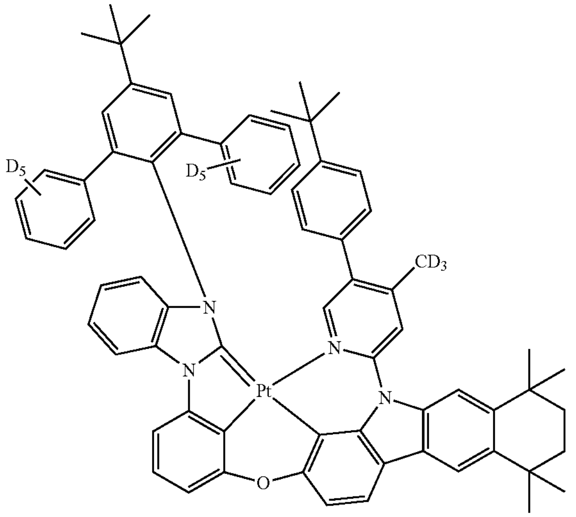
51
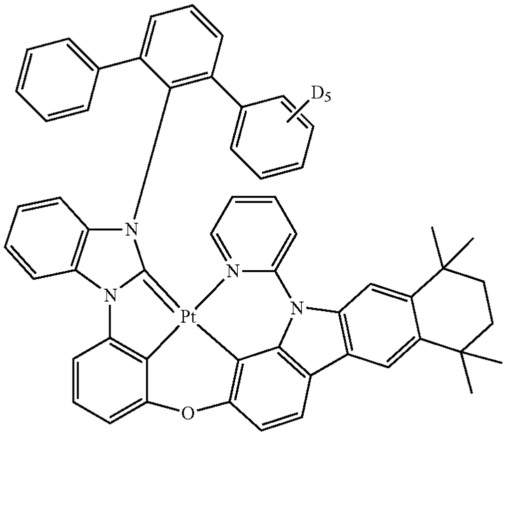
-continued
52
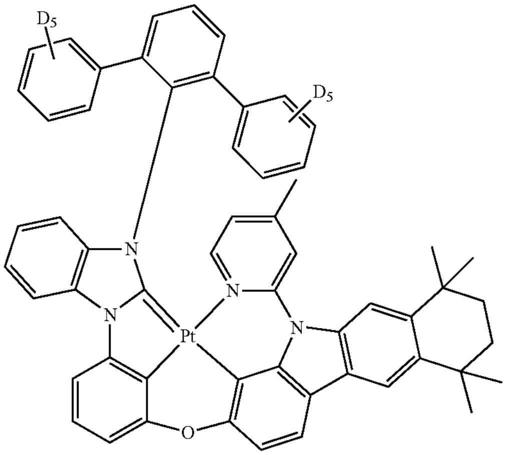
53
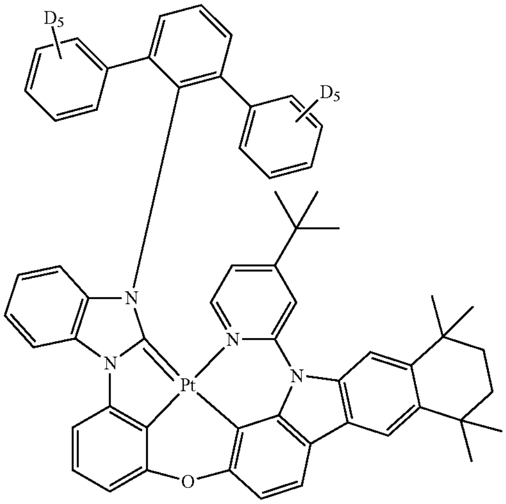
54
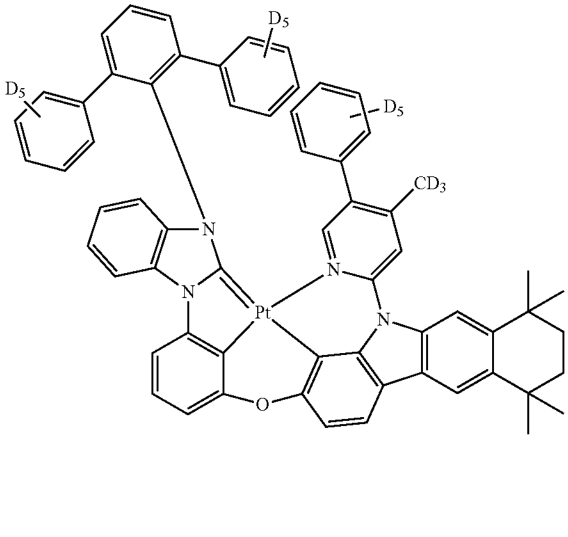

-continued
55
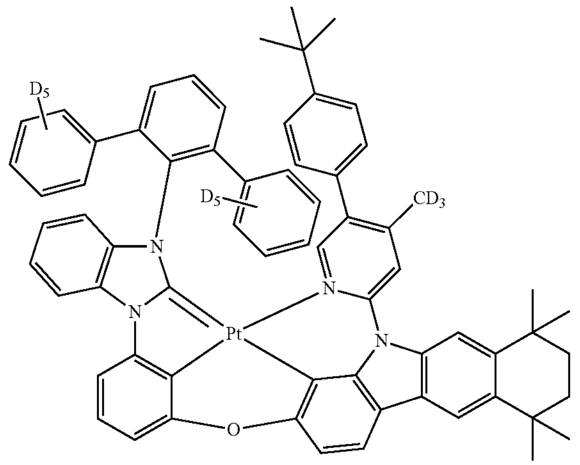
56
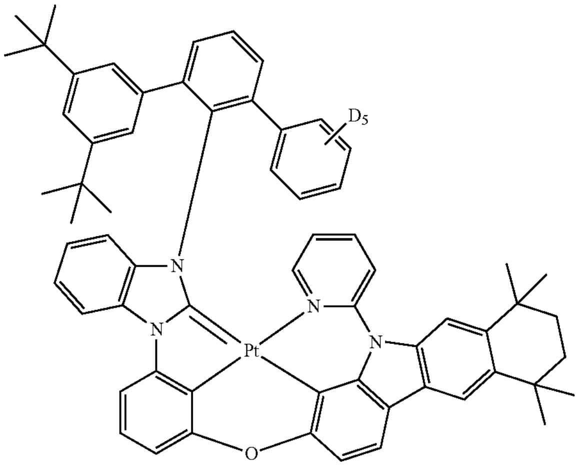
57
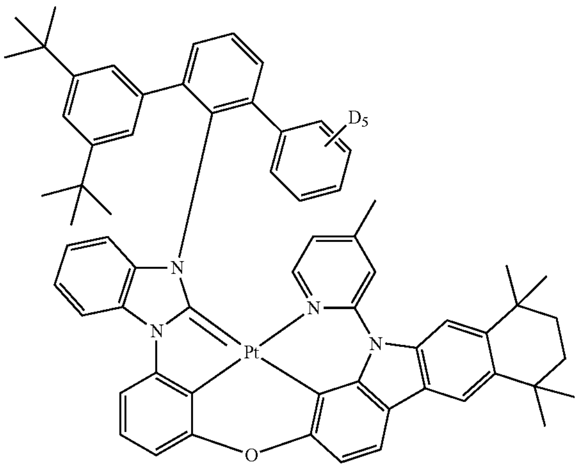
-continued
58
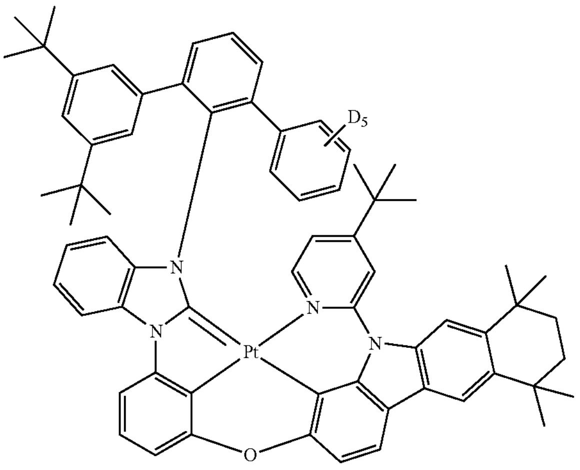
59
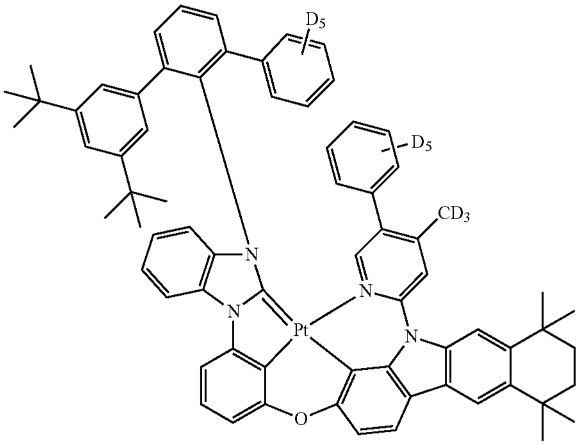
60
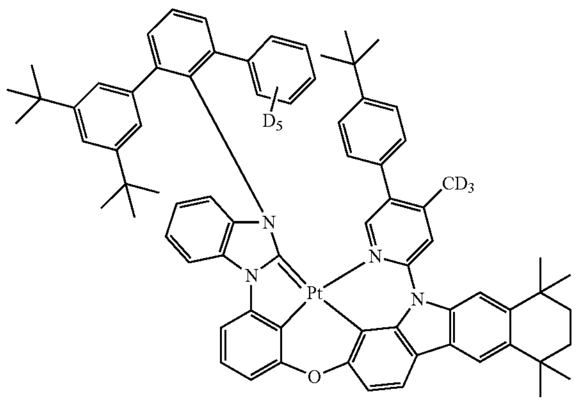
61
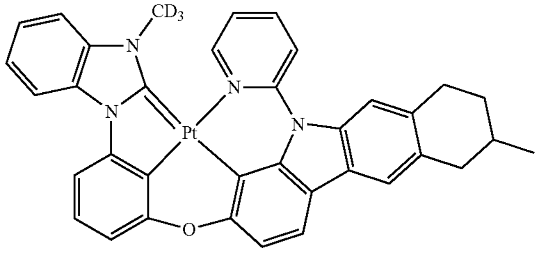

-continued
62
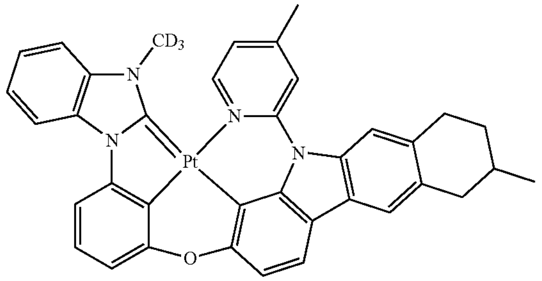
63
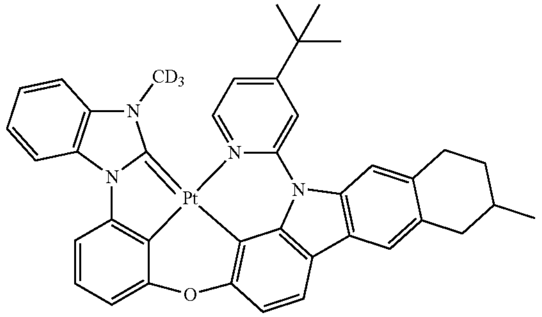
64
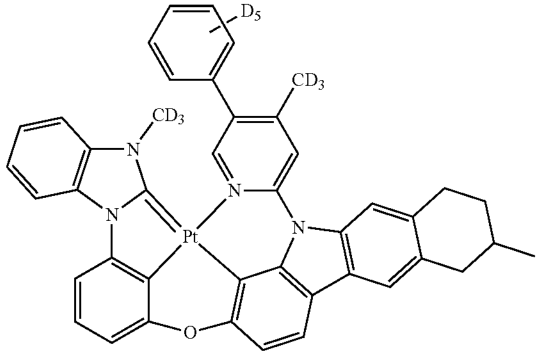
65
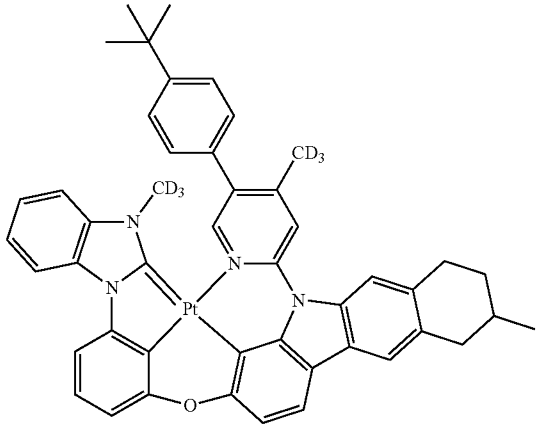
-continued
66
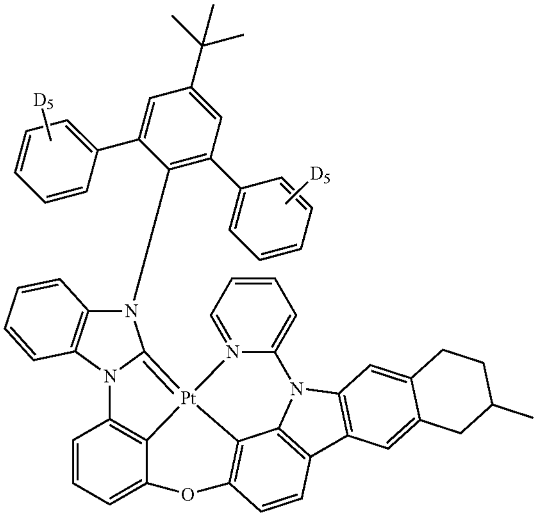
67
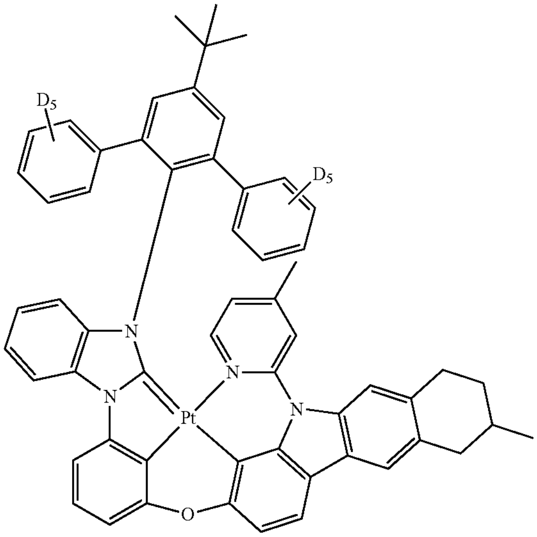
68
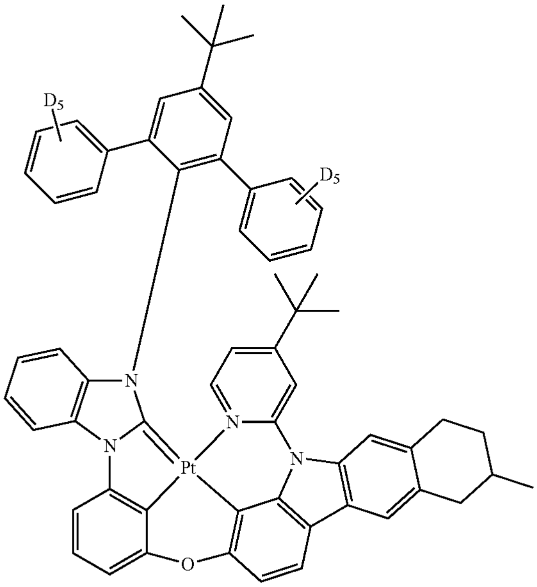

-continued
69
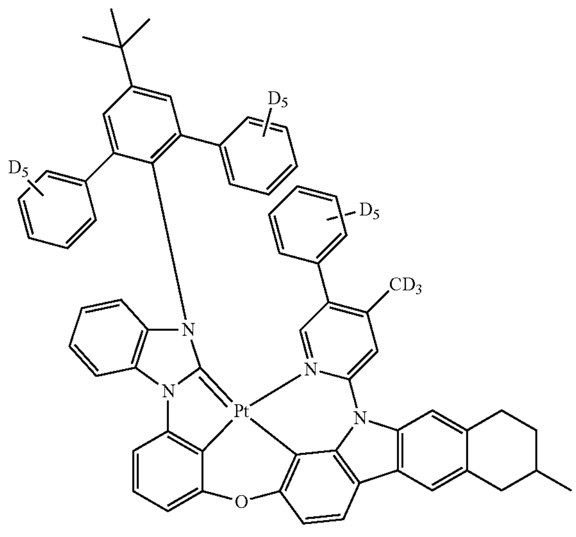
70
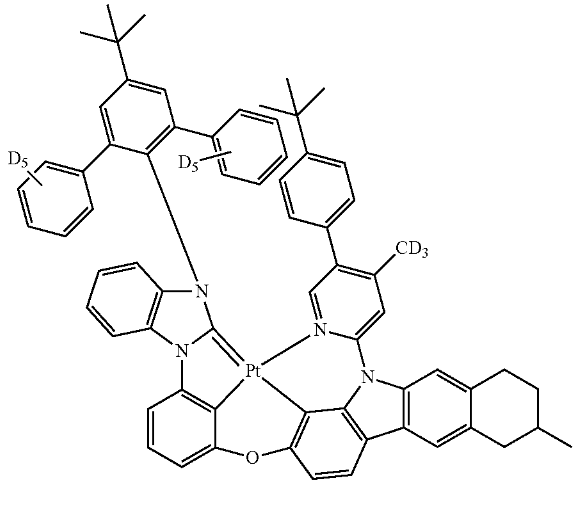
71
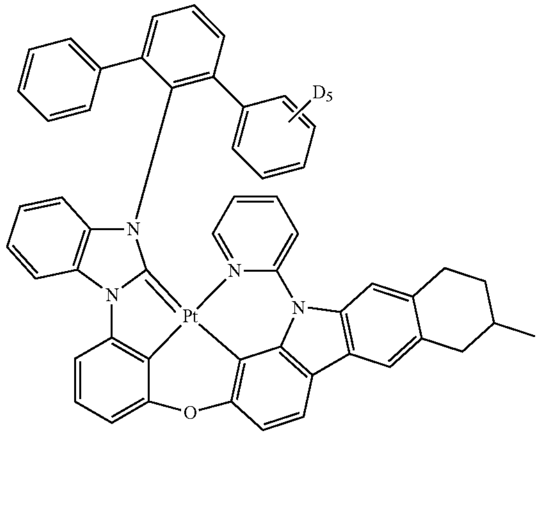
-continued
72
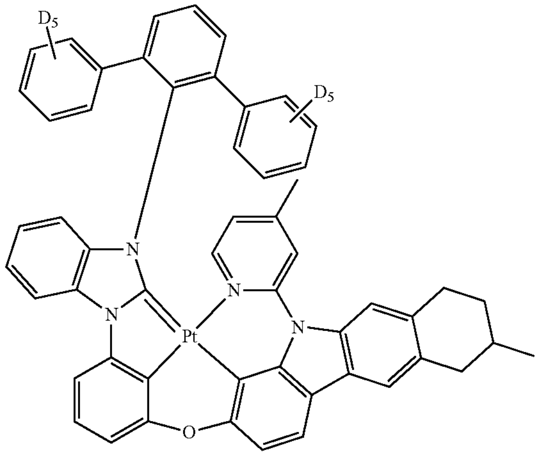
73
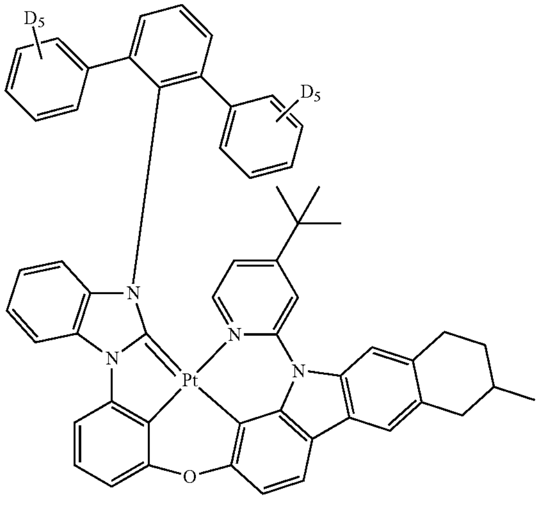
74
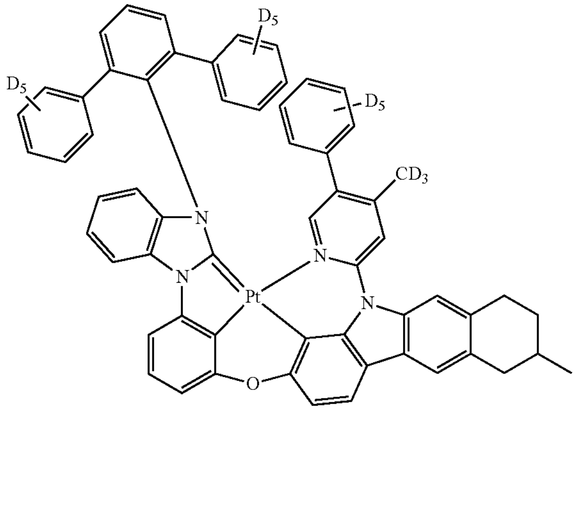

-continued
75
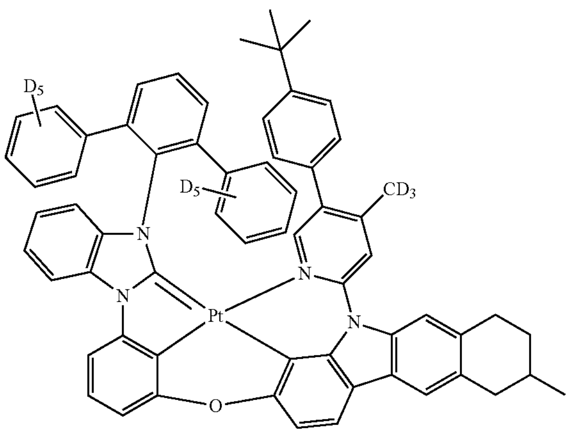
76
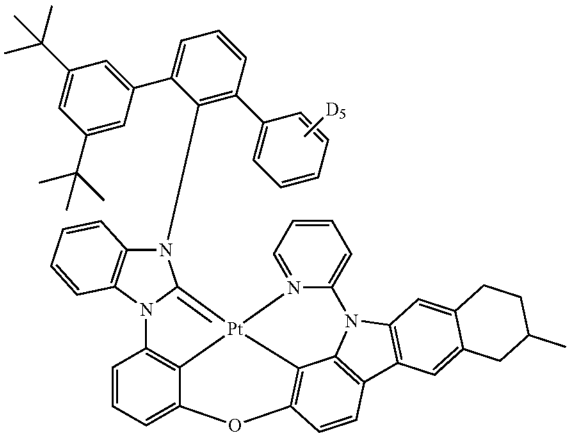
77
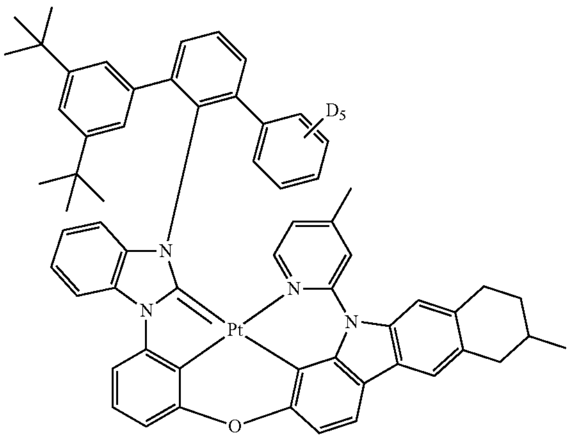
-continued
78
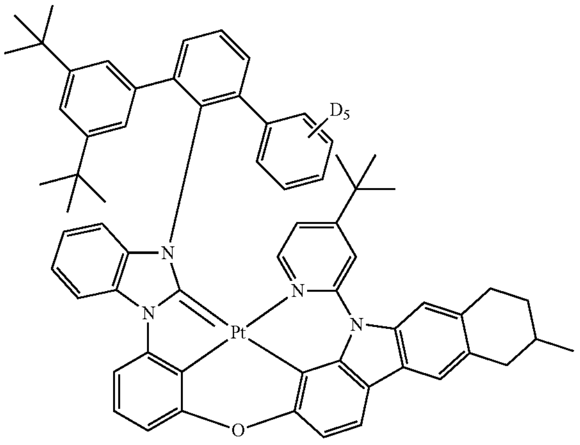
79
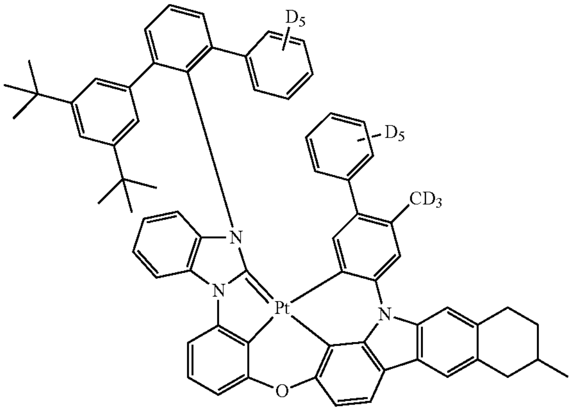
80
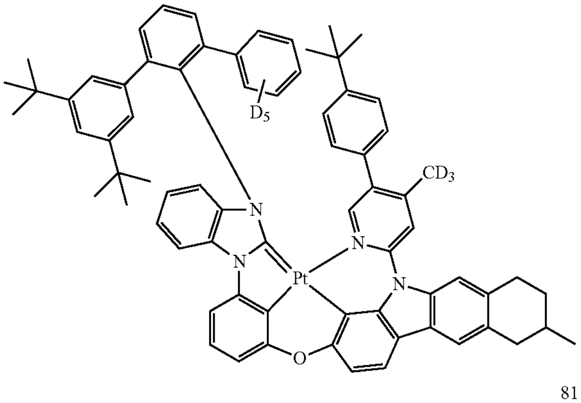
81
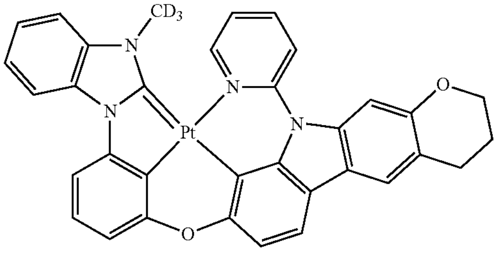

-continued
82
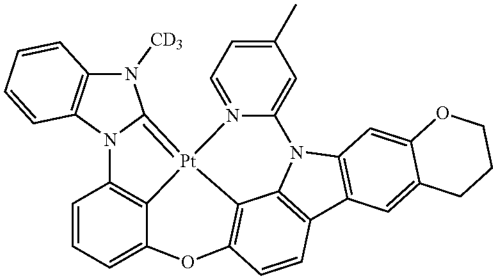
83
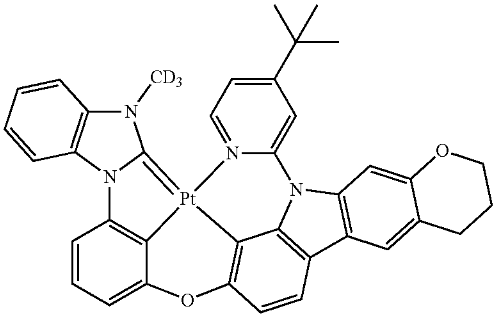
84
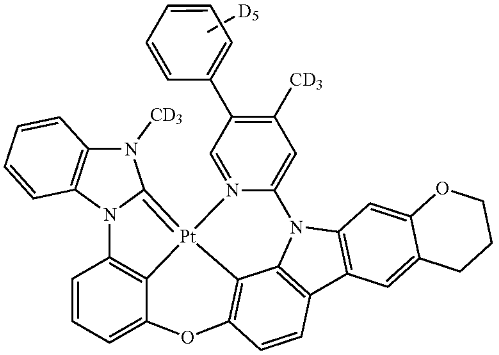
85
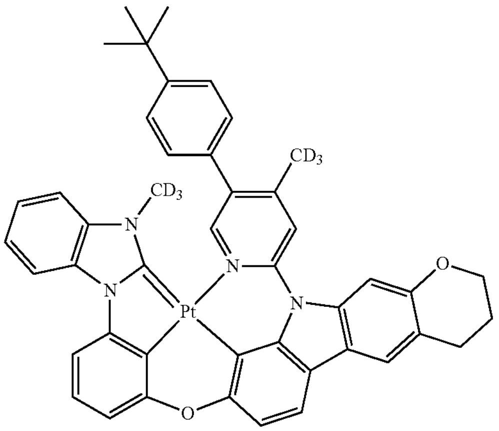
-continued
86
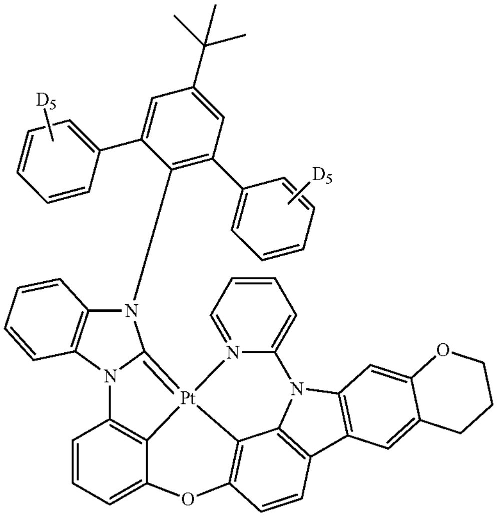
87
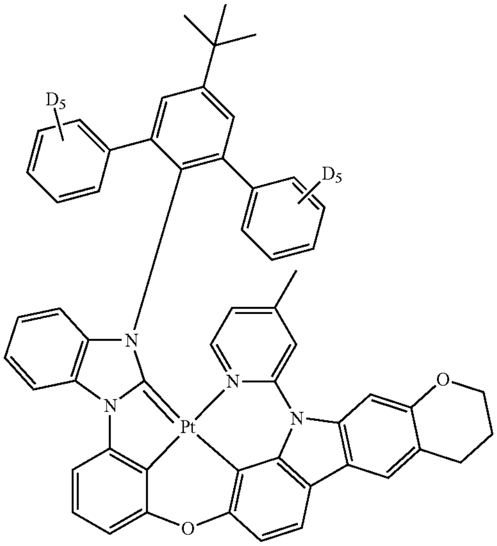
88
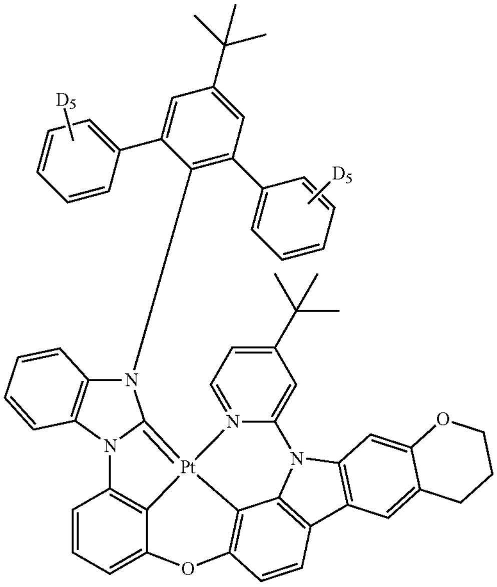

-continued
89
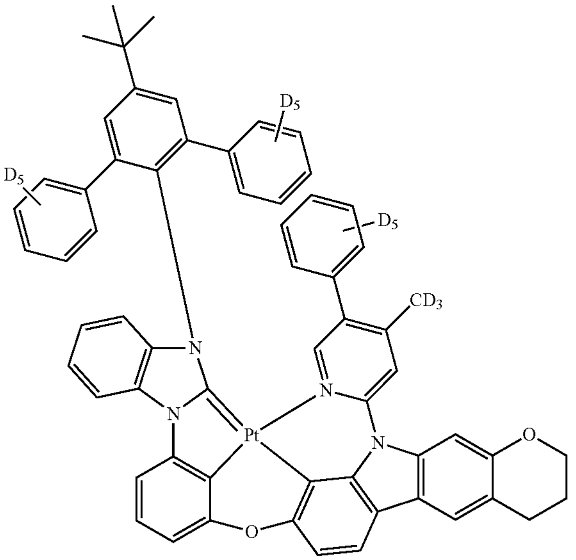
90
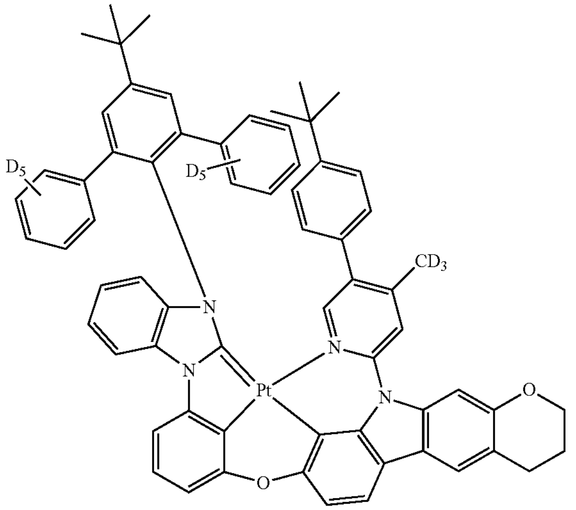
91
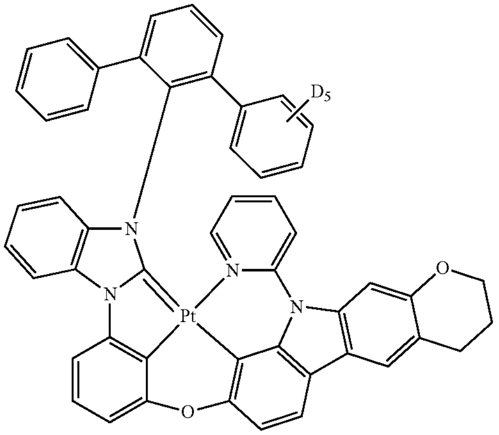
-continued
92
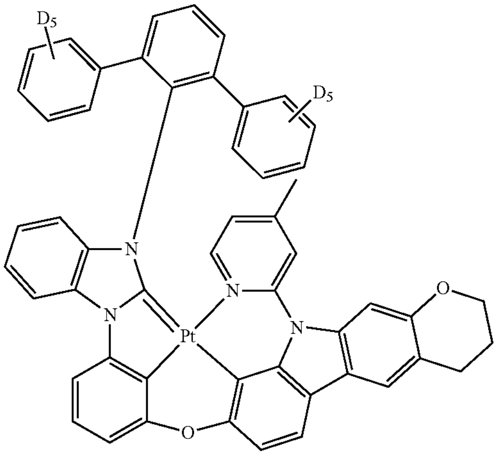
93
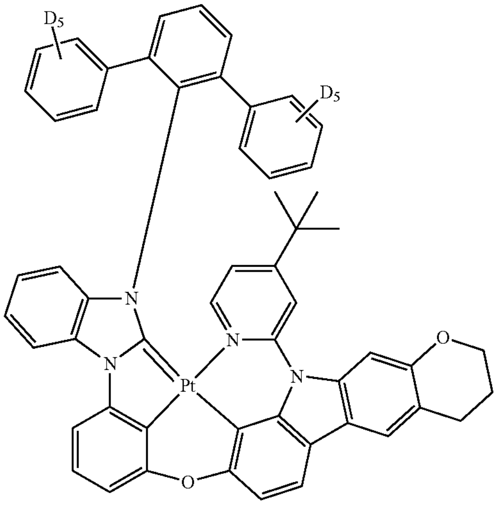
94
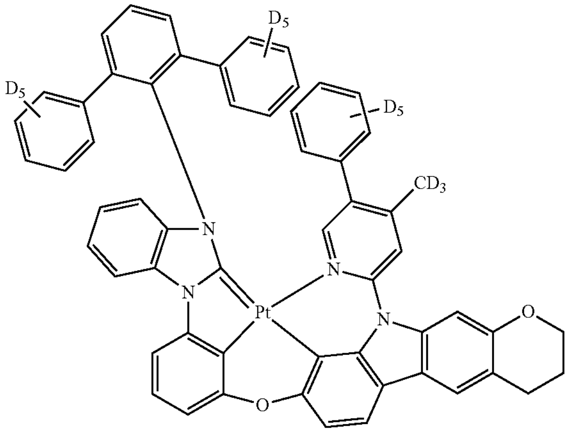

95
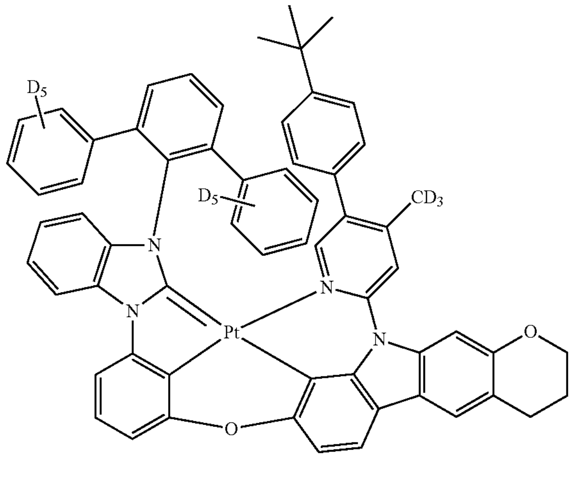
96
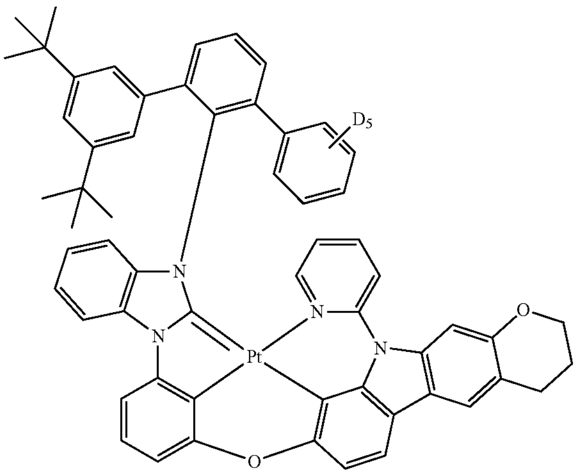
97
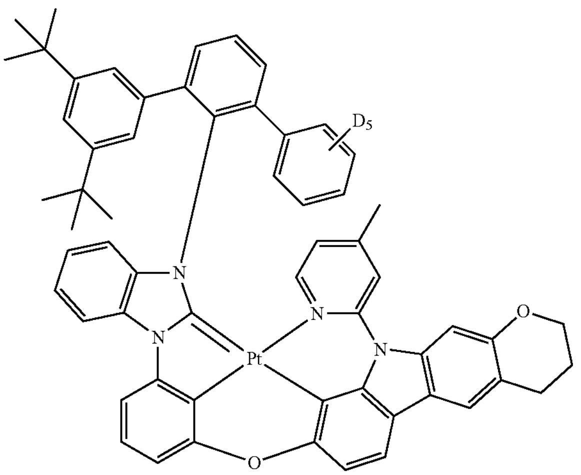
98
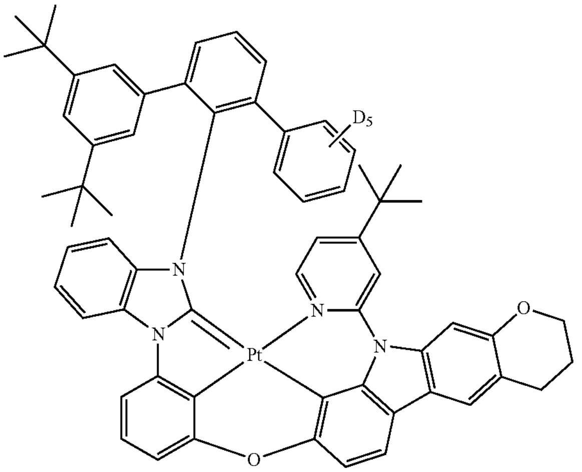
99
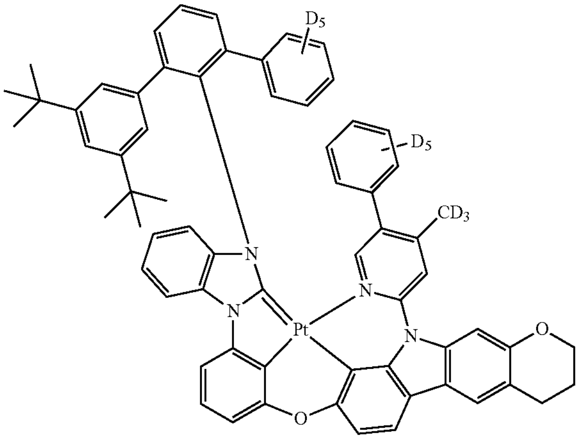
100
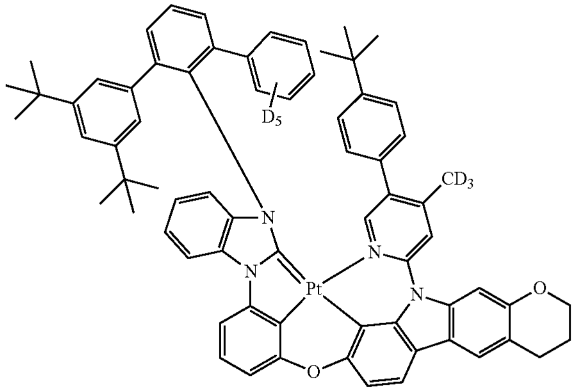
101
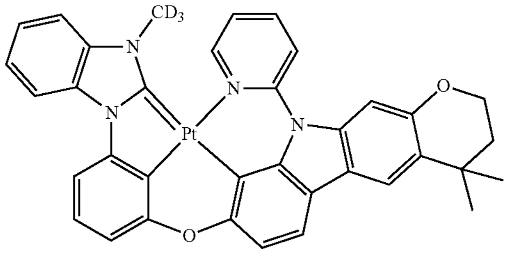

-continued
102
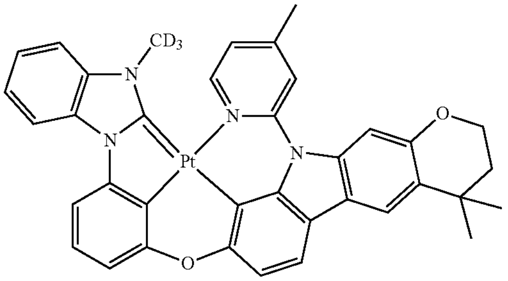
103
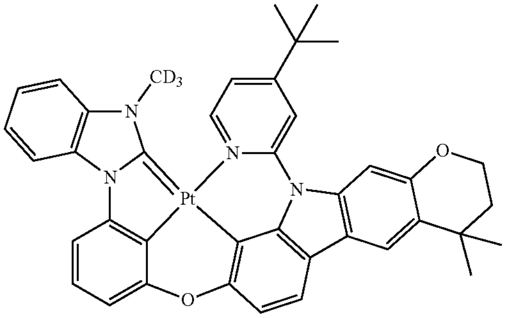
104
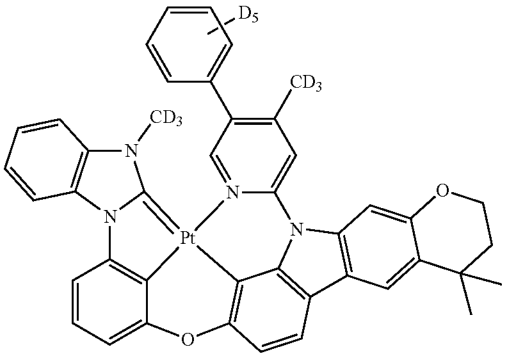
105
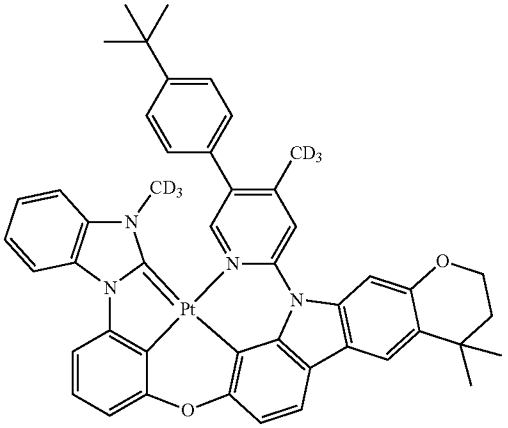
-continued
106
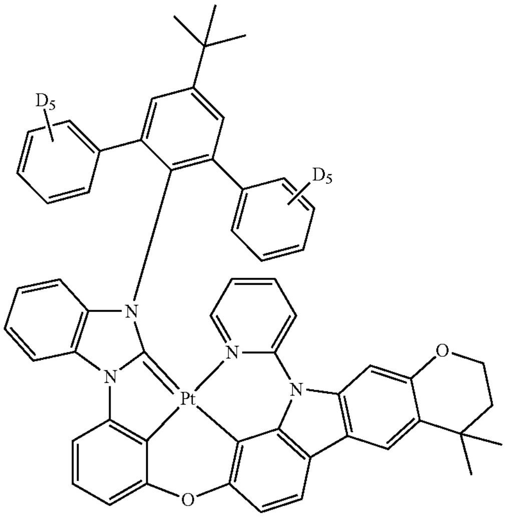
107
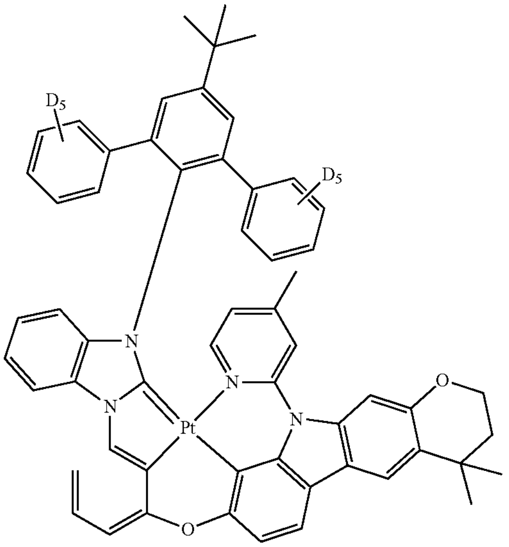
108
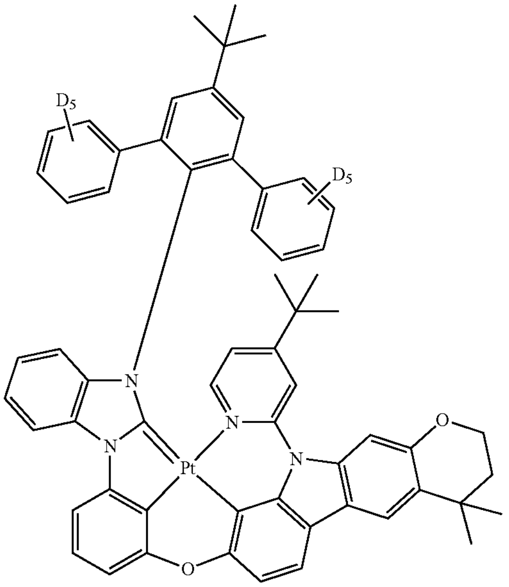

-continued
109
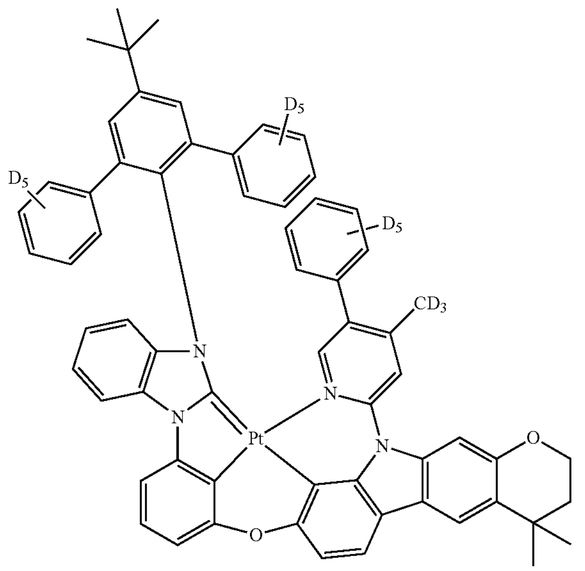
110
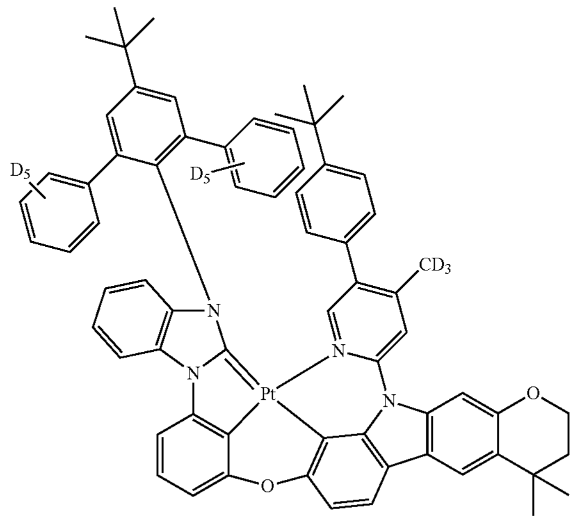
111
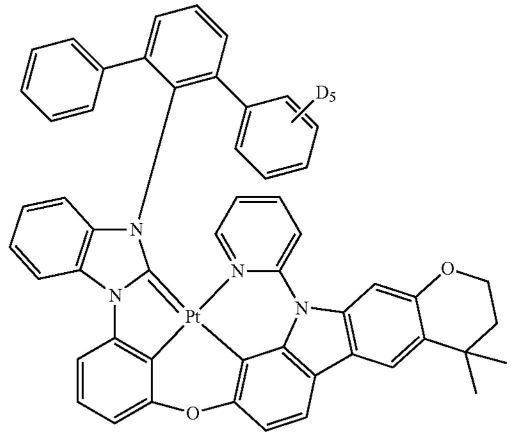
-continued
112
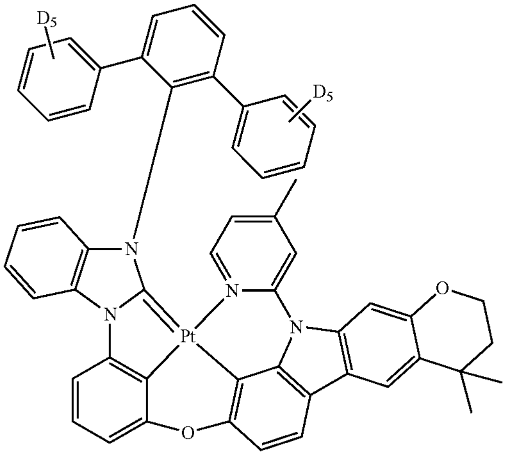
113
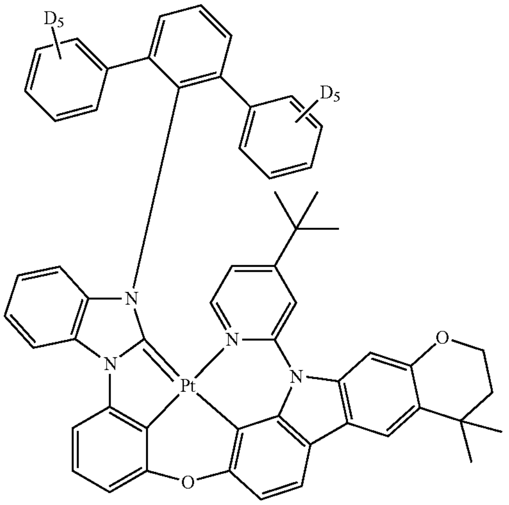
114
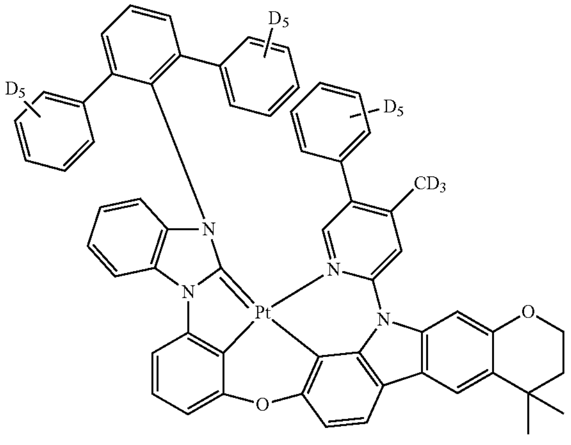

-continued
115
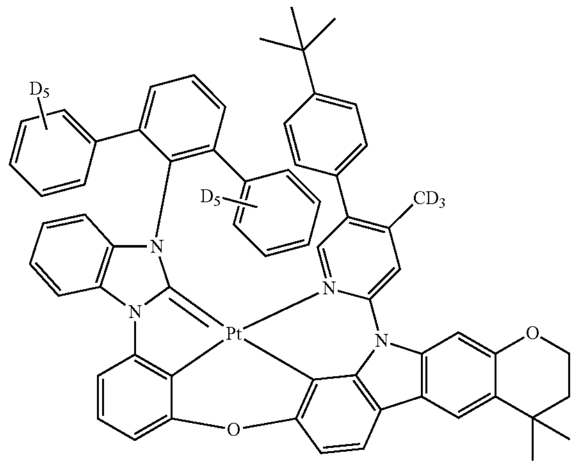
116
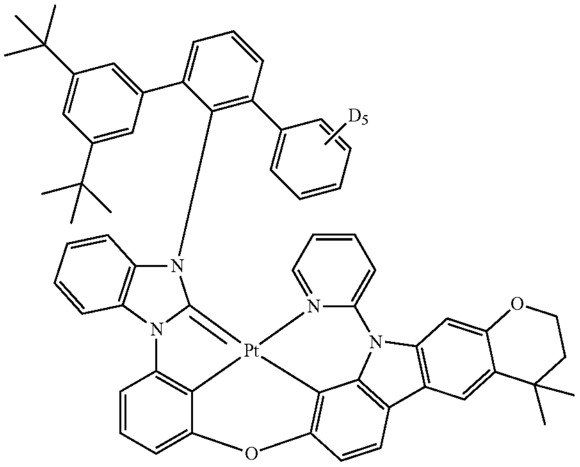
117
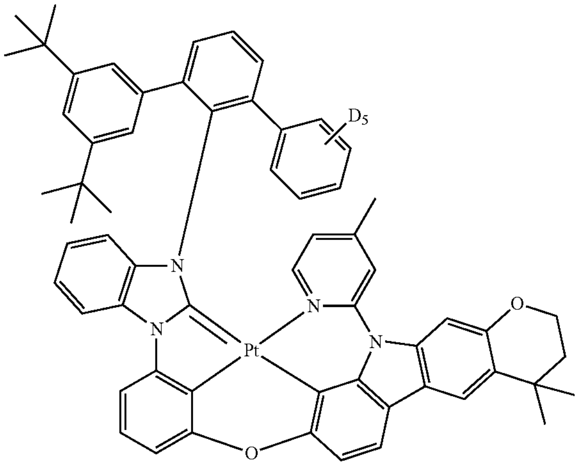
-continued
118
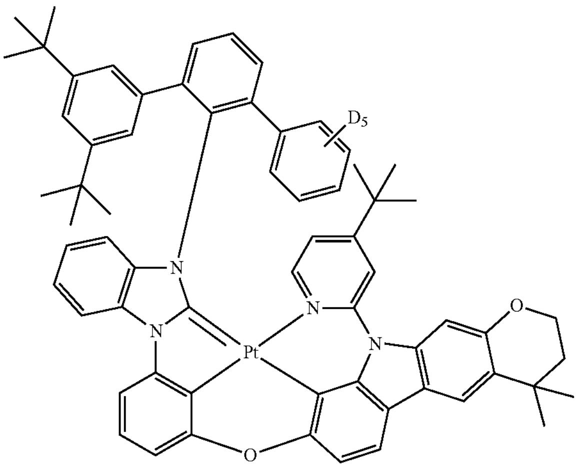
119
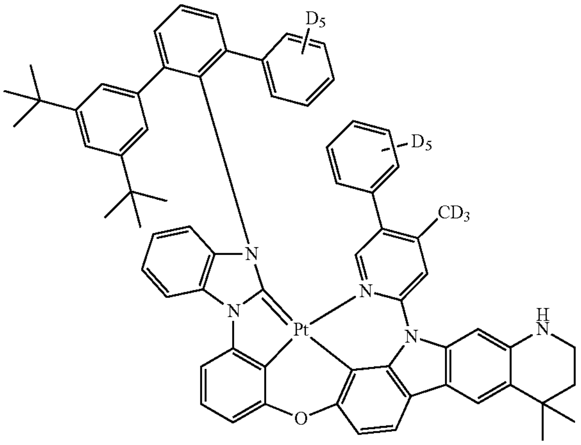
120
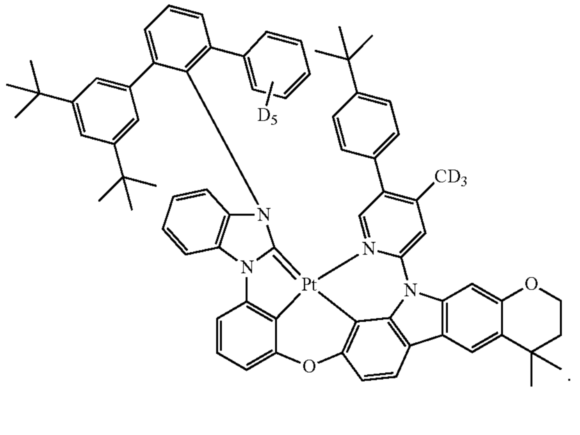
In an embodiment, the second compound may be one of Compounds ETH1 to ETH84:

-continued
ETH1
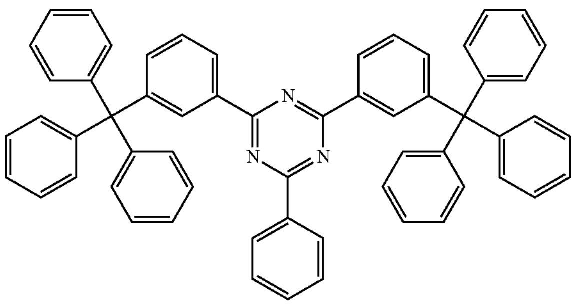
ETH2
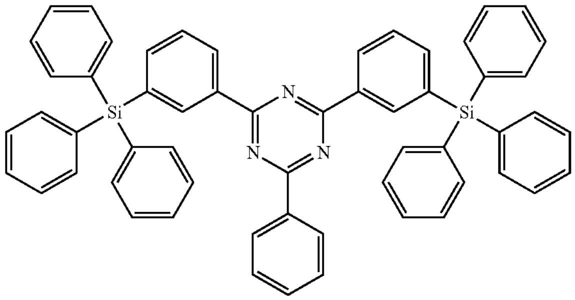
ETH3
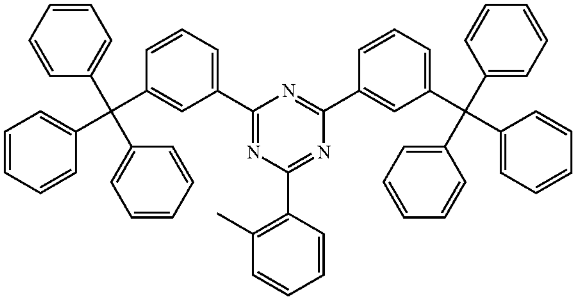
ETH4
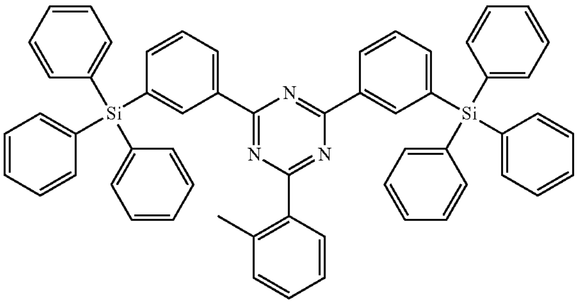
ETH5
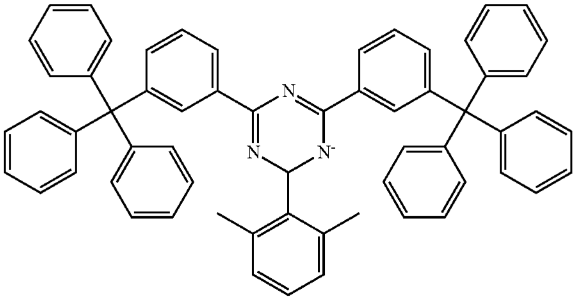
ETH6
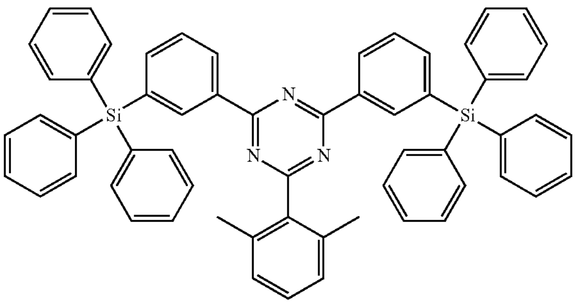
ETH7
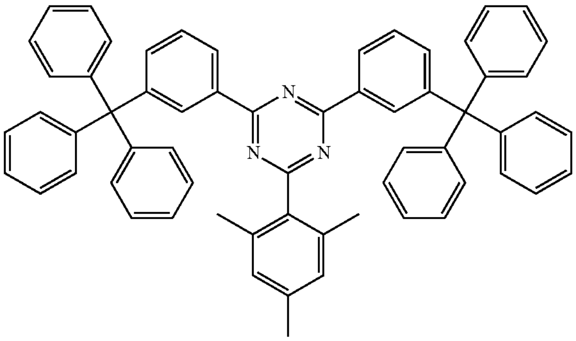
ETH8
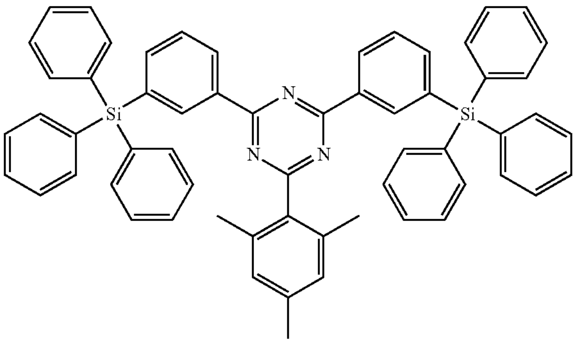
ETH9
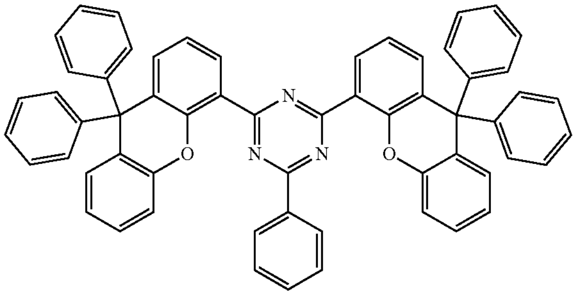

-continued
ETH10
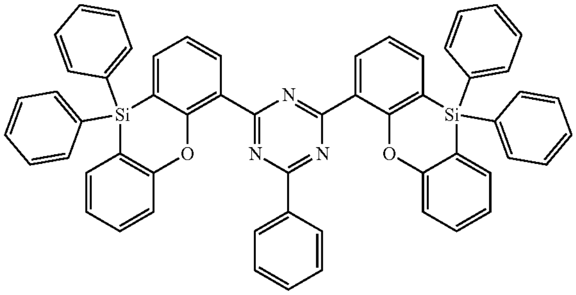
ETH11
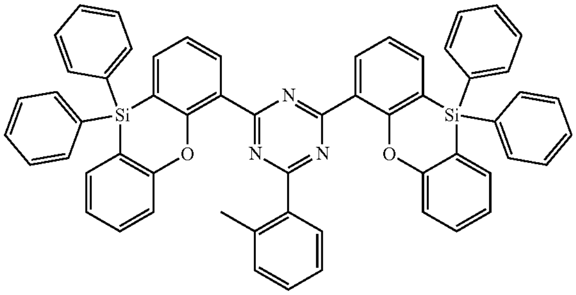
ETH12
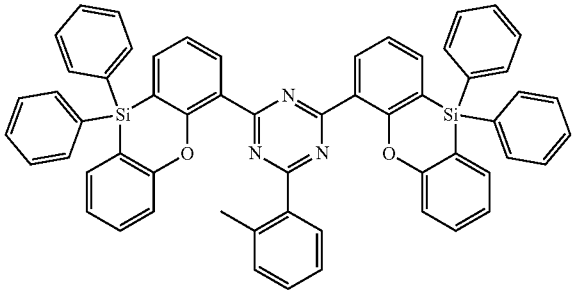
ETH13
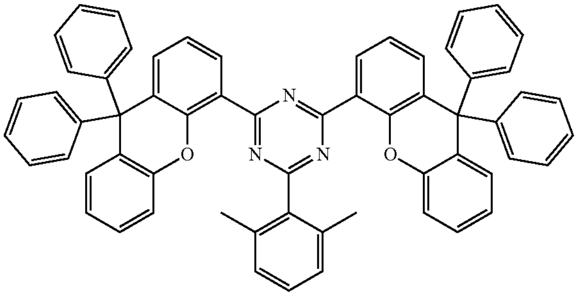
ETH14
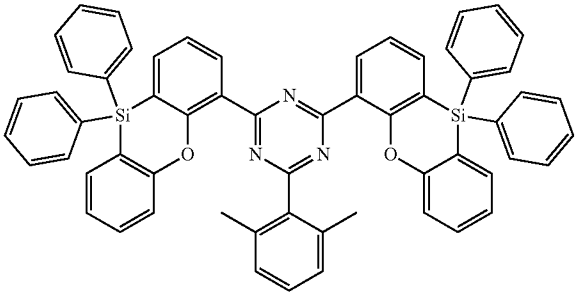
-continued
ETH15
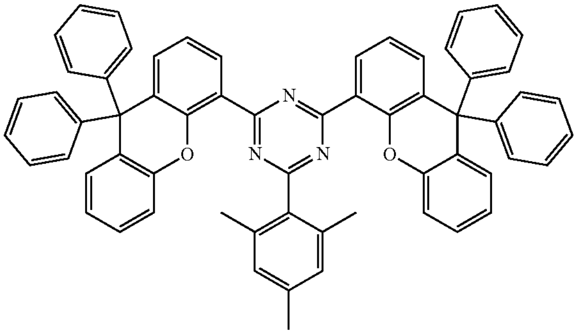
ETH16
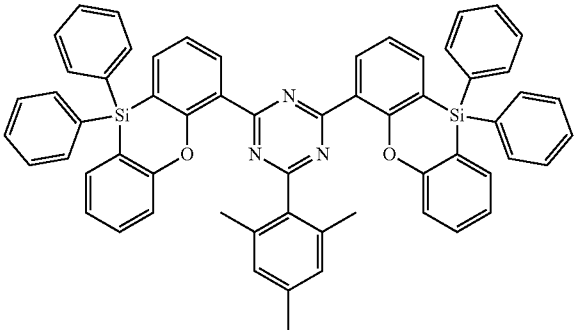
ETH17
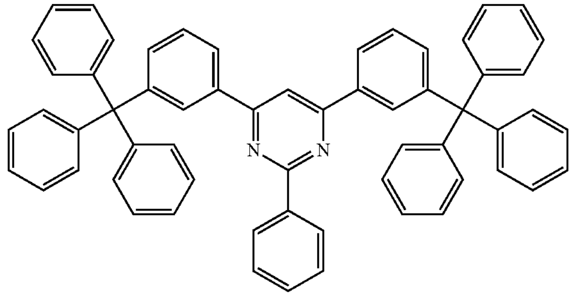
ETH18
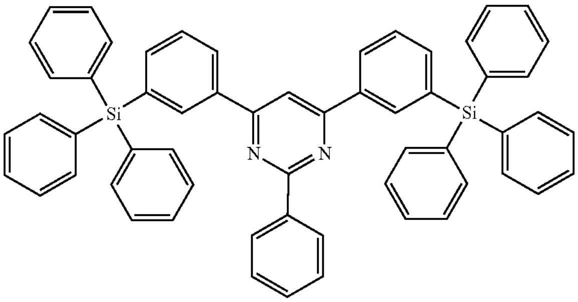

-continued
ETH19
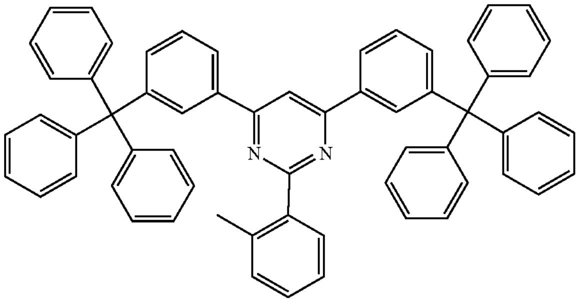
ETH20
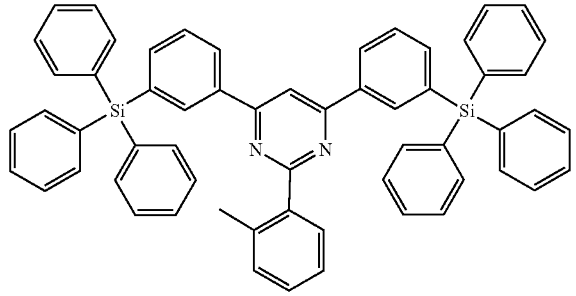
ETH21
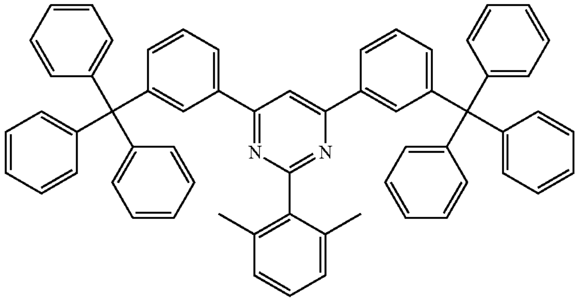
ETH22
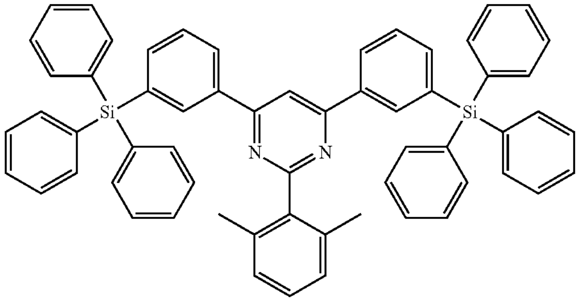
-continued
ETH23
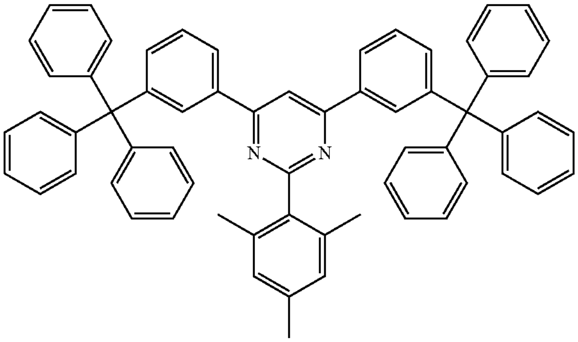
ETH24
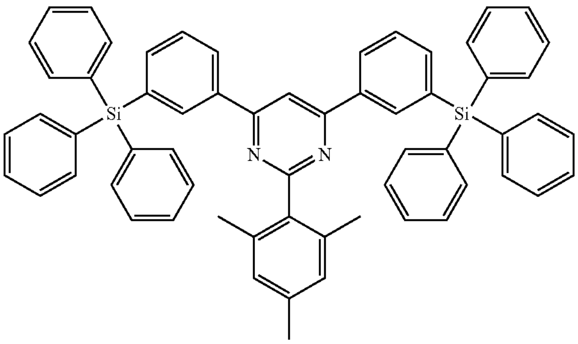
ETH25
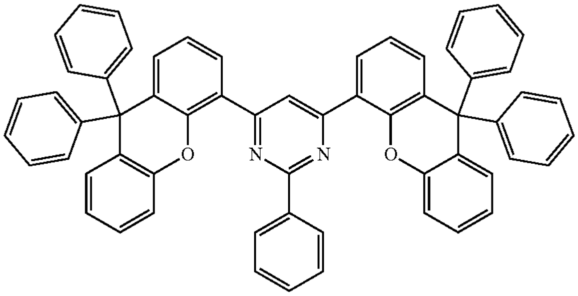
ETH26
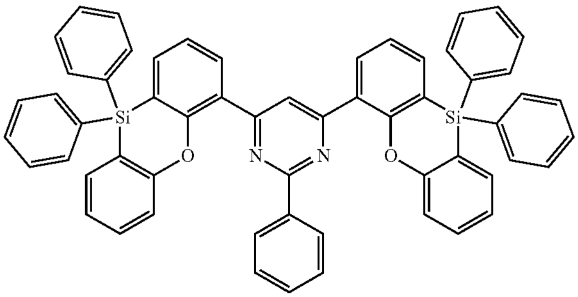

-continued
ETH27
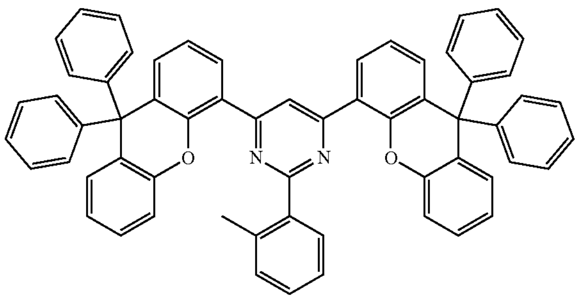
ETH28
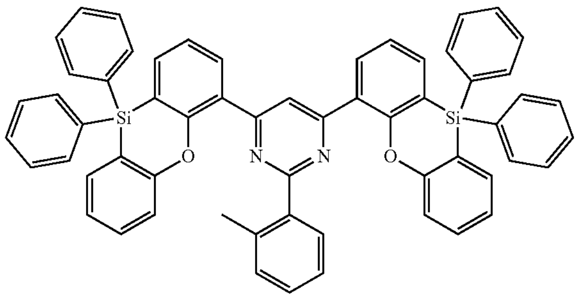
ETH29
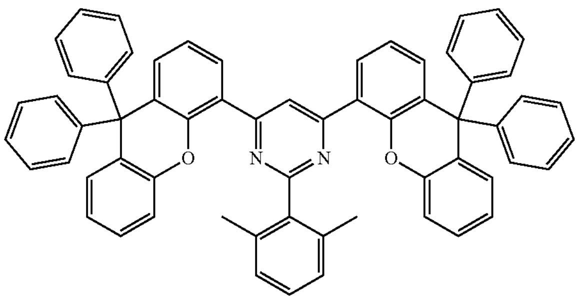
ETH30
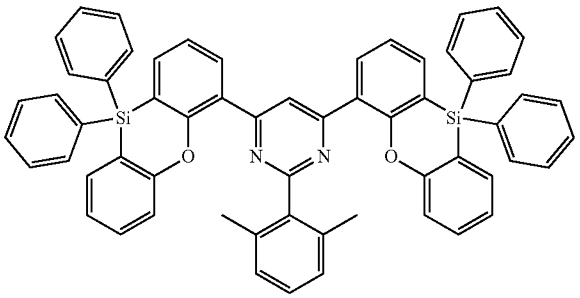
ETH31
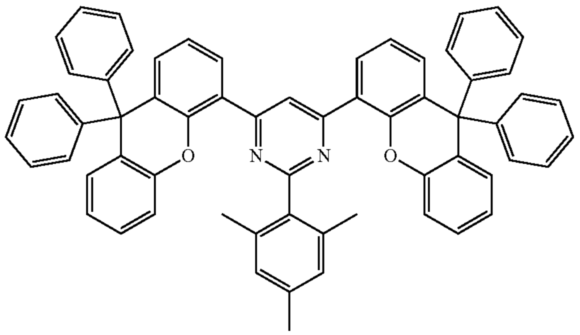
-continued
ETH32
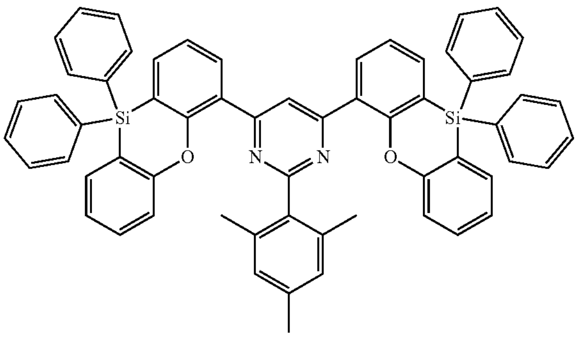
ETH33
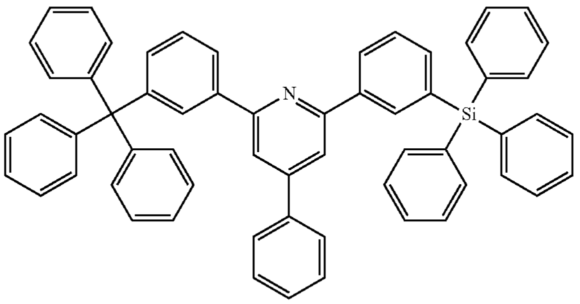
ETH34
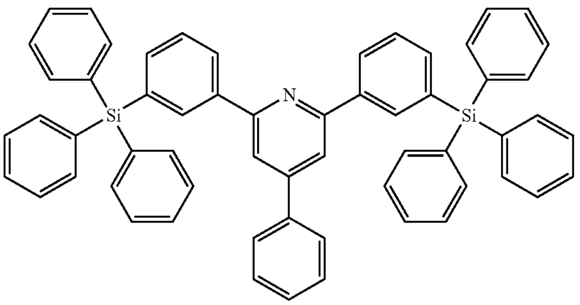
ETH35
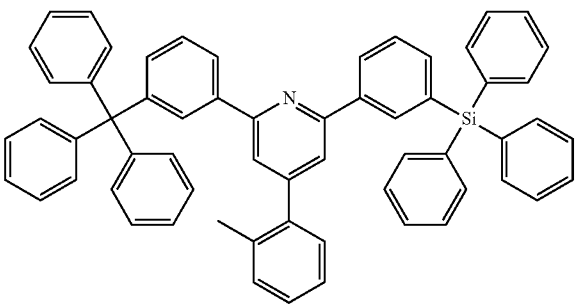

-continued
ETH36
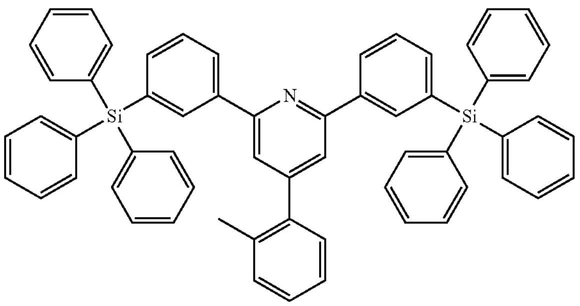
ETH37
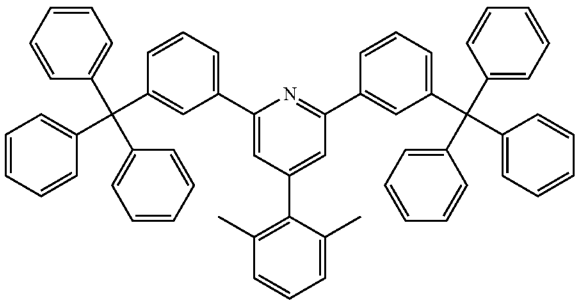
RTH38
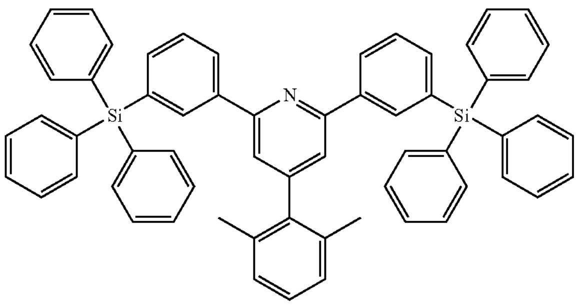
ETH39
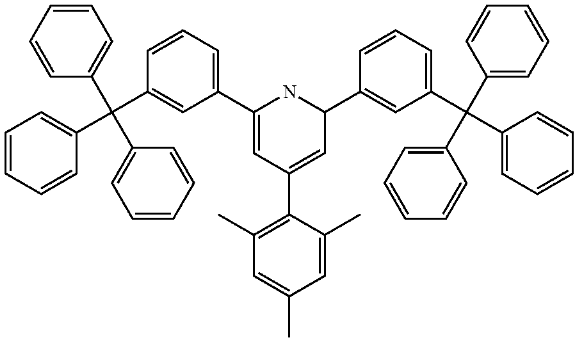
-continued
ETH40
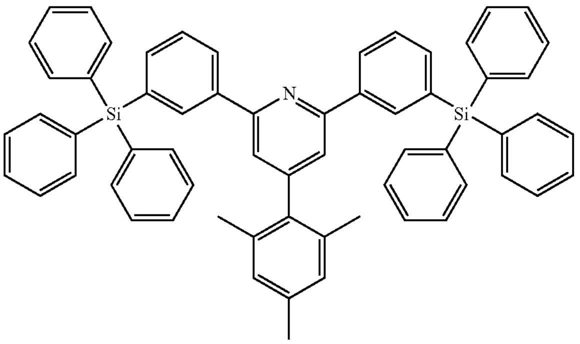
ETH41
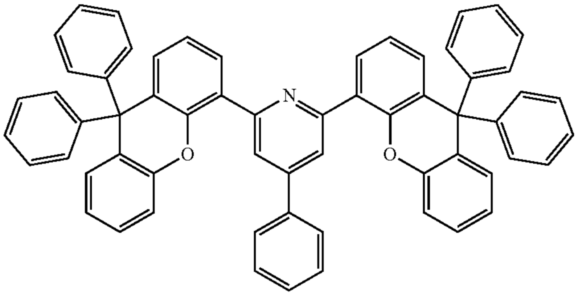
ETH42
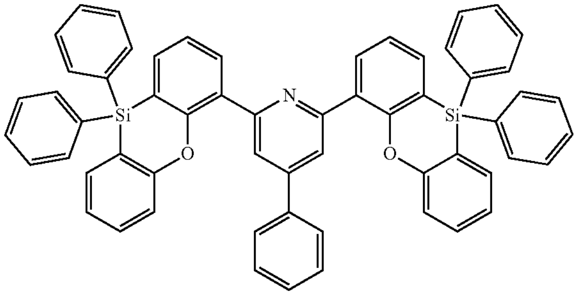
ETH43
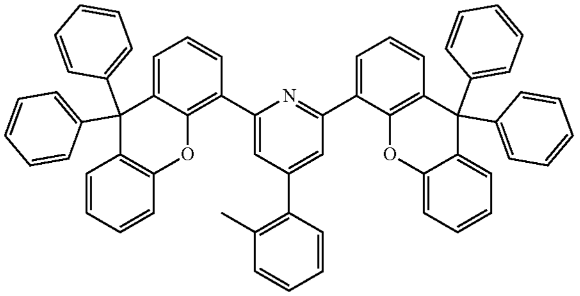
ETH44
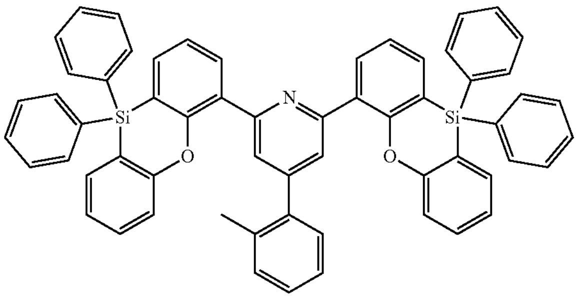

-continued
ETH45
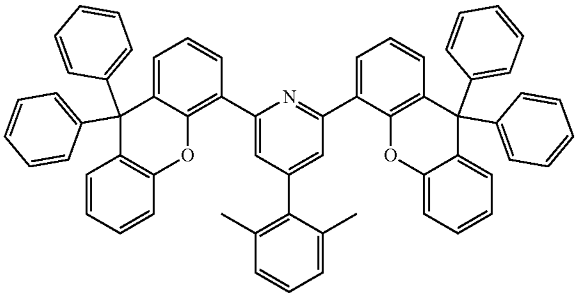
ETH46
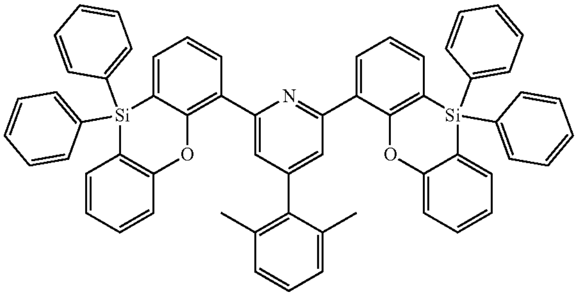
ETH47
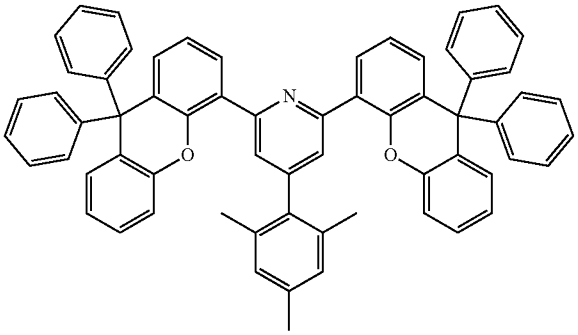
ETH48
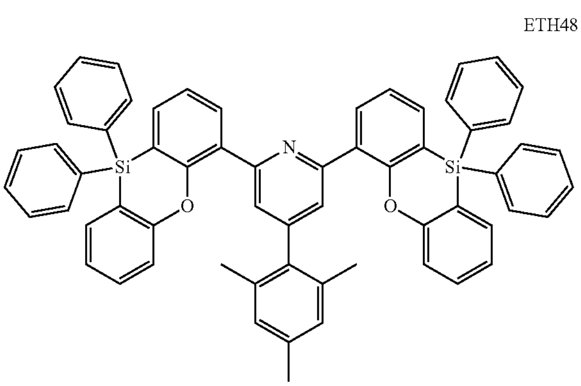
-continued
ETH49
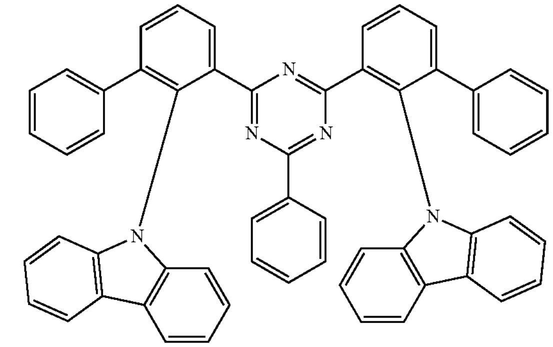
ETH50
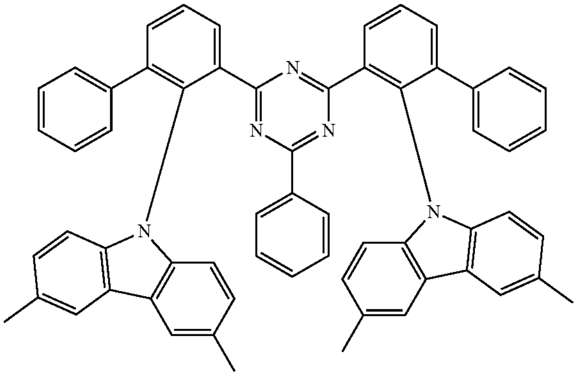
ETH51
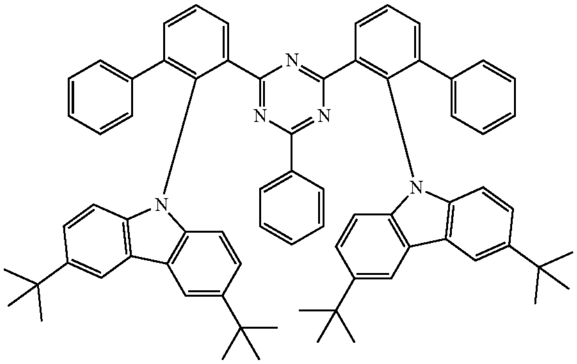
ETH52
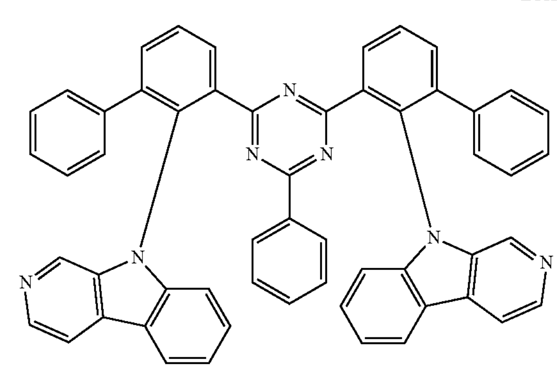

-continued
ETH53
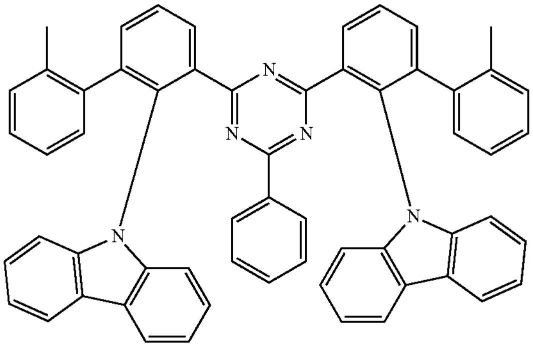
ETH54
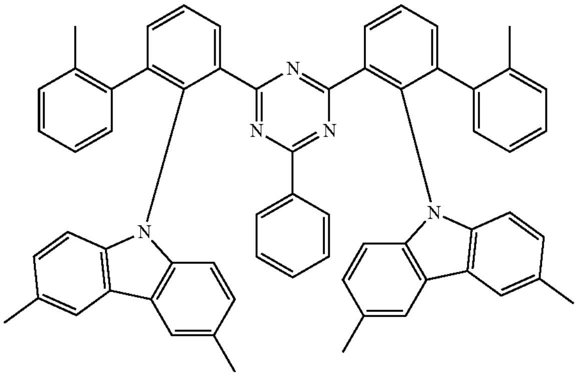
ETH55
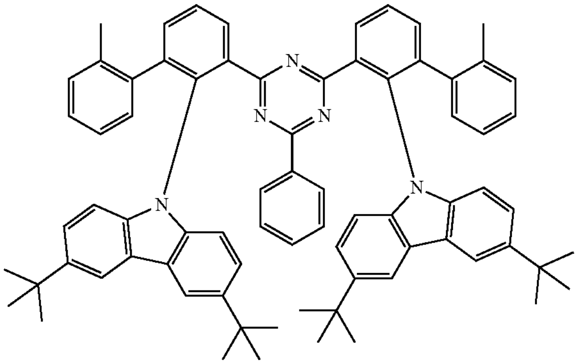
ETH56
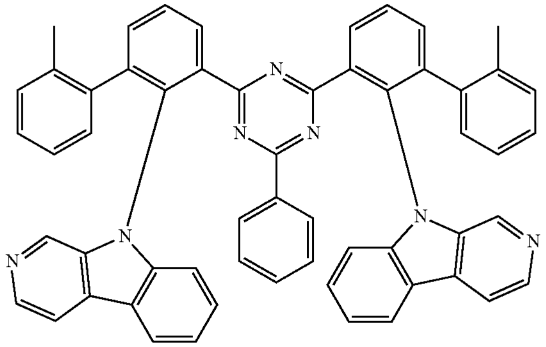
-continued
ETH57
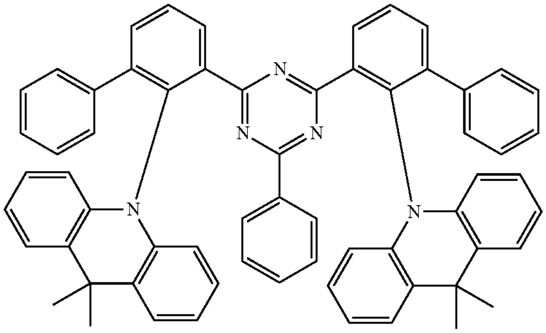
ETH58
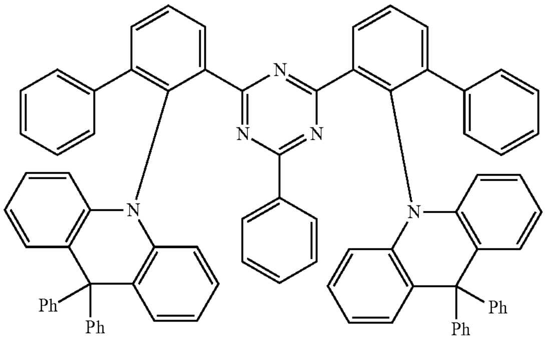
ETH59
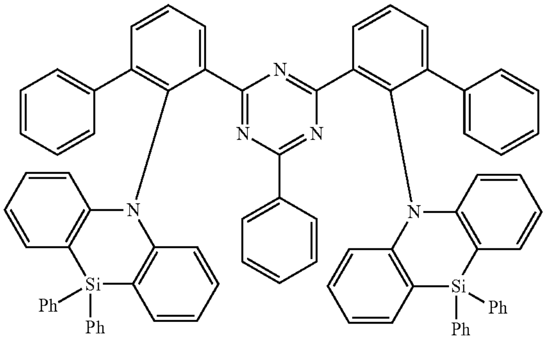
ETH60
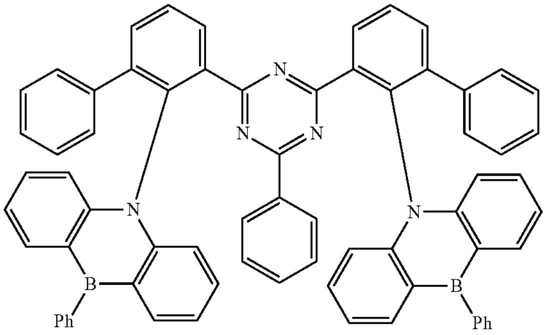

-continued
ETH61
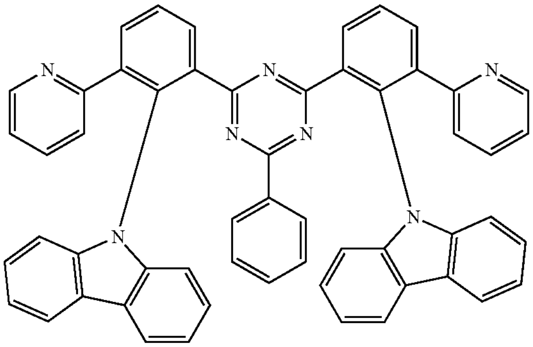
ETH62
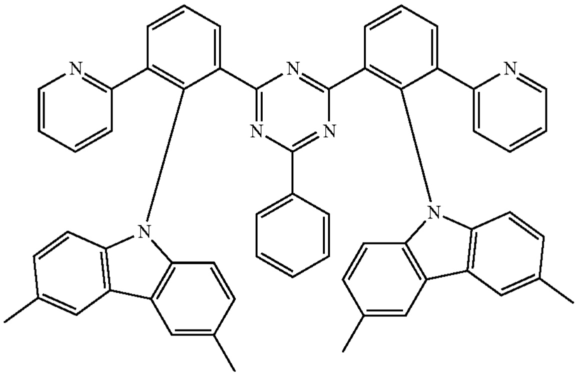
ETH63
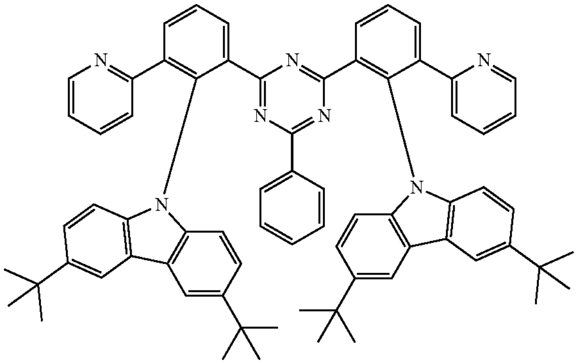
ETH64
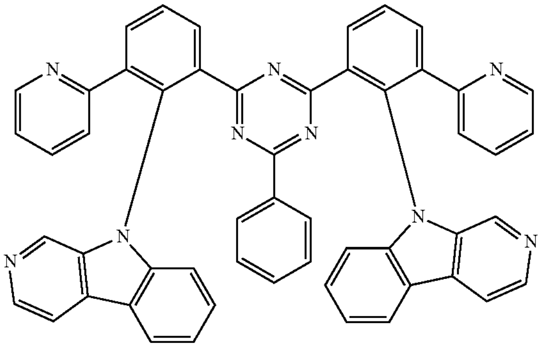
-continued
ETH65
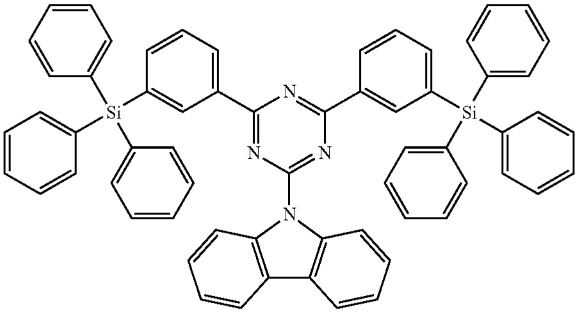
ETH66
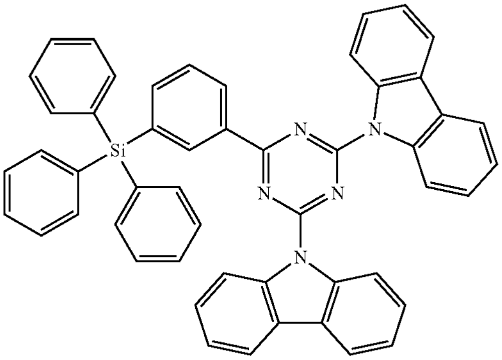
ETH67
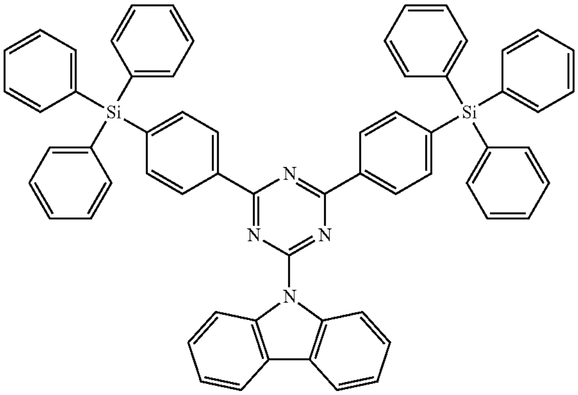
ETH68
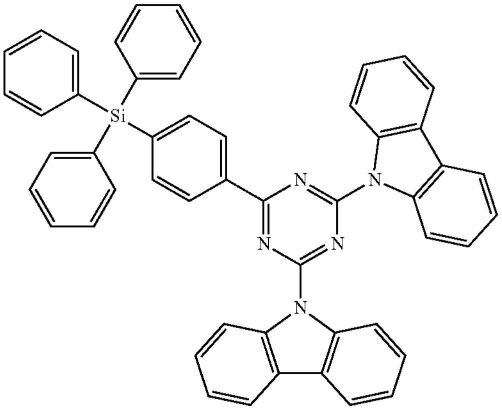

-continued
ETH69
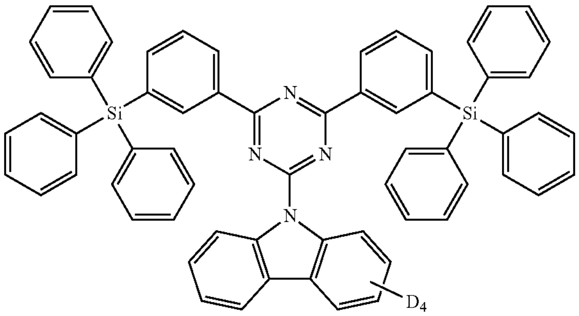
ETH70
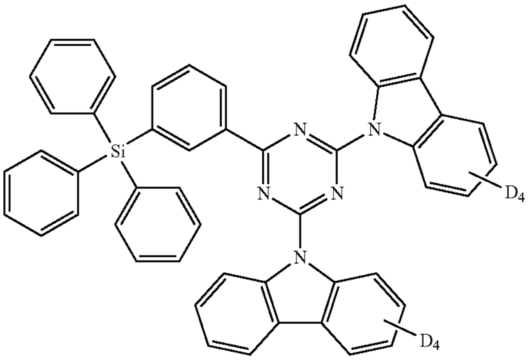
ETH71
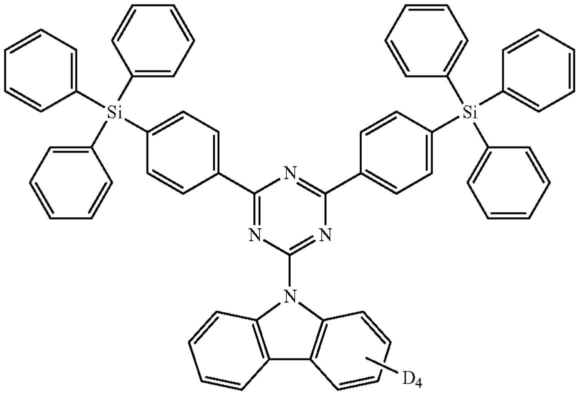
ETH72
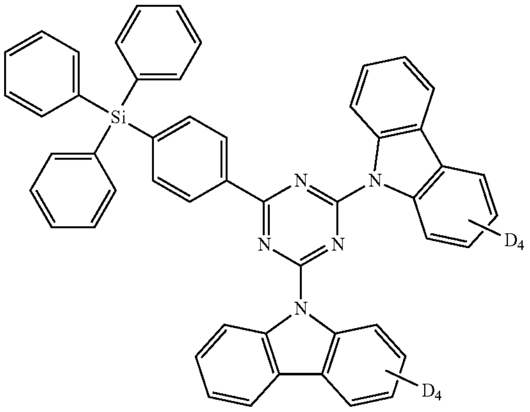
-continued
ETH73
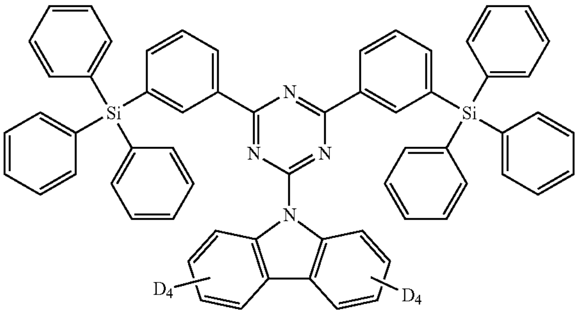
ETH74
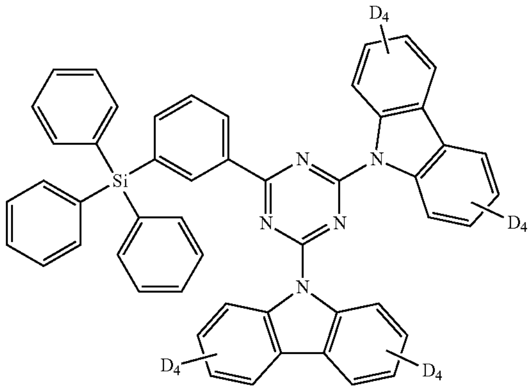
ETH75
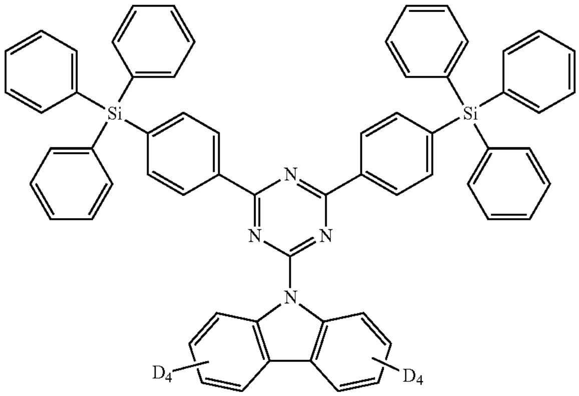
ETH76
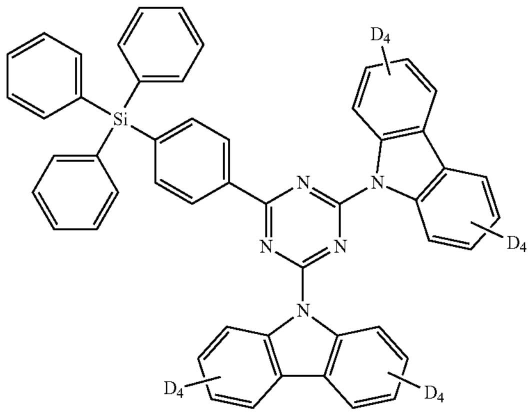

-continued
ETH77
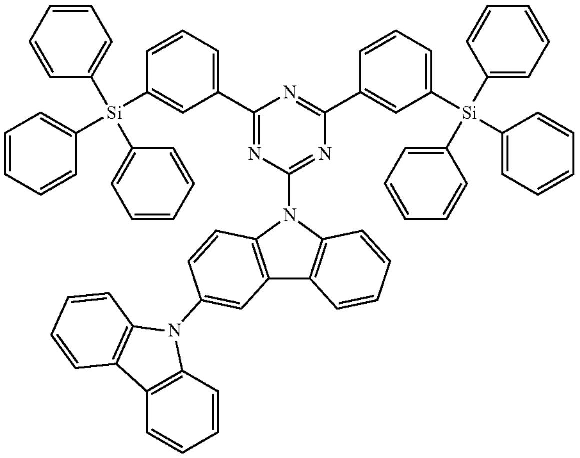
RTH78
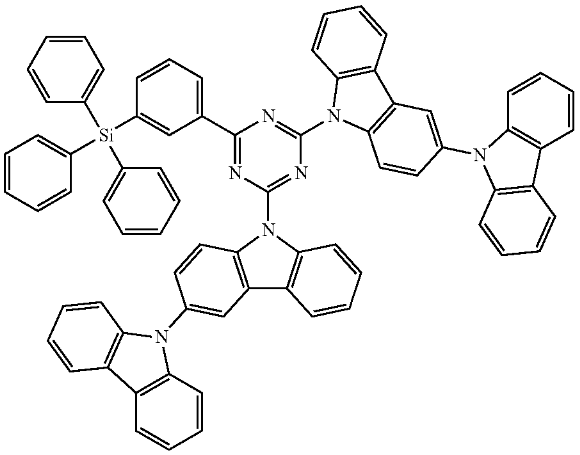
ETH79
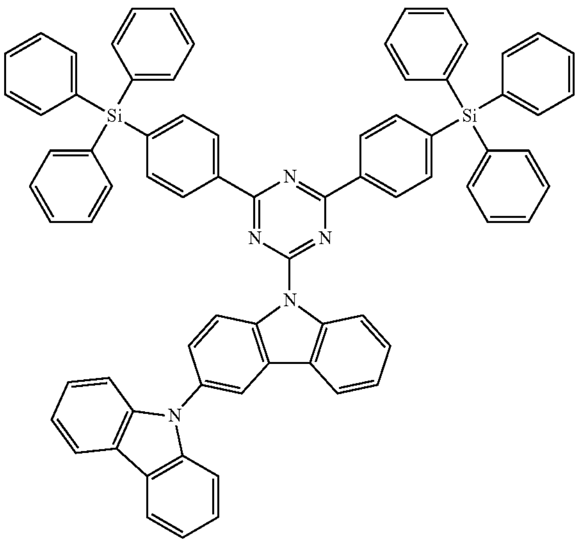
-continued
ETH80
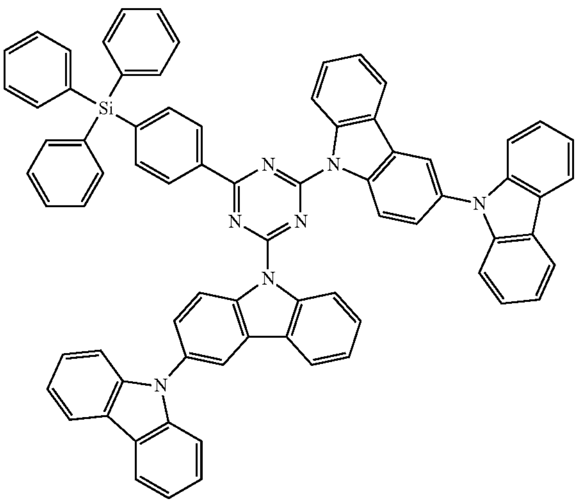
ETH81
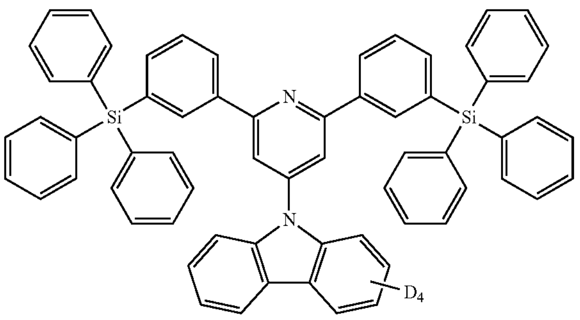
ETH82
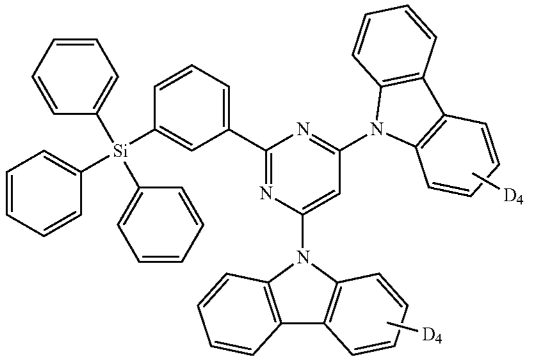
ETH83
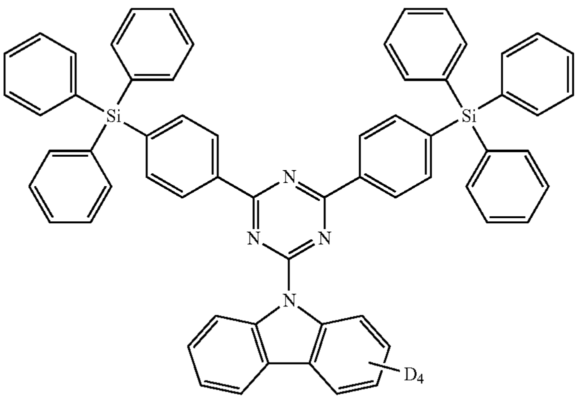

-continued
ETH84
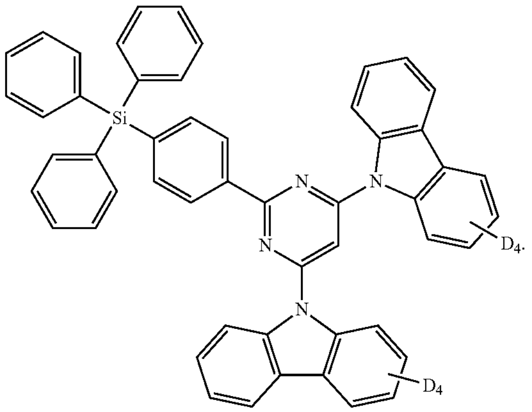
In an embodiment, the third compound may be one of Compounds HTH1 to HTH52:
HTH1
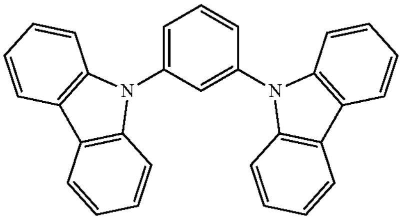
HTH2
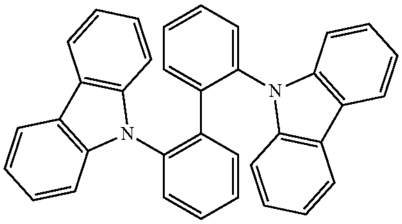
HTH3
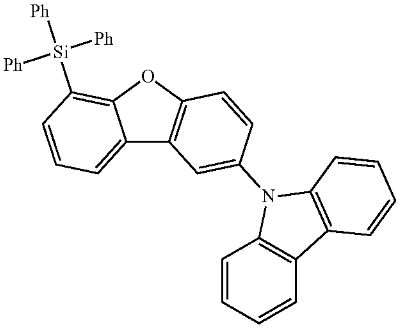
-continued
HTH4
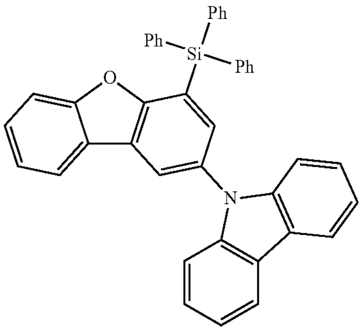
HTH5
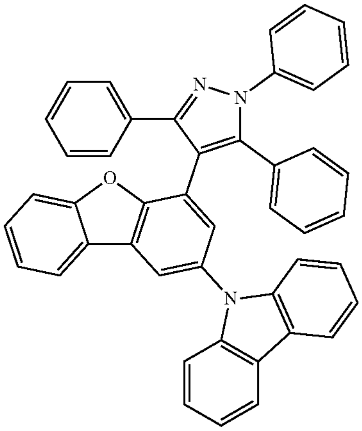
HTH6
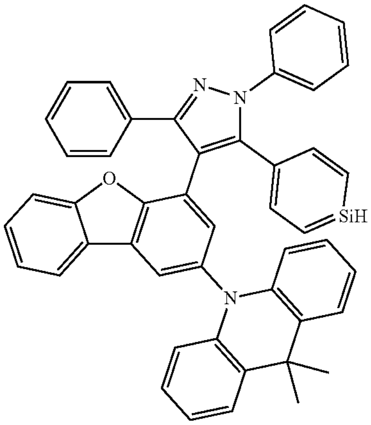
HTH7
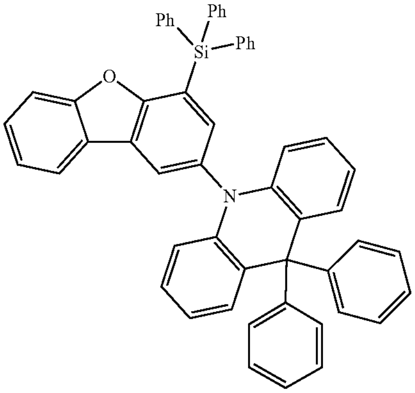

-continued
HTH8
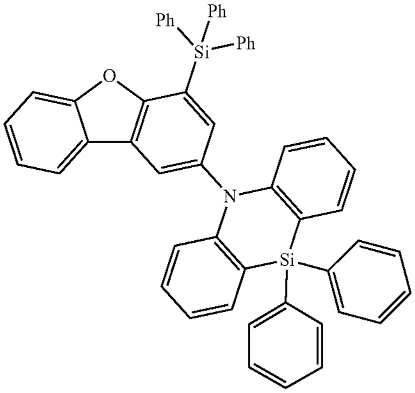
HTH9
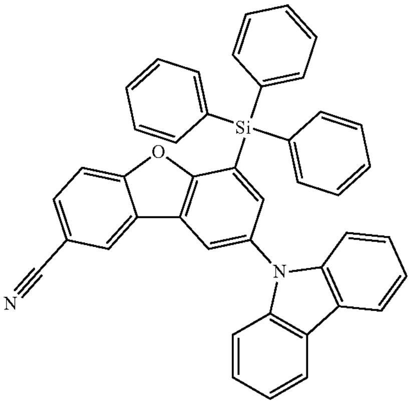
HTH10
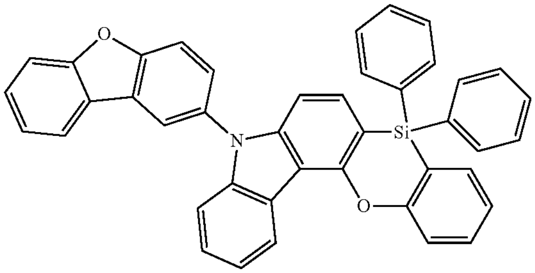
HTH11
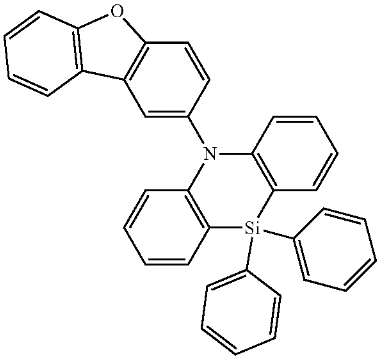
-continued
HTH12
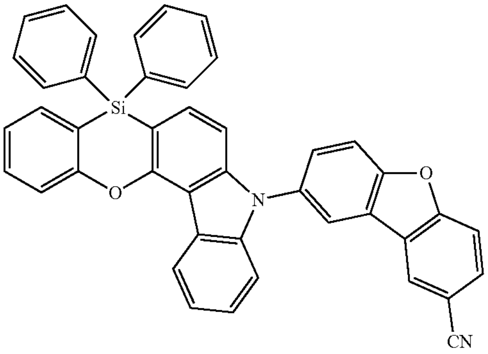
HTH13
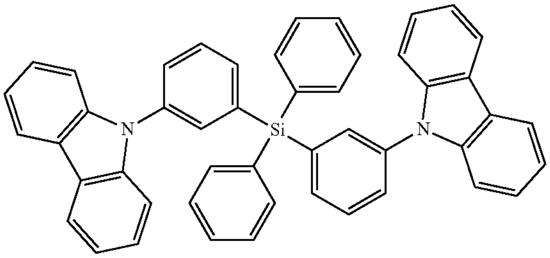
HTH14
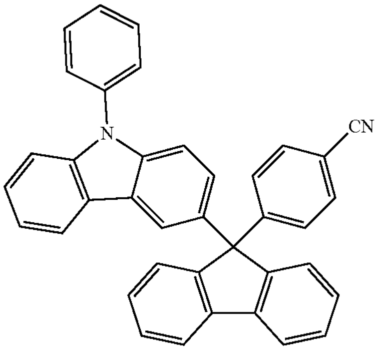
HTH15
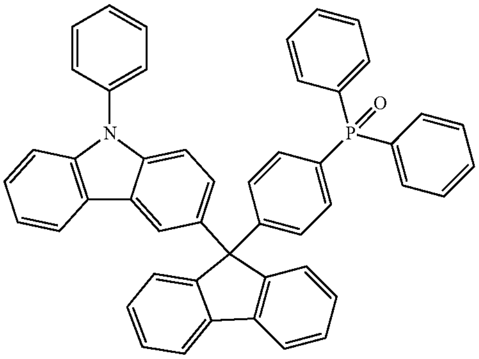

HTH16
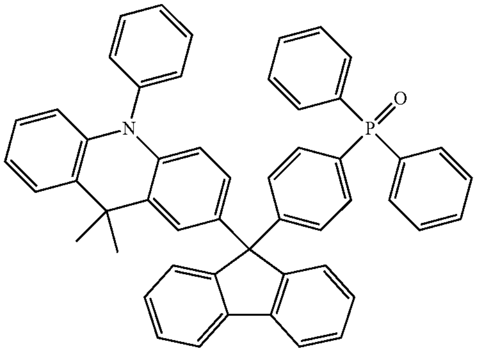
HTH17
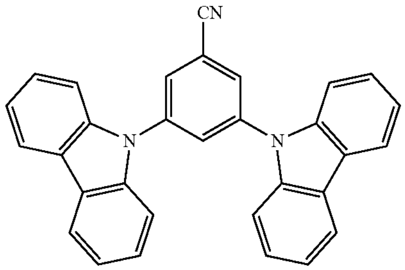
HTH18
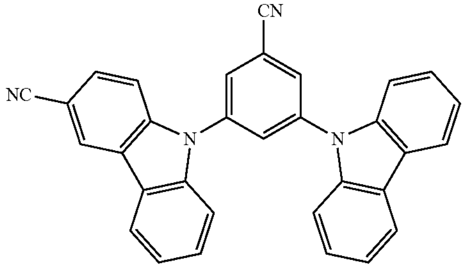
HTH19
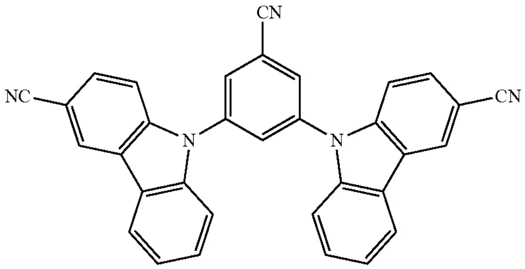
HTH20
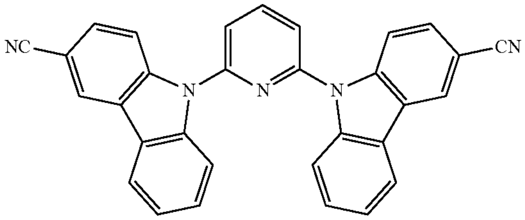
HTH21
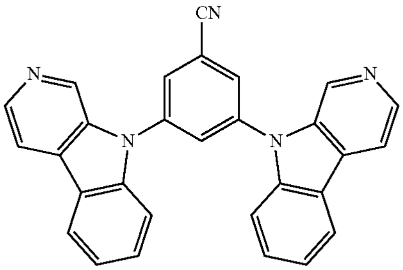
HTH22
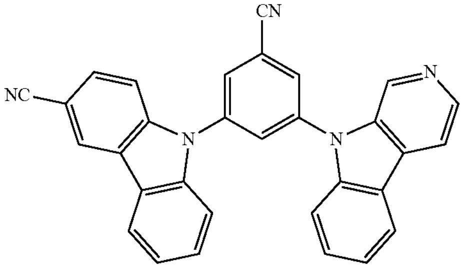
HTH23
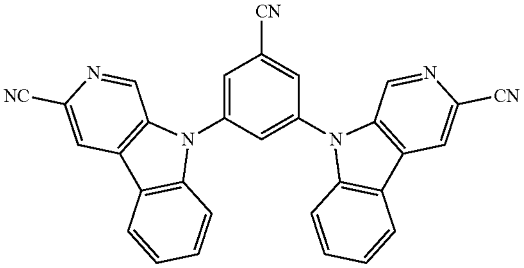
HTH24
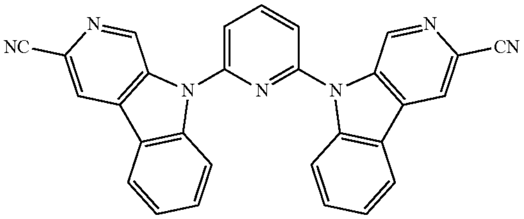
HTH25
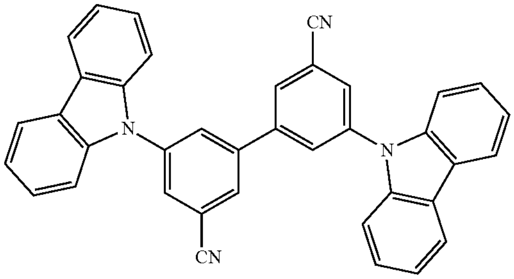

-continued
HTH26
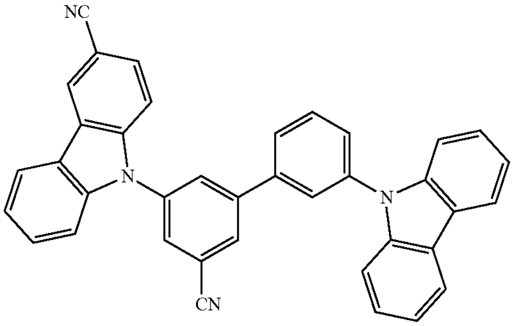
HTH27
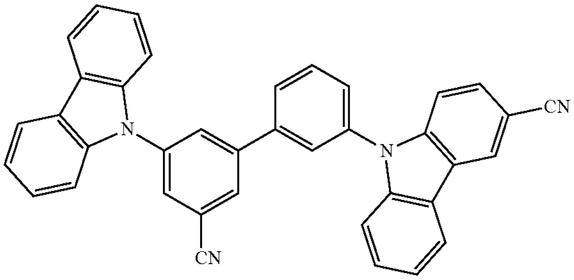
HTH28
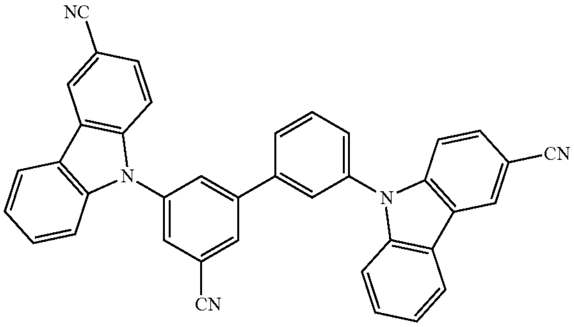
HTH29
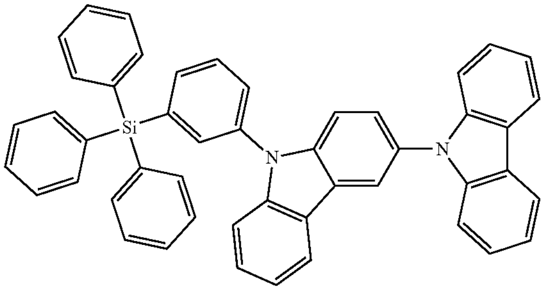
-continued
HTH30
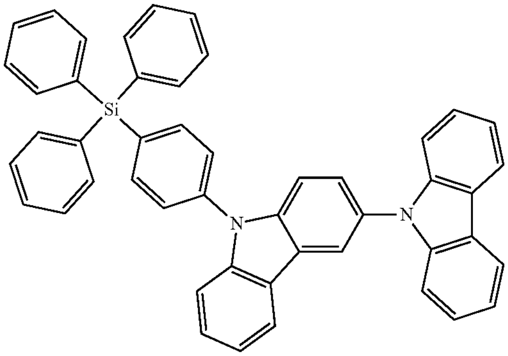
HTH31
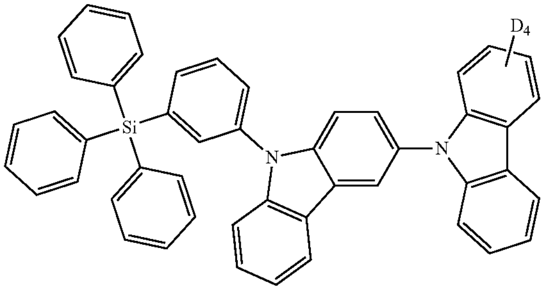
HTH32
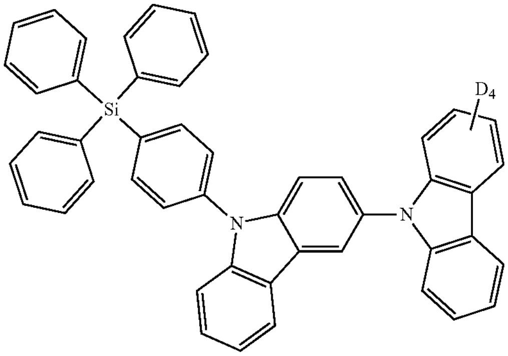
HTH33
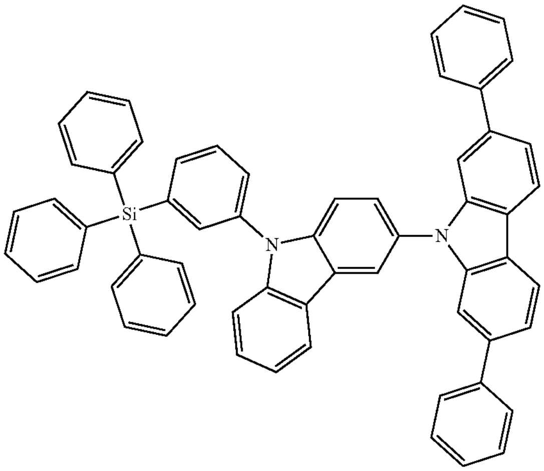

-continued
HTH34
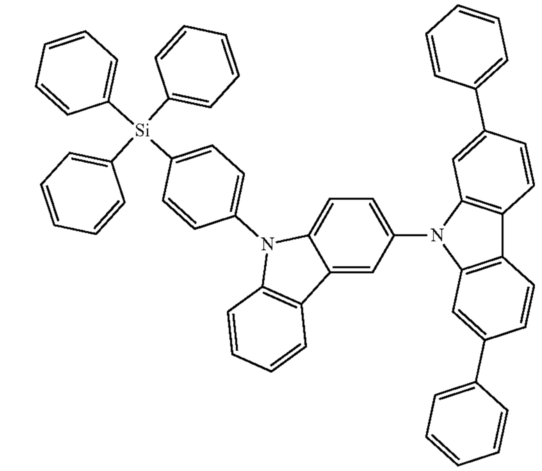
HTH35
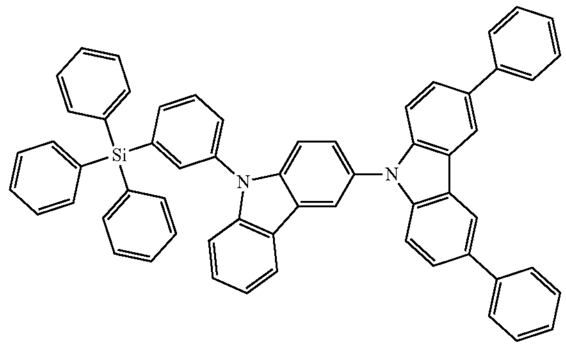
HTH36
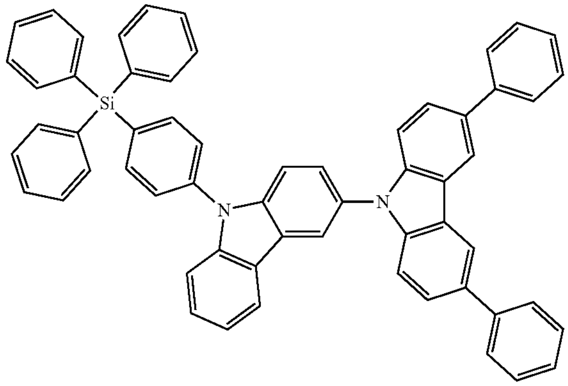
HTH37
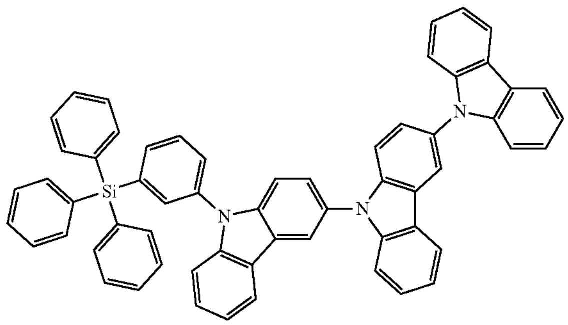
-continued
HTH38
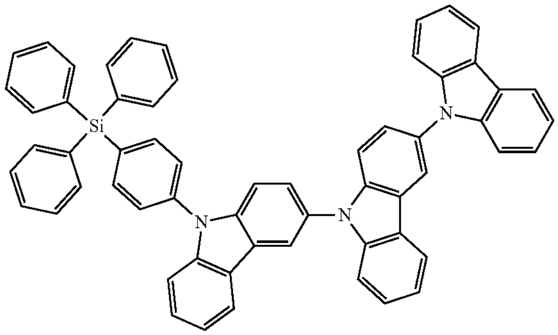
HTH39
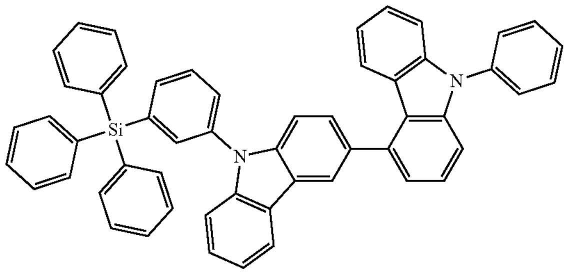
HTH40
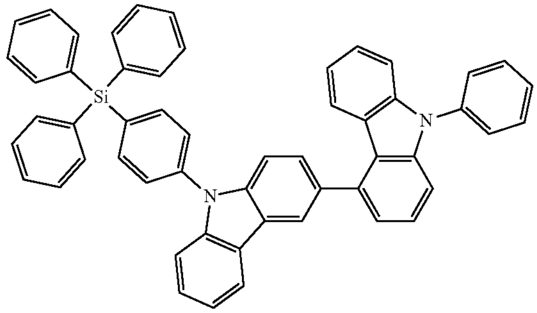
HTH41
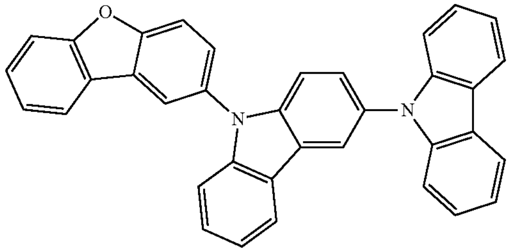
HTH42
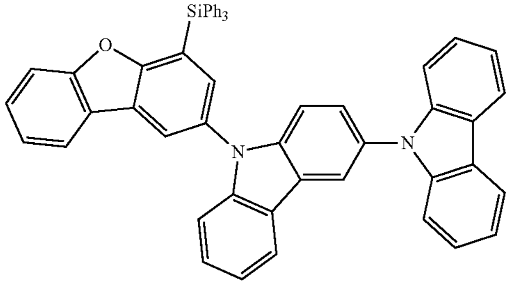

-continued
HTH43
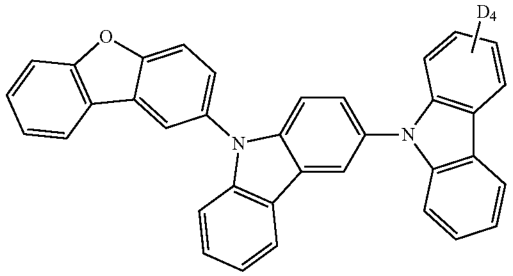
HTH44
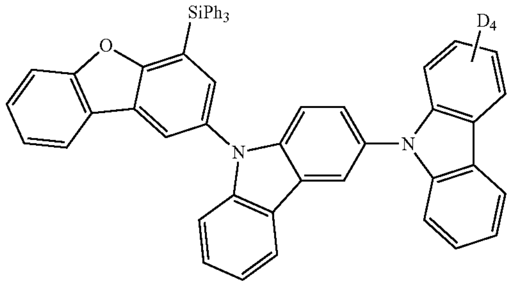
HTH45
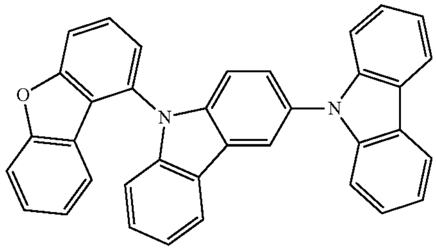
HTH46
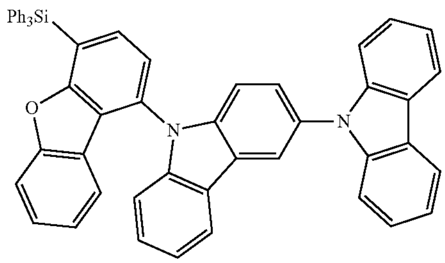
HTH47
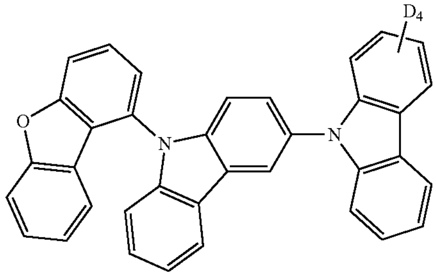
-continued
HTH48
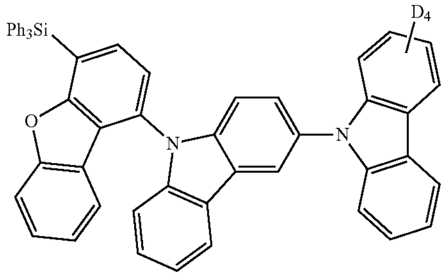
HTH49
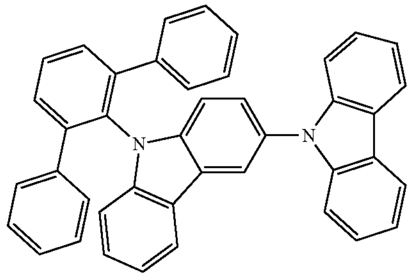
HTH50
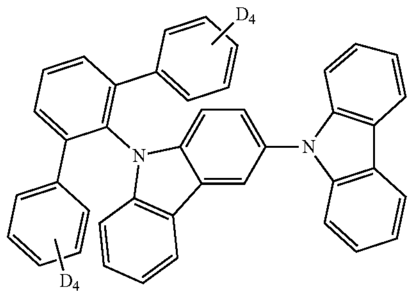
HTH51
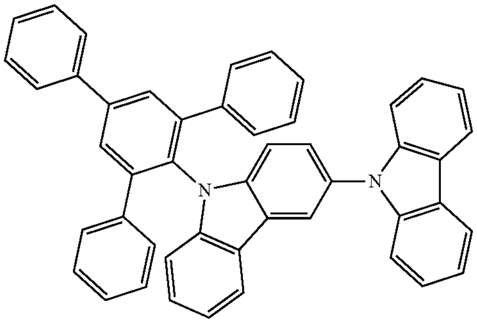
HTH52
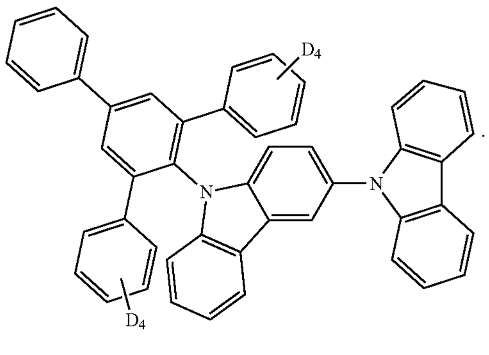

In an embodiment, the fourth compound may be one of Compounds DFD1 to DFD29:
DFD1
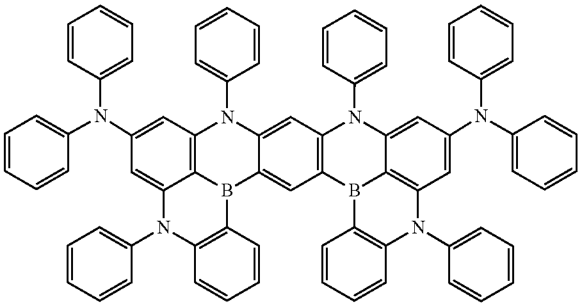
DFD2
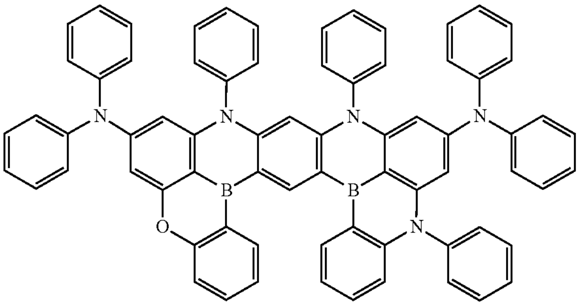
DFD3
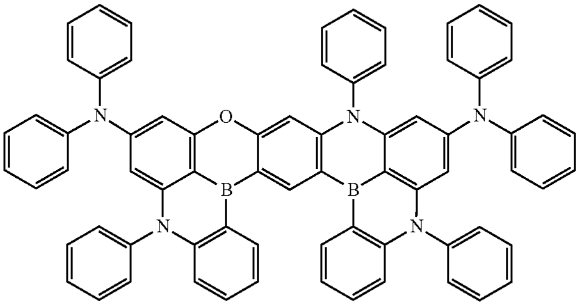
DFD4
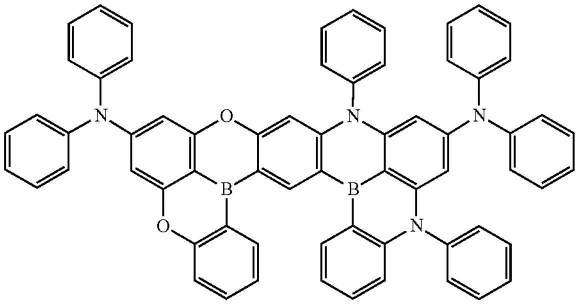
-continued
DFD5
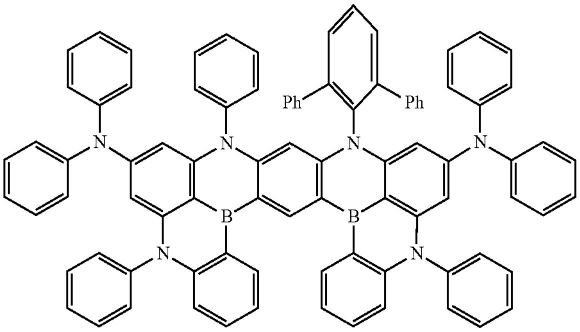
DFD6
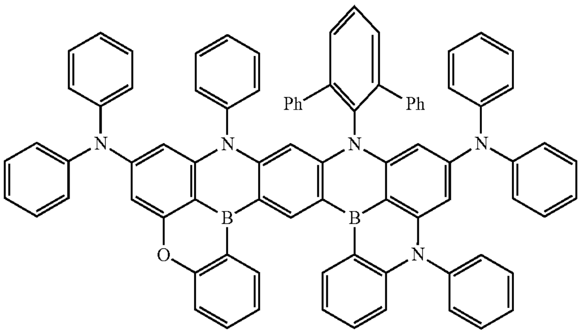
DFD7
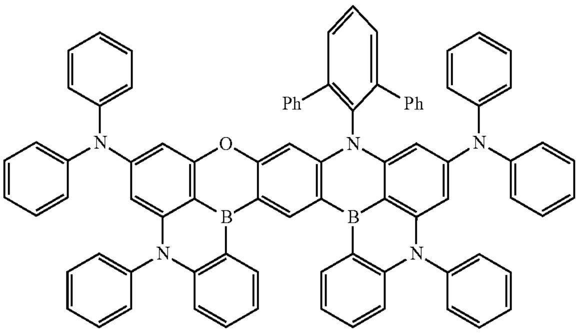
DFD8
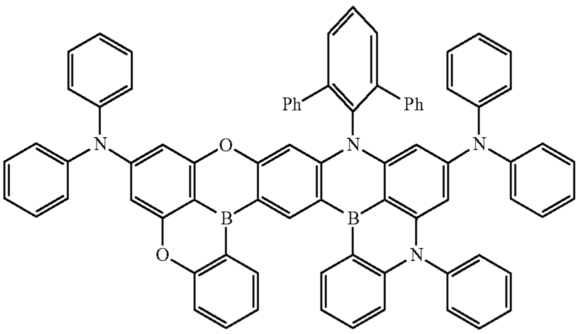

-continued
DFD9
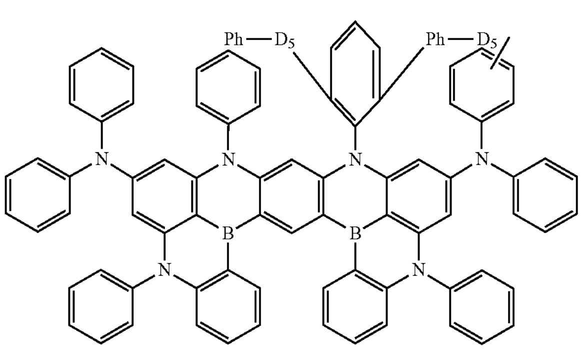
DFD10
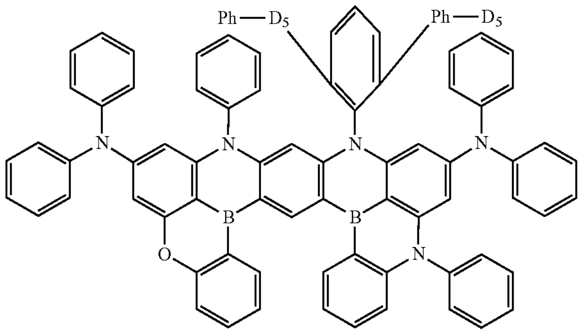
DFD11
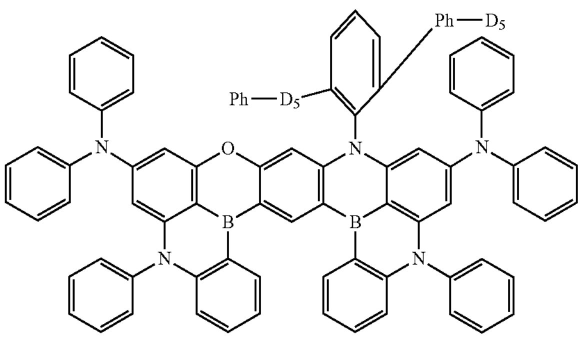
DFD12
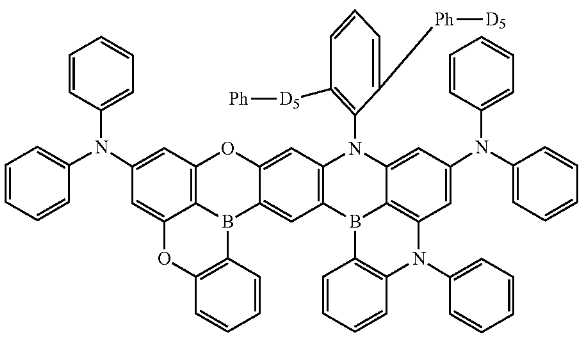
-continued
DFD13
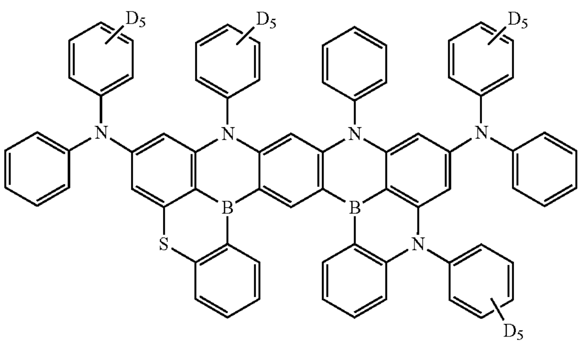
DFD14
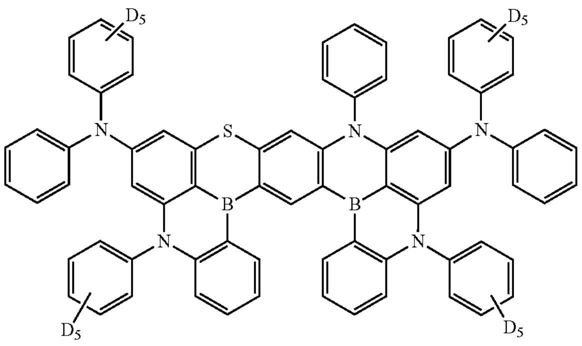
DFD15
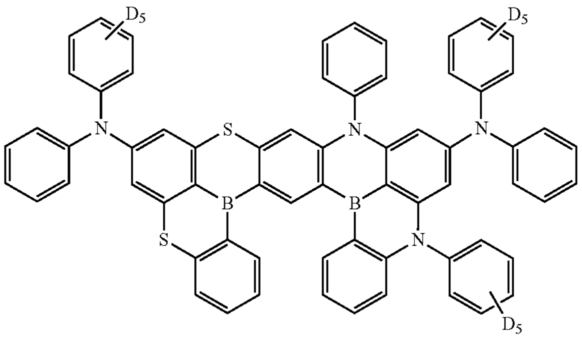
DFD16
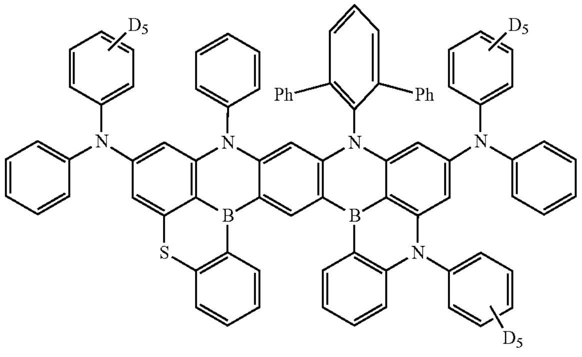

-continued
DFD17
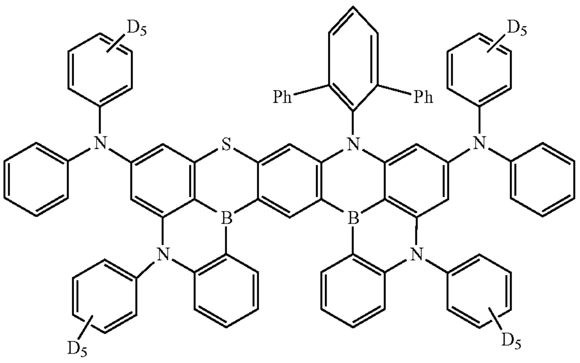
DFD18
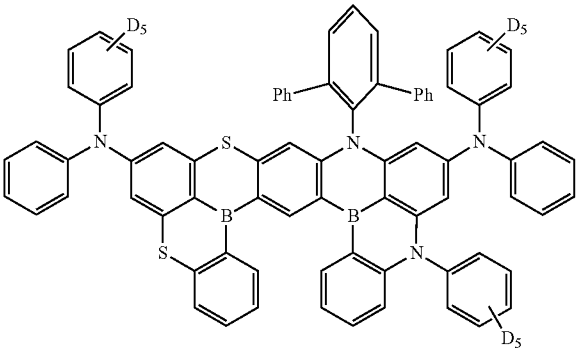
DFD19
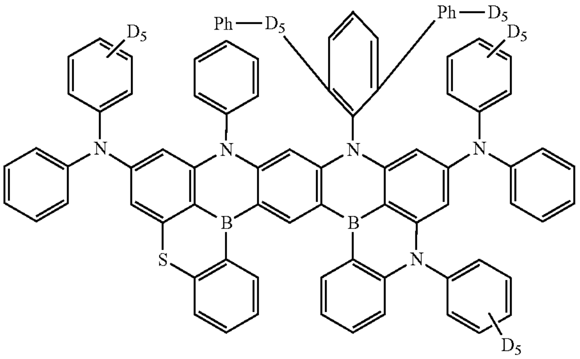
DFD20
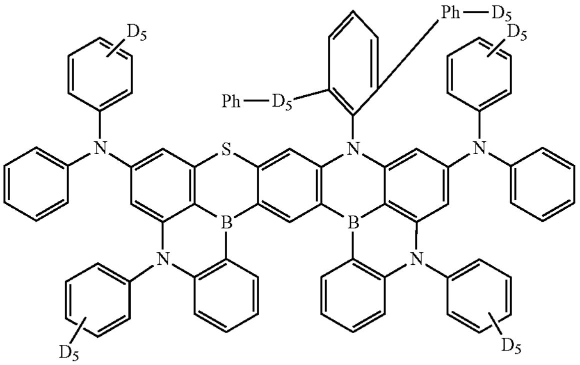
-continued
DFD21
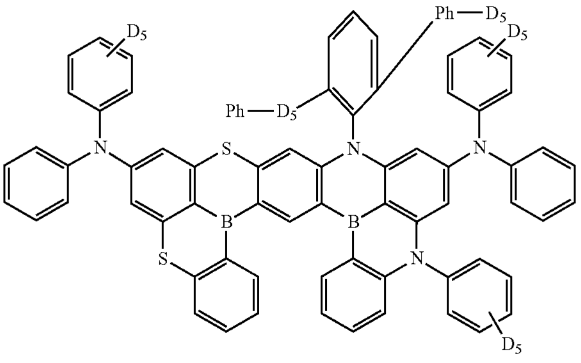
DFD22
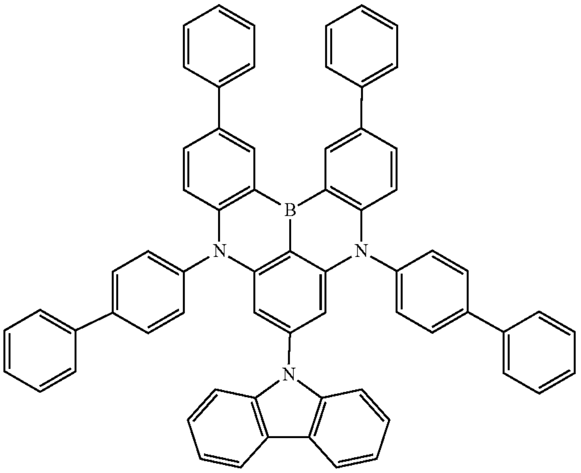
DFD23
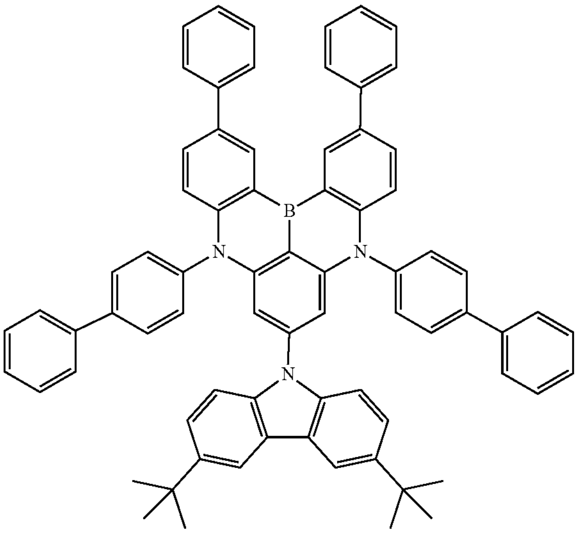

-continued
DFD24
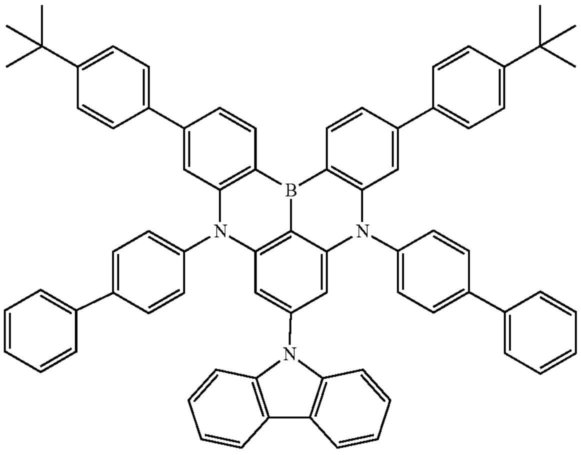
DFD25
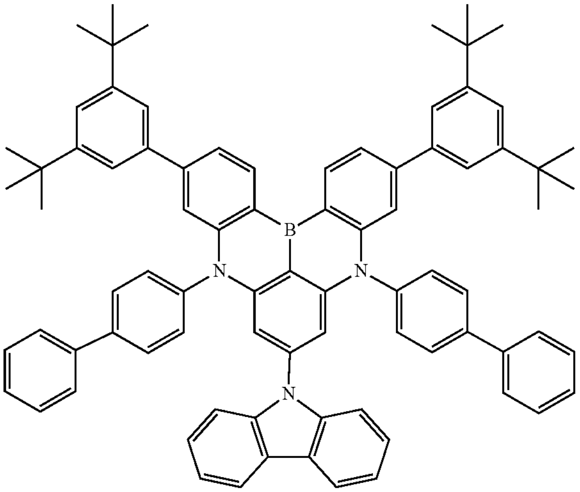
DFD26
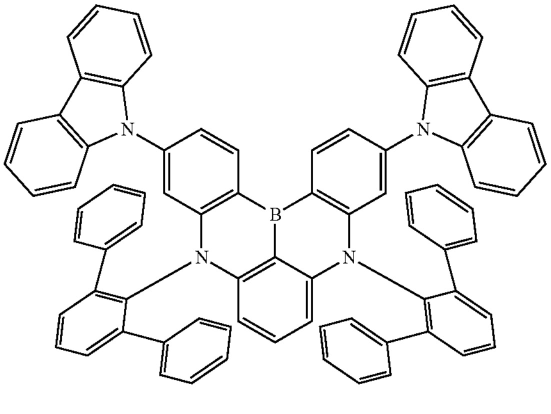
-continued
DFD27
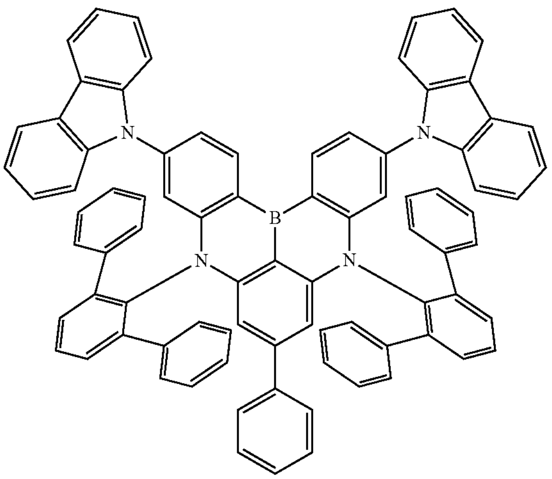
DFD28
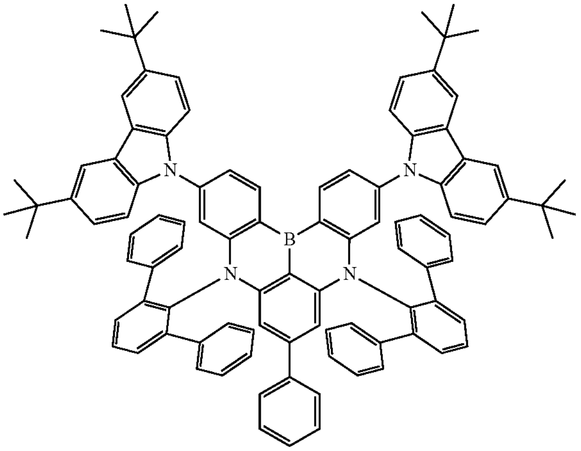
DFD29
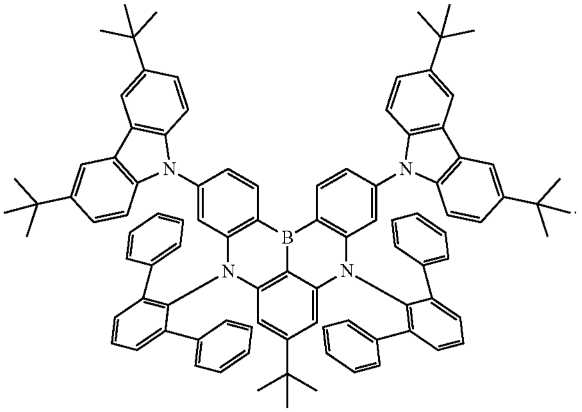
In Compounds 1 to 120, ETH1 to ETH84, HTH1 to HTH52, and DFD1 to DFD29, "Ph" represents a phenyl group, "$D_5$" represents substitution with five deuterium atoms, and "$D_4$" represents substitution with four deuterium atoms. For example, a group represented by

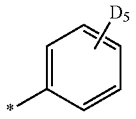

may be identical to a group represented by D

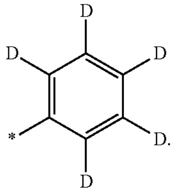

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described with reference to FIG. 1.

[First Electrode 110]

In FIG. 1, a substrate may be further included under the first electrode 110 or on the second electrode 150. The substrate may be a glass substrate or a plastic substrate. In embodiments, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or a combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates the injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or a combination thereof. In embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or a combination thereof.

The first electrode 110 may have a single-layered structure consisting of a single layer or a multi-layered structure including multiple layers. For example, the first electrode 110 may have a three-layered structure of ITO/Ag/ITO.

[Interlayer 130]

The interlayer 130 may be located on the first electrode 110. The interlayer 130 may include an emission layer.

The interlayer 130 may further include a hole transport region between the first electrode 110 and the emission layer, and an electron transport region between the emission layer and the second electrode 150.

The interlayer 130 may further include, in addition to various organic materials, a metal-containing compound such as an organometallic compound, an inorganic material such as quantum dots, or the like.

In an embodiment, the interlayer 130 may include two or more emitting units stacked between the first electrode 110 and the second electrode 150, and at least one charge generation layer which may be each located between adjacent units among the two or more emitting units. When the interlayer 130 includes emitting units and a charge generation layer as described above, the light-emitting device 10 may be a tandem light-emitting device.

[Hole Transport Region in Interlayer 130]

The hole transport region may have a structure consisting of a layer consisting of a single material, a structure consisting of a layer including different materials, or a structure including multiple layers including different materials.

The hole transport region may include a hole injection layer, a hole transport layer, an emission auxiliary layer, an electron blocking layer, or a combination thereof.

In embodiments, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked from the first electrode 110 in its respective stated order, but the structure of the hole transport region is not limited thereto.

The hole transport region may include a compound represented by Formula 201, a compound represented by Formula 202, or a combination thereof:

[Formula 201]

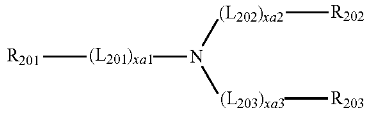

[Formula 202]

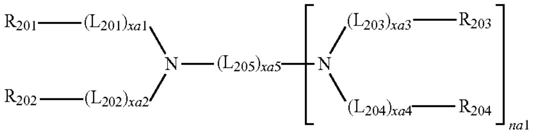

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (for example, a carbazole group or the like) unsubstituted or substituted with at least one $R_{10a}$ (for example, see Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In embodiments, the compound represented by Formula 201 and the compound represented by Formula 202 may each independently include at least one of groups represented by Formulae CY201 to CY217:

CY201

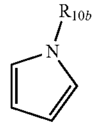

CY202

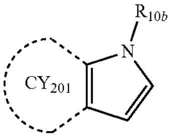

CY203

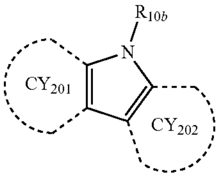

CY204

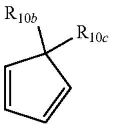

CY205

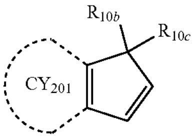

CY206

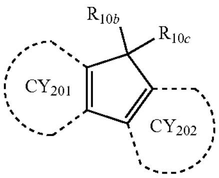

-continued

CY207

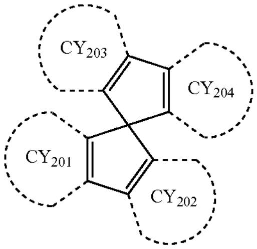

CY208

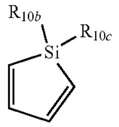

CY209

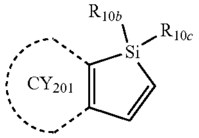

CY210

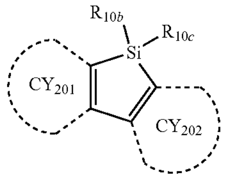

CY211

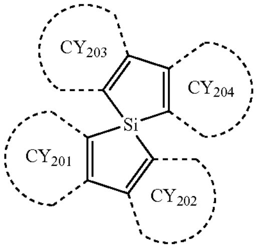

CY212

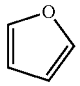

CY213

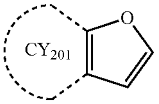

CY214

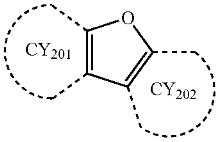

CY215

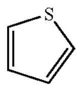

CY216

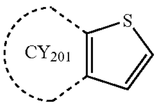

-continued

CY217

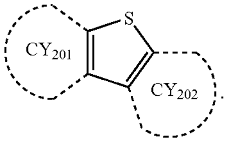

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In embodiments, in Formulae CY201 to CY217, ring $CY_{201}$ to ring $CY_{204}$ may each independently be a benzene group, a naphthalene group, a phenanthrene group, or an anthracene group.

In embodiments, the compound represented by Formula 201 and the compound represented by Formula 202 may each independently include at least one of groups represented by Formulae CY201 to CY203.

In embodiments, the compound represented by Formula 201 may include at least one of the groups represented by Formulae CY201 to CY203 and at least one of the groups represented by Formulae CY204 to CY217.

In embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In embodiments, the compound represented by Formula 201 and the compound represented by Formula 202 may each not include a group represented by one of Formulae CY201 to CY203.

In embodiments, the compound represented by Formula 201 and the compound represented by Formula 202 may each not include a group represented by one of Formulae CY201 to CY203, and may each independently include at least one of the groups represented by Formulae CY204 to CY217.

In embodiments, the compound represented by Formula 201 and the compound represented by Formula 202 may each not include a group represented by one of Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or a combination thereof:

HT1

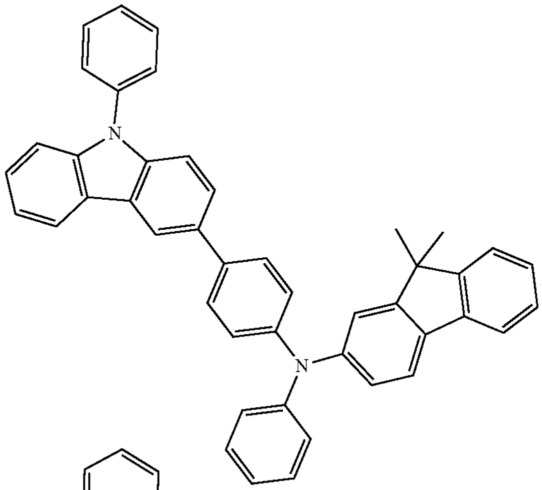

HT2

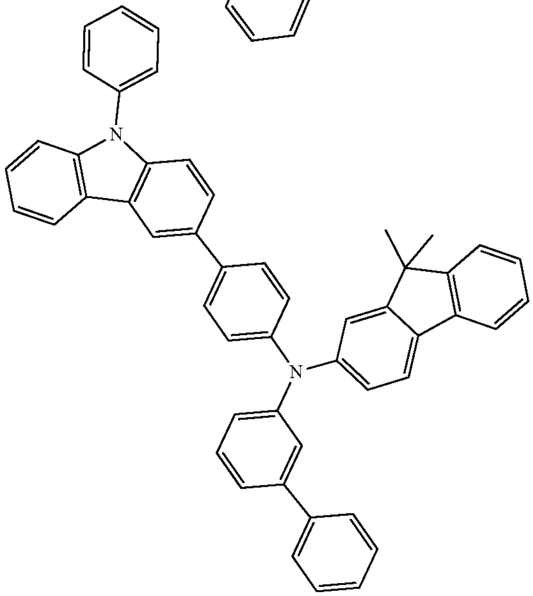

-continued
HT3
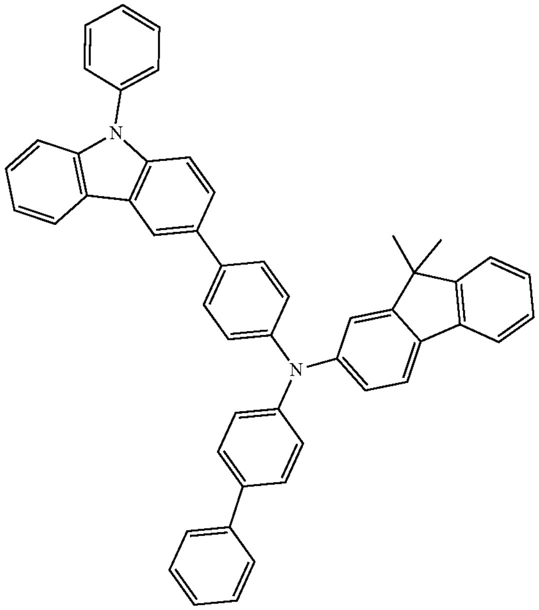
HT4
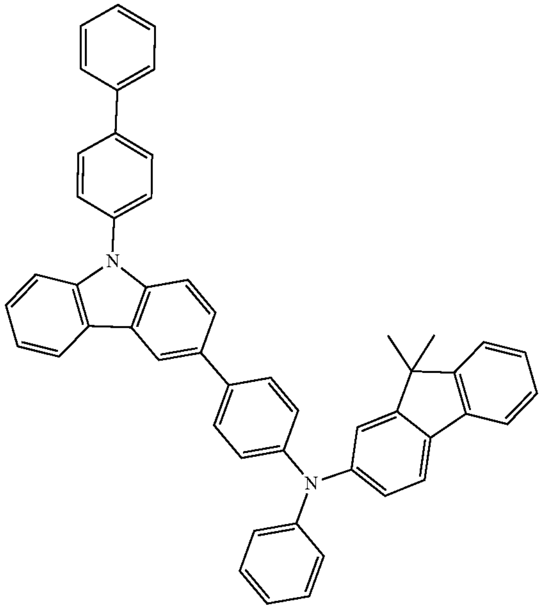

-continued
HT5
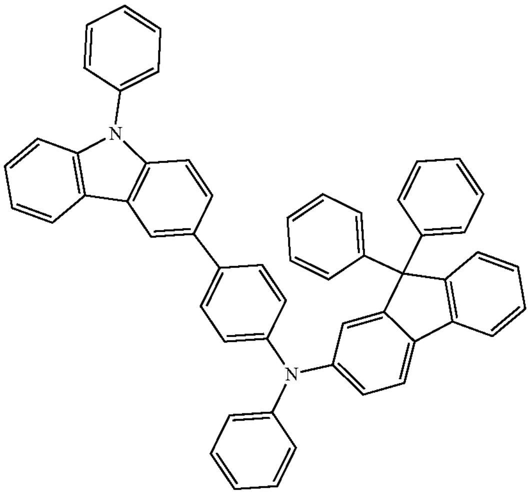
HT6
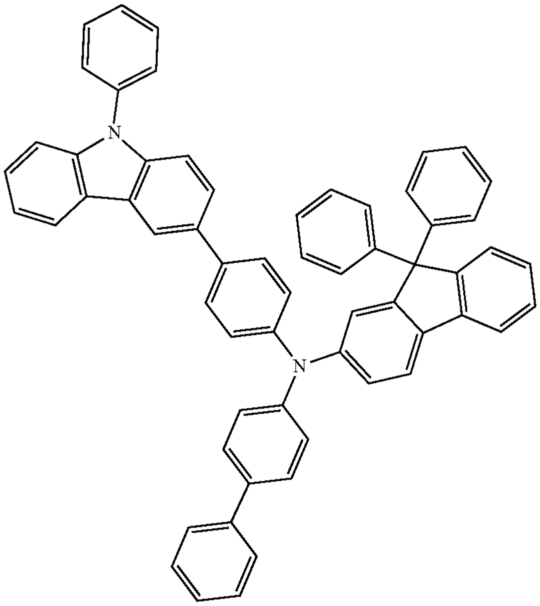

-continued
HT7
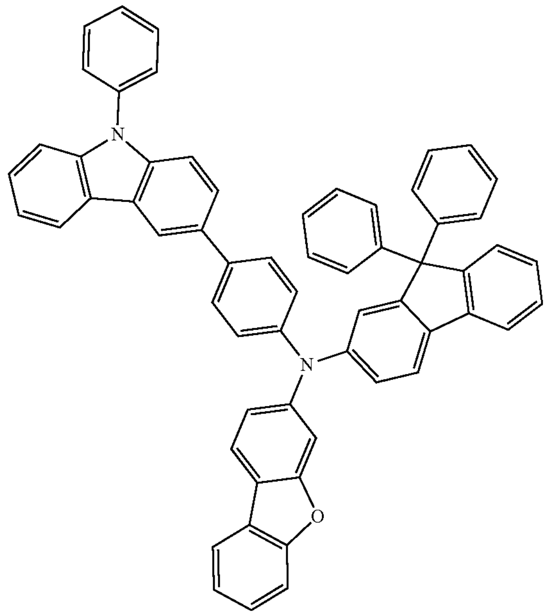
HT8
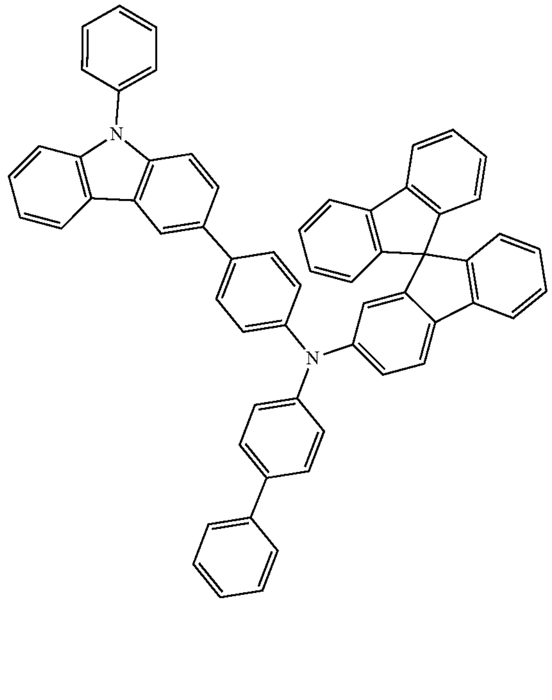

-continued
HT9
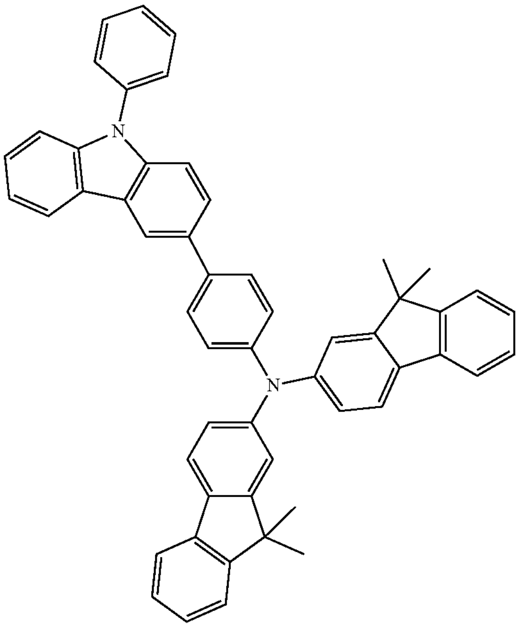
HT10
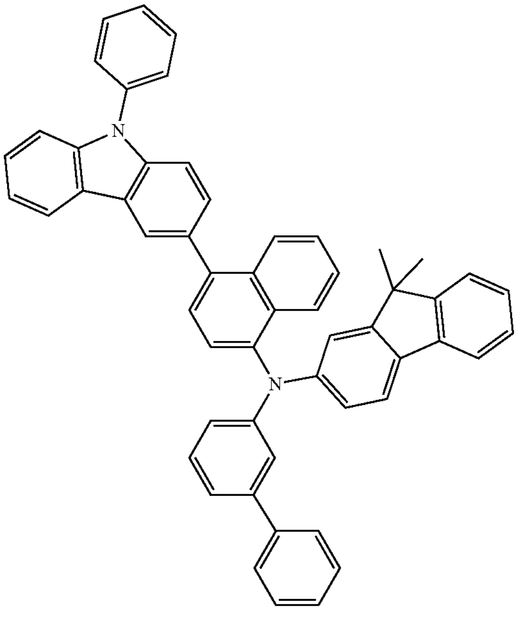

-continued
HT11
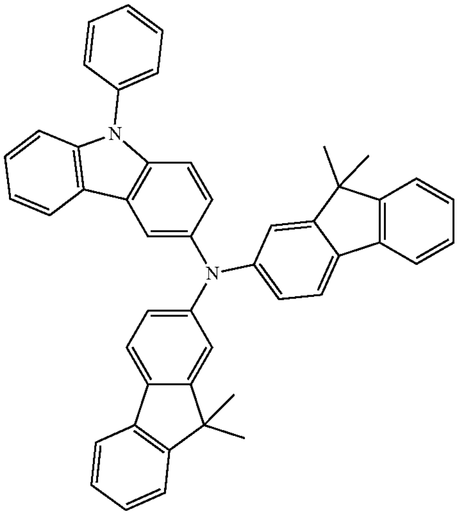
HT12
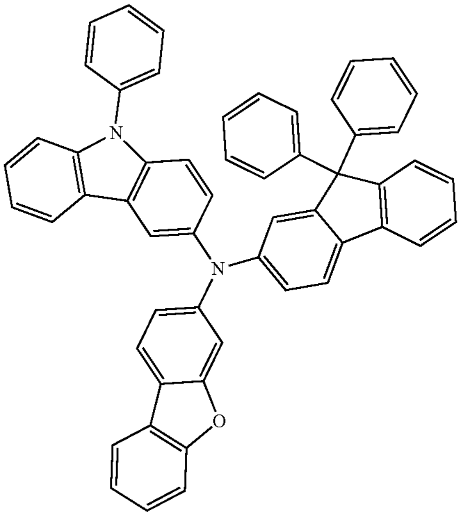
HT13
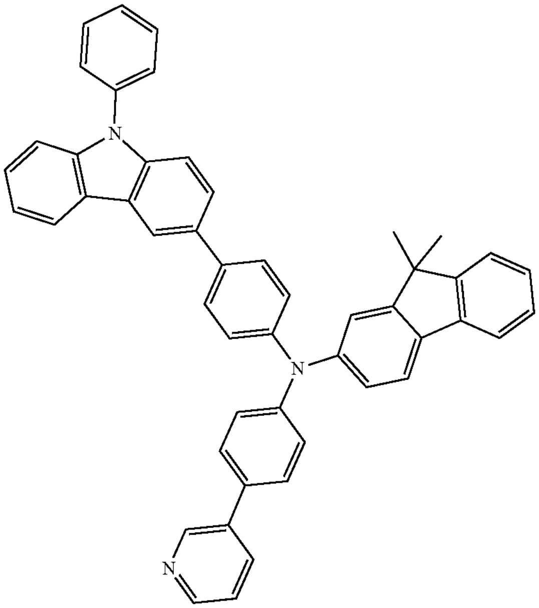

-continued
HT14
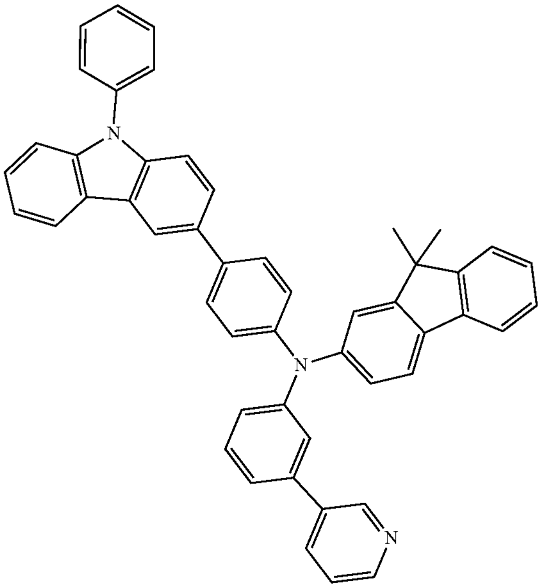
HT15
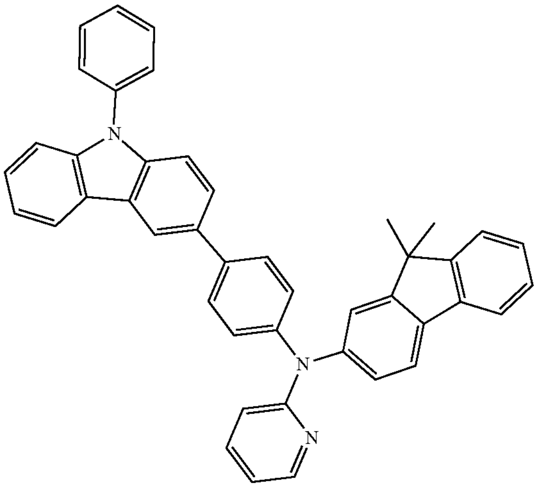
HT16
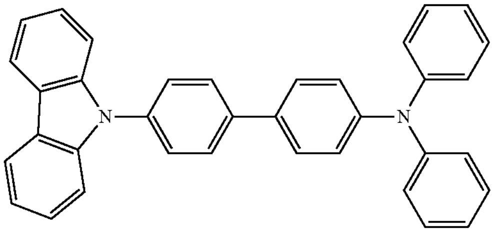

-continued
HT17
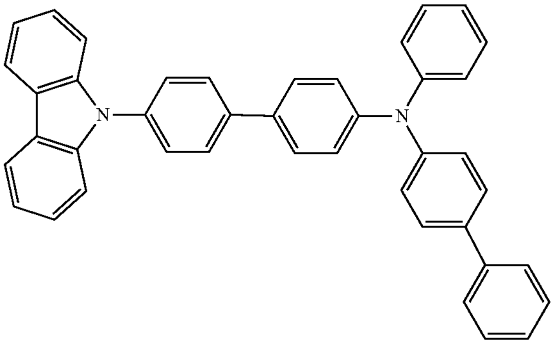
HT18
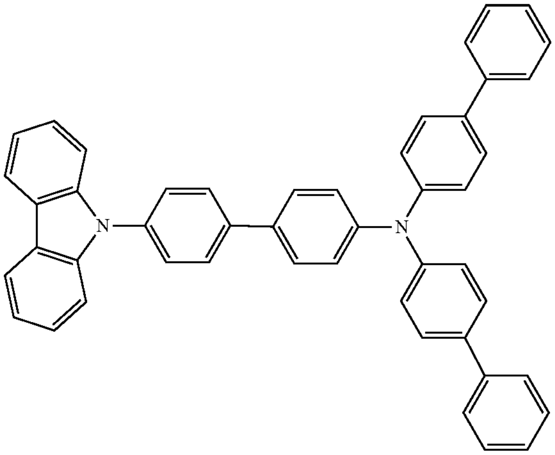
HT19
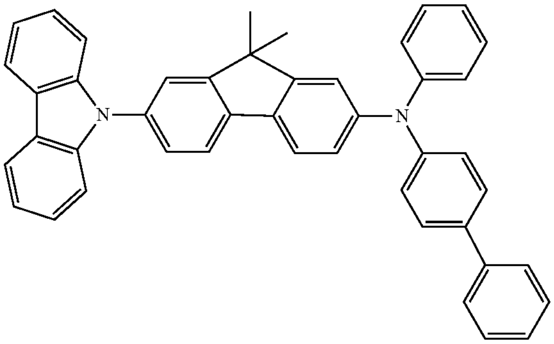

-continued
HT20
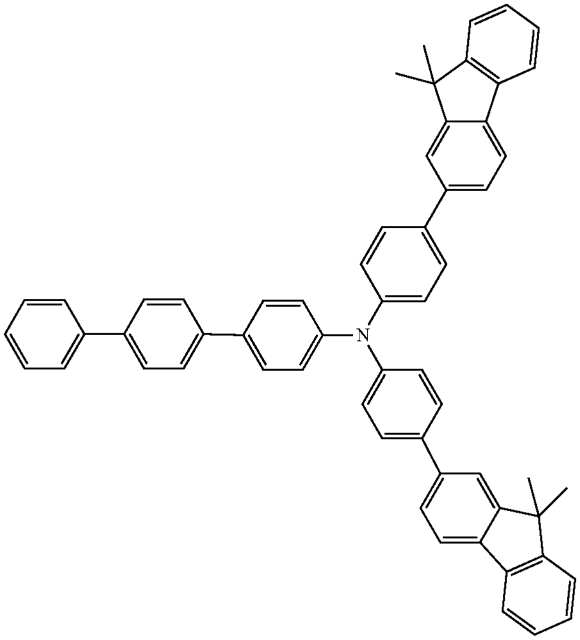
HT21
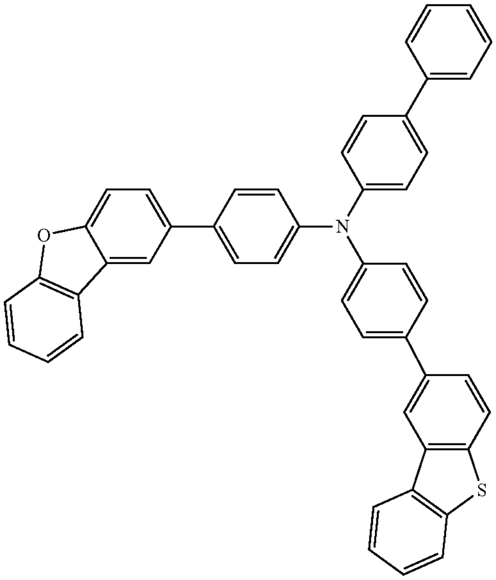
HT22
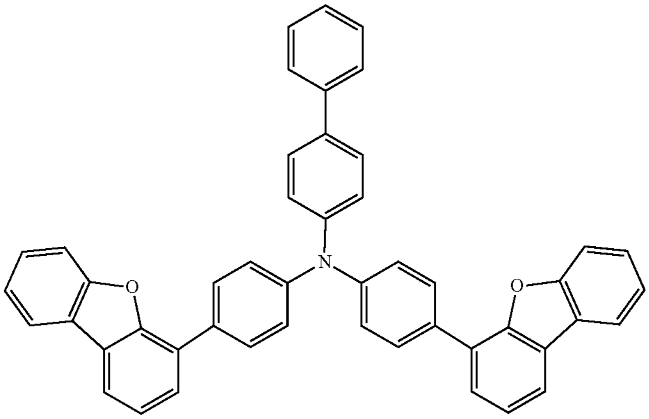

-continued
HT23
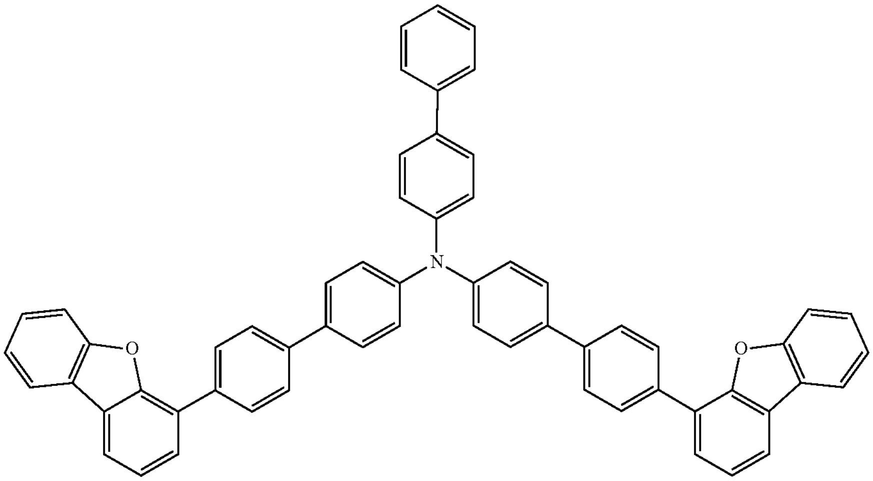
HT24
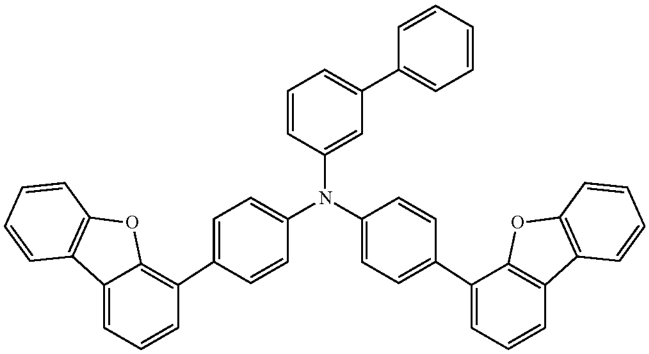
HT25
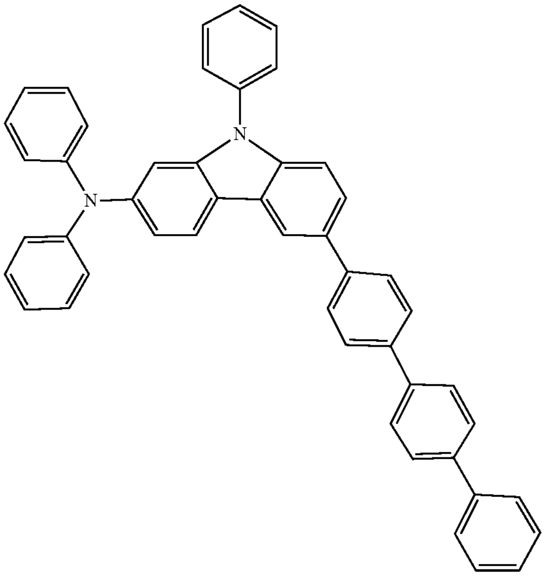

-continued
HT26
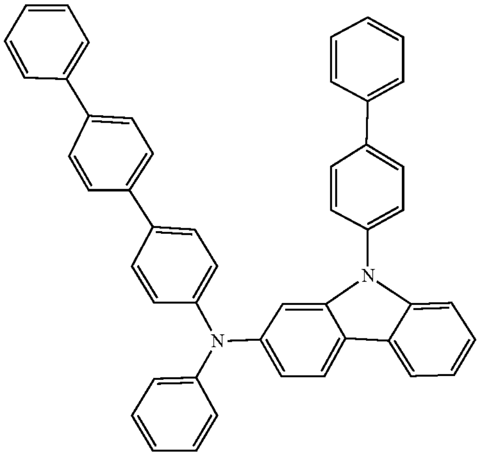
HT27
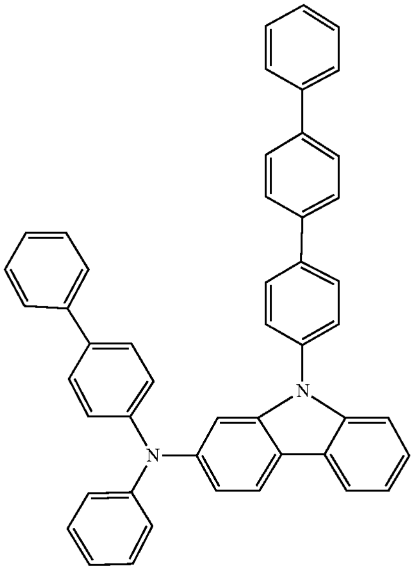
HT28
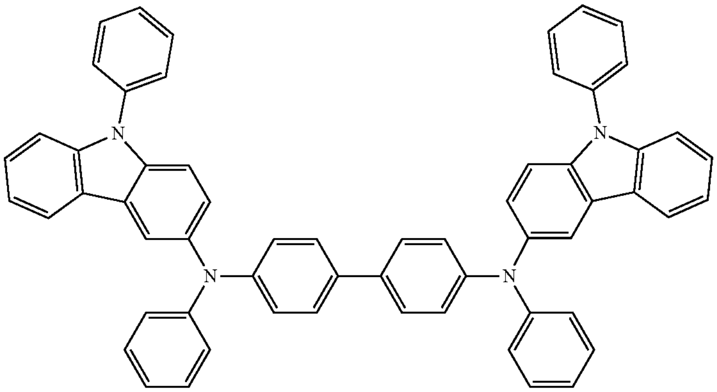

-continued
HT29
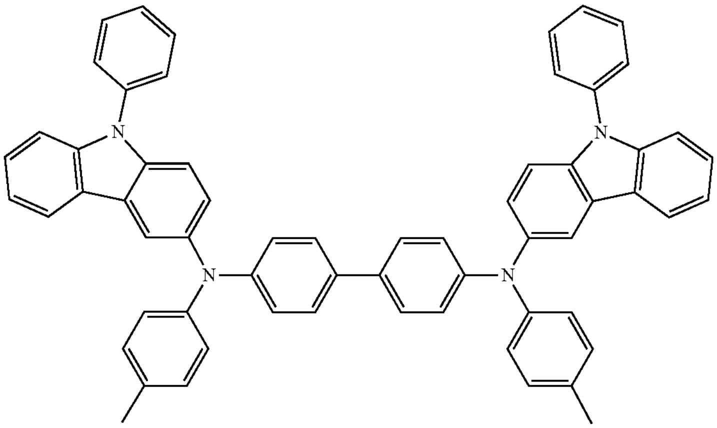
HT30
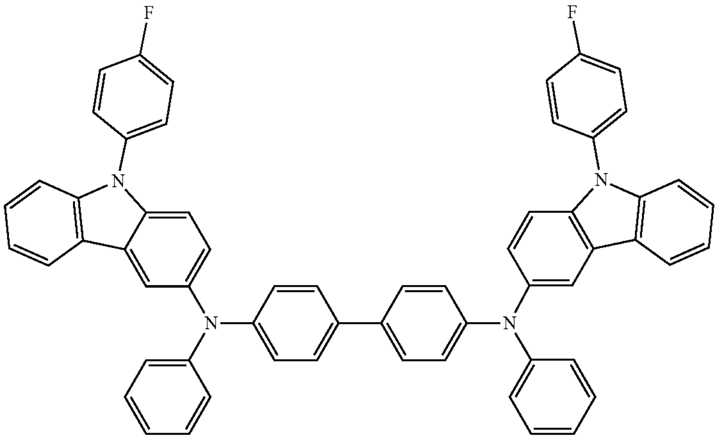
HT31
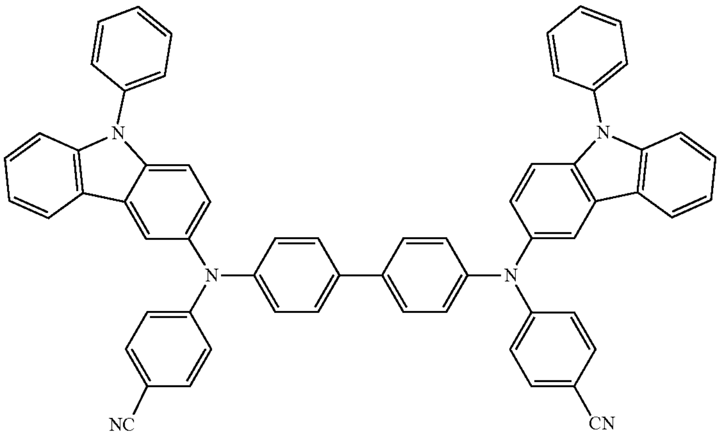

-continued
HT32
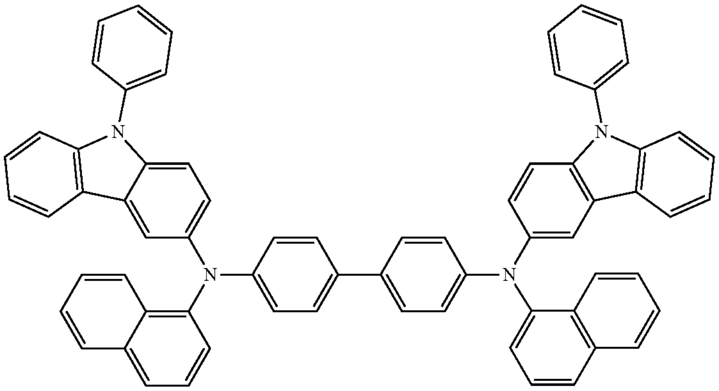
HT33
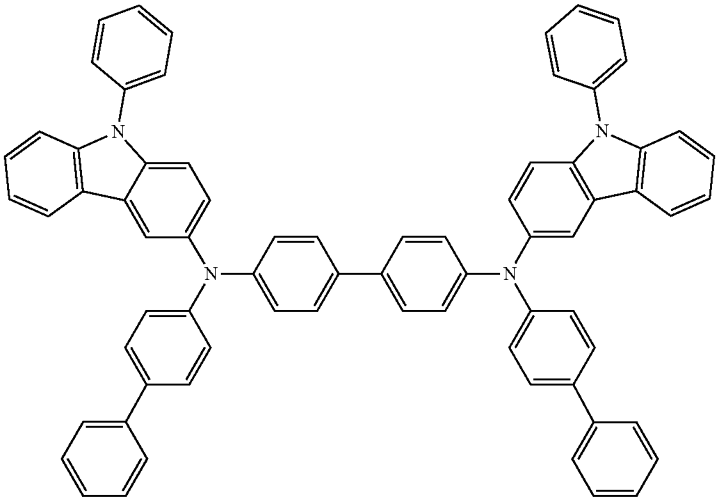
HT34
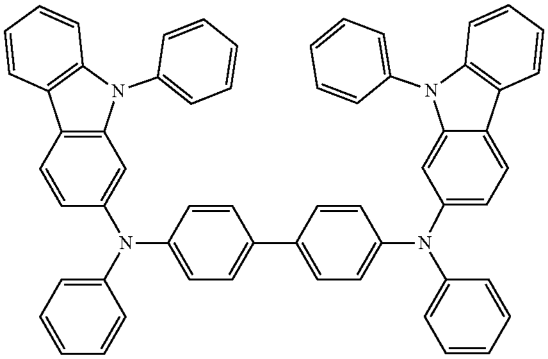

-continued
HT35
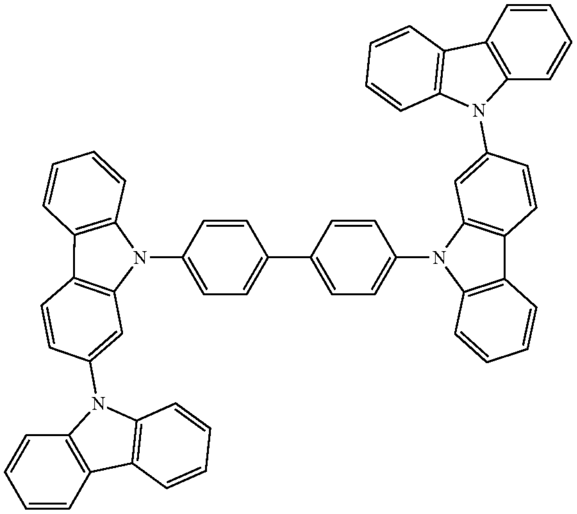
HT36
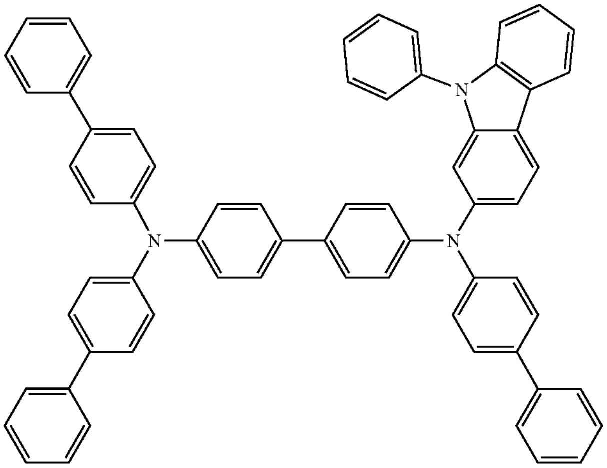
HT37
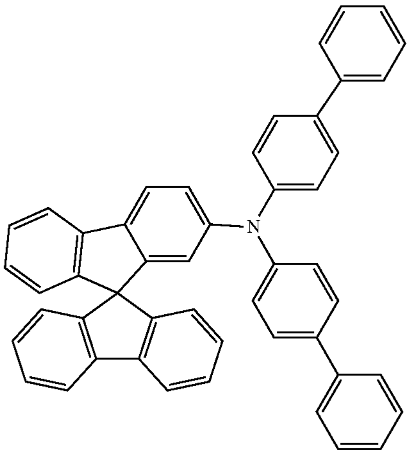

-continued
HT38
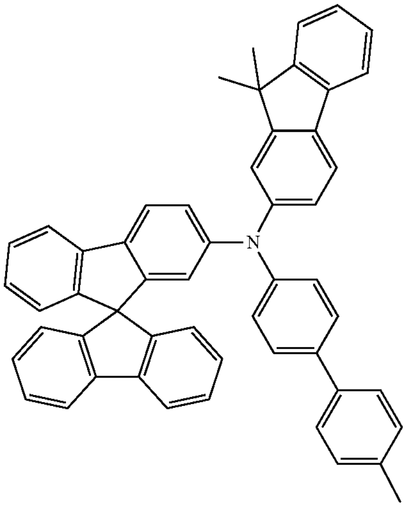
HT39
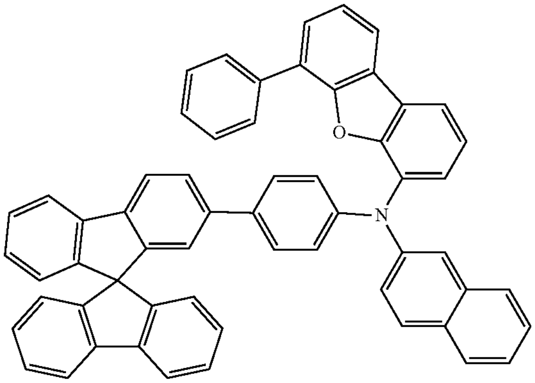
HT40
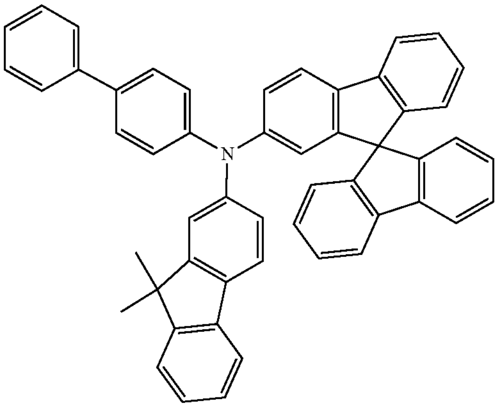

-continued
HT41
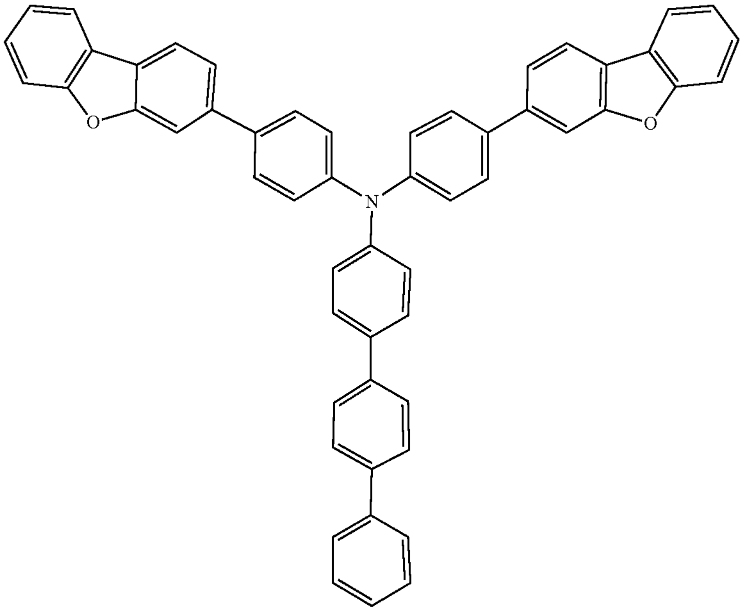
HT42
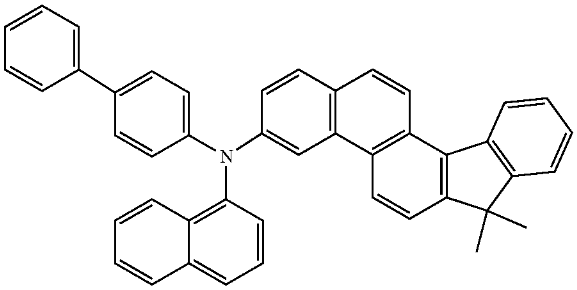
HT43
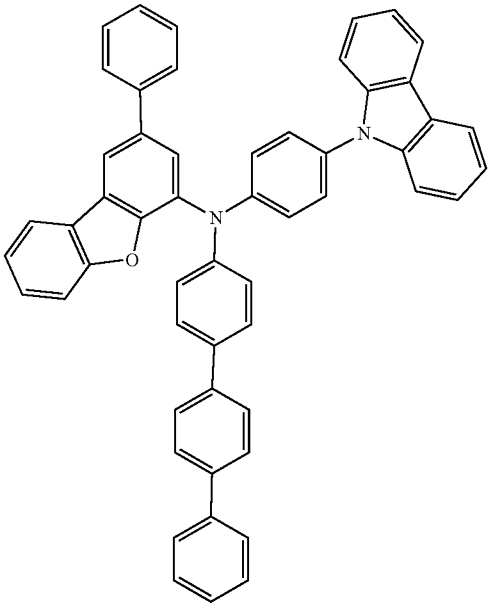

-continued
HT44
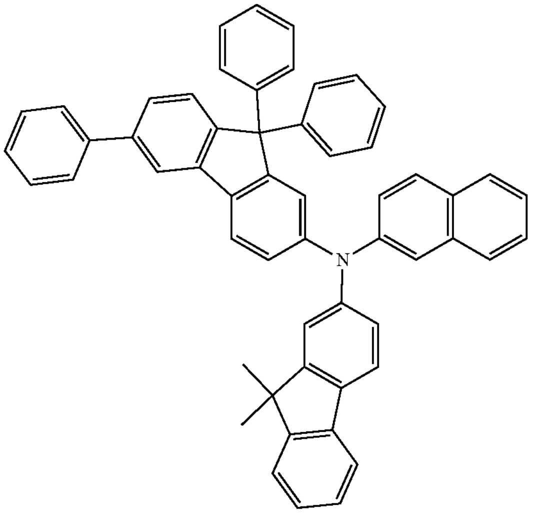
HT45
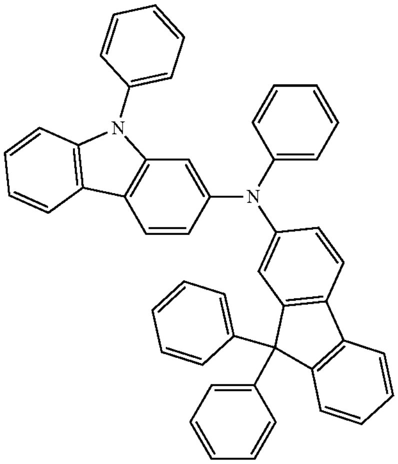
HT46
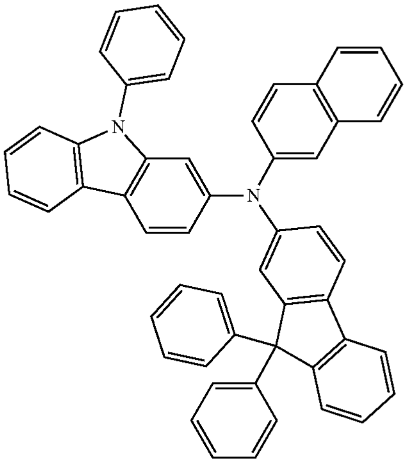

-continued
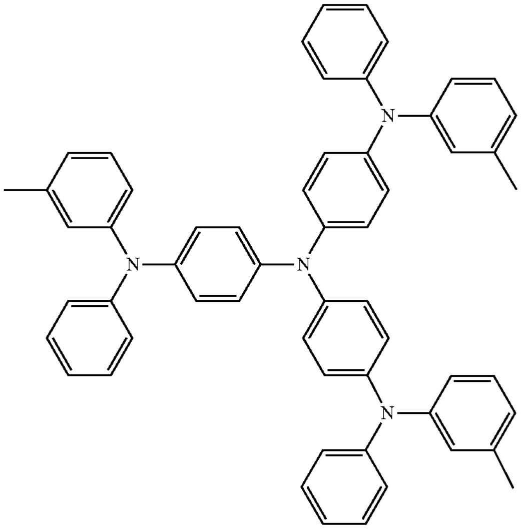
m-MTDATA
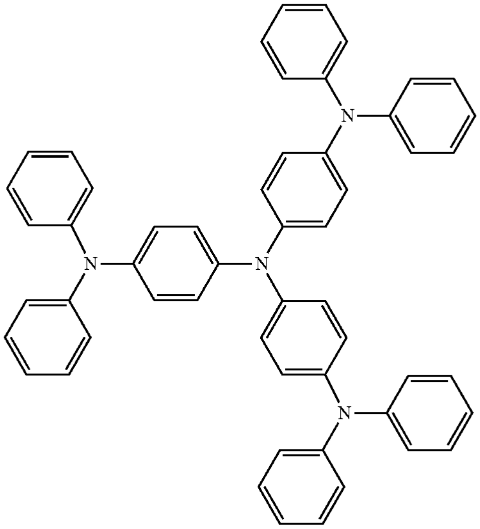
TDATA

-continued
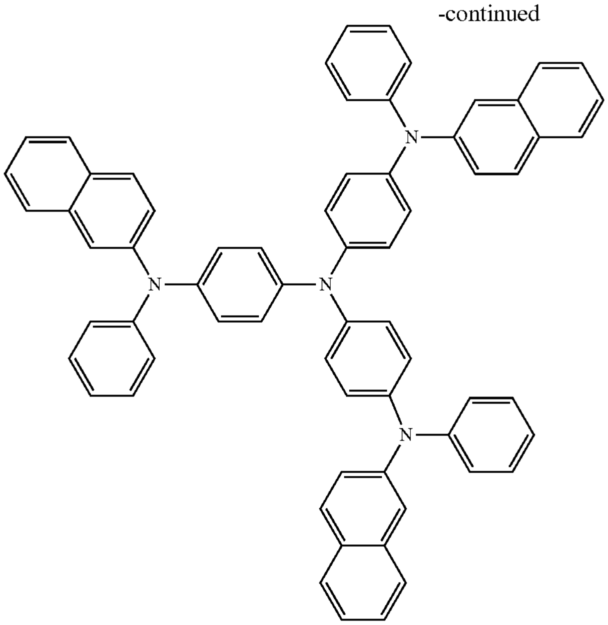
2-TNATA
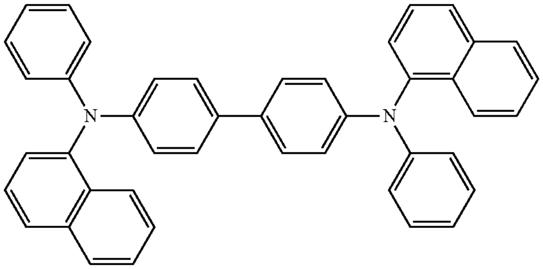
NPB
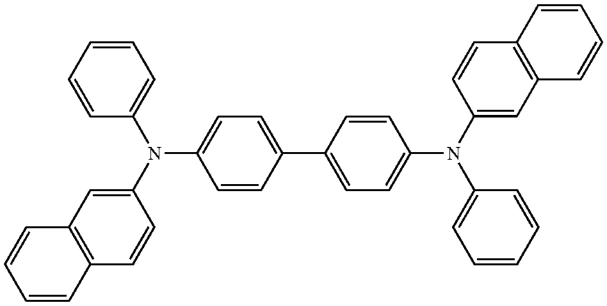
β-NPB
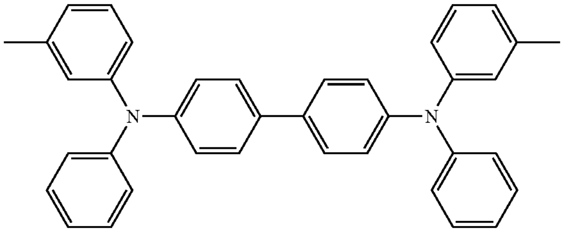
TPD -continued

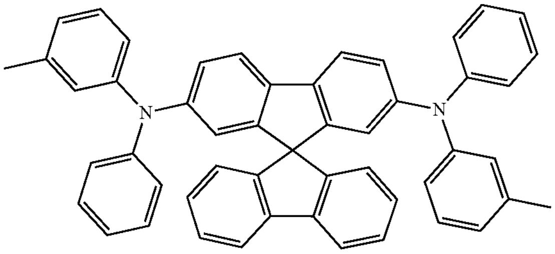

Spiro-TPD

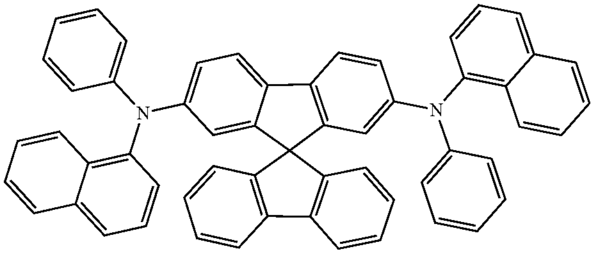

Spiro-NPB

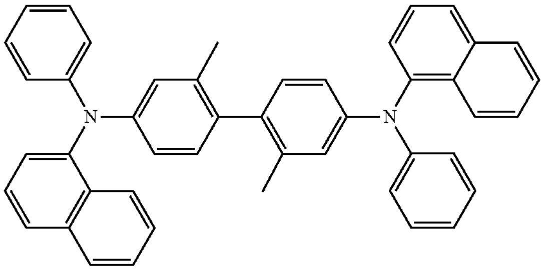

methylated-NPB

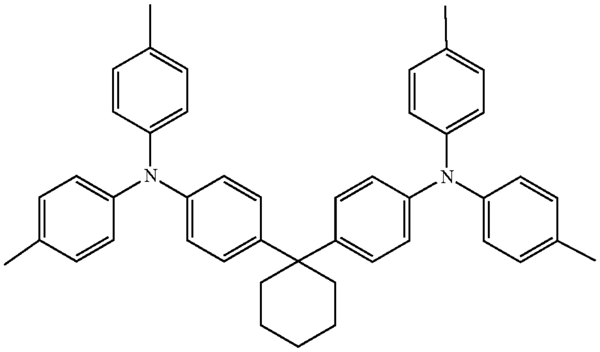

TAPC

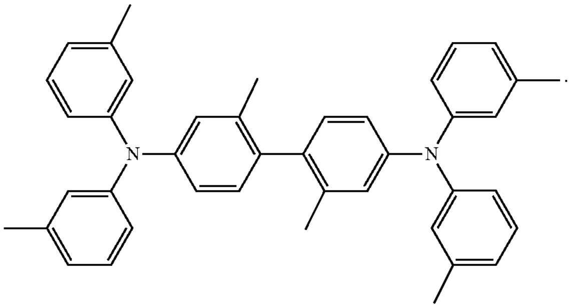

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or a combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light emission efficiency by compensating for an optical resonance distance according to a wavelength of light emitted by an emission layer, and the electron blocking layer may block the leakage of electrons from an emission layer to a hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, a lowest unoccupied molecular orbital (LUMO) energy level of the p-dopant may be less than or equal to about −3.5 eV.

In embodiments, the p-dopant may include a quinone derivative, a cyano group-containing compound, a compound including element EL1 and element EL2, or a combination thereof.

Examples of a quinone derivative may include TCNQ, F4-TCNQ, etc.

Examples of a cyano group-containing compound may include HAT-CN and a compound represented by Formula 221:

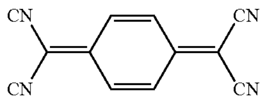

TCNQ

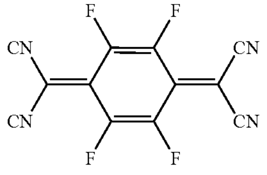

F4-TCNQ

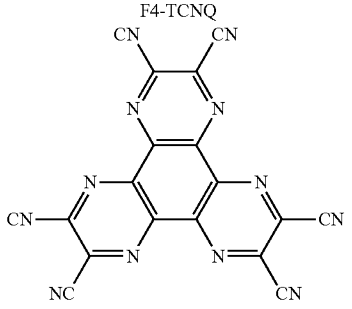

HAT-CN

-continued

[Formula 221]

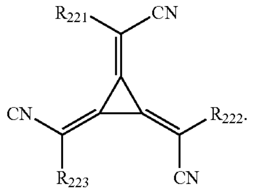

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —$C_1$; —Br; —I; a $C_1$-$C_{20}$ alkyl group substituted with a cyano group, —F, —Cl, —Br, —I, or a combination thereof; or a combination thereof.

In the compound including element EL1 and element EL2, element EL1 may be a metal, a metalloid, or a combination thereof, and element EL2 may be a non-metal, a metalloid, or a combination thereof.

Examples of a metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of a metalloid may include silicon (Si), antimony (Sb), and tellurium (Te).

Examples of a non-metal may include oxygen (O) and a halogen (for example, F, Cl, Br, I, etc.).

Examples of a compound including element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or a combination thereof.

Examples of a metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $MO_2O_5$, etc.), and a rhenium oxide (for example, $ReO_3$, etc.).

Examples of a metal halide may include an alkali metal halide, an alkaline earth metal halide, a transition metal halide, a post-transition metal halide, and a lanthanide metal halide.

Examples of an alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of an alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of a transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $Cr_{13}$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $Tc_{12}$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $COCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdC_{12}$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of a post-transition metal halide may include a zinc halide (for example, $ZnF_2$, $ZnCl_2$, $ZnBr_2$, $Zn_{12}$, etc.), an indium halide (for example, $InI_3$, etc.), and a tin halide (for example, $SnI_2$, etc.).

Examples of a lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, $SmI_3$, and the like.

Examples of a metalloid halide may include an antimony halide (for example, $SbCl_5$, etc.).

Examples of a metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a subpixel. In embodiments, the emission layer may have a stacked structure of two or more layers of a red emission layer, a green emission layer, and a blue emission layer, in which the two or more layers may contact each other or may be separated from each other to emit white light. In embodiments, the emission layer may include two or more materials of a red light-emitting material, a green light-emitting material, and a blue light-emitting material, in which the two or more materials may be mixed with each other in a single layer to emit white light.

In an embodiment, the emission layer may include a host and a dopant (or an emitter). In an embodiment, the emission layer may further include an auxiliary dopant that promotes energy transfer to a dopant (or an emitter), in addition to the host and the dopant (or the emitter). When the emission layer includes the dopant (or the emitter) and the auxiliary dopant, the dopant (or the emitter) and the auxiliary dopant are different from each other.

The organometallic compound represented by Formula 1 may serve as a dopant (or as an emitter), or may serve as an auxiliary dopant.

An amount of the dopant (or the emitter) in the emission layer may be in a range of about 0.01 parts by weight to about 15 parts by weight, based on 100 parts by weight of the host.

The emission layer may include the organometallic compound represented by Formula 1. An amount of the organometallic compound in the emission layer may be in a range of about 0.01 parts by weight to about 30 parts by weight, based on 100 parts by weight of the host. For example, an amount of the organometallic compound in the emission layer may be in a range of about 0.1 parts by weight to about 20 parts by weight, based on 100 parts by weight of the host. For example, an amount of the organometallic compound in the emission layer may be in a range of about 0.1 parts by weight to about 15 parts by weight, based on 100 parts by weight of the host.

A thickness of the emission layer may be in a range of about 100 Å to about 1,000 Å. For example, the thickness of the emission layer may be in a range of about 200 Å to about 600 Å. When the thickness of the emission layer is within any of these ranges, excellent light-emission characteristics may be obtained without a substantial increase in driving voltage.

[Host]

The host in the emission layer may include the second compound, the third compound, or a combination thereof.

In an embodiment, the host may include a compound represented by Formula 301:

$$[Ar_{301}]_{xb11}-[(L_{301})_{xb1}-R_{301}]_{xb21} \quad \text{[Formula 301]}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ are each independently the same as described in connection with $Q_1$.

In an embodiment, in Formula 301, when xb11 is 2 or more, two or more of $Ar_{301}$(s) may be linked to each other via a single bond.

In embodiments, the host may include a compound represented by Formula 301-1, a compound represented by Formula 301-2, or a combination thereof:

[Formula 301-1]

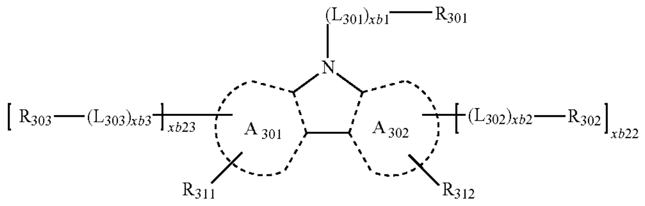

[Formula 301-2]

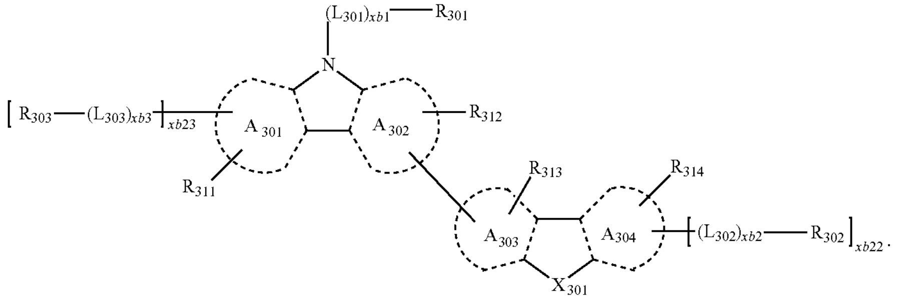

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ are each the same as described herein, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are each independently the same as described in connection with $R_{301}$.

In embodiments, the host may include an alkali earth metal complex, a post-transition metal complex, or a combination thereof. For example, the host may include a Be complex (for example, Compound H55), an Mg complex, a Zn complex, or a combination thereof.

In embodiments, the host may include one of Compounds H1 to H130, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or a combination thereof:

H1

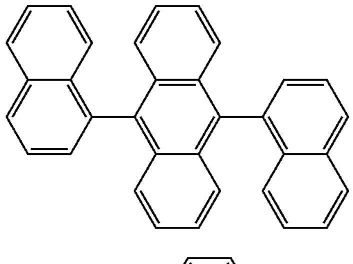

H2

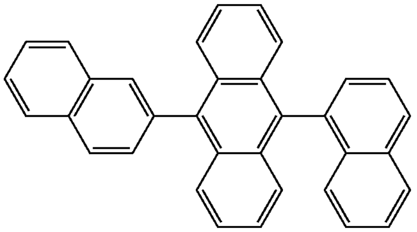

H3

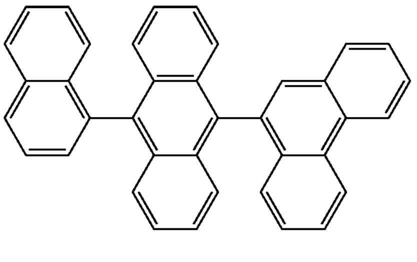

-continued
H4
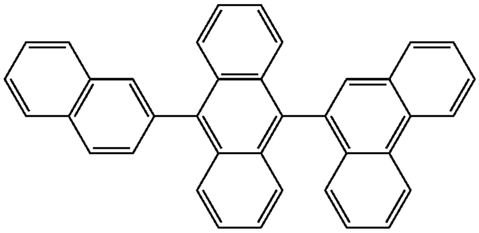
H5
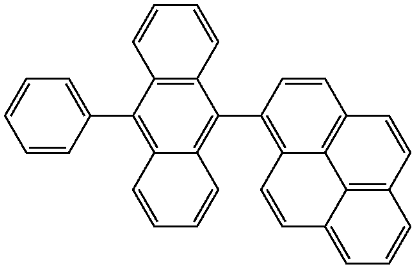
H6
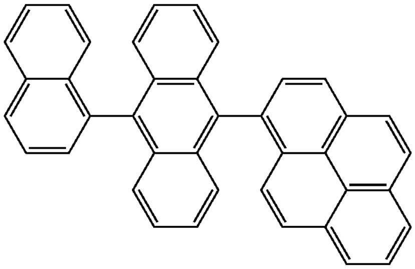
H7
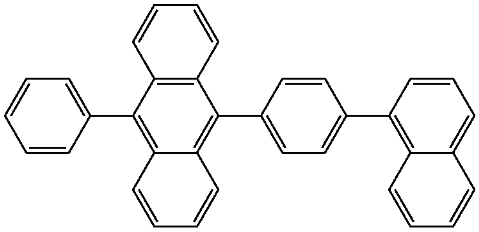
H8
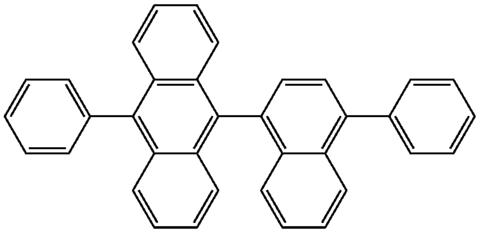
H9
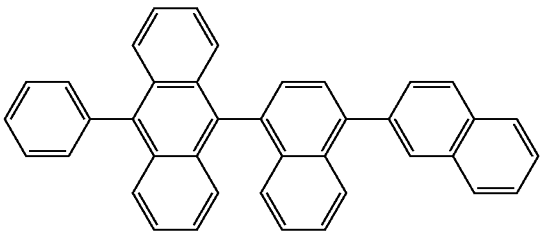
-continued
H10
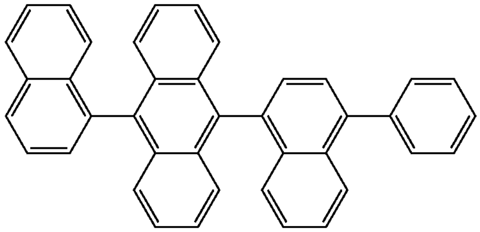
H11
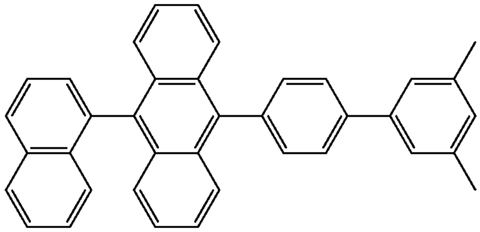
H12
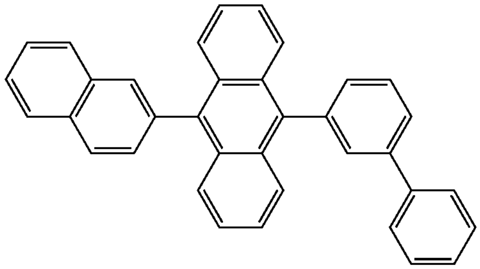
H13
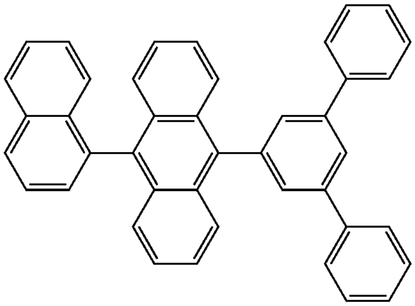
H14
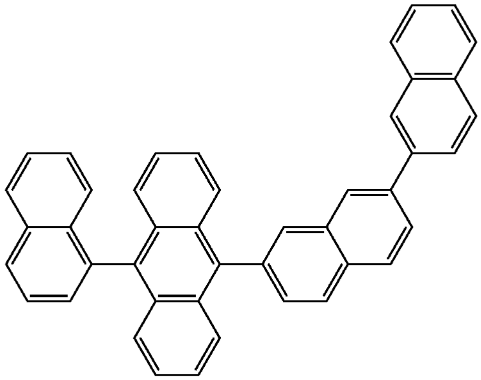

-continued
H15
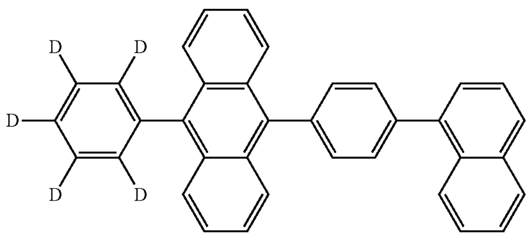
H16
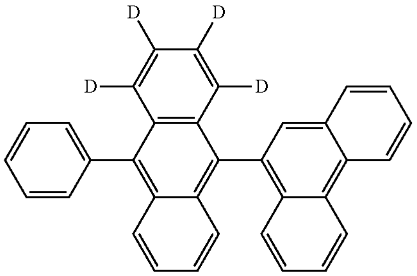
H17
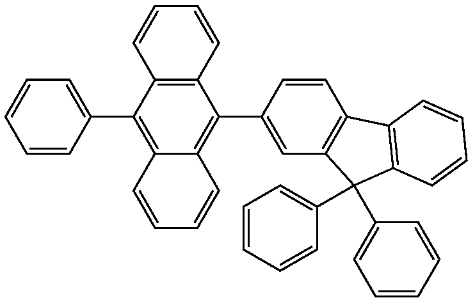
H18
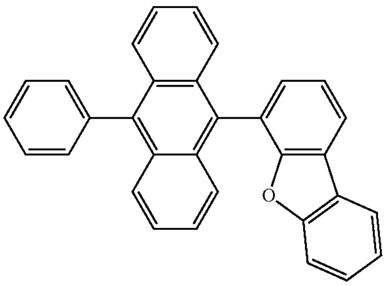
H19
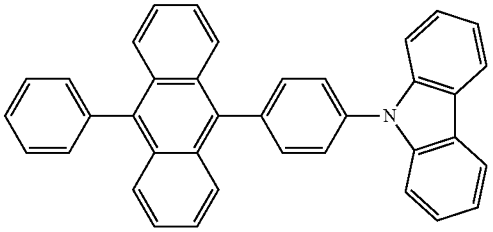
-continued
H20
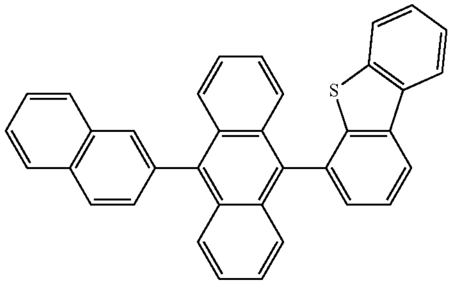
H21
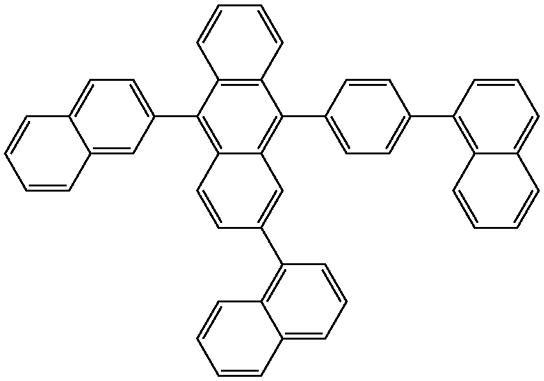
H22
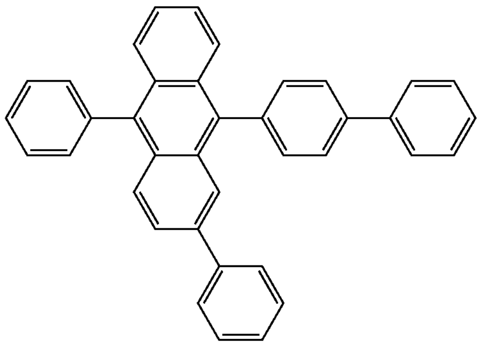
H23
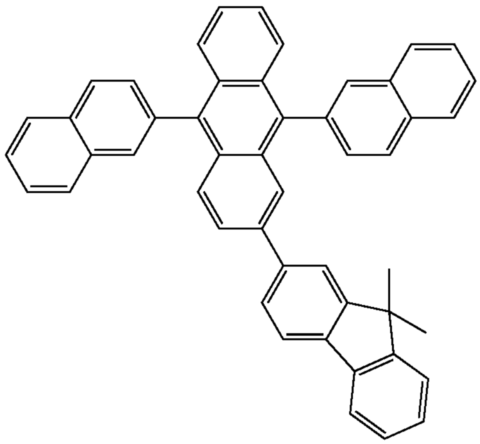

-continued
H24
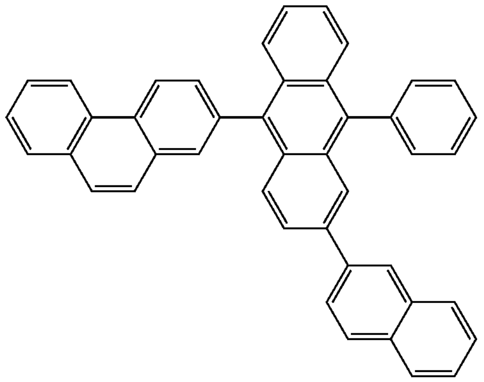
H25
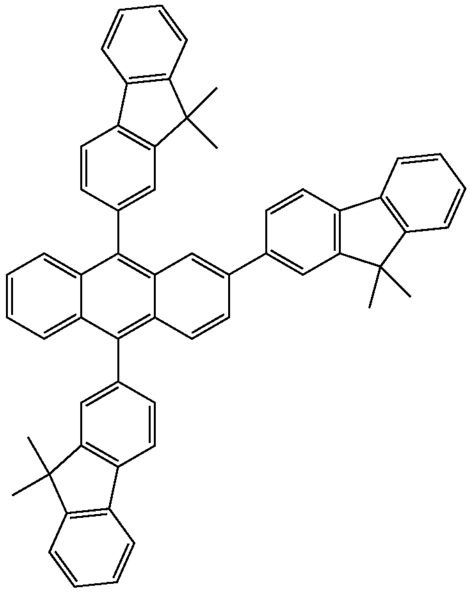
H26
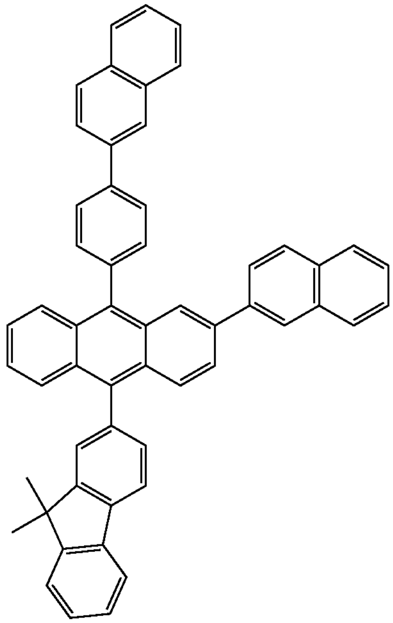
-continued
H27
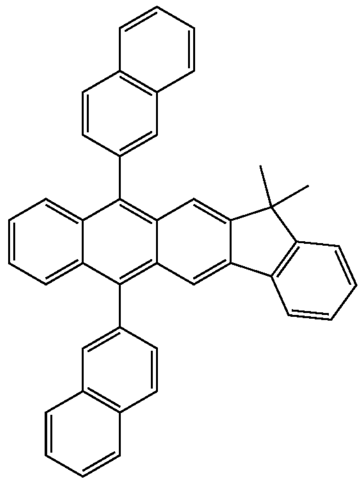
H28
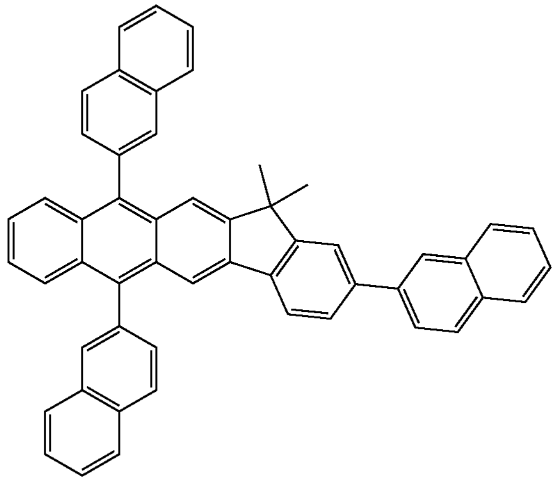
H29
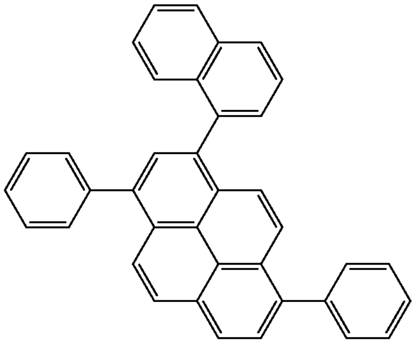

-continued
H30
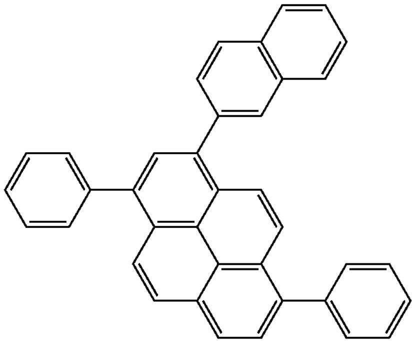
H30
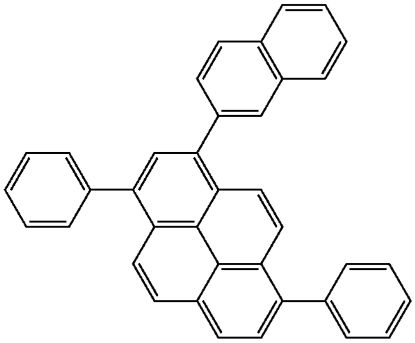
H31
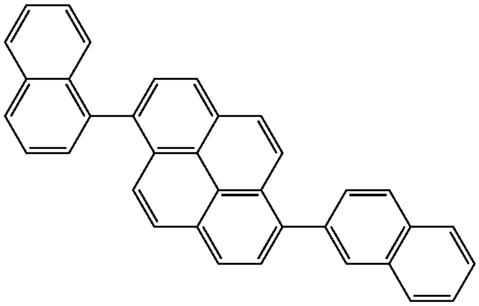
H32
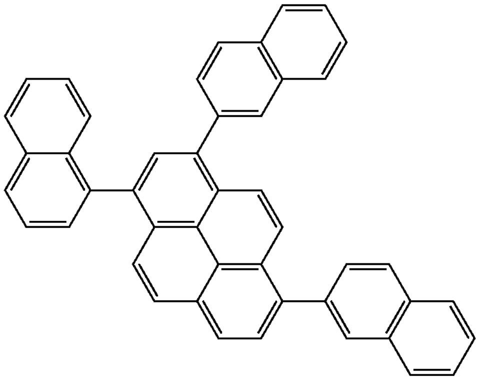
H33
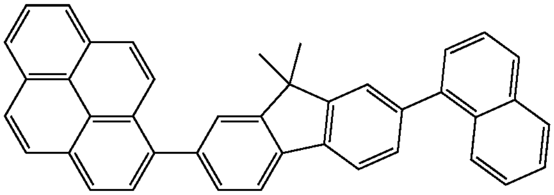
-continued
H34
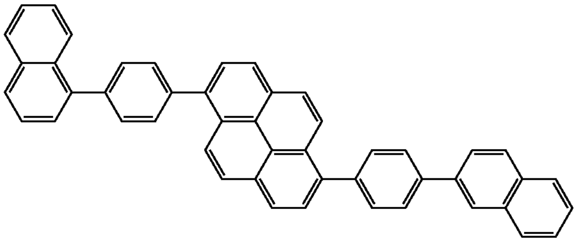
H35
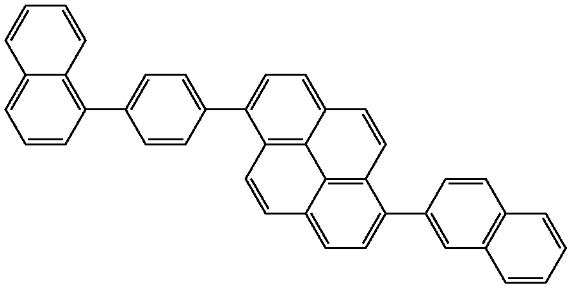
H36
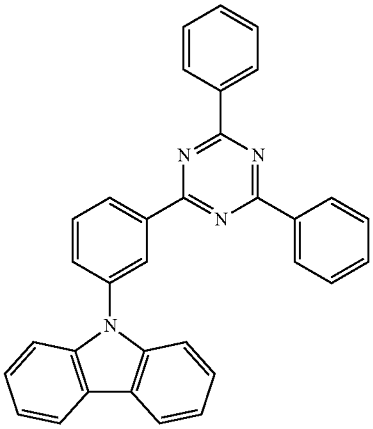
H37
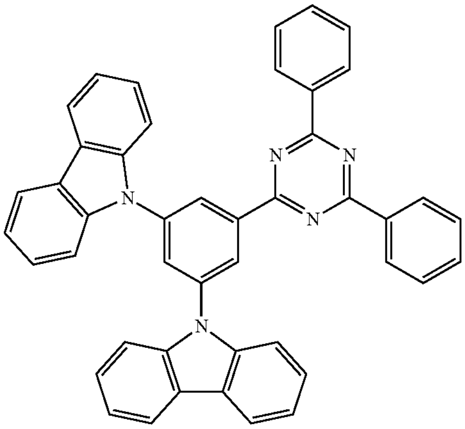

-continued
H38
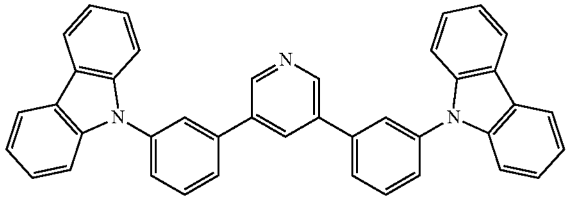
H39
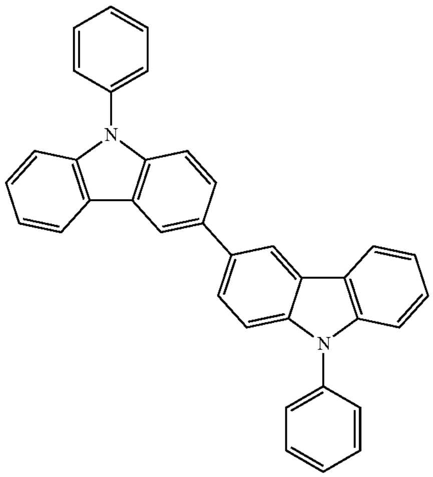
H40
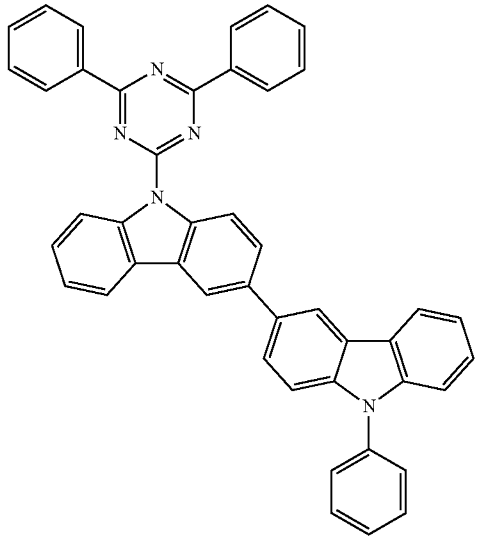
-continued
H41
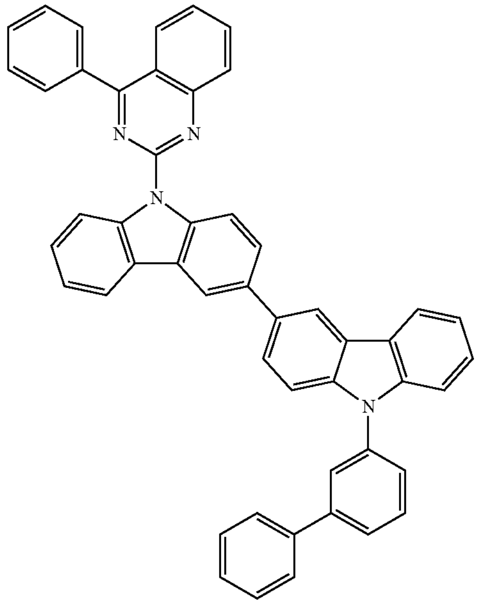
H42
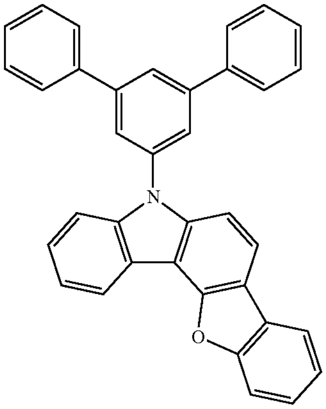
H43
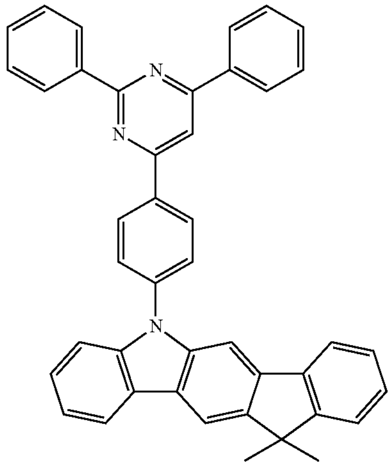

-continued
H44
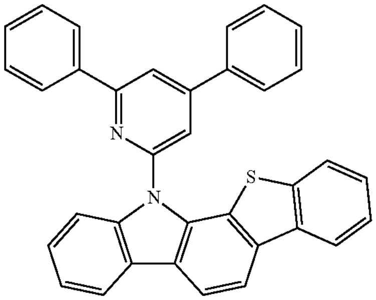
H45
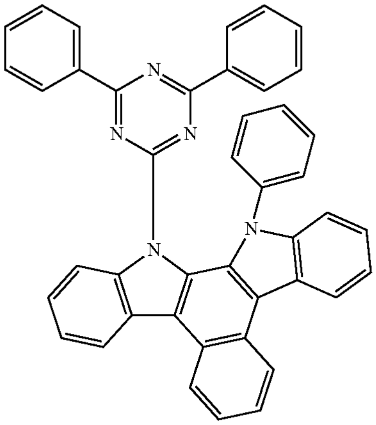
H46
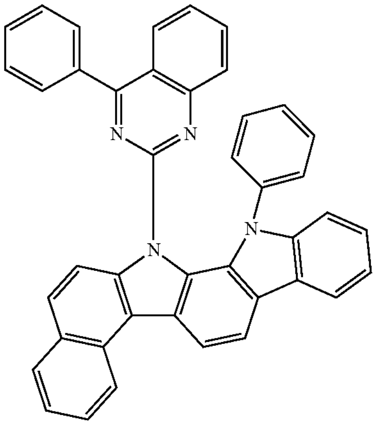
H47
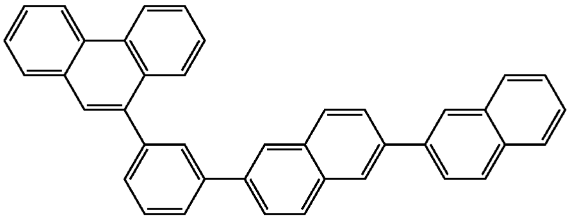
H48
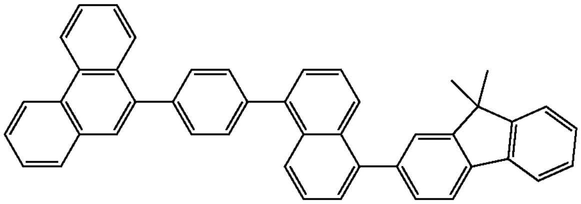
-continued
H49
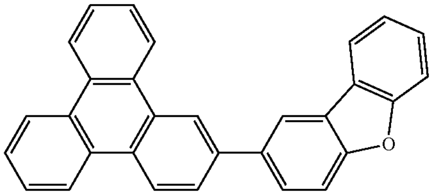
H50
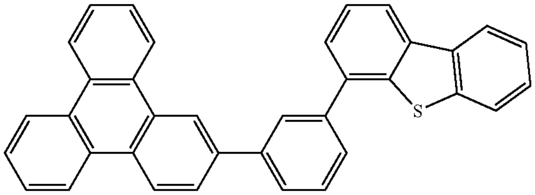
H51
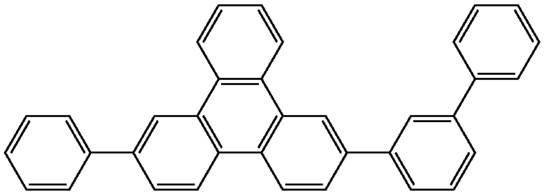
H52
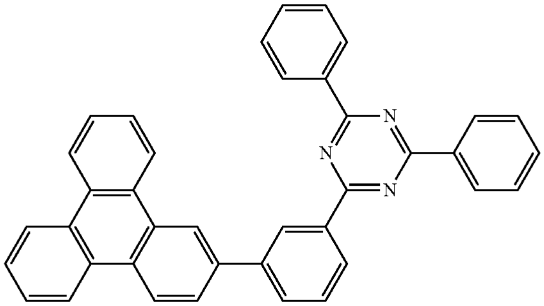
H53
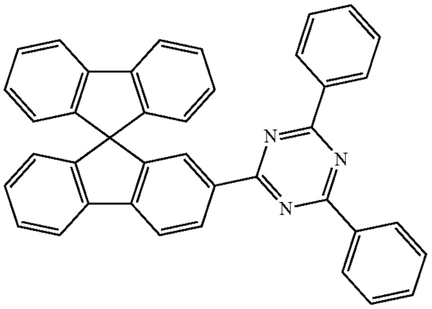

-continued
H54
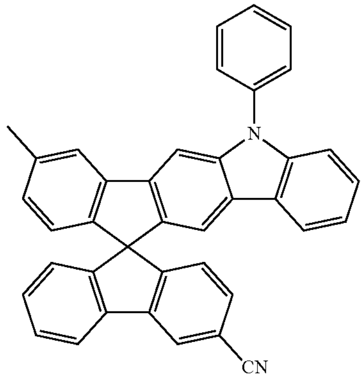
H55
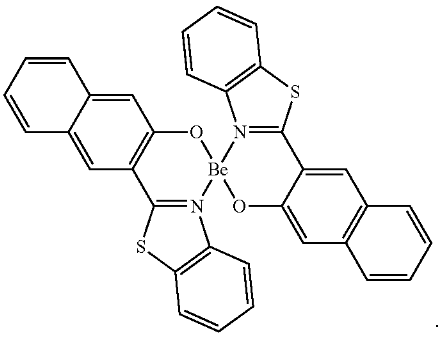
H56
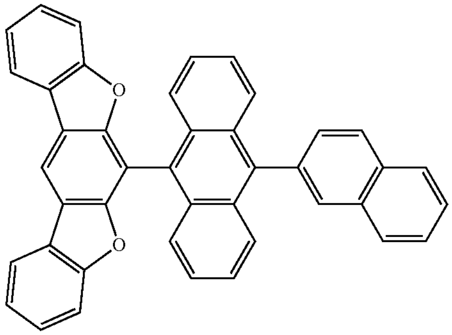
H57
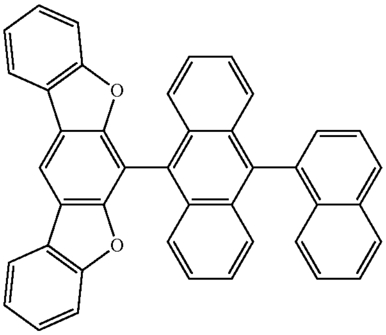
-continued
H58
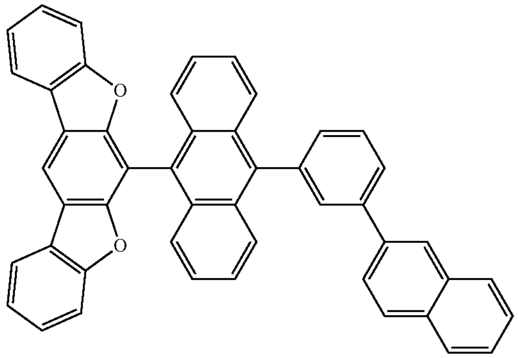
H59
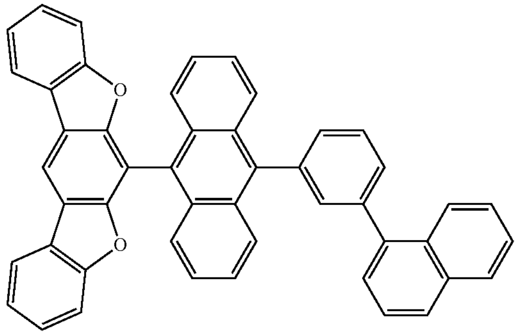
H60
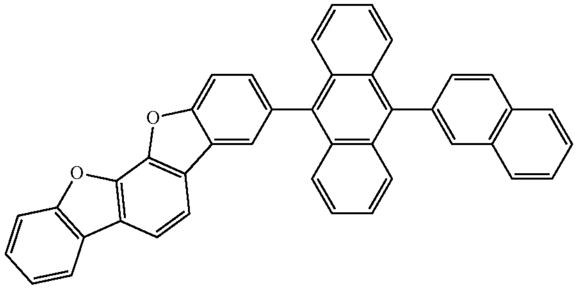
H61
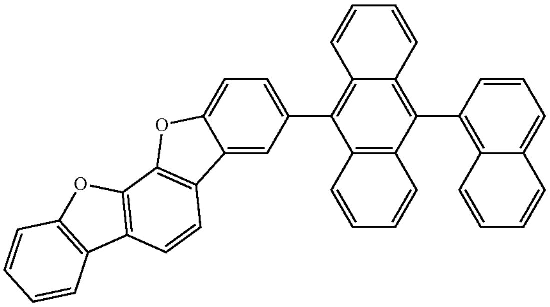

-continued
H62
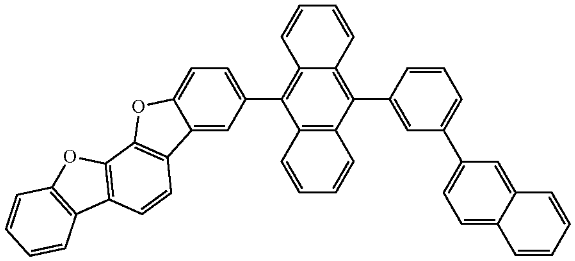
H63
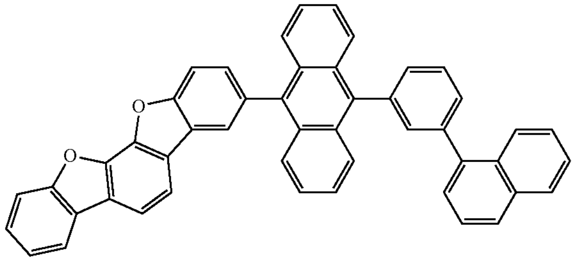
H64
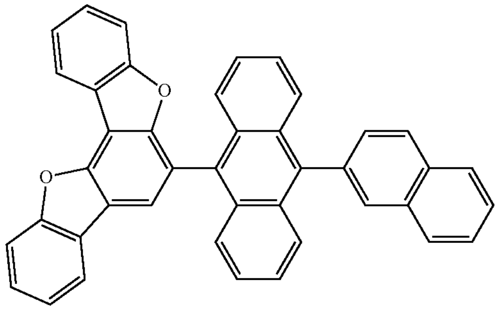
H65
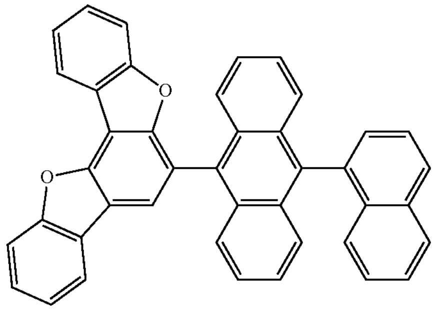
H66
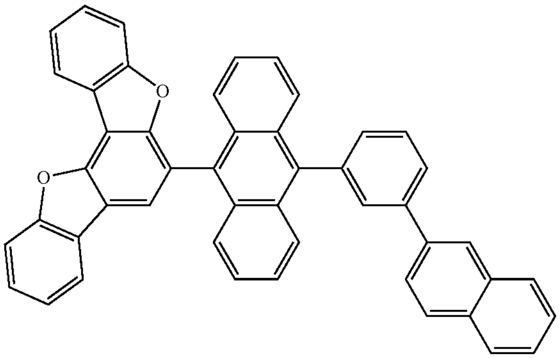
-continued
H67
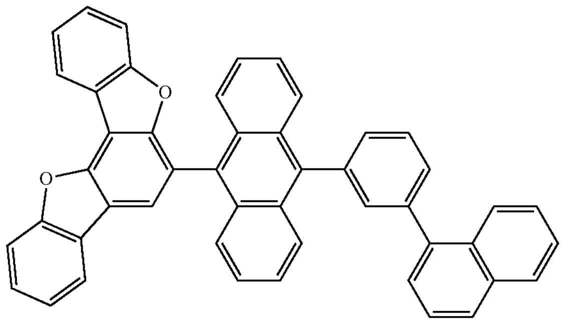
H68
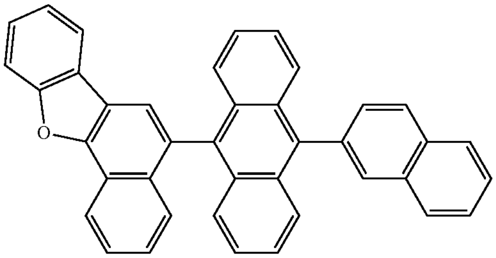
H69
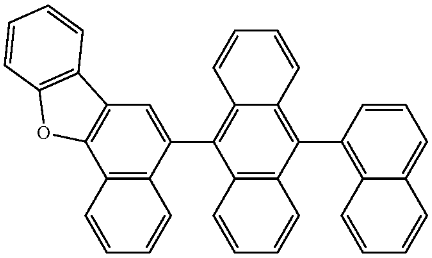
H70
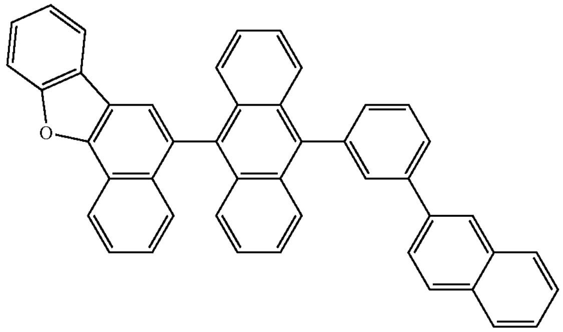
H71
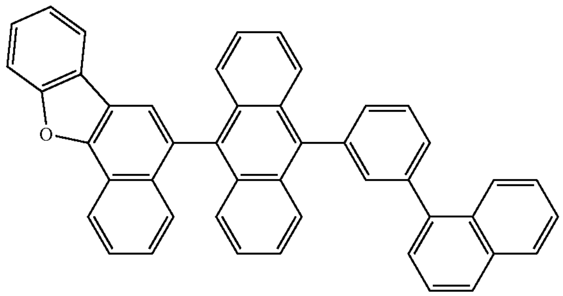

-continued
H72
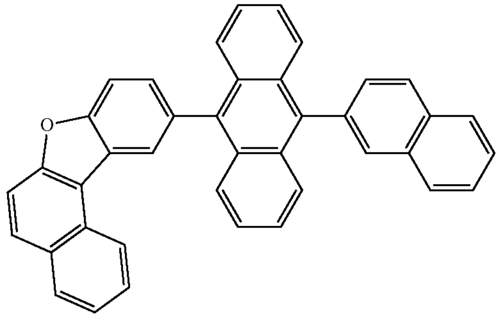
H73
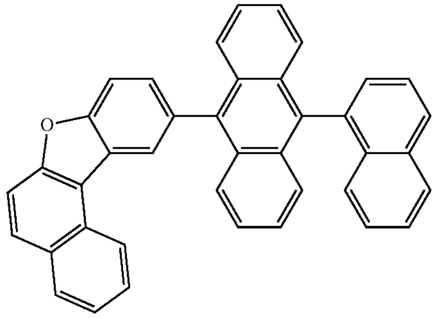
H74
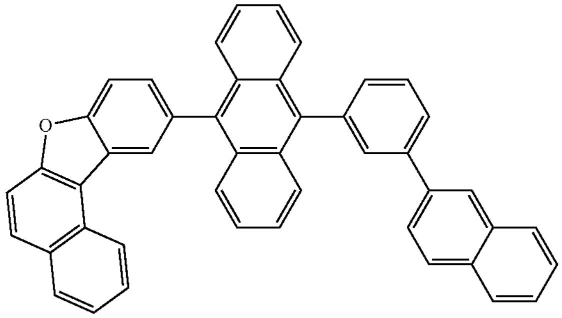
H75
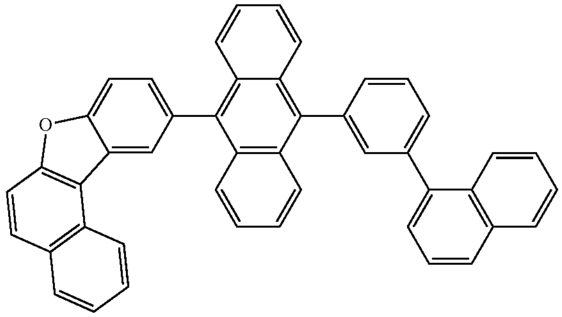
H76
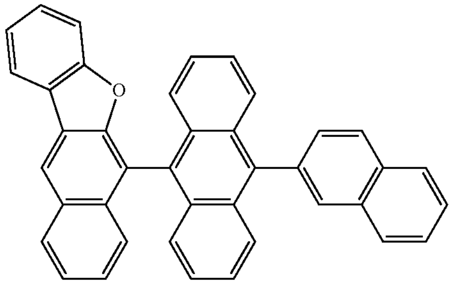
-continued
H77
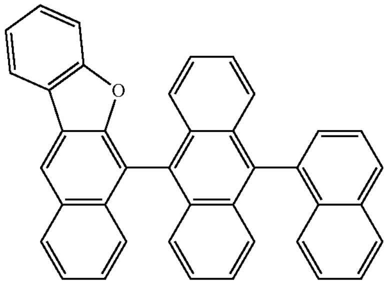
H78
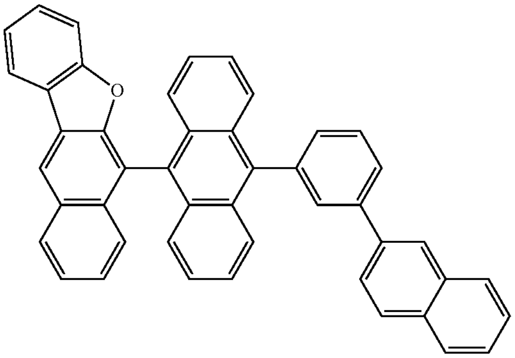
H79
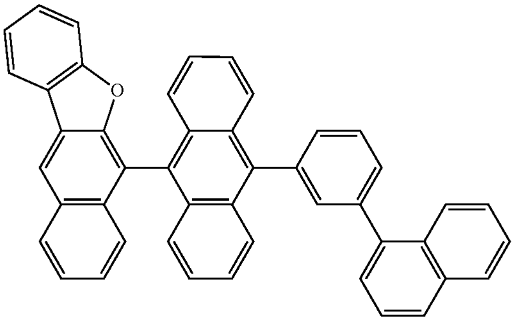
H80
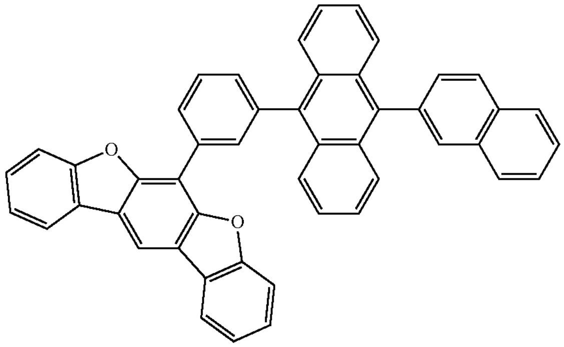

-continued
H81
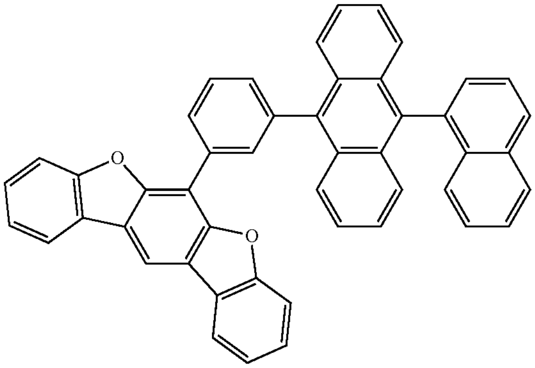
H82
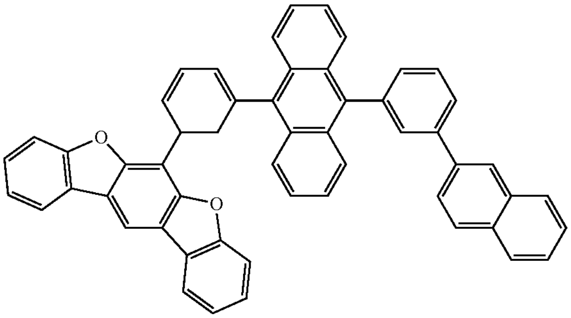
H83
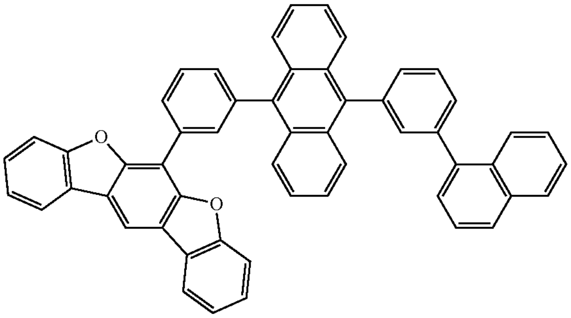
H84
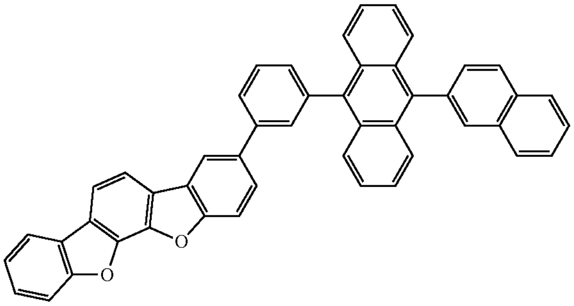
-continued
H85
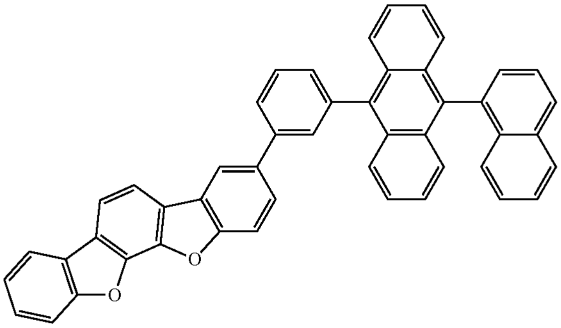
H86
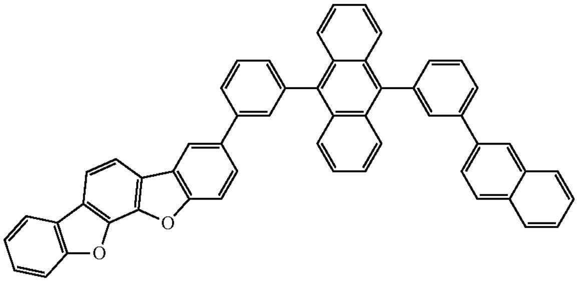
H87
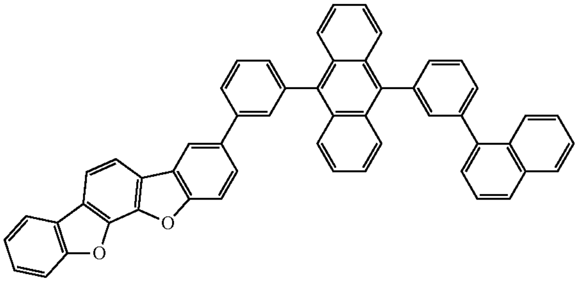
H88
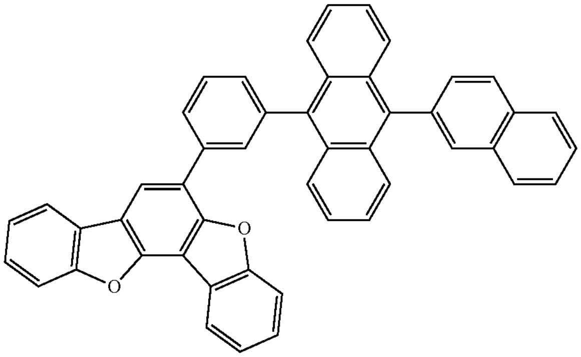

-continued
H89
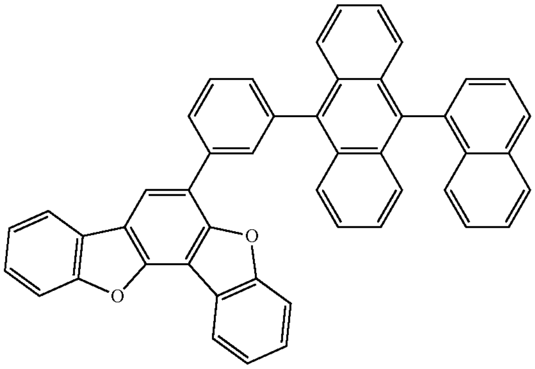
H90
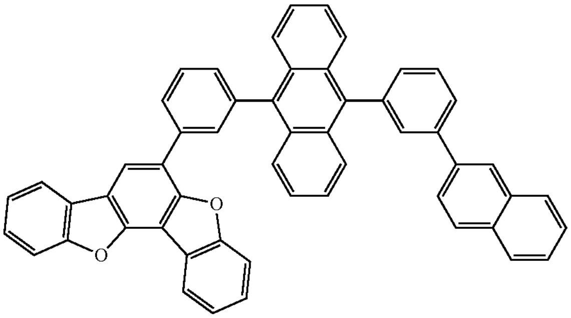
H91
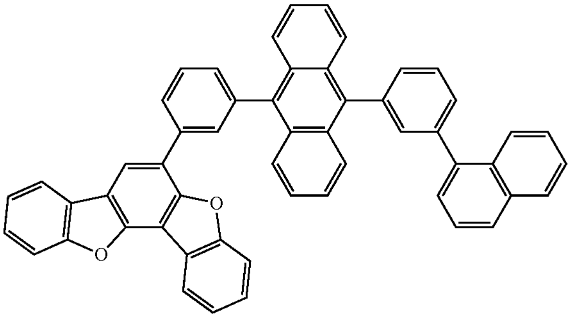
H92
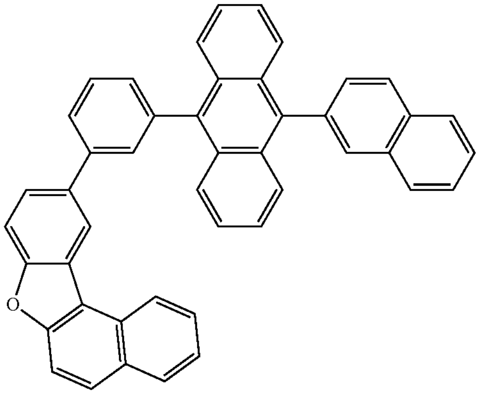
-continued
H93
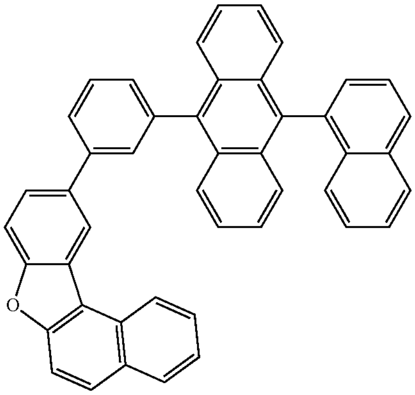
H94
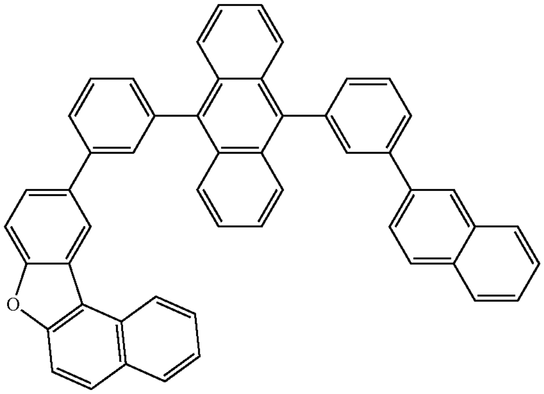
H95
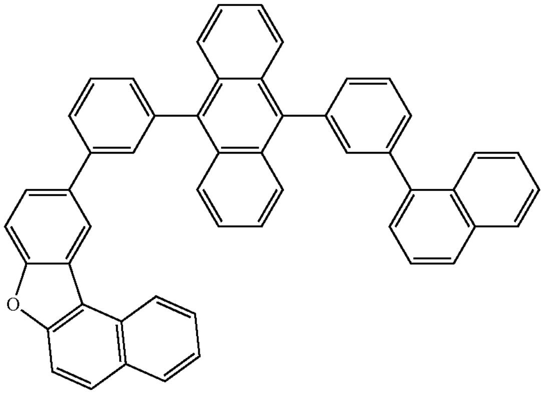
H96
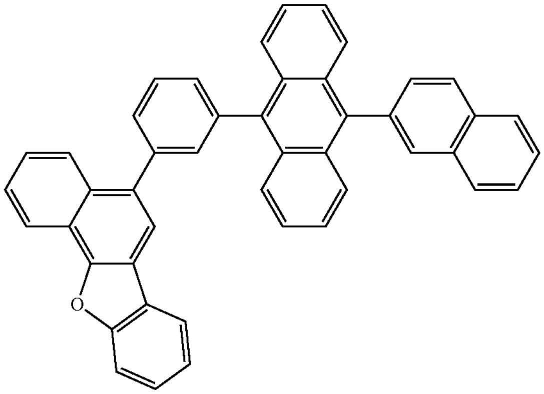

-continued
H97
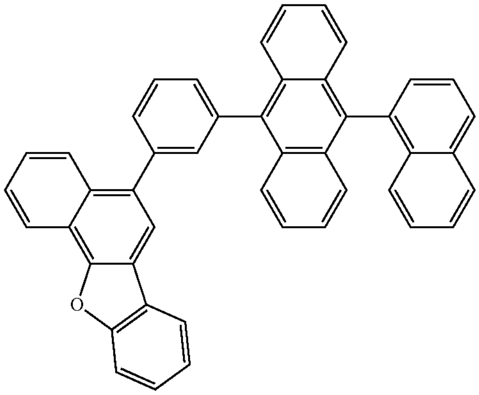
H98
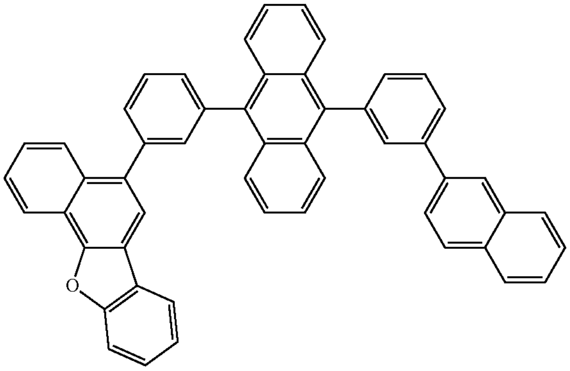
H99
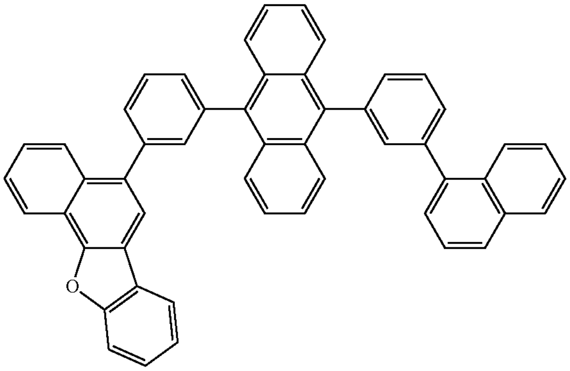
H100
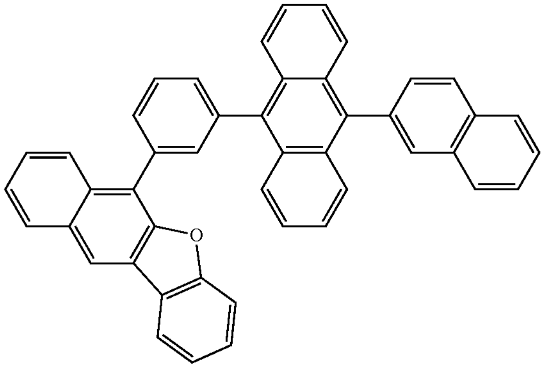
-continued
H101
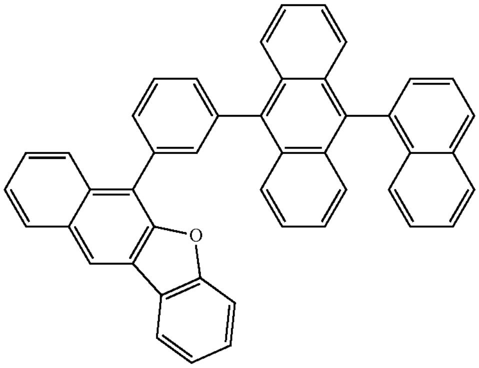
H102
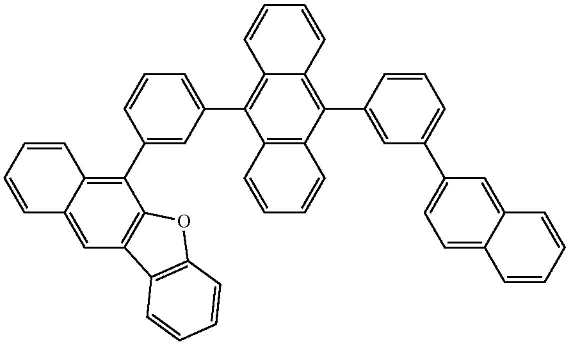
H103
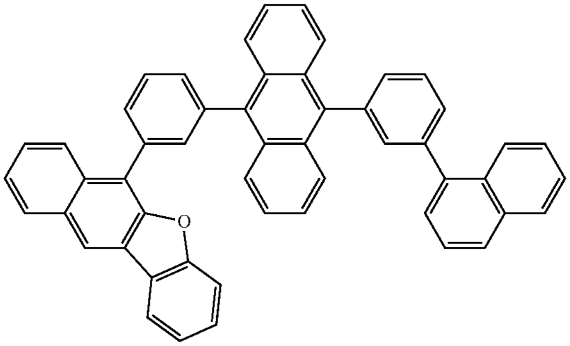
H104
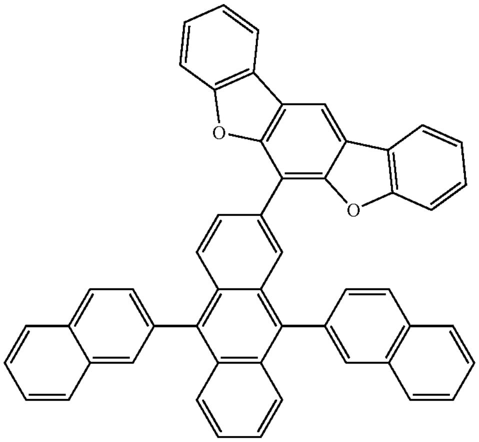

-continued
H105
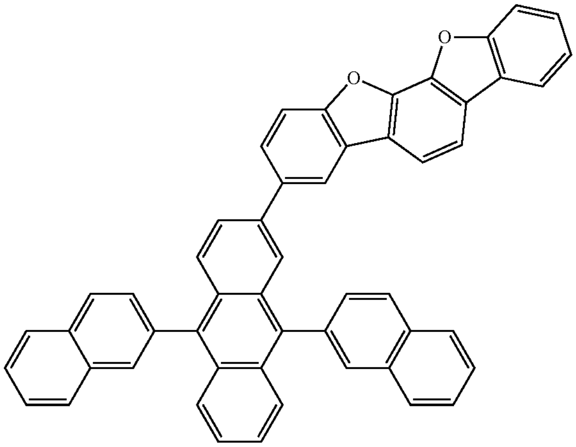
H106
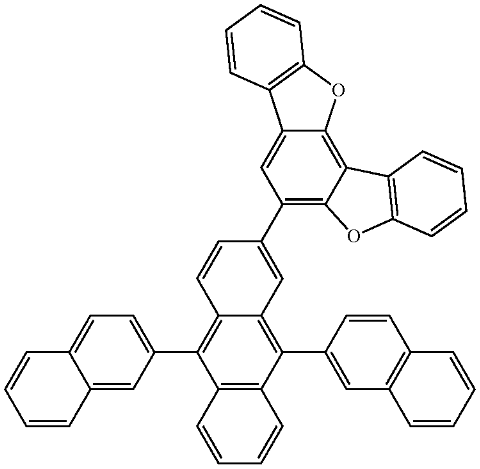
H107
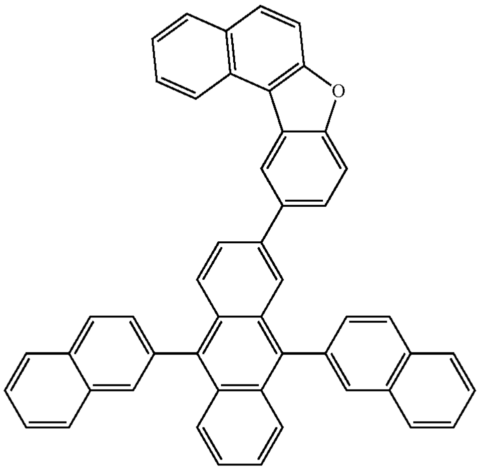
-continued
H108
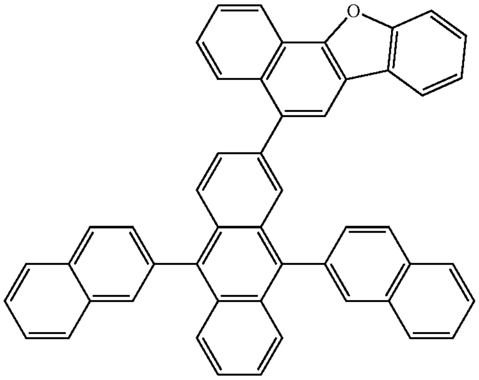
H109
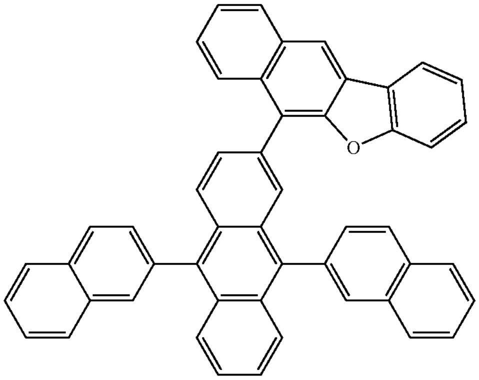
H110
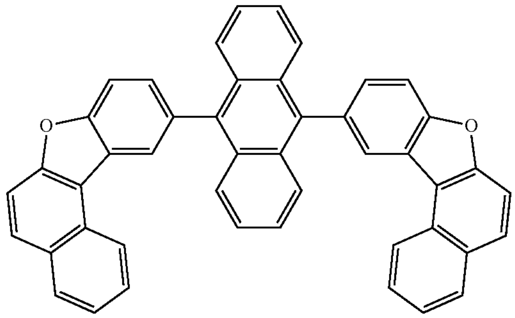
H111
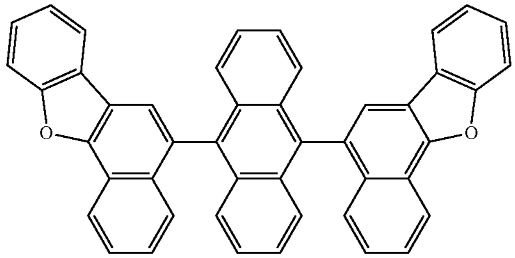
H112
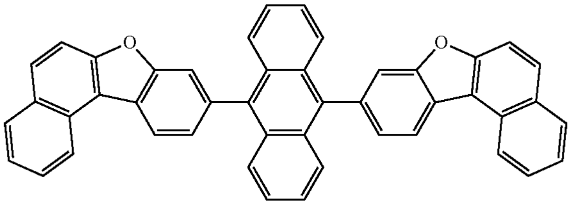

-continued
H113
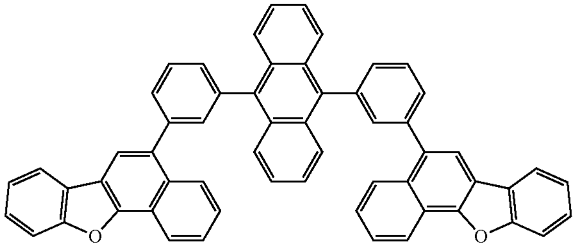
H114
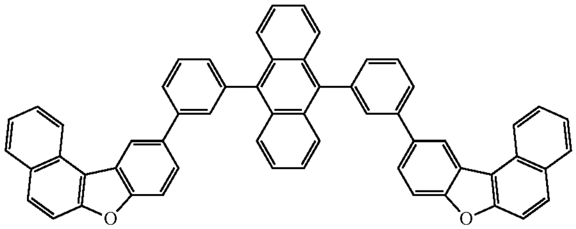
H115
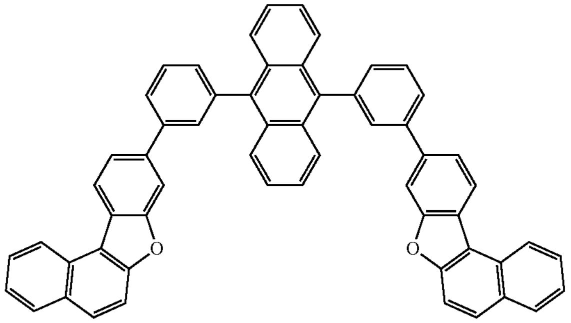
H116
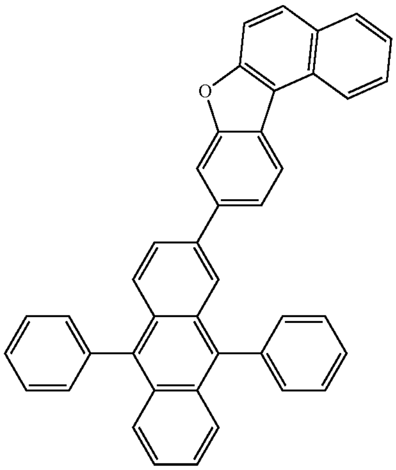
-continued
H117
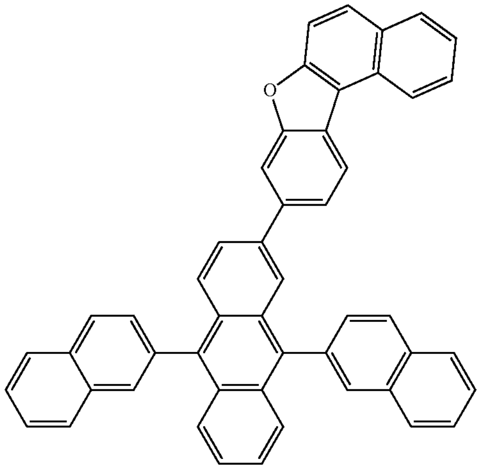
H118
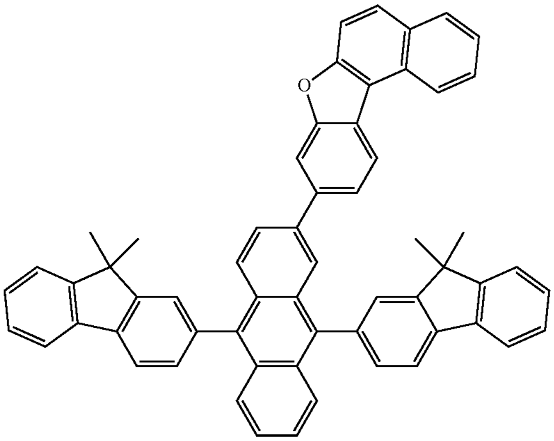
H119
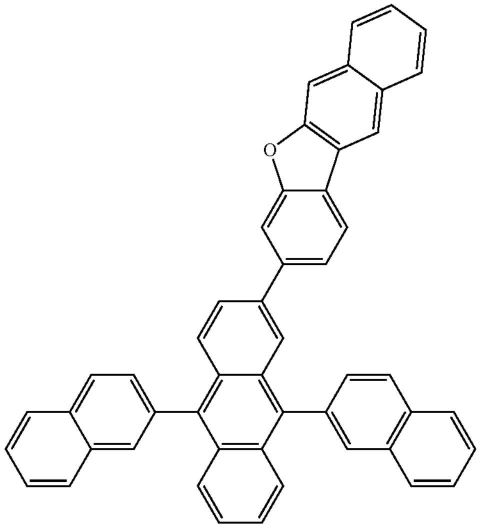

-continued
H120
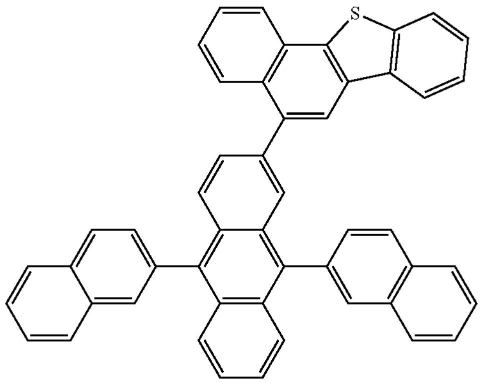
H121
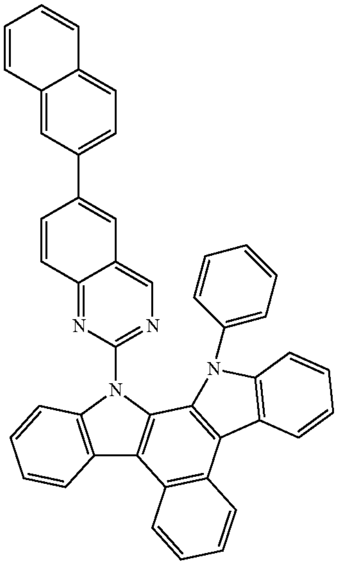
H122
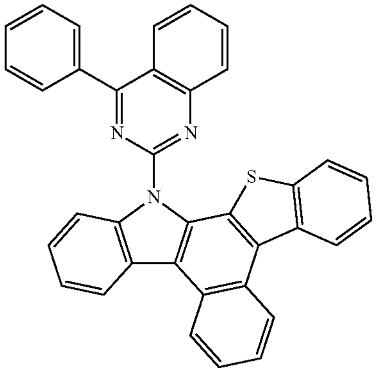
-continued
H123
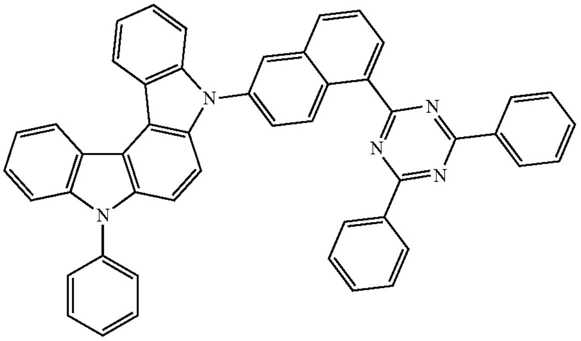
H124
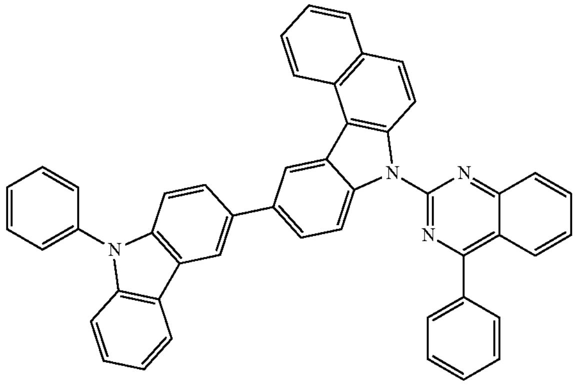
H125
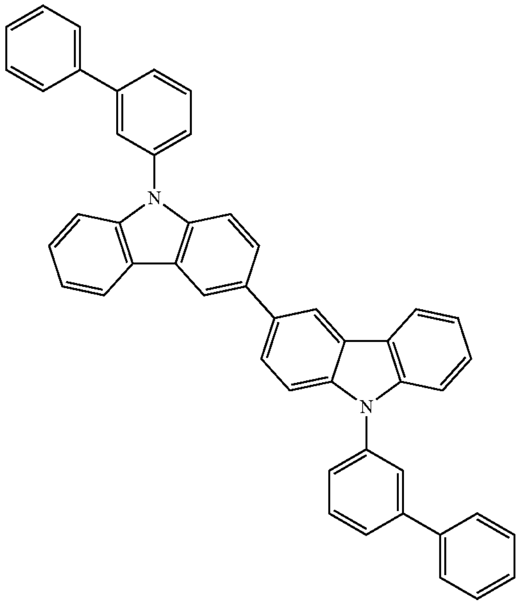

-continued

H126

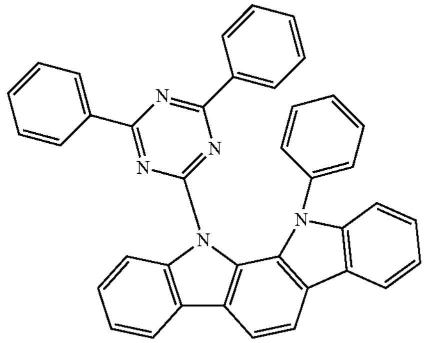

H127

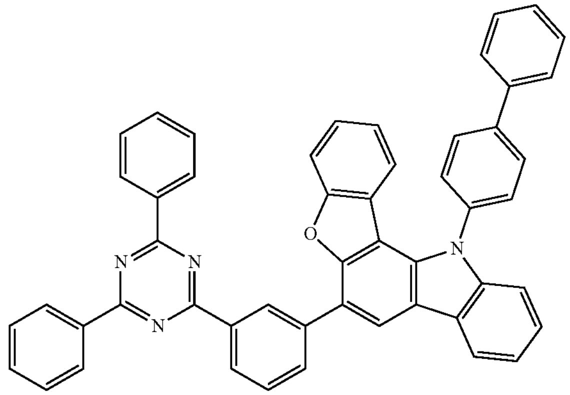

H128

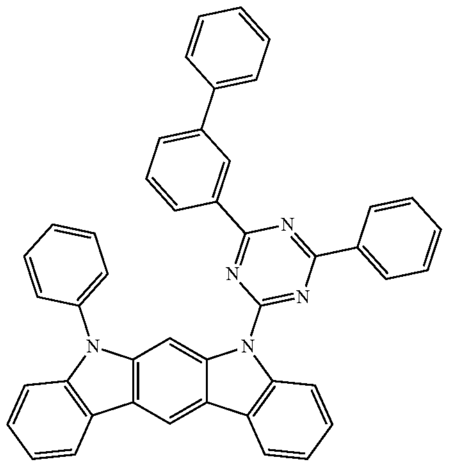

H129

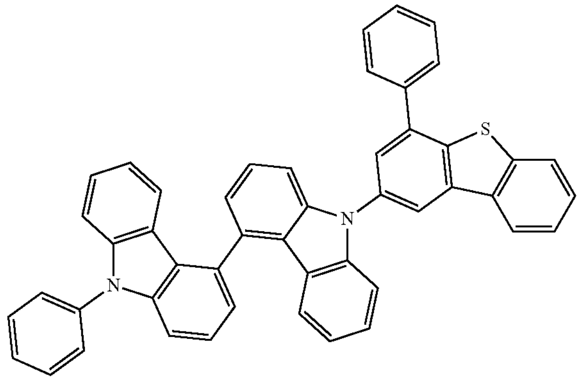

-continued

H130

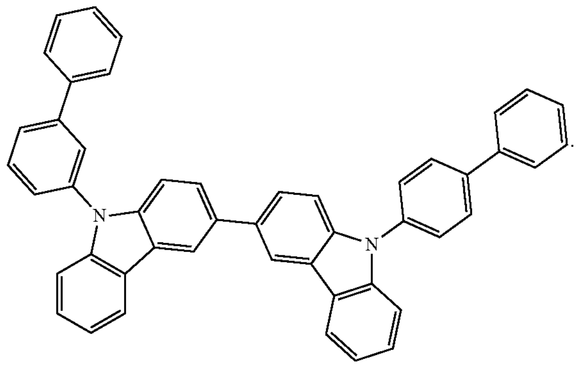

In an embodiment, the host may include a silicon-containing compound, a phosphine oxide-containing compound, or a combination thereof.

The host may have various modifications. For example, the host may include only one kind of compound, or may include two or more different kinds of compounds.

[Phosphorescent Dopant]

The emission layer may include, as a phosphorescent dopant, the organometallic compound represented by Formula 1.

In another embodiment, when the emission layer includes the organometallic compound represented by Formula 1 and the organometallic compound represented by Formula 1 serves as an auxiliary dopant, the emission layer may include a phosphorescent dopant.

In embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or a combination thereof.

The phosphorescent dopant may be electrically neutral.

In an embodiment, the phosphorescent dopant may include an organometallic compound represented by Formula 401:

[Formula 401]

$$M(L_{401})_{xc1}(L_{402})_{xc2}$$

[Formula 402]

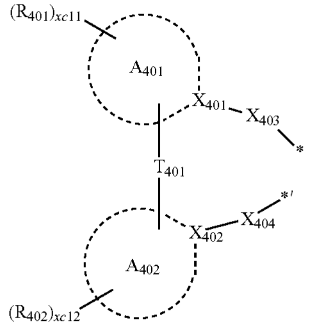

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$ (s) may be identical to or different from each other, $L_{402}$ may be an organic ligand, and xc2 may be 0, 1, 2, 3, or 4, wherein when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, $X_{401}$ may be nitrogen and $X_{402}$ may be carbon, or $X_{401}$ and $X_{402}$ may each be nitrogen.

In embodiments, in Formula 401, when xc1 is 2 or more, two ring $A_{401}$(s) in two or more of $L_{401}$ (s) may be optionally linked to each other via $T_{402}$, which is a linking group, or two ring $A_{402}$(s) may be optionally linked to each other via $T_{403}$, which is a linking group (see Compounds PD1 to PD4 and PD7). $T_{402}$ and $T_{403}$ may each independently be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or a combination thereof.

In an embodiment, the phosphorescent dopant may include, for example, one of Compounds PD1 to PD25, or a combination thereof:

PD1

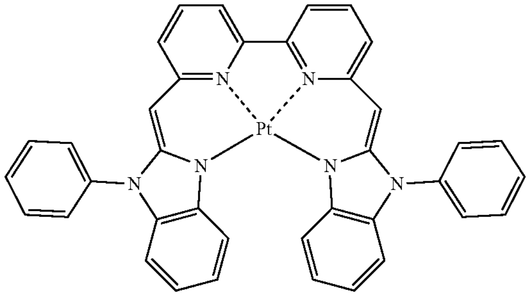

PD2

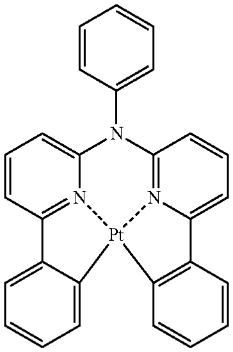

PD3

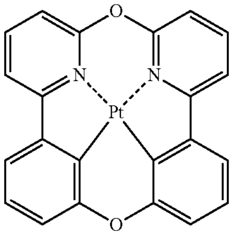

PD4

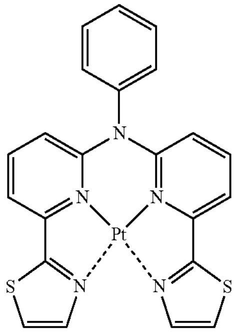

PD5

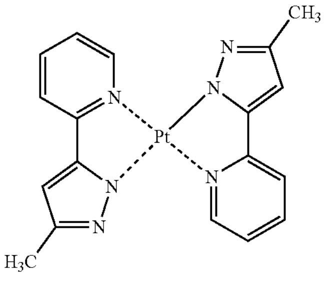

PD6
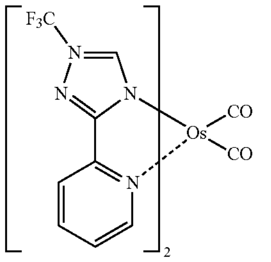
PD7
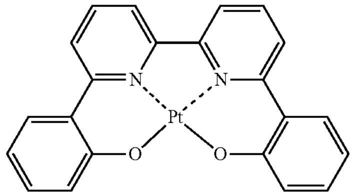
PD8
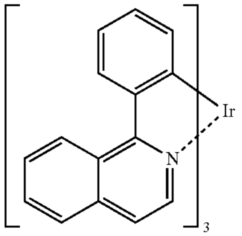
PD9
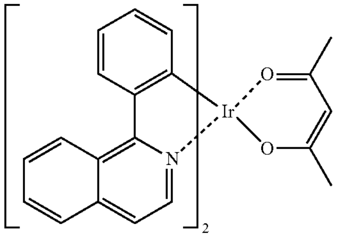
PD10
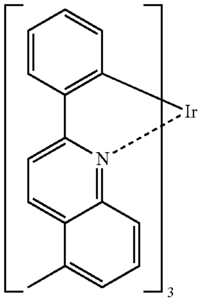
PD11
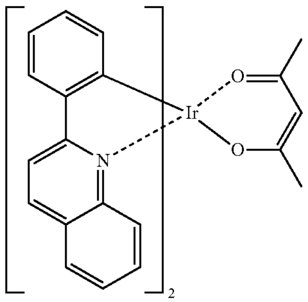
PD12
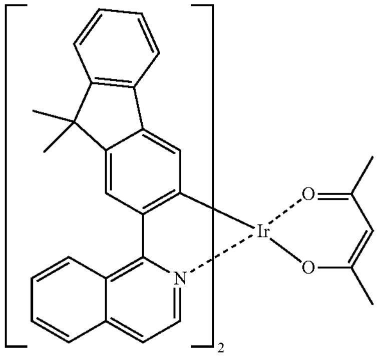
PD13
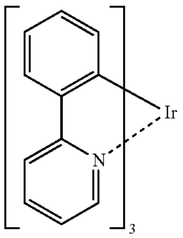
PD14
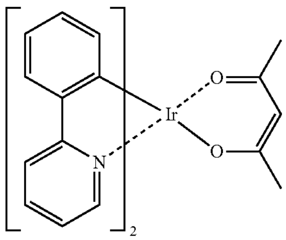
PD15
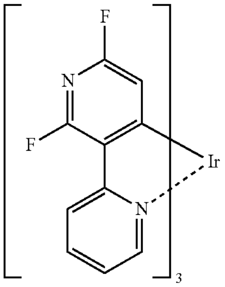
PD16
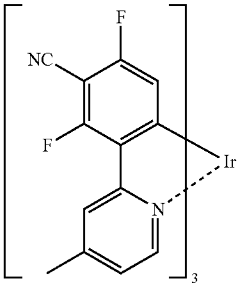

-continued

PD17

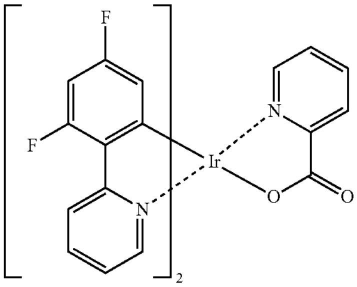

PD18

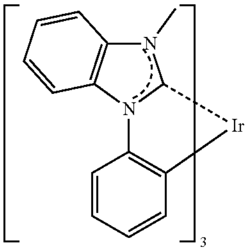

PD19

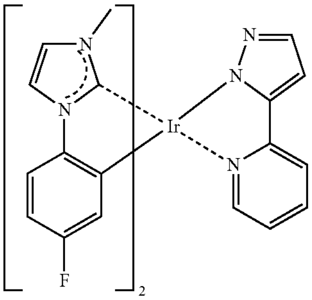

PD20

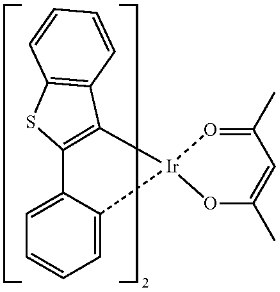

PD21

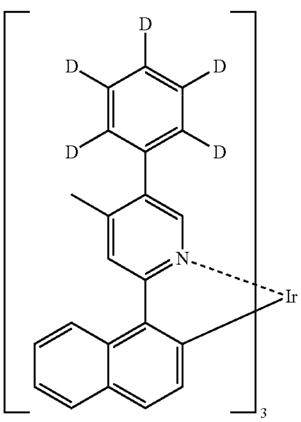

-continued

PD22

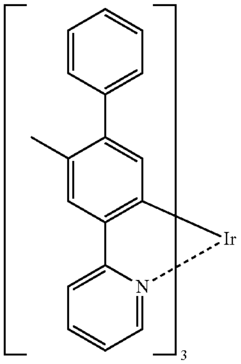

PD23

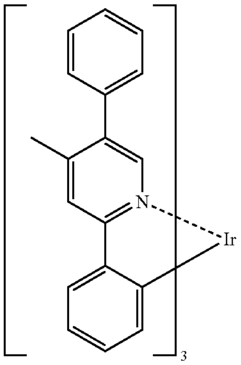

PD24

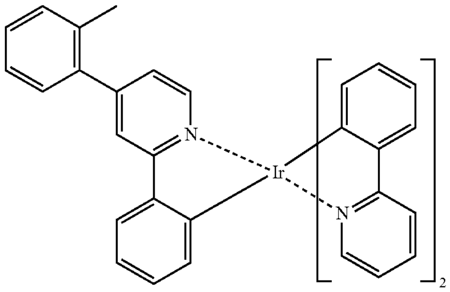

PD25

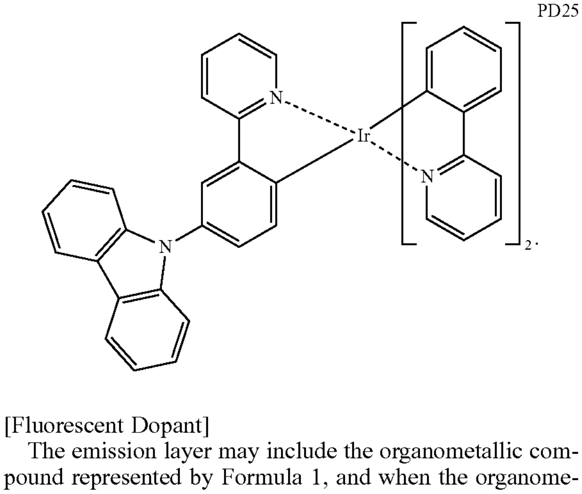

[Fluorescent Dopant]

The emission layer may include the organometallic compound represented by Formula 1, and when the organometallic compound represented by Formula 1 serves as an auxiliary dopant, the emission layer may further include a fluorescent dopant.

In another embodiment, when the emission layer includes the organometallic compound represented by Formula 1 and the organometallic compound represented by Formula 1 serves as a phosphorescent dopant, the emission layer may further include an auxiliary dopant.

The fluorescent dopant and the auxiliary dopant may each independently include an arylamine compound, a styrylamine compound, a boron-containing compound, or a combination thereof.

In an embodiment, the fluorescent dopant and the auxiliary dopant may each independently include a compound represented by Formula 501:

[Formula 501]

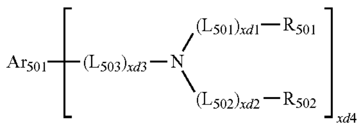

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, in Formula 501, $Ar_{501}$ may be a condensed cyclic group (for example, an anthracene group, a chrysene group, or a pyrene group) in which three or more monocyclic groups are condensed together.

In embodiments, in Formula 501, xd4 may be 2.

In an embodiment, the fluorescent dopant and the auxiliary dopant may each independently include one of Compounds FD1 to FD36, DPVBi, DPAVBi, or a combination thereof:

FD1

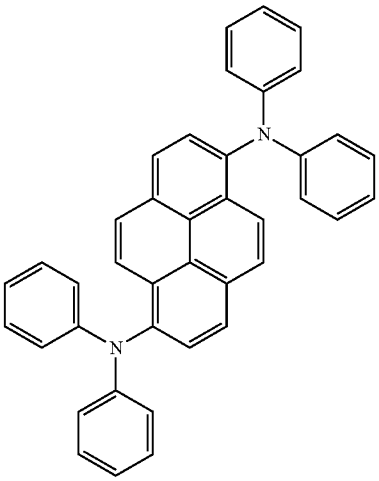

FD2

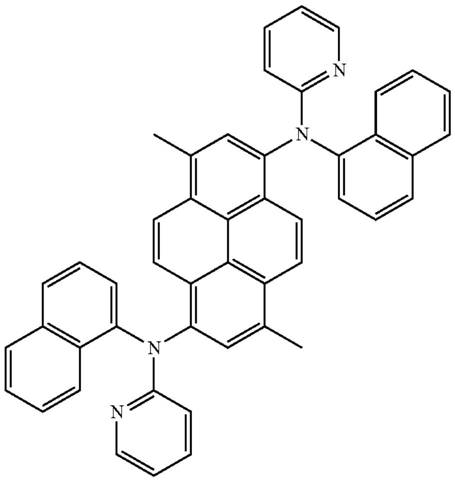

FD3

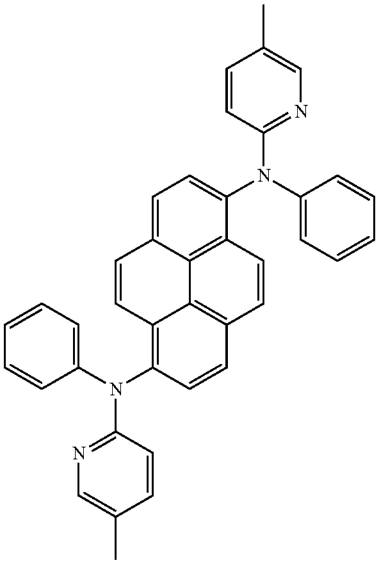

FD4

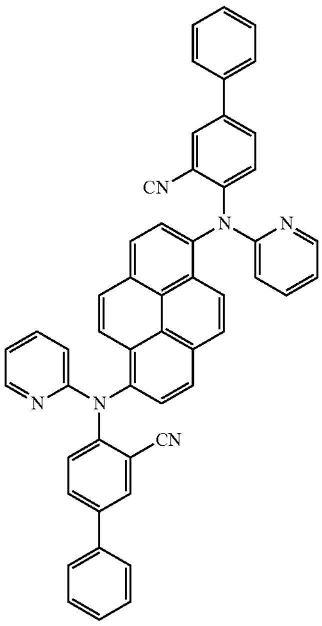

-continued
FD5
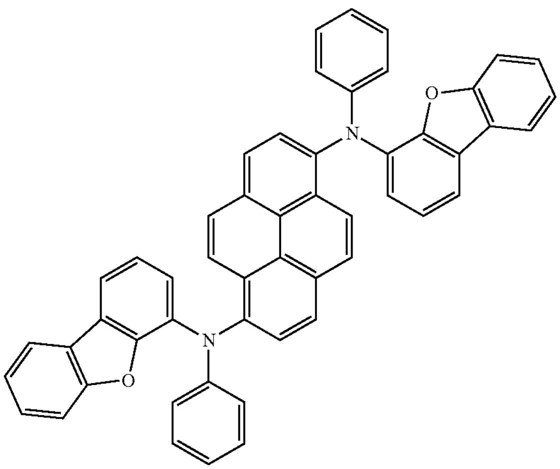
FD6
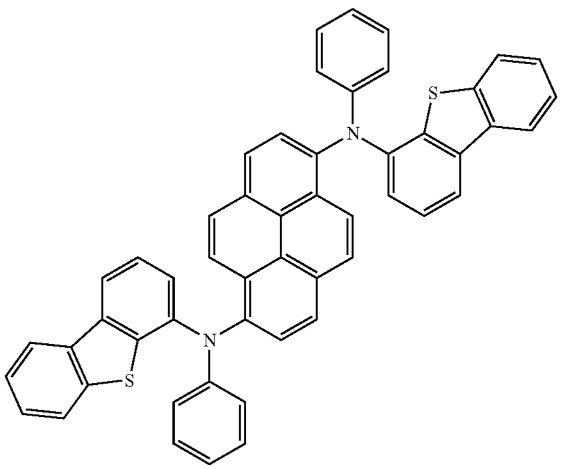
FD7
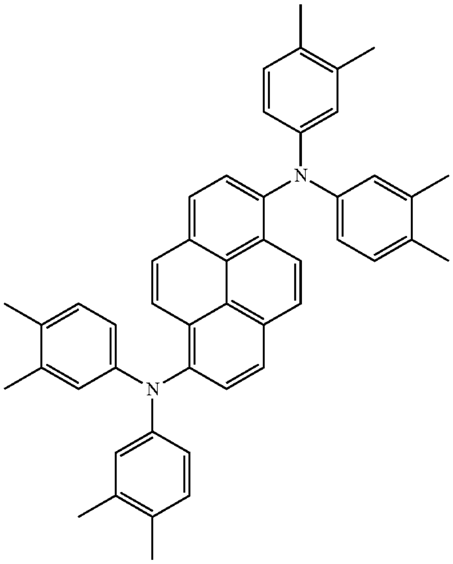
FD8
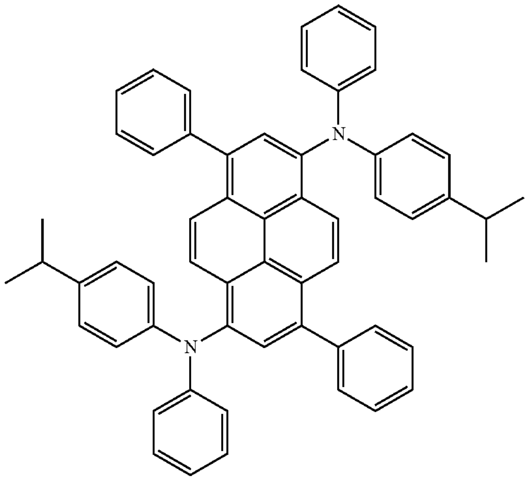
FD9
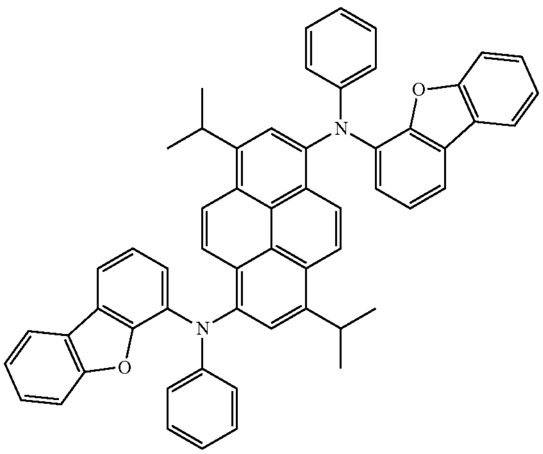
FD10
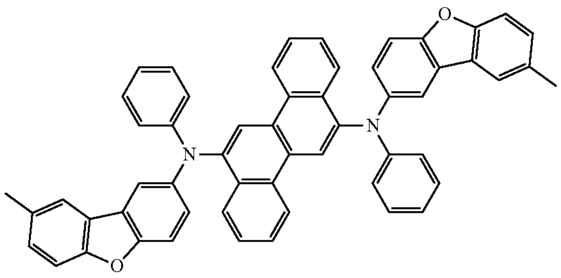

-continued
FD11
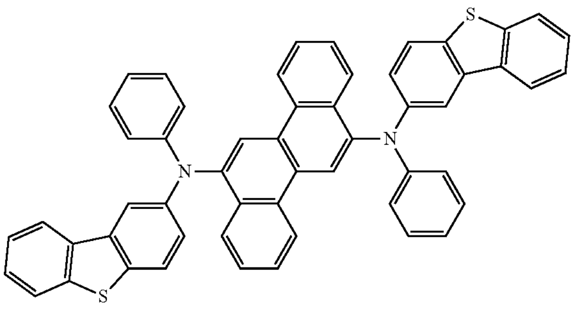
FD12
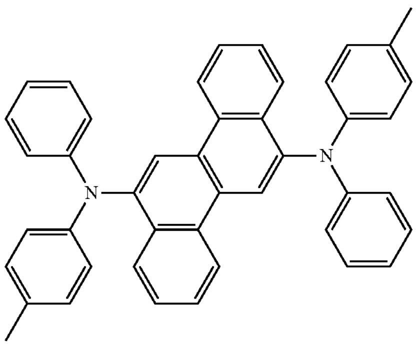
FD13
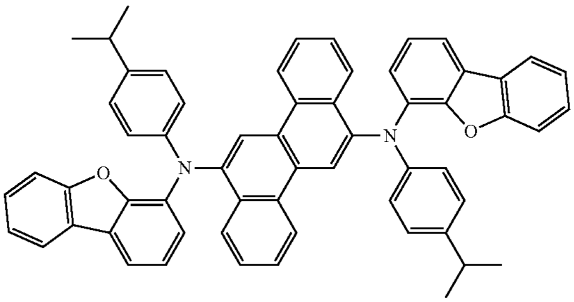
FD14
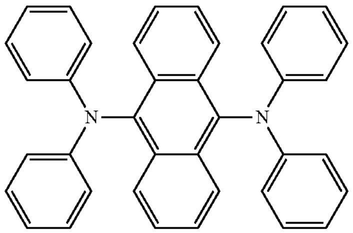
FD15
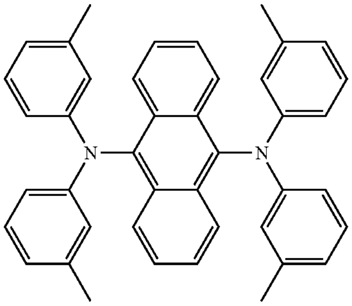
FD16
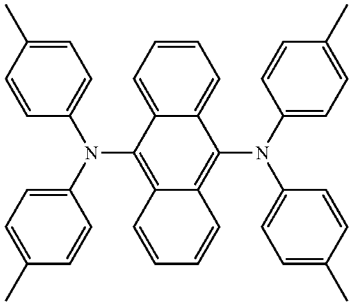
FD17
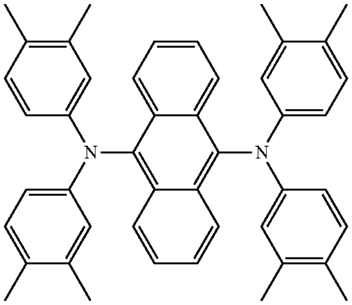
FD18
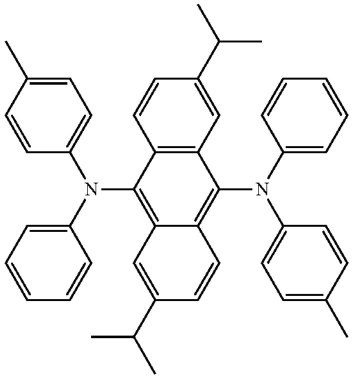

-continued
FD19
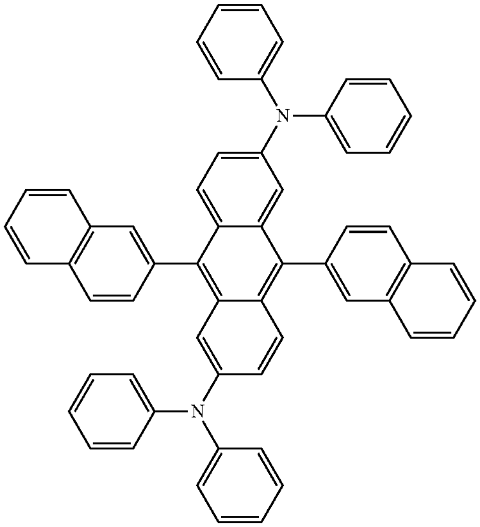
FD20
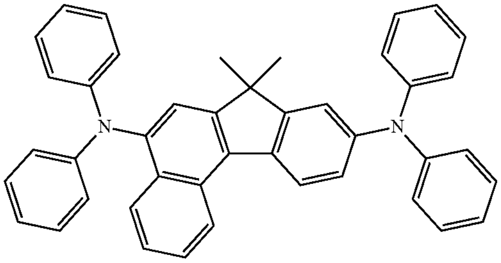
FD21
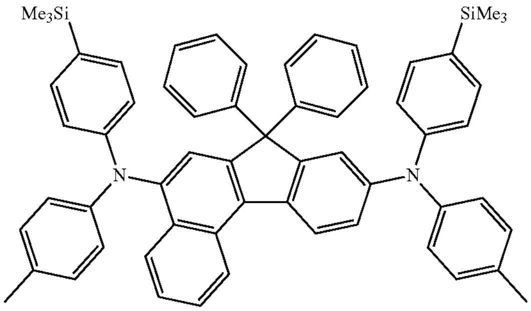
FD22
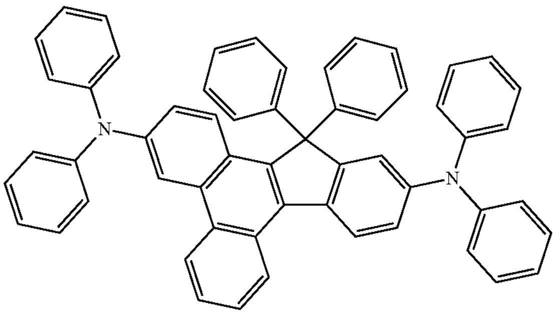
.
FD23
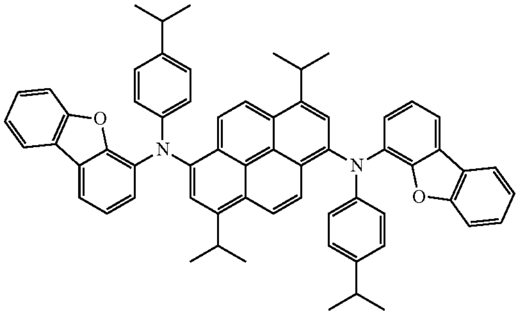
FD24
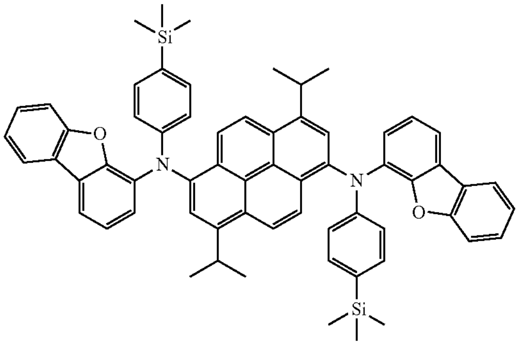
FD25
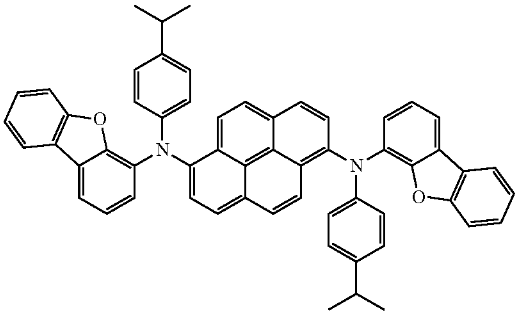
FD26
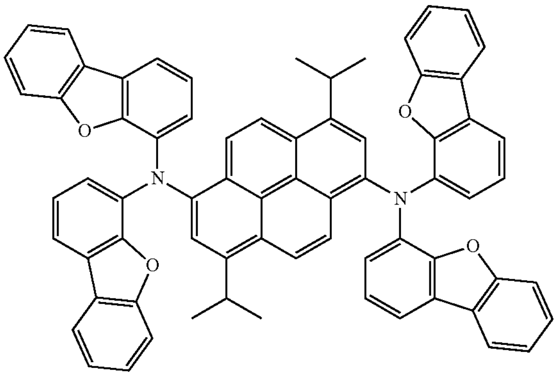

-continued
FD27
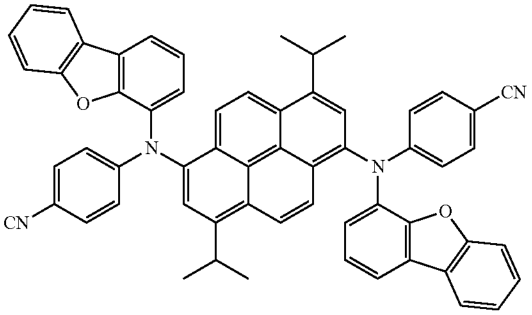
FD28
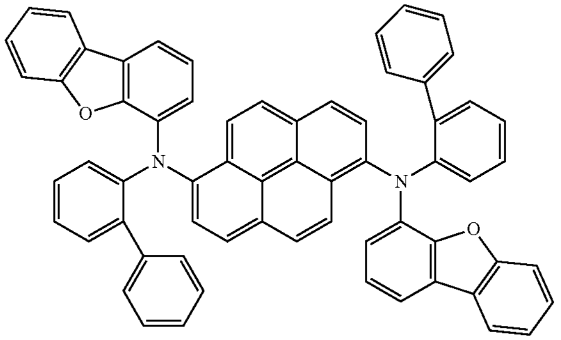
FD29
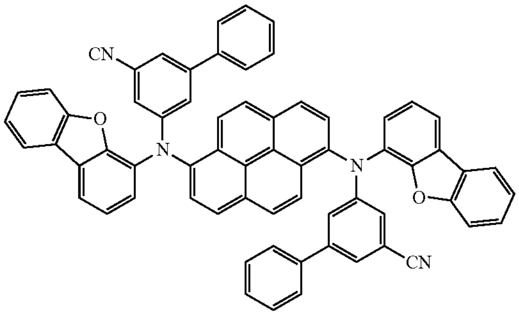
FD30
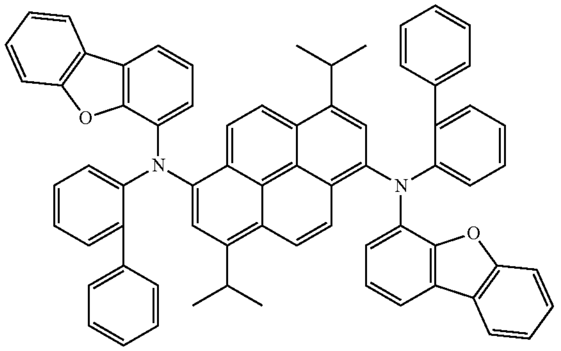
FD31
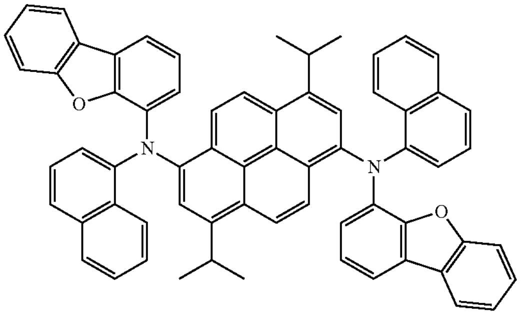
FD32
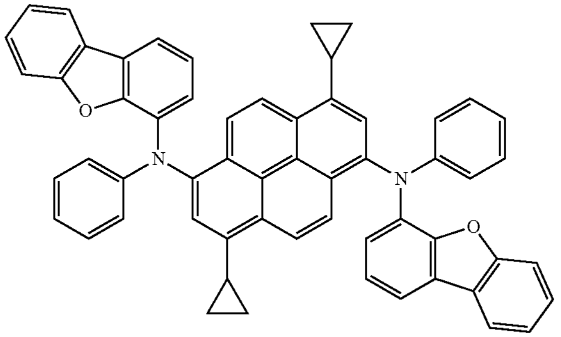
FD33
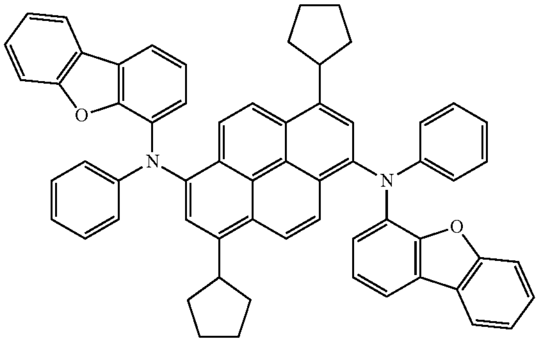
FD34
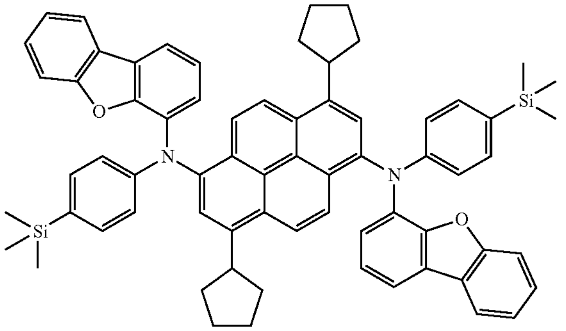

-continued

FD35

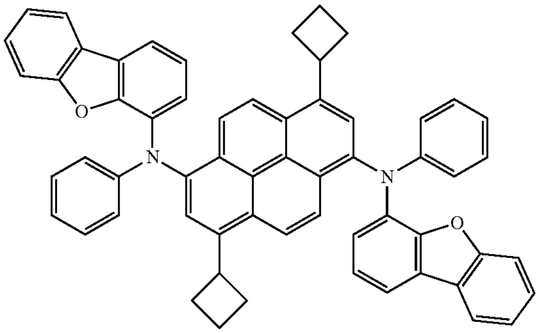

FD36

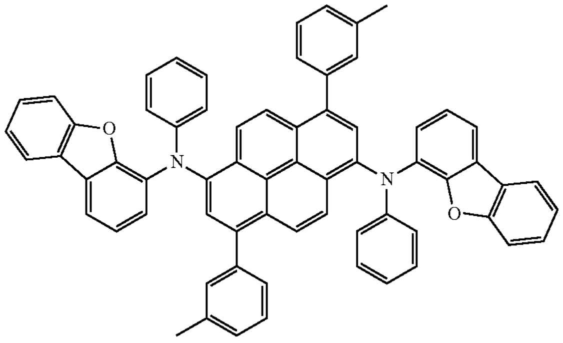

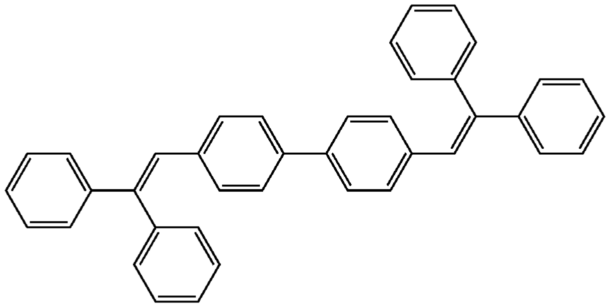

DPVBi

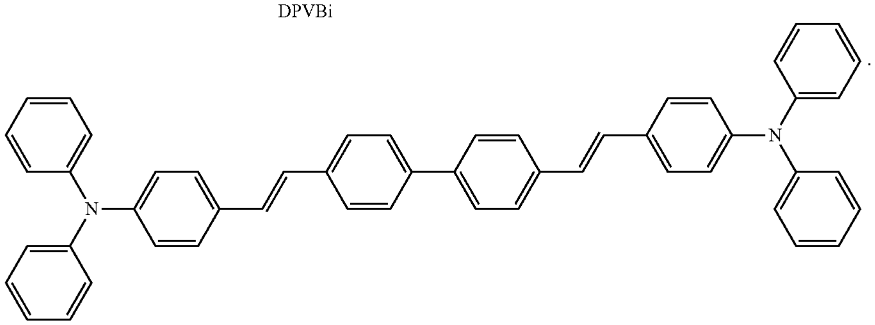

DPAVBi

In an embodiment, the fluorescent dopant and the auxiliary dopant may each independently include the fourth compound represented by Formula 502 or Formula 503 as described in the specification.

[Electron Transport Region in Interlayer 130]

The electron transport region may have a structure consisting of a layer consisting of a single material, a structure consisting of a layer including different materials, or a structure including multiple layers including different materials.

The electron transport region may include a buffer layer, a hole blocking layer, an electron control layer, an electron transport layer, an electron injection layer, or a combination thereof.

In embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure may be stacked from an emission layer in its respective stated order, but the structure of the electron transport region is not limited thereto.

The electron transport region (for example, a buffer layer, a hole blocking layer, an electron control layer, or an electron transport layer in the electron transport region) may include a metal-free compound including at least one π electron-deficient nitrogen-containing $C_1$-$C_{60}$ heterocyclic group.

In an embodiment, the electron transport region may include a compound represented by Formula 601:

$$[Ar_{601}]_{xe11}\text{-}[(L_{601})_{xe1}\text{-}R_{601}]_{xe21} \quad \text{[Formula 601]}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ heterocyclic group that is unsubstituted or substituted with at least one $R_{10a}$.

In an embodiment, in Formula 601, when xe11 is 2 or more, two or more of $Ar_{601}$ (s) may be linked to each other via a single bond.

In embodiments, in Formula 601, $Ar_{601}$ may be a substituted or unsubstituted anthracene group.

In embodiments, the electron transport region may include a compound represented by Formula 601-1:

[Formula 601-1]

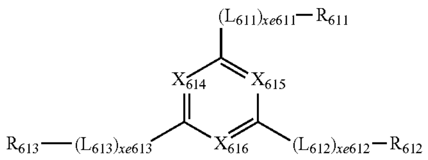

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may each be N, $L_{611}$ to $L_{613}$ may each independently be the same as described in connection with $L_{601}$, xe611 to xe613 may each independently be the same as described in connection with xe1, $R_6$11 to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In embodiments, in Formulae 601 and 601-1, xe1 and xe611 to xe613 may each independently be 0, 1, or 2.

In an embodiment, the electron transport region may include one of Compounds ET1 to ET46, 2,9-dimethyl-4,7-diphenyl-1,10-phenanthroline (BOP), 4,7-diphenyl-1,10-phenanthroline (Bphen), $Alq_3$, BAlq, TAZ, NTAZ, or a combination thereof:

ET1

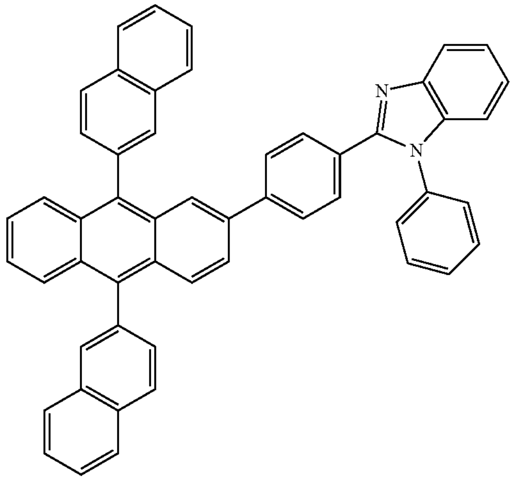

-continued

ET2

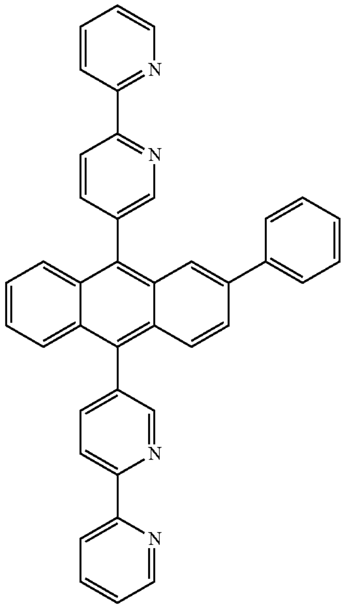

ET3

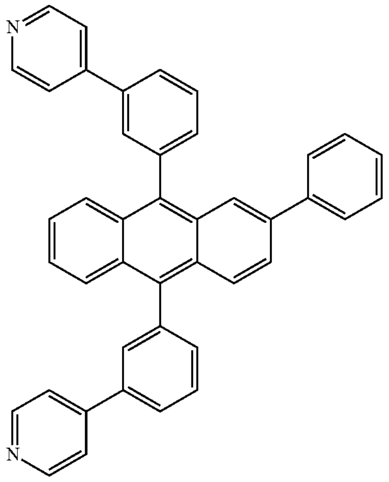

ET4

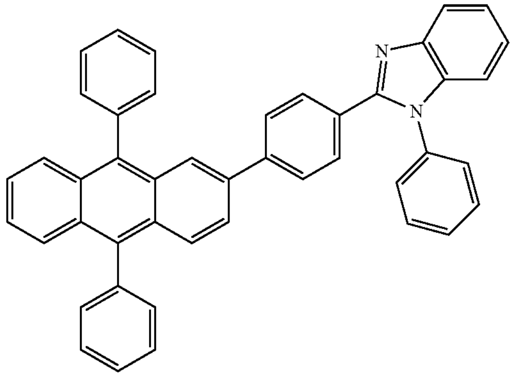

-continued
ET5
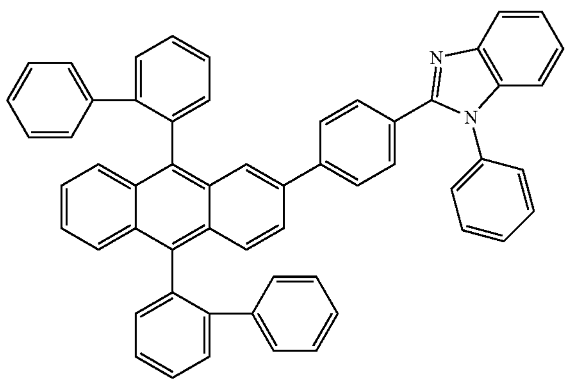
ET6
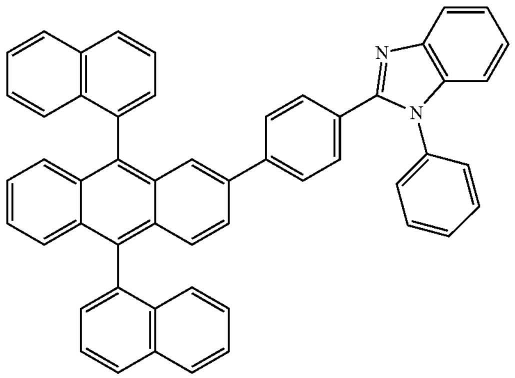
ET7
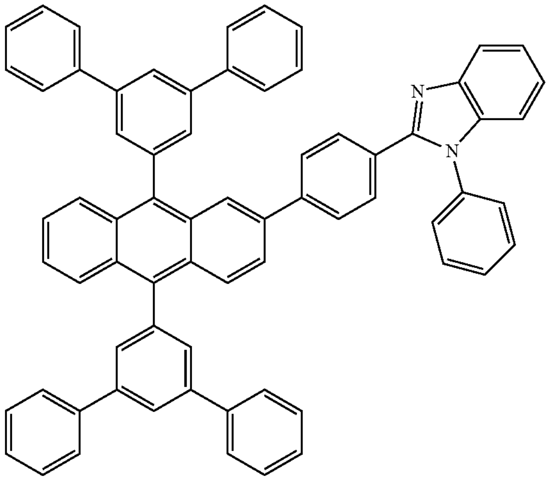
-continued
ET8
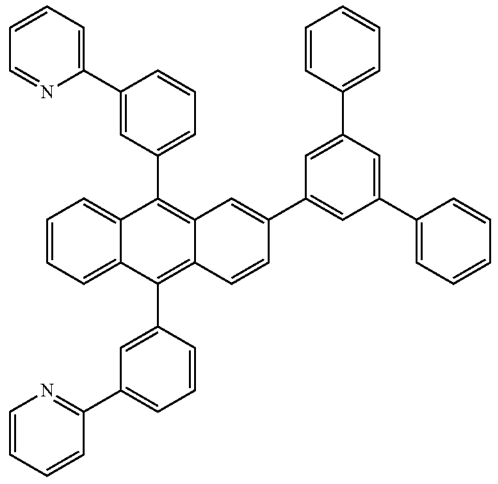
ET9
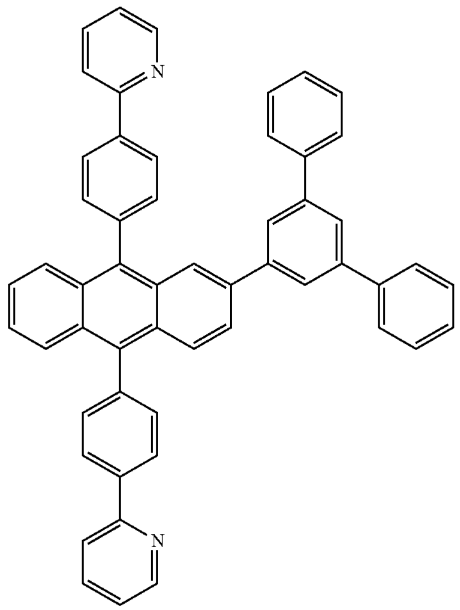

-continued
ET10
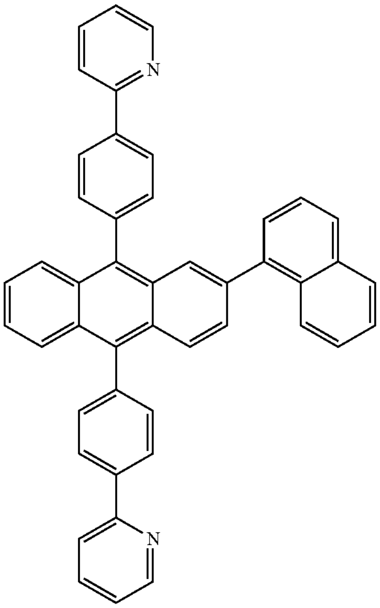
ET11
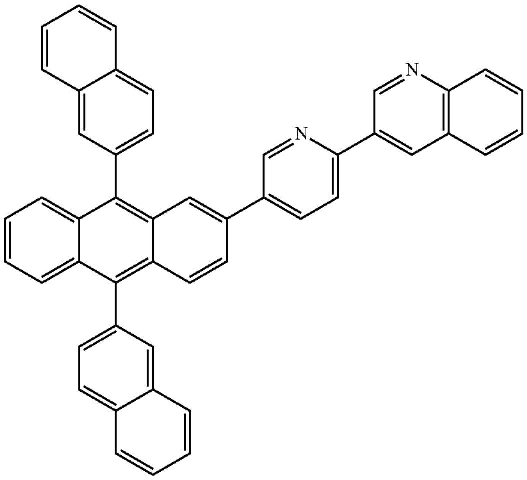
ET12
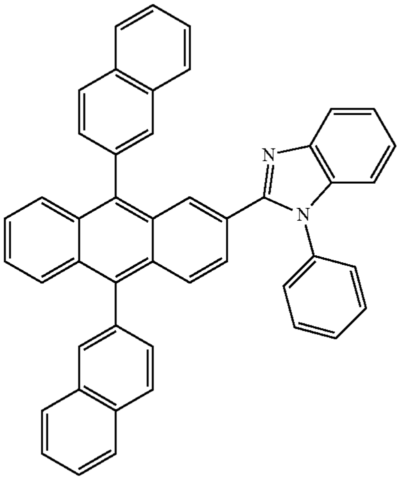
-continued
ET13
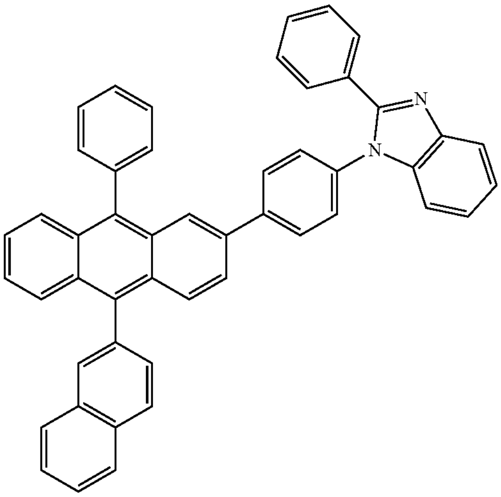
ET14
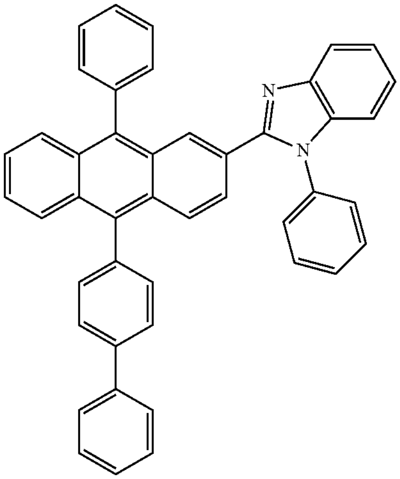
ET15
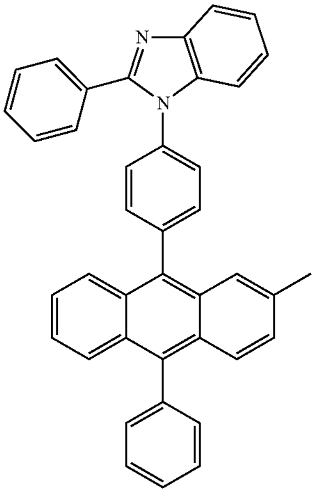

-continued
ET16
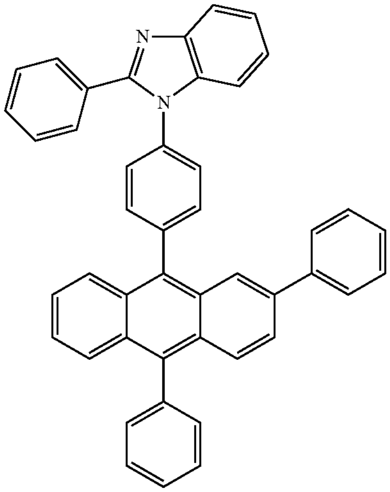
ET17
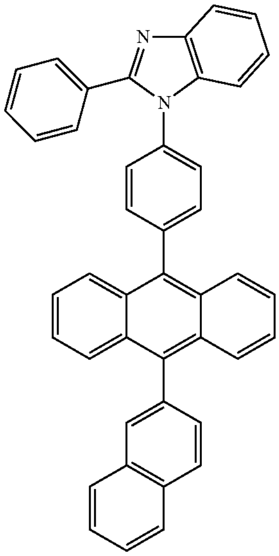
ET18
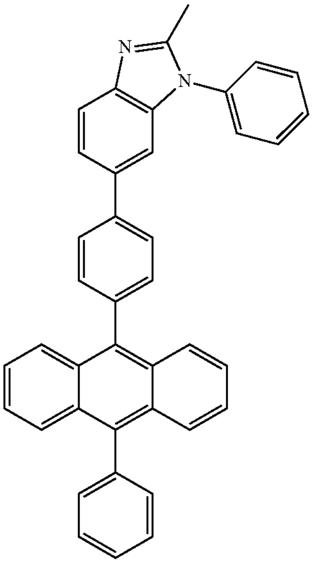
-continued
ET19
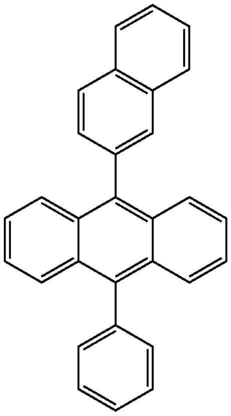
ET20
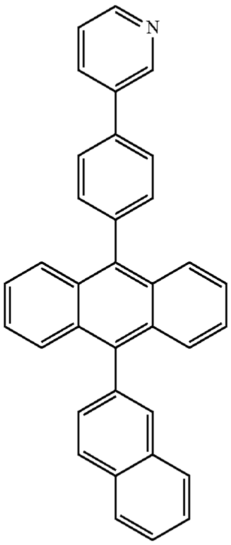
ET21
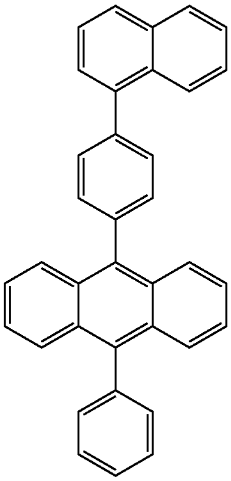

-continued
ET22
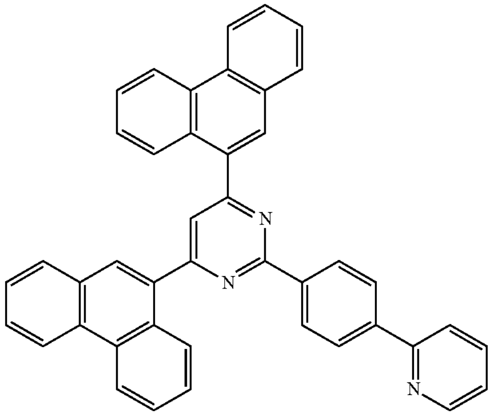
ET23
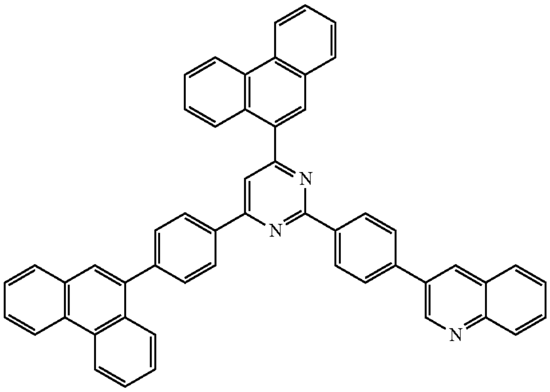
ET24
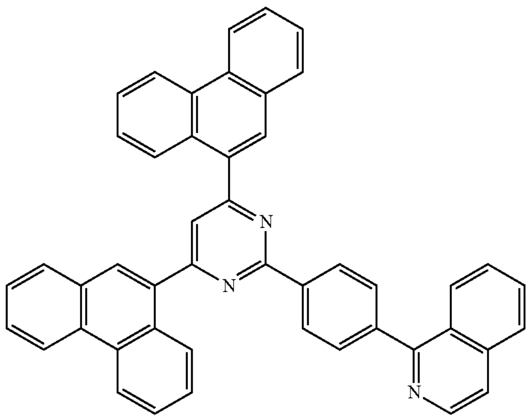
-continued
ET25
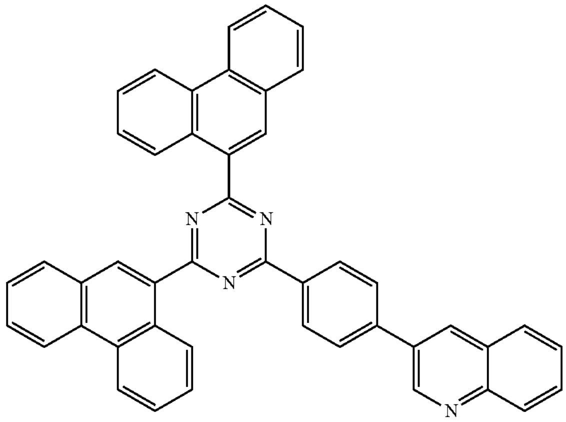
ET26
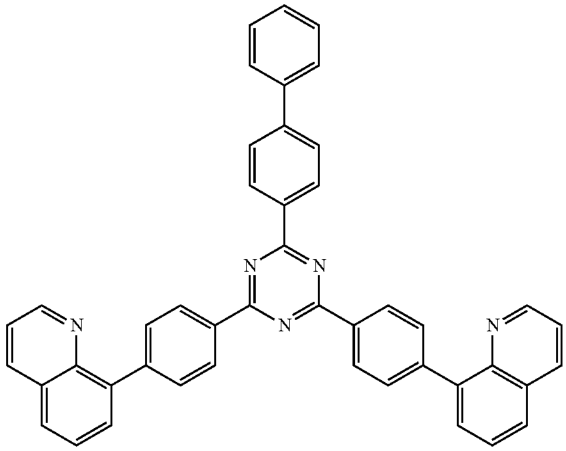
ET27
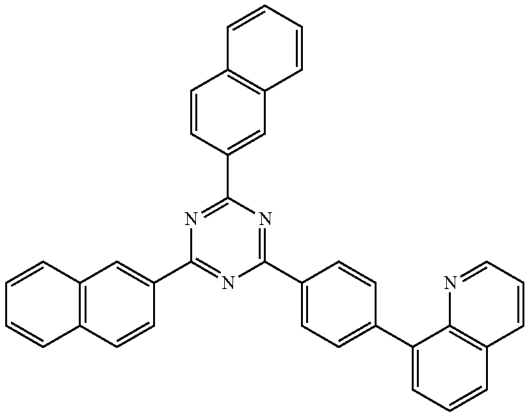

-continued
ET28
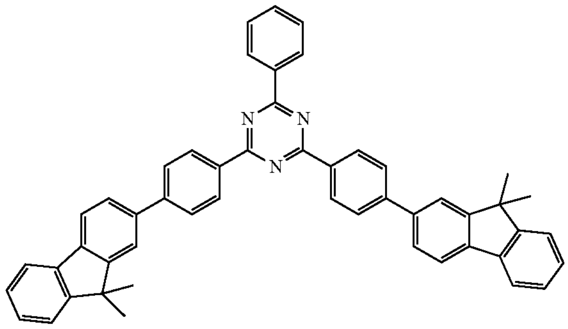
ET29
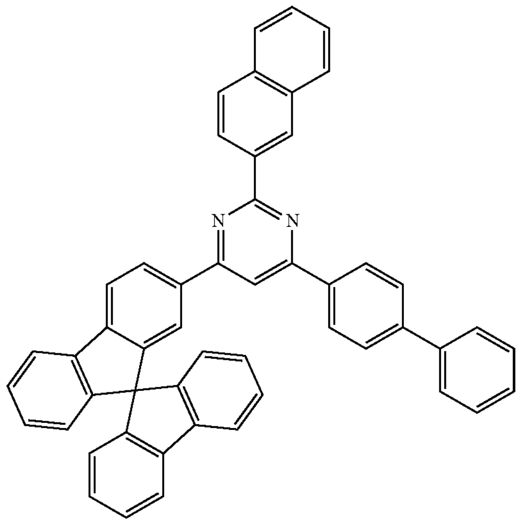
ET30
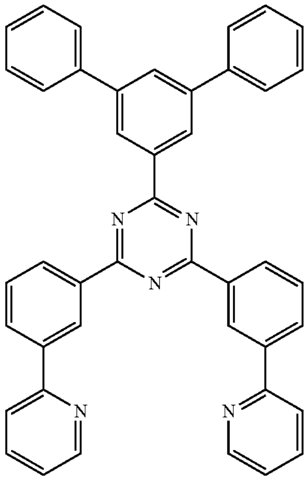
-continued
ET31
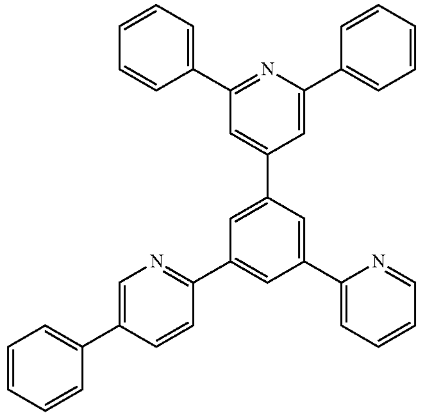
ET32
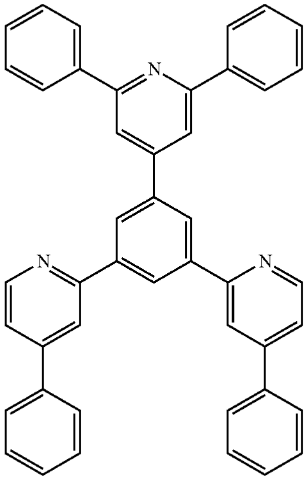
ET33
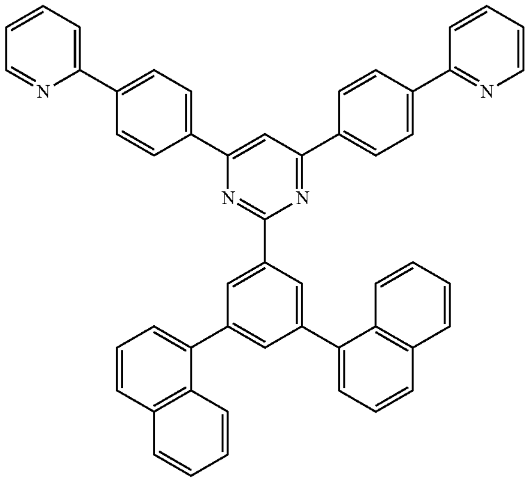

-continued
ET34
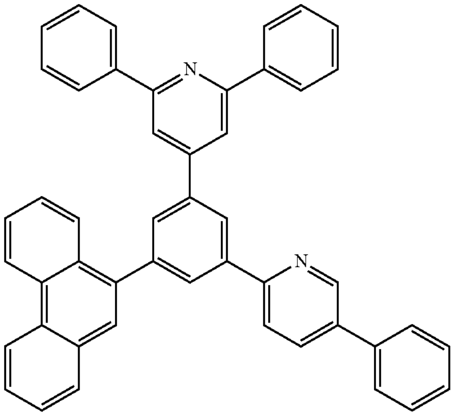
ET35
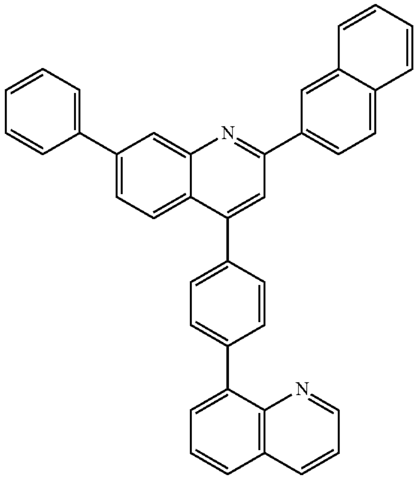
ET36
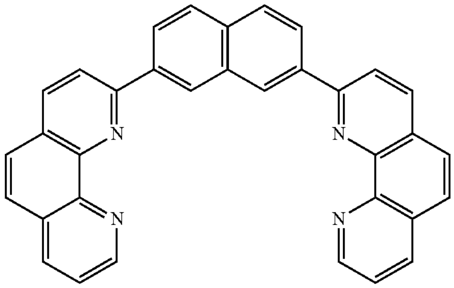
ET37
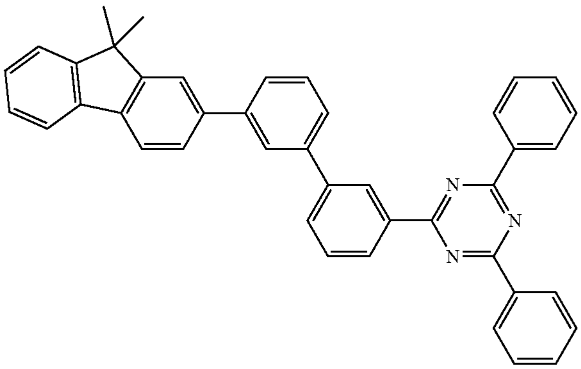
-continued
ET38
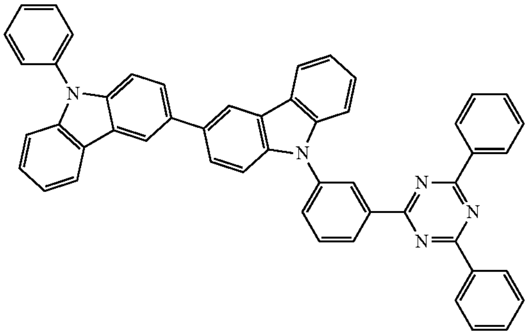
ET39
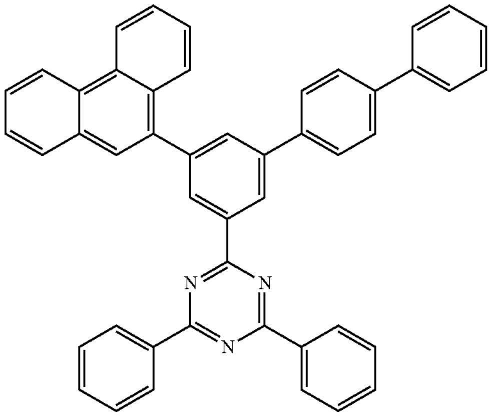
ET40
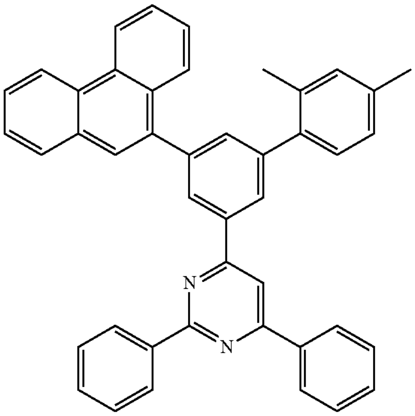
ET41
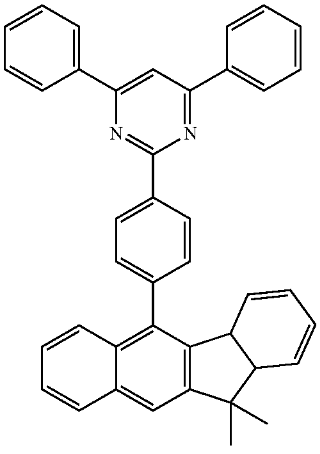

ET42
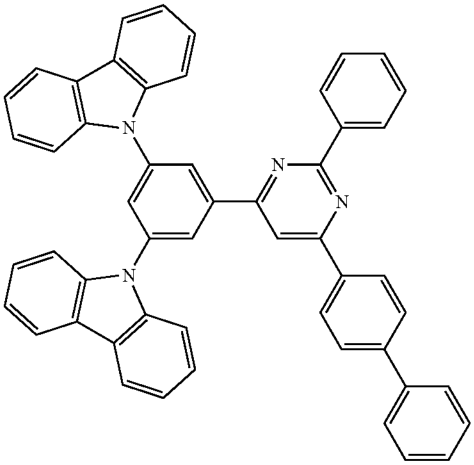
ET43
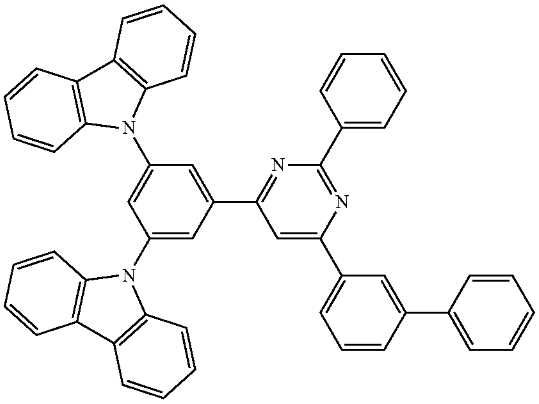
ET44
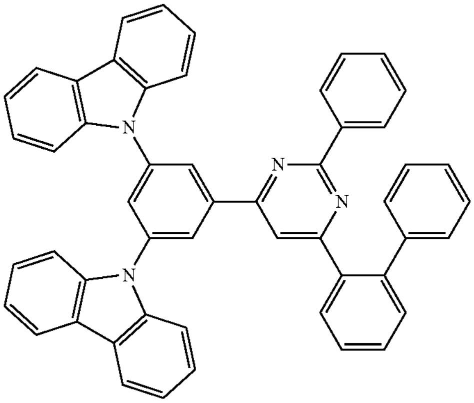
ET45
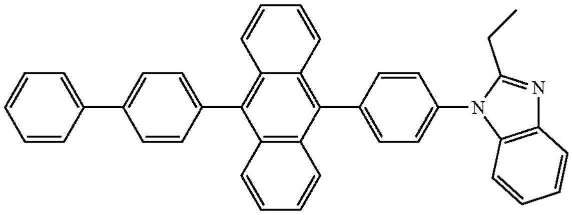
ET46
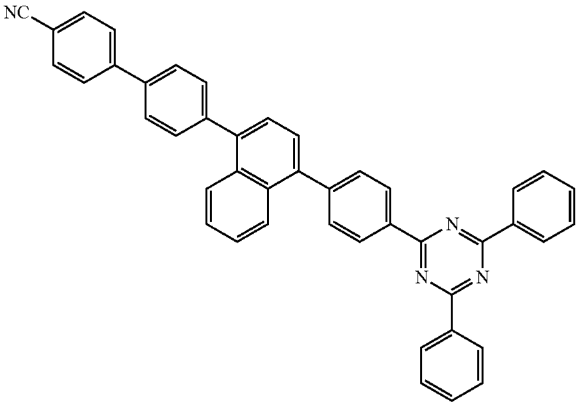
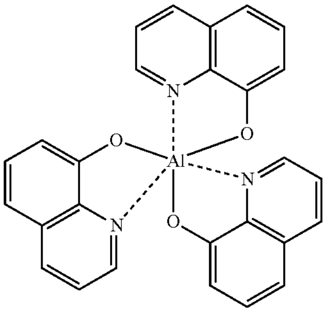
$Alq_3$
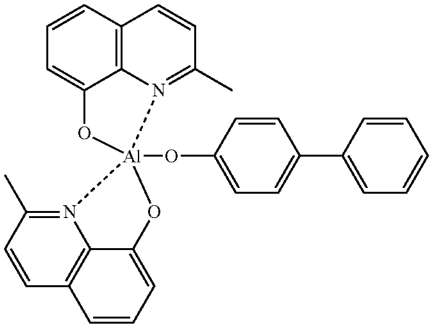
BAlq
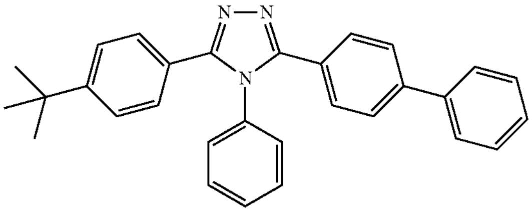
TAZ
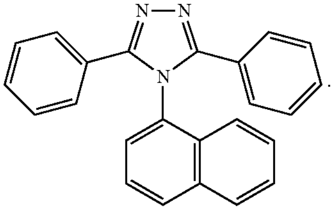
NTAZ A thickness of the electron region may be in a range of about 100 Å to about 5,000 Å. For example, the thickness of the electron transport region may be in a range of about 160 Å to about 4,000 Å. When the electron transport region includes a buffer layer, a hole blocking layer, an electron control layer, an electron transport layer, or a combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thickness of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or a combination thereof. A metal ion of an alkali metal complex may be a Li ion, a Na ion, a K ion, a Rb ion, or a Cs ion, and a metal ion of an alkaline earth metal complex may be a Be ion, a Mg ion, a Ca ion, a Sr ion, or a Ba ion.

A ligand coordinated with a metal ion of the alkali metal complex or a metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or a combination thereof.

For example, the metal-containing material may include a Li complex. The Li complex may include, for example, Compound ET-D1 (LiQ) or Compound ET-D2:

ET-D1

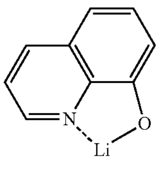

ET-D2

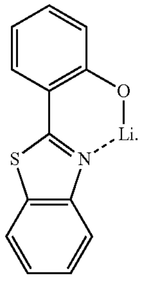

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer including different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof.

The alkali metal may include Li, Na, K, Rb, Cs, or a combination thereof. The alkaline earth metal may include Mg, Ca, Sr, Ba, or a combination thereof. The rare earth metal may include Sc, Y, Ce, Tb, Yb, Gd, or a combination thereof.

The alkali metal-containing compound, the alkaline earth metal-containing compound, and the rare earth metal-containing compound may be oxides, halides (for example, fluorides, chlorides, bromides, or iodides), tellurides, or a combination thereof of each of the alkali metal, the alkaline earth metal, and the rare earth metal.

The alkali metal-containing compound may include: an alkali metal oxides, such as $Li_2O$, $Cs_2O$, or $K_2O$; an alkali metal halide, such as LiF, NaF, CsF, KF, LiI, NaI, CsI, KI, or RbI; or a combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or a combination thereof. In embodiments, the rare earth metal-containing compound may include a lanthanide metal telluride. Examples of a lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include: an alkali metal ion, an alkaline earth metal ion, or a rare earth metal ion; and a ligand bonded to the metal ion (for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or a combination thereof).

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof, as described above. In embodiments, the electron injection layer may further include an organic material (for example, a compound represented by Formula 601).

In embodiments, the electron injection layer may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or a combination thereof. For example, the electron injection layer may be a KI:Yb co-deposited layer, an RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or a combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within any of the ranges described above, satisfactory electron injection characteristics may be obtained without a substantial increase in driving voltage.

[Second Electrode 150]

The second electrode 150 may be located on the interlayer 130. The second electrode 150 may be a cathode, which is an electron injection electrode. When the second electrode 150 is a cathode, a material for forming the second electrode 150 may include a material having a low work function, such as a metal, an alloy, an electrically conductive compound, or a combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure.

[Capping Layer]

The light-emitting device 10 may include a first capping layer outside the first electrode 110 and/or a second capping layer outside the second electrode 150. In embodiments, the light-emitting device 10 may have a structure in which the first capping layer, the first electrode 110, the interlayer 130, and the second electrode 150 are stacked in the stated order, a structure in which the first electrode 110, the interlayer 130, the second electrode 150, and the second capping layer are stacked in the stated order, or a structure in which the first capping layer, the first electrode 110, the interlayer 130, the second electrode 150, and the second capping layer are stacked in the stated order.

Light generated in an emission layer of the interlayer 130 of the light-emitting device 10 may be extracted toward the outside through the first electrode 110, which may be a semi-transmissive electrode or a transmissive electrode, and through the first capping layer. Light generated in an emission layer of the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external emission efficiency according to the principle of constructive interference.

Accordingly, the light extraction efficiency of the light-emitting device 10 is increased, so that the luminescence efficiency of the light-emitting device 10 may be improved.

The first capping layer and the second capping layer may each include a material having a refractive index equal to or greater than about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or a combination thereof. The carbocyclic compound, the heterocyclic compound, and the amine group-containing compound may be optionally substituted with a substituent including O, N, S, Se, Si, F, Cl, Br, I, or a combination thereof.

In embodiments, at least one of the first capping layer and the second capping layer may each independently include an amine group-containing compound.

In embodiment, at least one of the first capping layer and the second capping layer may each independently include a compound represented by Formula 201, a compound represented by Formula 202, or a combination thereof.

In embodiments, at least one of the first capping layer and the second capping layer may each independently include one of Compounds HT28 to HT33, one of Compounds CP1 to CP6, β-NPB, or a combination thereof:

CP1

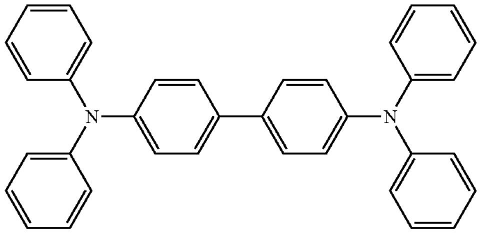

CP2

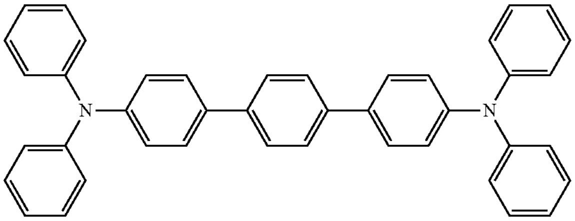

-continued

CP3

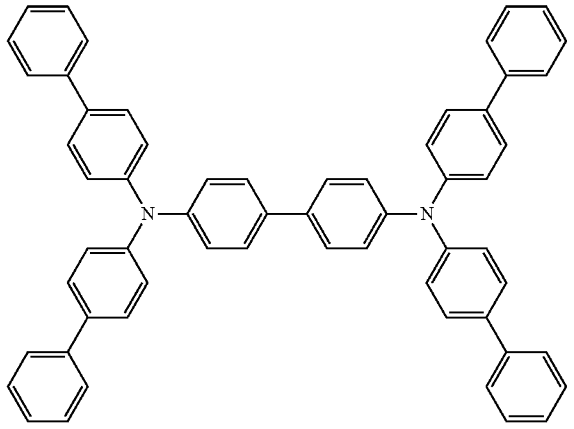

CP4

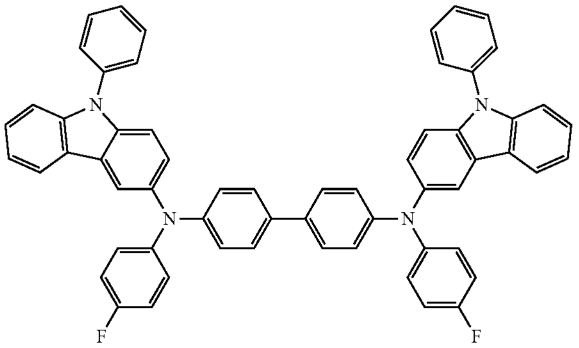

CP5

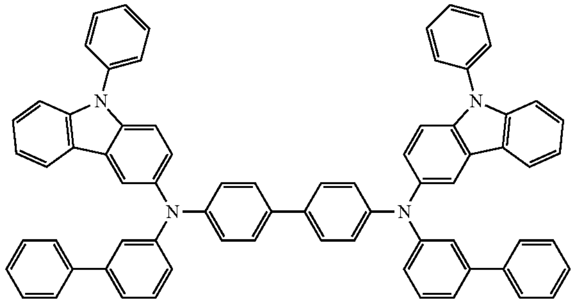

CP6

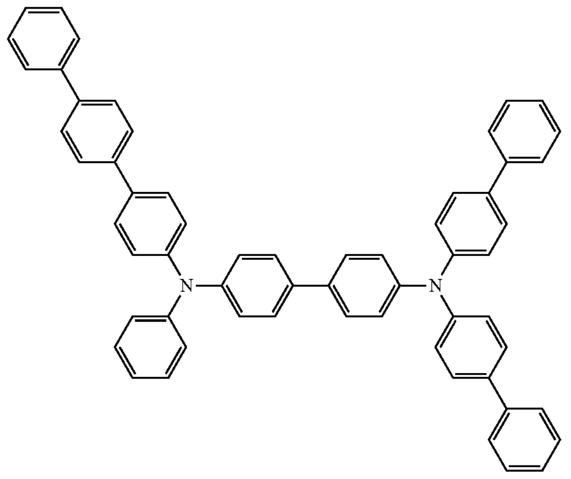

-continued

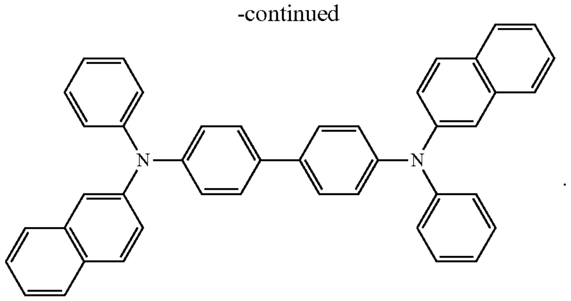

β-NPB

[Electronic Apparatus]

The light-emitting device may be included in various electronic apparatuses. For example, an electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be located in at least one direction in which light emitted from the light-emitting device travels. For example, the light emitted from the light-emitting device may be blue light, green light, or white light. The light-emitting device may be a light-emitting device as described herein. In embodiments, the color conversion layer may include a quantum dot.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located between the subpixels to define each subpixel.

The color filter may further include color filter areas and light-shielding patterns located between the color filter areas, and the color conversion layer may further include color conversion areas and light-shielding patterns located between the color conversion areas.

The color filter areas (or the color conversion areas) may include a first area emitting first color light, a second area emitting second color light, and/or a third area emitting third color light, wherein the first color light, the second color light, and/or the third color light may have different maximum emission wavelengths from one another. For example, the first color light may be red light, the second color light may be green light, and the third color light may be blue light. In an embodiment, the color filter areas (or the color conversion areas) may include quantum dots. For example, the first area may include a red quantum dot, the second area may include a green quantum dot, and the third area may not include a quantum dot. For details on the quantum dot, related descriptions provided herein may be referred to. The first area, the second area, and/or the third area may each further include a scatterer.

In an embodiment, the light-emitting device may emit first light, the first area may absorb the first light to emit first-first color light, the second area may absorb the first light to emit second-first color light, and the third area may absorb the first light to emit third-first color light. In this regard, the first-first color light, the second-first color light, and the third-first color light may have different maximum emission wavelengths.

In an embodiment, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, or the like.

The active layer may include crystalline silicon, amorphous silicon, an organic semiconductor, an oxide semiconductor, or the like.

The electronic apparatus may further include a sealing portion for sealing the light-emitting device. The sealing portion may be located between the color filter and/or the color conversion layer and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including at least one of an organic layer and an inorganic layer. When the sealing portion is a thin film encapsulation layer, the electronic apparatus may be flexible.

Various functional layers may be further included on the sealing portion, in addition to the color filter and/or the color conversion layer, according to the use of the electronic apparatus. Examples of a functional layer may include a touch screen layer, a polarizing layer, and the like. The touch screen layer may be a pressure-sensitive touch screen layer, a capacitive touch screen layer, or an infrared touch screen layer.

The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
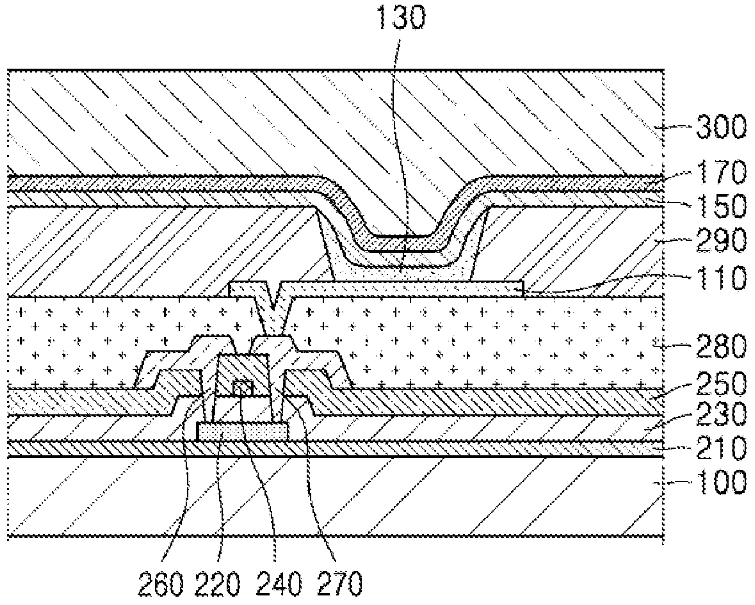
FIG. 2 is a schematic cross-sectional view of an electronic apparatus according to an embodiment.
Figure 3:
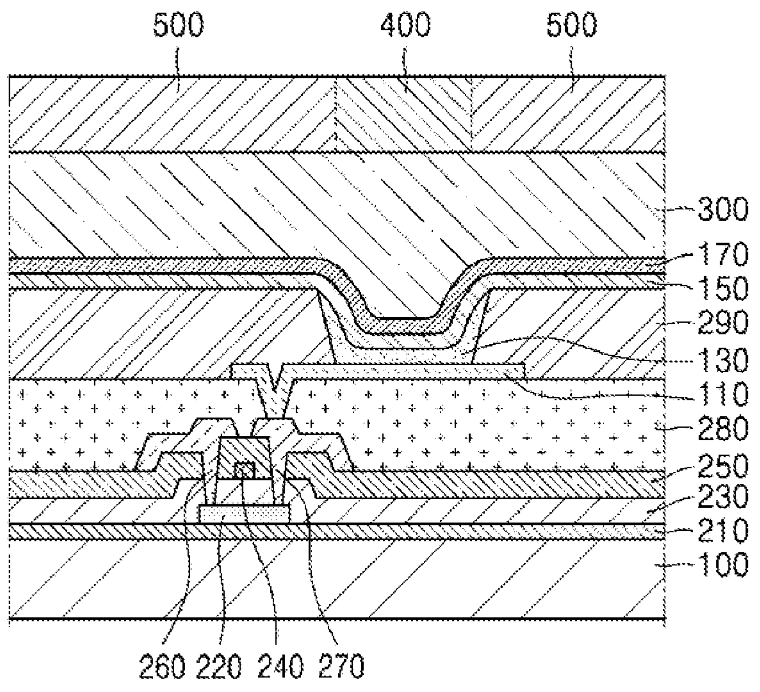
FIG. 3 is a schematic cross-sectional view of an electronic apparatus according to another embodiment.

[Description of FIGS. 2 and 3]

FIG. 2 is a schematic cross-sectional view of an electronic apparatus according to an embodiment.

The electronic apparatus (e.g., a light-emitting apparatus) of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose a source region and a drain region of the active layer 220, and the source electrode 260 and the drain electrode 270 may respectively contact the exposed portions of the source region and the drain region of the active layer 220.

The TFT is electrically connected to a light-emitting device to drive the light-emitting device, and is covered and protected by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may not completely cover the drain electrode 270 and may expose a portion of the drain electrode 270. The first electrode 110 may be connected (e.g., electrically connected) to the exposed portion of the drain electrode 270.

A pixel defining layer 290 including an insulating material may be located on the first electrode 110. The pixel defining layer 290 may expose a region of the first electrode 110, and an interlayer 130 may be formed on the exposed region of the first electrode 110. The pixel defining layer 290 may be a polyimide organic film or a polyacrylic organic film. Although not shown in FIG. 2, at least some layers of the interlayer 130 may extend beyond the upper portion of the pixel defining layer 290 to be provided in the form of a common layer.

A second electrode 150 may be located on the interlayer 130, and a capping layer 170 may be further included on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or a combination thereof; or any combination of the inorganic films and the organic films.

FIG. 3 is a schematic cross-sectional view of an electronic apparatus according to another embodiment.

The electronic apparatus of FIG. 3 may differ from the electronic apparatus of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

Figure 4:
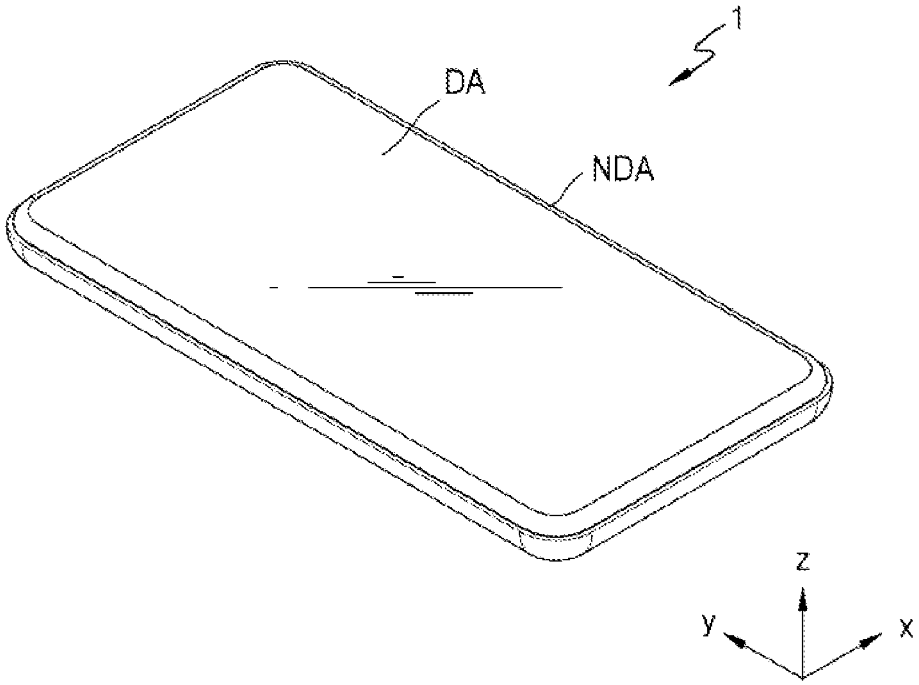
FIG. 4 is a schematic perspective view of an electronic equipment including a light-emitting device according to an embodiment.

[Description of FIG. 4]

FIG. 4 is a schematic perspective view of an electronic equipment 1 including a light-emitting device according to an embodiment.

The electronic equipment 1, which may be an apparatus that displays a moving image or still image, may be not only a portable electronic equipment, such as a mobile phone, a smartphone, a tablet personal computer (PC), a mobile communication terminal, an electronic notebook, an electronic book, a portable multimedia player (PMP), a navigation device, or an ultra-mobile PC (UMPC), but may also be various products, such as a television, a laptop computer, a monitor, billboards or Internet of things (IOT). The electronic equipment 1 may be any product as described above or a part thereof.

In an embodiment, the electronic equipment 1 may be a wearable device, such as a smart watch, a watch phone, a glasses-type display, or a head mounted display (HMD), or a part of the wearable device. However, embodiments are not limited thereto.

For example, the electronic equipment 1 may be a dashboard of a vehicle, an instrument panel of a vehicle, a center fascia of a vehicle, a center information display (CID) on a dashboard of a vehicle, a room mirror display that replaces a side mirror of a vehicle, an entertainment display for a rear seat of a car or a display placed on the back of a front seat, a head up display (HUD) installed in the front of a vehicle or projected on a front window glass, or a computer generated hologram augmented reality head up display (CGH AR HUD). FIG. 4 illustrates an embodiment in which the electronic equipment 1 is a smartphone, for convenience of explanation.

The electronic equipment 1 may include a display area DA and a non-display area NDA outside the display area DA. A display device may implement an image through a two-dimensional array of pixels that are arranged in the display area DA.

The non-display area NDA is an area that does not display an image, and may surround the display area DA. A driver for providing electrical signals or power to display devices arranged in the display area DA may be arranged in the non-display area NDA. A pad, which is an area to which an electronic element or a printed circuit board may be electrically connected, may be arranged in the non-display area NDA.

In the electronic equipment 1, a length in the x-axis direction and a length in the y-axis direction may be different from each other. In an embodiment, as shown in FIG. 4, the length in the x-axis direction may be shorter than the length in the y-axis direction. In embodiments, the length in the x-axis direction may be the same as the length in the y-axis direction. In other embodiments, the length in the x-axis direction may be longer than the length in the y-axis direction.

[Descriptions of FIGS. 5 and 6A to 6C]

Figure 5:
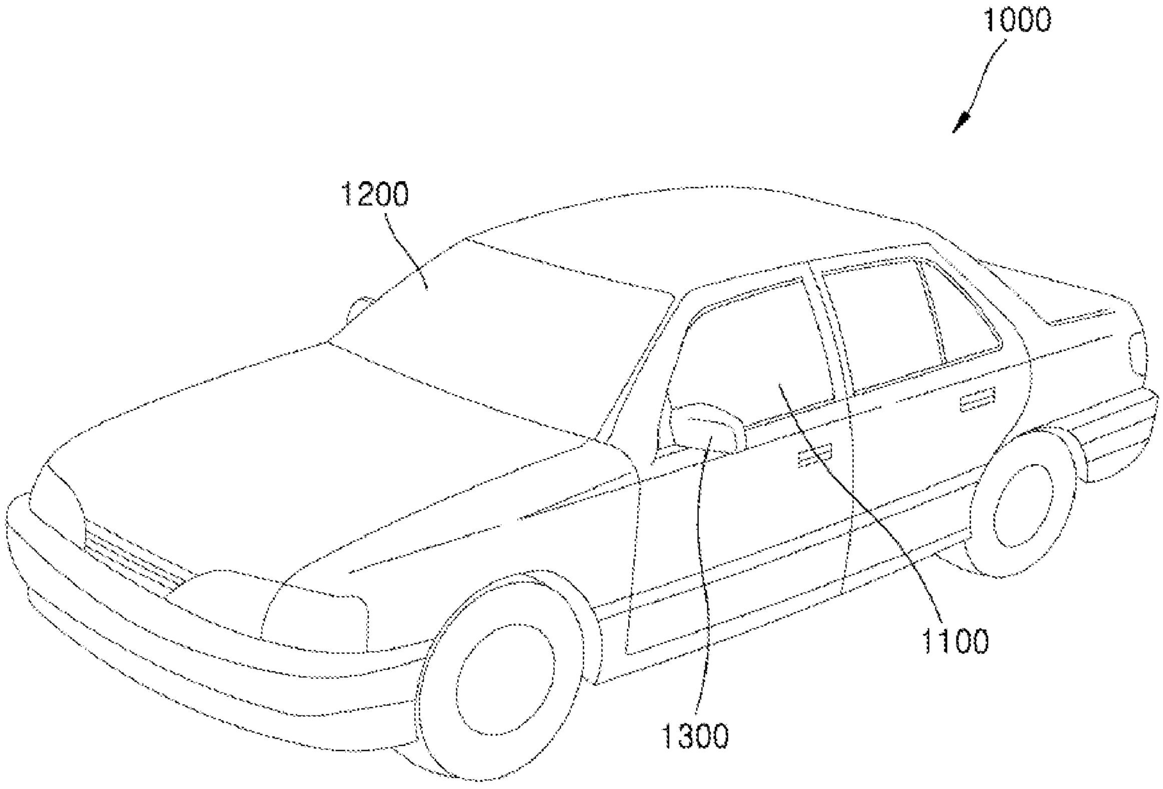
FIG. 5 is a schematic perspective view of an exterior of a vehicle as an electronic equipment including a light-emitting device according to an embodiment.

FIG. 5 is a schematic perspective view of an exterior of a vehicle 1000 as an electronic equipment including a light-emitting device according to an embodiment.

Figure 6A:
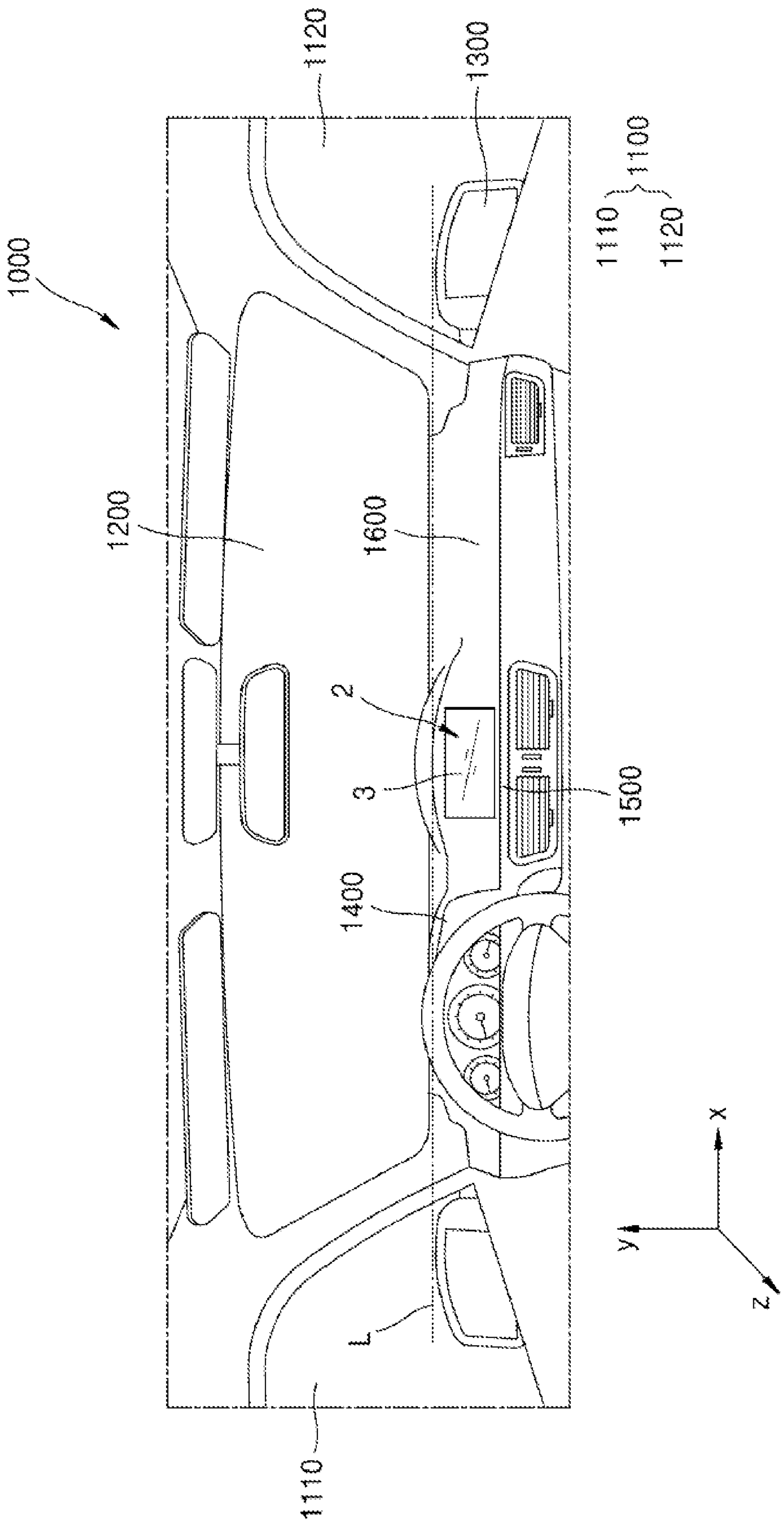
FIGS. 6A, 6B, and 6C are each a schematic diagram of an interior of the vehicle of FIG. 5, according to embodiments.
Figure 6B:
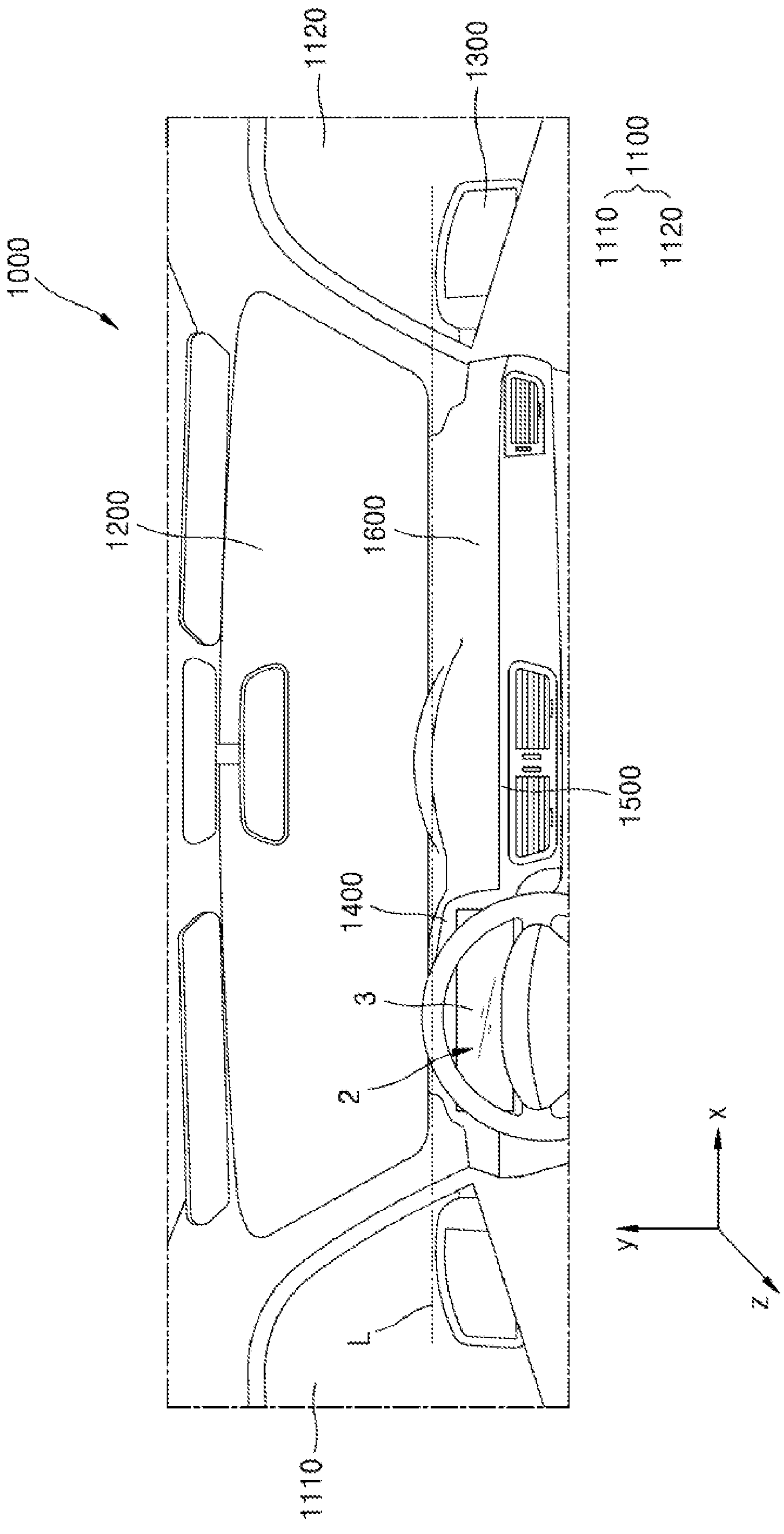
Figure 6C:
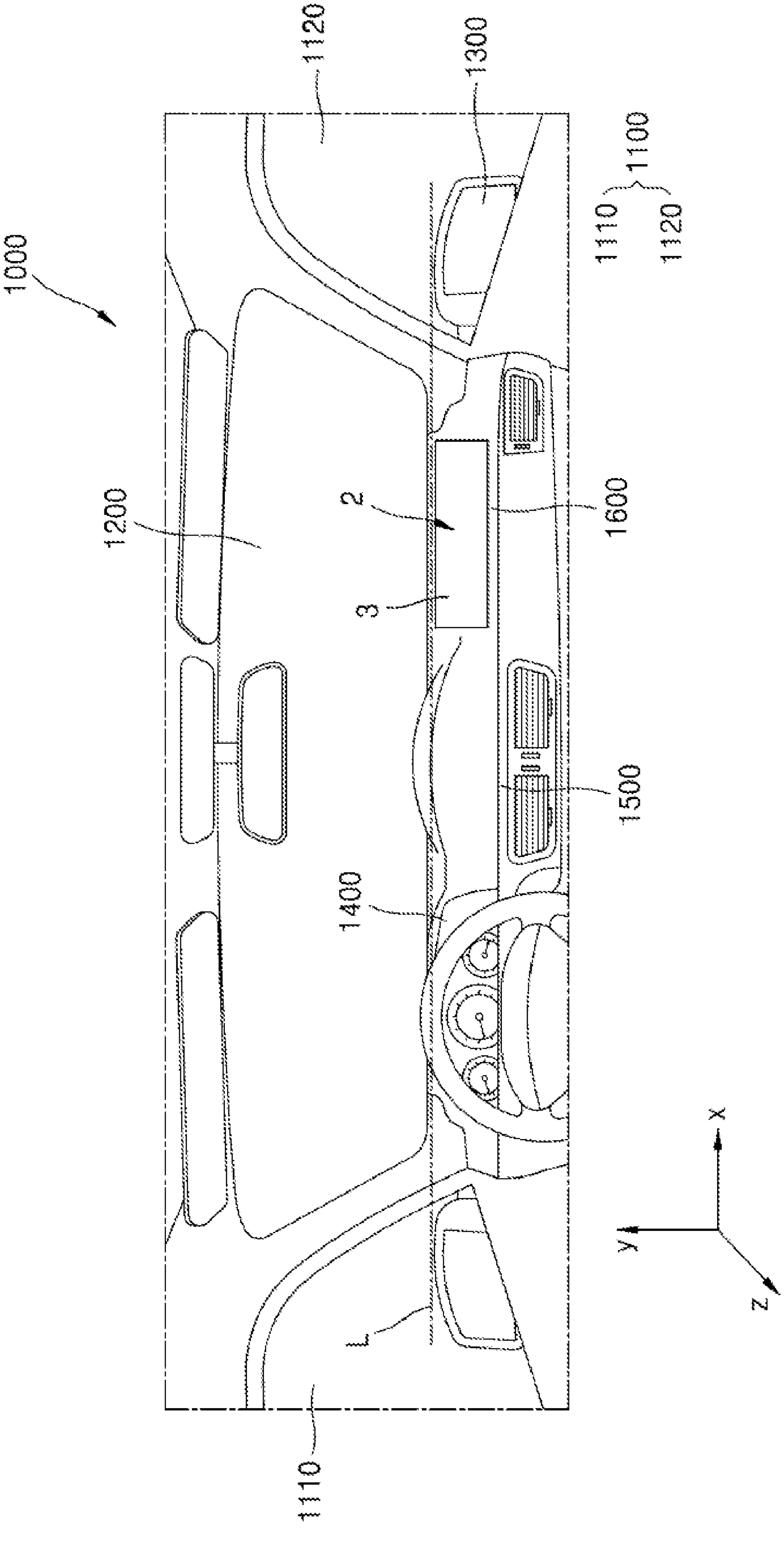

FIGS. 6A to 6C are each a schematic diagram of an interior of a vehicle 1000 according to embodiments.

Referring to FIGS. 5, 6A, 6B, and 6C, embodiments of the vehicle 1000 may include various apparatuses for moving a subject to be transported, such as a person, an object, or an animal, from a departure point to a destination. Examples of the vehicle 1000 may include a vehicle traveling on a road or track, a vessel moving over a sea or river, an airplane flying in the sky using the action of air, and the like.

The vehicle 1000 may travel on a road or a track. The vehicle 1000 may move in a selected direction according to the rotation of at least one wheel. Examples of the vehicle 1000 may include a three-wheeled or four-wheeled vehicle, a construction machine, a two-wheeled vehicle, a prime mover device, a bicycle, and a train running on a track.

The vehicle 1000 may include a body having an interior and an exterior, and a chassis that is a portion excluding the body in which mechanical apparatuses necessary for driving are installed. The exterior of the vehicle body may include a front panel, a bonnet, a roof panel, a rear panel, a trunk, a pillar provided at a boundary between doors, and the like. The chassis of the vehicle 1000 may include a power generating device, a power transmitting device, a driving device, a steering device, a braking device, a suspension device, a transmission device, a fuel device, front and rear wheels, left and right wheels, and the like.

The vehicle 1000 may include a side window glass 1100, a front window glass 1200, a side mirror 1300, a cluster 1400, a center fascia 1500, a passenger seat dashboard 1600, and a display device 2.

The side window glass 1100 and the front window glass 1200 may be partitioned by a pillar arranged between the side window glass 1100 and the front window glass 1200.

The side window glass 1100 may be installed on a side of the vehicle 1000. In an embodiment, the side window glass 1100 may be installed on a door of the vehicle 1000. Multiple side window glasses 1100 may be provided and may face each other. In an embodiment, the side window glass 1100 may include a first side window glass 1110 and a second side window glass 1120. In an embodiment, the first side window glass 1110 may be arranged adjacent to the cluster 1400, and the second side window glass 1120 may be arranged adjacent to the passenger seat dashboard 1600.

In an embodiment, the side window glasses 1100 may be spaced apart from each other in the x-direction or the −x-direction. For example, the first side window glass 1110 and the second side window glass 1120 may be spaced apart from each other in the x-direction or the −x-direction. For example, an imaginary straight line L connecting the side window glasses 1100 may extend in the x-direction or the −x-direction. For example, an imaginary straight line L connecting the first side window glass 1110 and the second side window glass 1120 to each other may extend in the x-direction or the −x-direction.

The front window glass 1200 may be installed in the front of the vehicle 1000. The front window glass 1200 may be arranged between the side window glasses 1100 facing each other.

The side mirror 1300 may provide a rear view of the vehicle 1000. The side mirror 1300 may be installed on the exterior of the body. In an embodiment, multiple side mirrors 1300 may be provided. One of the side mirrors 1300 may be arranged outside the first side window glass 1110. Another one of the side mirrors 1300 may be arranged outside the second side window glass 1120.

The cluster 1400 may be arranged in front of a steering wheel. The cluster 1400 may include a tachometer, a speedometer, a coolant thermometer, a fuel gauge, a turn signal indicator, a high beam indicator, a warning light, a seat belt warning light, an odometer, an automatic transmission selector indicator light, a door open warning light, an engine oil warning light, and/or a low fuel warning light.

The center fascia 1500 may include a control panel on which buttons for adjusting an audio device, an air conditioning device, and a seat heater are disposed. The center fascia 1500 may be arranged on a side of the cluster 1400.

A passenger seat dashboard 1600 may be spaced apart from the cluster 1400 with the center fascia 1500 arranged therebetween. In an embodiment, the cluster 1400 may be arranged to correspond to a driver seat (not shown), and the passenger seat dashboard 1600 may be disposed to correspond to a passenger seat (not shown). In an embodiment, the cluster 1400 may be adjacent to the first side window glass 1110, and the passenger seat dashboard 1600 may be adjacent to the second side window glass 1120.

In an embodiment, the display device 2 may include a display panel 3, and the display panel 3 may display an image. The display device 2 may be arranged inside the vehicle 1000. In an embodiment, the display device 2 may be arranged between the side window glasses 1100 facing each other. The display device 2 may be arranged on at least one of the cluster 1400, the center fascia 1500, and the passenger seat dashboard 1600.

The display device 2 may include an organic light-emitting display device, an inorganic electroluminescent (EL) display device, a quantum dot display device, or the like. Hereinafter, an organic light-emitting display device display including the light-emitting device according to an embodiment will be described as an example as the display device 2. However, various types of display devices as described herein may be used in embodiments.

Referring to FIG. 6A, the display device 2 may be arranged on the center fascia 1500. In an embodiment, the display device 2 may display navigation information. In an embodiment, the display device 2 may display information regarding audio settings, video settings, or vehicle settings.

Referring to FIG. 6B, the display device 2 may be arranged on the cluster 1400. When the display device 2 is arranged on the cluster 1400, the cluster 1400 may display driving information and the like through the display device 2. For example, the cluster 1400 may digitally implement driving information. The cluster 1400 may digitally display vehicle information and driving information as images. For example, a needle and a gauge of a tachometer and various warning lights or icons may be displayed by a digital signal.

Referring to FIG. 6C, the display device 2 may be arranged on the passenger seat dashboard 1600. The display device 2 may be embedded in the passenger seat dashboard 1600 or arranged on the passenger seat dashboard 1600. In an embodiment, the display device 2 arranged on the passenger seat dashboard 1600 may display an image related to information displayed on the cluster 1400 and/or information displayed on the center fascia 1500. In embodiments, the display device 2 arranged on the passenger seat dashboard 1600 may display information that is different from information displayed on the cluster 1400 and/or information displayed on the center fascia 1500.

[Manufacturing Method]

Respective layers included in the hole transport region, the emission layer, and respective layers included in the electron transport region may be formed in a selected region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/see to about 100 Å/see, depending on a material to be included in a layer to be formed and the structure of a layer to be formed.

[Definitions of Terms]

The term "$C_3$-$C_{60}$ carbocyclic group" as used herein may be a cyclic group consisting of carbon atoms as the only ring-forming atoms and having three to sixty carbon atoms. The term "$C_1$-$C_{60}$ heterocyclic group" as used herein may be a cyclic group that has one to sixty carbon atoms and further has, in addition to a carbon atom, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, a $C_1$-$C_{60}$ heterocyclic group may have 3 to 61 ring-forming atoms.

The term "cyclic group" as used herein may be a $C_3$-$C_{60}$ carbocyclic group or a $C_1$-$C_{60}$ heterocyclic group.

The term "π electron-rich $C_3$-$C_{60}$ cyclic group" as used herein may be a cyclic group that has 3 to 60 carbon atoms and may not include *—N=*' as a ring-forming moiety.

The term "π electron-deficient nitrogen-containing $C_1$-$C_{60}$ heterocyclic group" as used herein may be a heterocyclic group that has 1 to 60 carbon atoms and may include *—N=*' as a ring-forming moiety.

In embodiments, a $C_3$-$C_{60}$ carbocyclic group may be a T1 group or a group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), a $C_1$-$C_{60}$ heterocyclic group may be a T2 group, a group in which at least two T2 groups are condensed with each other, or a group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like.), a π electron-rich $C_3$-$C_{60}$ cyclic group may be a T1 group, a group in which two or more T1 groups are condensed with each other, a T3 group, a group in which two or more T3 groups are condensed with each other, or a group in which at least one T3 group and at least one T1 group are condensed with each other (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), and a π electron-deficient nitrogen-containing $C_1$-$C_{60}$ heterocyclic group may be a T4 group, a group in which at least two T4 groups are condensed with each other, a group in which at least one T4 group and at least one T1 group are condensed with each other, a group in which at least one T4 group and at least one T3 group are condensed with each other, or a group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a petrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group," "$C_3$-$C_{60}$ carbocyclic group," "$C_1$-$C_{60}$ heterocyclic group," "π electron-rich $C_3$-$C_{60}$ cyclic group," and "π electron-deficient nitrogen-containing $C_1$-$C_{60}$ heterocyclic group" as used herein may each be a group condensed to any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of a monovalent $C_3$-$C_{60}$ carbocyclic group or a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

Examples of a divalent $C_3$-$C_{60}$ carbocyclic group or a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein may be a linear or branched monovalent aliphatic hydrocarbon group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group, a propynyl group, and the like. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by $—O(A_{101})$ (wherein $A_{101}$ may be a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group having 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the cyclic structure thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group having 1 to 10 carbon atoms, further including, in addition to carbon atoms, at least one heteroatom, as ring-forming atoms, and having at least one carbon-carbon double bond in the cyclic structure thereof. Examples of a $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms. The term "$C_6$-$C_{60}$ arylene group" as used herein may be a divalent group having a carbocyclic aromatic system of 6 to 60 carbon atoms. Examples of a $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of a $C_1$-$C_6$a heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its molecular structure as a whole. Examples of a monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as the monovalent non-aromatic condensed polycyclic group described above.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having no aromaticity in its molecular structure as a whole. Examples of a monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as the monovalent non-aromatic condensed heteropolycyclic group described above.

The term "$C_6$-$C_{60}$ aryloxy group" as used herein may be a group represented by —O($A_{102}$) (wherein $A_{102}$ may be a $C_6$-$C_{60}$ aryl group), and the term "$C_6$-$C_{60}$ arylthio group" as used herein may be a group represented by —S($A_{103}$) (wherein $A_{103}$ may be a $C_6$-$C_{60}$ aryl group).

The term "$C_7$-$C_{60}$ arylalkyl group" as used herein may be a group represented by -($A_{104}$)($A_{105}$) (wherein $A_{104}$ may be a $C_1$-$C_{54}$ alkylene group, and $A_{105}$ may be a $C_6$-$C_{59}$ aryl group), and the term $C_2$-$C_{60}$ heteroarylalkyl group" as used herein may be a group represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

In the specification, the group "$R_{10a}$" may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

In the specification, the groups $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —$C_1$; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

The term "heteroatom" as used herein may be any atom other than a carbon atom or a hydrogen atom. Examples of a heteroatom may include O, S, N, P, Si, B, Ge, Se, and any combination thereof.

The term "third-row transition metal" as used herein may be hafnium (Hf), tantalum (Ta), tungsten (W), rhenium (Re), osmium (Os), iridium (Ir), platinum (Pt), gold (Au), or the like.

In the specification, "Ph" refers to a phenyl group, "Me" refers to a methyl group, "Et" refers to an ethyl group, "ter-Bu" or "$Bu^t$" each refers to a tert-butyl group, and "OMe" refers to a methoxy group.

The term "biphenyl group" as used herein may be a "phenyl group substituted with a phenyl group." For example, the "biphenyl group" may be a substituted phenyl group having a $C_6$-$C_{60}$ aryl group as a substituent.

The term "terphenyl group" as used herein may be a "phenyl group substituted with a biphenyl group." For example, the "terphenyl group" may be a substituted phenyl group having, as a substituent, a $C_6$-$C_{60}$ aryl group substituted with a $C_6$-$C_{60}$ aryl group.

The symbols *, *', and *" as used herein, unless defined otherwise, each refer to a binding site to an adjacent atom in a corresponding formula or moiety.

Hereinafter, compounds according to embodiments and light-emitting devices according to embodiments will be described in detail with reference to the Synthesis Examples and Examples. The wording "B was used instead of A" used in describing Synthesis Examples means that an identical molar equivalent of B was used in place of A.

EXAMPLES
Synthesis Example 1: Synthesis of Compound 20
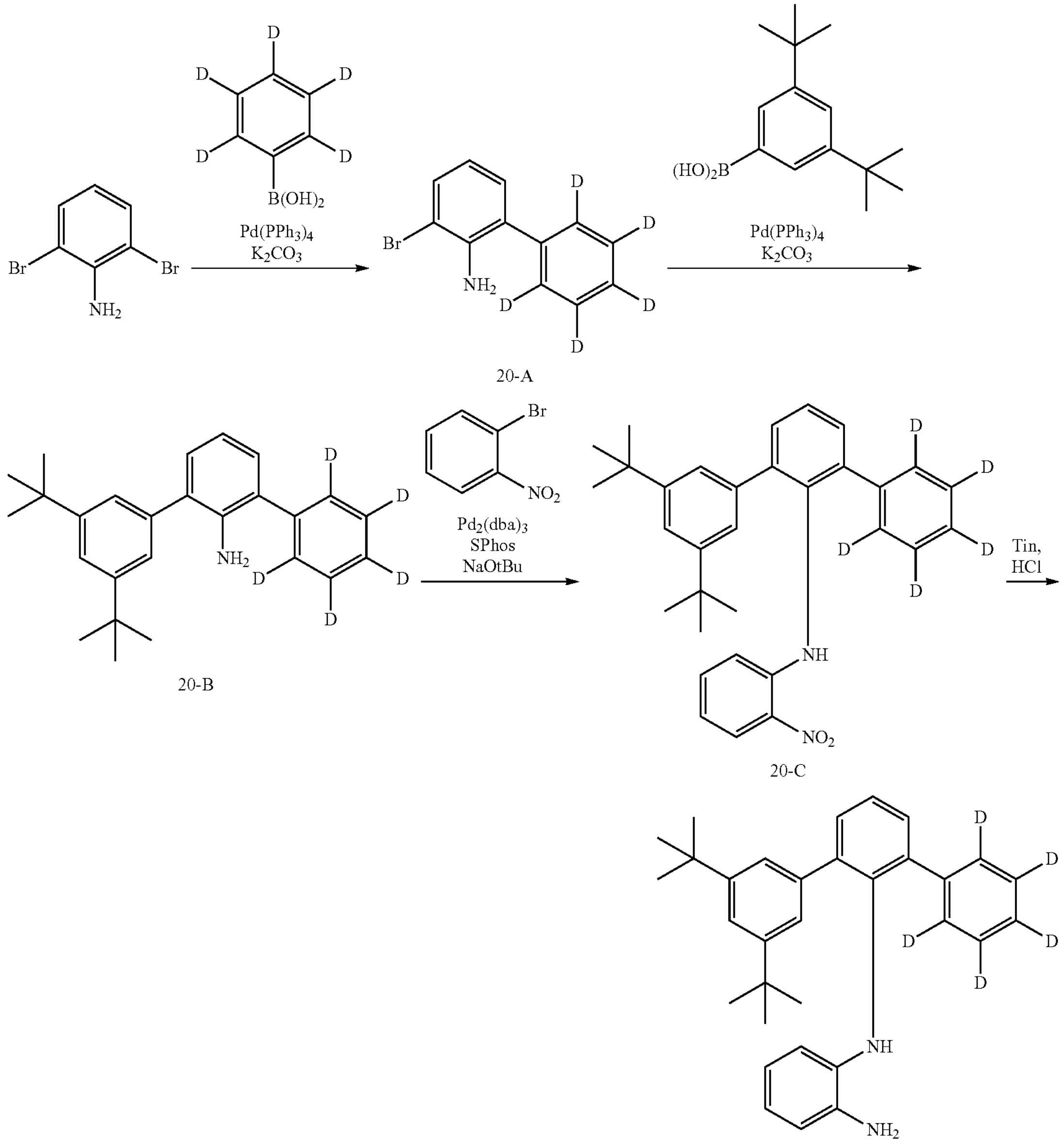
20-A
20-B
20-C
20-D
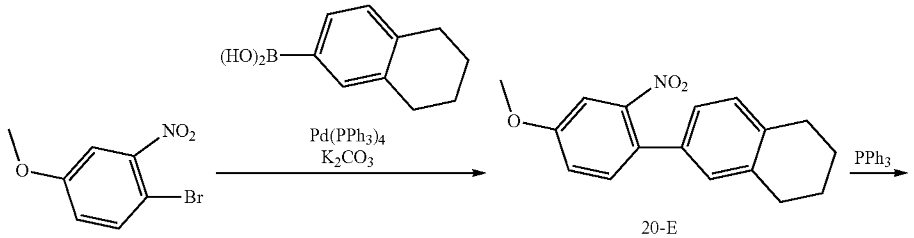
20-E -continued
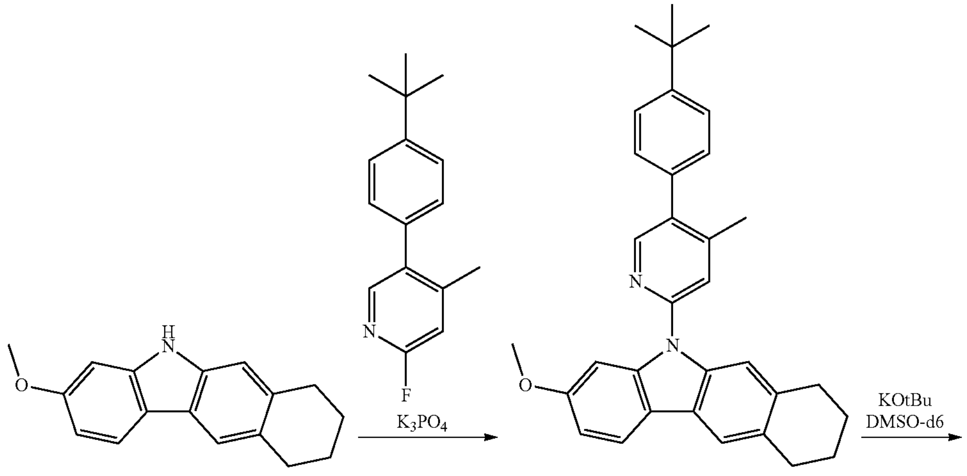
20-F 20-G
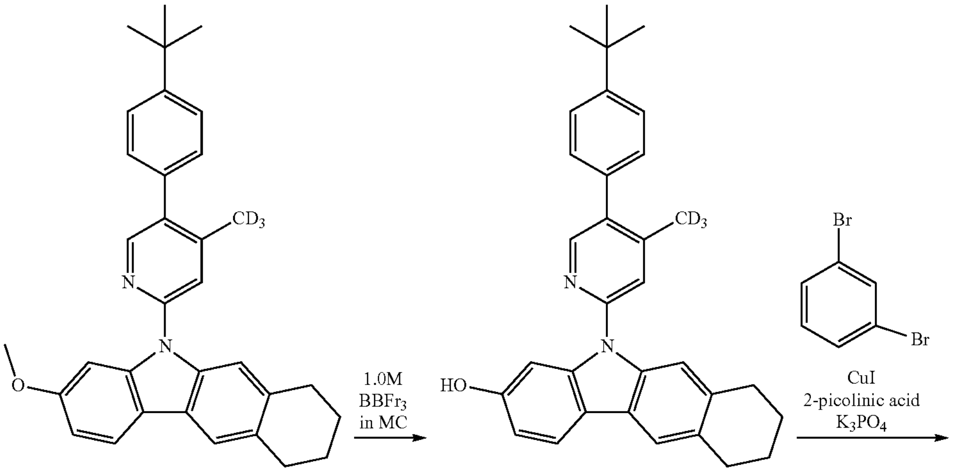
20-H 20-I
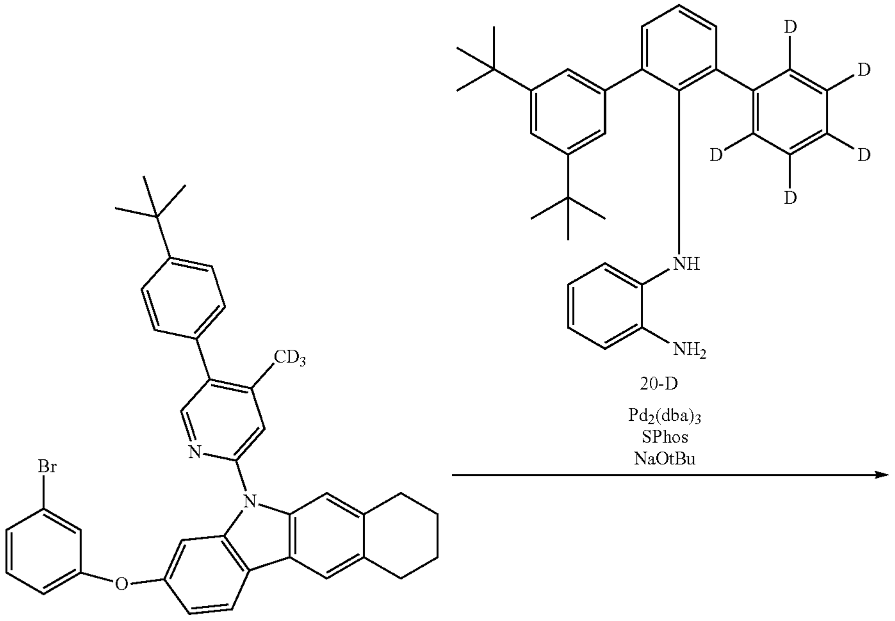
20-D
20-J -continued
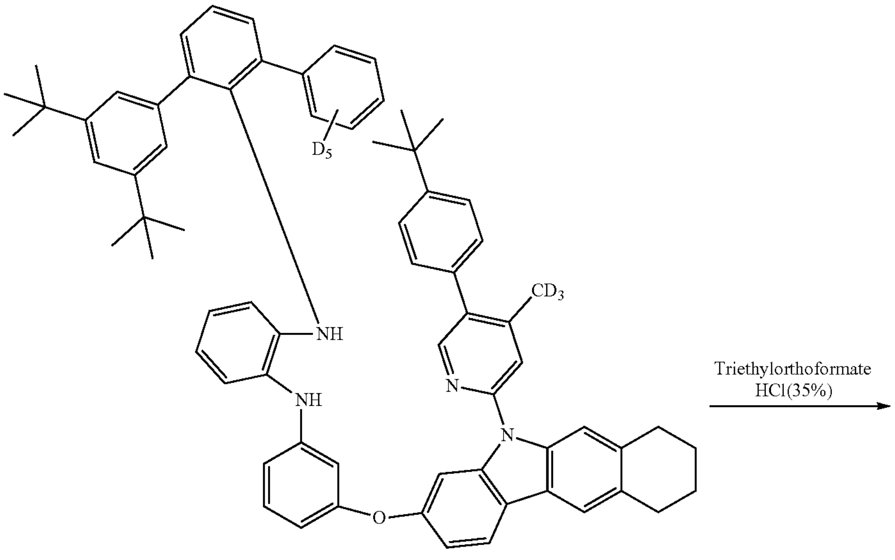
20-K
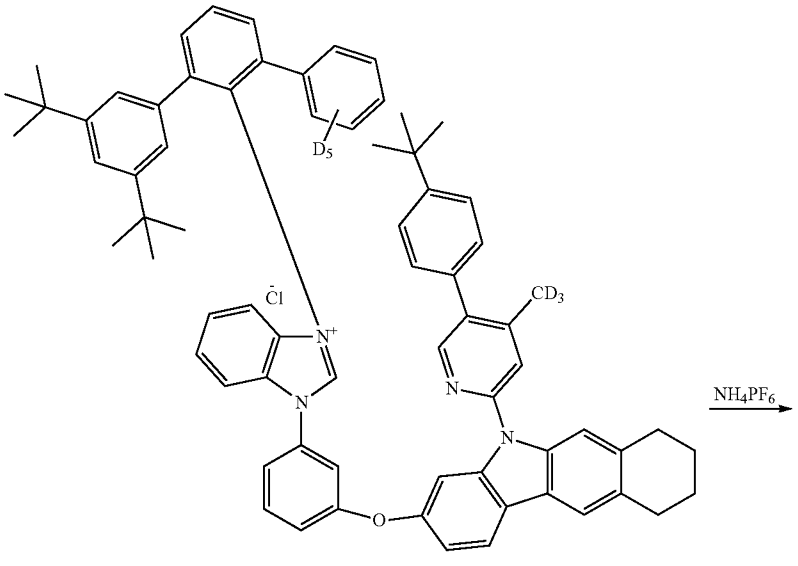
20-L -continued

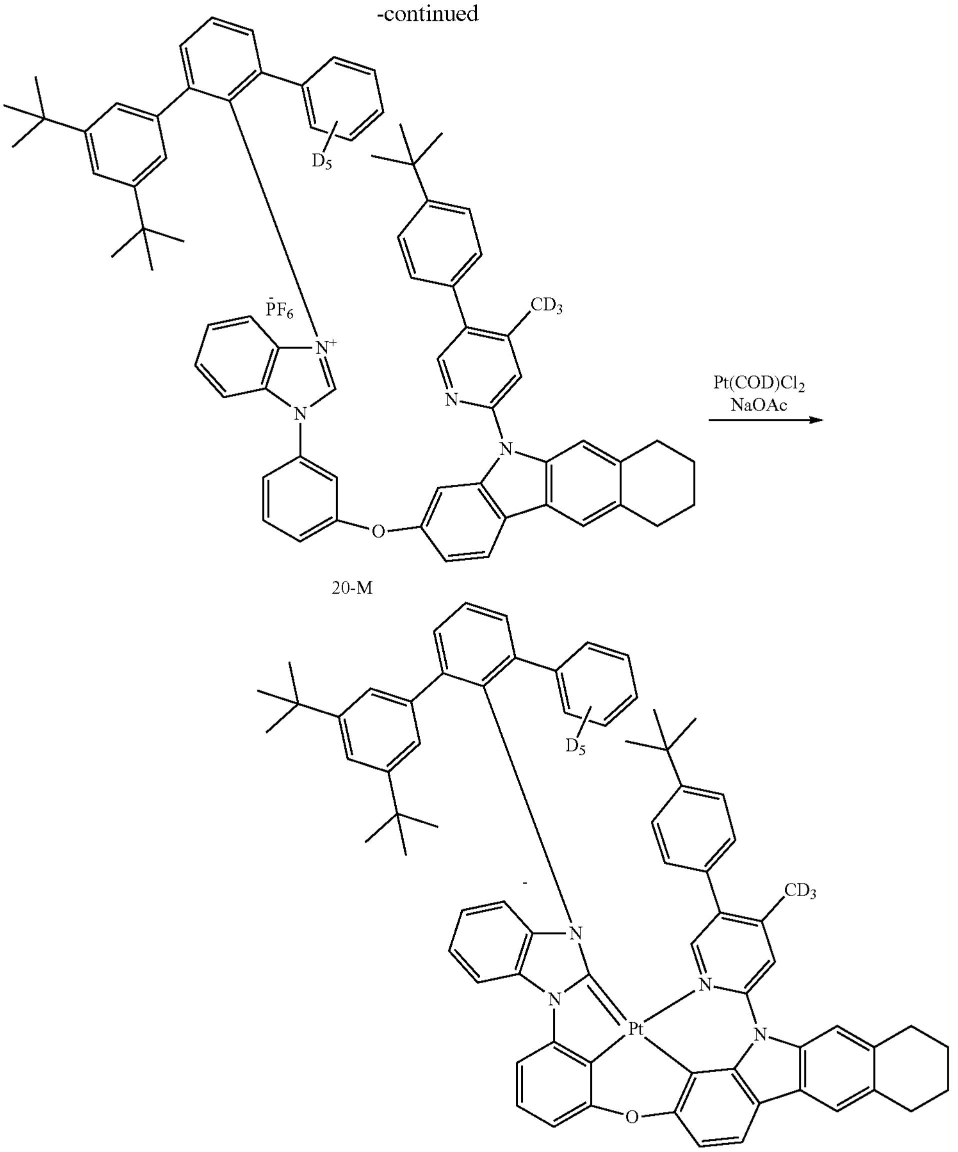

20-M

20

1) Synthesis of Intermediate [20-A]

2,6-dibromoaniline (2.0 eq), (phenyl-$d_5$)boronic acid (1.0 eq), $Pd(PPh_3)_4$ (0.05 eq), and $K_2CO_3$ (2.0 eq) were suspended in THF/$H_2O$ (4:1, 0.1 M). The reaction mixture was heated and stirred at 80° C. for 12 hours. After the reaction was terminated, the solvent was removed therefrom under reduced pressure, and an organic layer was extracted by using distilled water and methylene chloride. The extracted organic layer was washed by using a saturated NaCl aqueous solution and dried by using magnesium sulfate. The residue from which the solvent was removed was separated by using column chromatography to thereby obtain Intermediate [20-A](yield: 67%).

2) Synthesis of Intermediate [20-B]

Intermediate [20-A] (1.0 eq), (3,5-di-tert-butylphenyl) boronic acid (2.0 eq), $Pd(PPh_3)_4$ (0.05 eq), and $K_2CO_3$ (2.0 eq) were suspended in 1,4-dioxane/$H_2O$ (3:1, 0.1 M). The reaction mixture was heated and stirred at 100° C. for 12 hours. After the reaction was terminated, the solvent was removed therefrom under reduced pressure, and an organic layer was extracted by using distilled water and methylene chloride.

The extracted organic layer was washed by using a saturated NaCl aqueous solution and dried by using magnesium sulfate. The residue from which the solvent was removed was separated by using column chromatography to thereby obtain Intermediate [20-B] (yield: 83%).

3) Synthesis of Intermediate [20-C]

Intermediate [20-B] (1.0 eq), 1-bromo-2-nitrobenzene (1.3 eq), SPhos (0.07 eq), $Pd_2(dba)_3$ (0.05 eq), and sodium tert-butoxide (2.0 eq) were suspended in toluene (0.1 M). The reaction mixture was heated to a temperature of 110° C. and stirred for 12 hours. After the reaction was terminated, the solvent was removed therefrom under reduced pressure, and an organic layer was extracted by using distilled water and methylene chloride. The extracted organic layer was washed by using a saturated NaCl aqueous solution and dried by using magnesium sulfate. The residue from which the solvent was removed was separated by using column chromatography to thereby obtain Intermediate [20-C] (yield: 82%).

4) Synthesis of Intermediate [20-D]

Intermediate [20-C] (1.0 eq), tin (3.0 eq), and HCl (5.0 eq) were suspended in ethanol (0.1 M). The reaction mixture was heated and stirred at 80° C. for 12 hours. After the reaction was terminated, the reaction mixture was neutralized in an ice bath by using NaOH and was subjected to an extraction process by using methylene chloride. The extracted organic layer was washed by using a saturated NaCl aqueous solution and dried by using magnesium sulfate. The residue from which the solvent was removed was separated by using column chromatography to thereby obtain Intermediate [20-D] (yield: 85%).

5) Synthesis of Intermediate [20-E]

1-bromo-4-methoxy-2-nitrobenzene (1.0 eq), (5,6,7,8-tetrahydronaphthalen-2-yl)boronic acid (1.5 eq), $Pd(PPh_3)_4$ (0.05 eq), and $K_2CO_3$ (2.0 eq) were suspended in $THF/H_2O$ (4:1, 0.1 M). The reaction mixture was heated and stirred at 80° C. for 12 hours. After the reaction was terminated, the solvent was removed therefrom under reduced pressure, and an organic layer was extracted by using distilled water and methylene chloride. The extracted organic layer was washed by using a saturated NaCl aqueous solution and dried by using magnesium sulfate. The residue from which the solvent was removed was separated by using column chromatography to thereby obtain Intermediate [20-E] (yield: 66%).

5) Synthesis of Intermediate [20-F]

Intermediate [20-E] (1.0 eq) and $PPh_3$ (1.5 eq) were put in a reaction vessel and suspended in o-DCB (0.2 M). The reaction mixture was heated to a temperature of 120° C. and stirred for 12 hours. After the reaction was terminated, the mixture was cooled to room temperature, and an organic layer was extracted by utilizing distilled water and dichloromethane. The extracted organic layer was washed by using a saturated NaCl aqueous solution and dried by using magnesium sulfate. The residue from which the solvent was removed was separated by using column chromatography to thereby obtain Intermediate [20-F] (yield: 49%).

7) Synthesis of Intermediate [20-G]

Intermediate [20-F] (1.0 eq), 5-(4-(tert-butyl)phenyl)-2-fluoro-4-methylpyridine (2.0 eq), and $K_3PO_4$ (2.0 eq) were put in a reaction vessel and suspended in DMF (0.1 M). The reaction mixture was heated, and stirred at 160° C. for 12 hours. After the reaction was terminated, the mixture was cooled to room temperature, and an organic layer was extracted by utilizing distilled water and dichloromethane. The extracted organic layer was washed by using a saturated NaCl aqueous solution and dried by using magnesium sulfate. The residue from which the solvent was removed was separated by using column chromatography to thereby obtain Intermediate [20-G](yield: 83%).

8) Synthesis of Intermediate [20-H]

Intermediate [20-G] (1.0 eq) and KOtBu (0.2 eq) were put in a reaction vessel and suspended in DMSO-$d_6$ (0.5 M). The reaction mixture was heated and stirred at 80 to 90° C. for 6 hours. After the reaction was terminated, the mixture was cooled to room temperature, and an organic layer was extracted by utilizing distilled water and dichloromethane. The extracted organic layer was washed by using a saturated NaCl aqueous solution and dried by using magnesium sulfate. The residue from which the solvent was removed was separated by using column chromatography to thereby obtain Intermediate [20-H] (yield: 89%).

9) Synthesis of Intermediate [20-I]

Intermediate [20-H] (1.0 eq) was placed in a reaction vessel and suspended in dichloromethane (0.15 M). 1.0 M $BBr_3$ in dichloromethane (2.0 eq) was slowly added dropwise to the reaction vessel at 0° C. After the dropwise addition, the mixture was stirred at room temperature for 12 hours. After an excess amount of distilled water was poured to terminate the reaction, the aqueous layer was neutralized by using NaOH, and an organic layer was extracted by using distilled water and dichloromethane. The organic layer was dried by using magnesium sulfate, and the residue from which the solvent was removed was separated by using column chromatography to thereby obtain Intermediate [20-1] (yield: 70%).

10) Synthesis of Intermediate [20-J]

Intermediate [20-1] (1.0 eq), 1,3-dibromobenzene (2.0 eq), CuI (0.1 eq), 2-picolinic acid (0.2 eq), and $K_3PO_4$ (2.0 eq) were put in a reaction vessel and suspended in DMSO (0.15 M). The reaction mixture was heated and stirred at 100° C. for 12 hours. After the reaction was terminated, the mixture was cooled to room temperature, and an organic layer was extracted by utilizing distilled water and dichloromethane. The extracted organic layer was washed by using a saturated NaCl aqueous solution and dried by using magnesium sulfate. The residue from which the solvent was removed was separated by using column chromatography to thereby obtain Intermediate [20-J](yield: 72%).

11) Synthesis of Intermediate [20-K]

Intermediate [20-J] (1.0 eq), Intermediate [20-D] (1.2 eq), SPhos (0.075 eq), $Pd_2(dba)_3$ (0.05 eq), and sodium tert-butoxide (2.0 eq) were suspended in toluene (0.1 M). The reaction mixture was heated to a temperature of 110° C. and stirred for 12 hours. After the reaction was terminated, the solvent was removed therefrom under reduced pressure, and an organic layer was extracted by using distilled water and methylene chloride. The extracted organic layer was washed by using a saturated NaCl aqueous solution and dried by using magnesium sulfate. The residue from which the solvent was removed was separated by using column chromatography to thereby obtain Intermediate [20-K] (yield: 79%).

12) Synthesis of Intermediate [20-L]

Intermediate [20-K] (1.0 eq), triethylorthoformate (50 eq), and HCl (1.2 eq) were dissolved, and the reaction mixture was heated and stirred at 80° C. for 12 hours. After the reaction was terminated, the solvent was removed therefrom under reduced pressure, and an organic layer was extracted by using distilled water and methylene chloride. The extracted organic layer was washed by using a saturated NaCl aqueous solution and dried by using magnesium sulfate. The residue from which the solvent was removed was separated by using column chromatography to thereby obtain Intermediate [20-L] (yield: 81%).

13) Synthesis of Intermediate [20-M]

Intermediate [20-L] (1.0 eq) was placed in a reaction vessel and suspended in a mixed solution of methanol and distilled water at a ratio of 2:1. The mixture was sufficiently dissolved, and ammonium hexafluorophosphate (3.0 eq) was slowly added thereto, followed by stirring the reaction solution at room temperature for 12 hours. After the reaction was terminated, the thus produced solid was filtered. The obtained solid was dissolved in dichloromethane and dried by using magnesium sulfate, and the solvent was removed therefrom to thereby obtain Intermediate [20-M] (yield: 98%).

14) Synthesis of Compound 20

Intermediate [20-M] (1.0 eq), dichloro(1,5-cyclooctadiene)platinum (1.1 eq), and sodium acetate (3.0 eq) were suspended in 1,4-dioxane (0.1 M). The reaction mixture was heated to a temperature of 120° C. and stirred for 72 hours. Once the reaction was complete, the mixture was cooled to room temperature, and an extraction process was performed thereon by using distilled water and ethyl acetate. The extracted organic layer was washed by using a saturated NaCl aqueous solution and dried by using magnesium sulfate. The residue from which the solvent was removed was separated by using column chromatography to thereby obtain Compound 20 (yield: 34%).

Synthesis Example 2: Synthesis of Compound 58

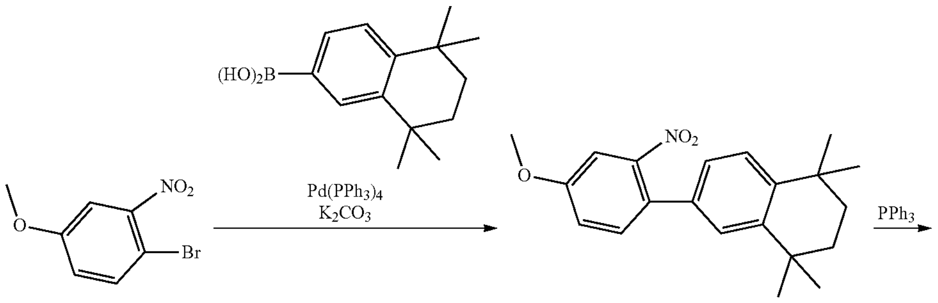

58-A

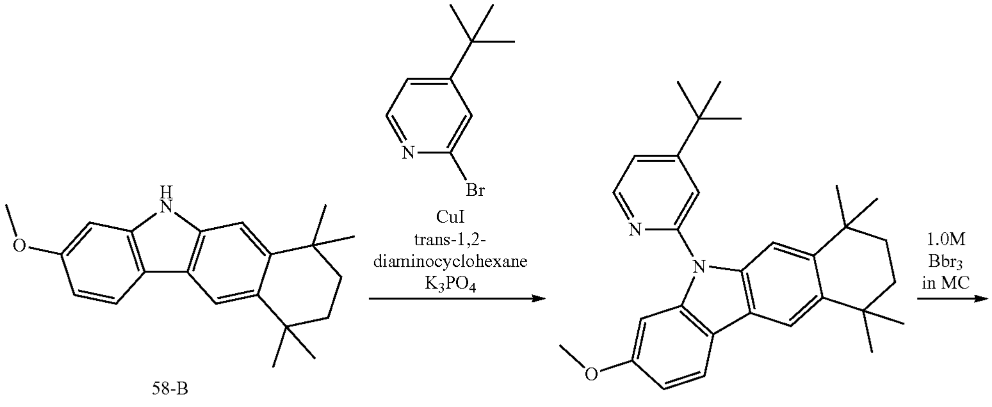

58-B

58-C

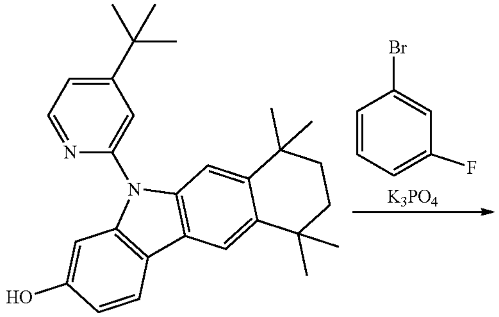

58-D

-continued
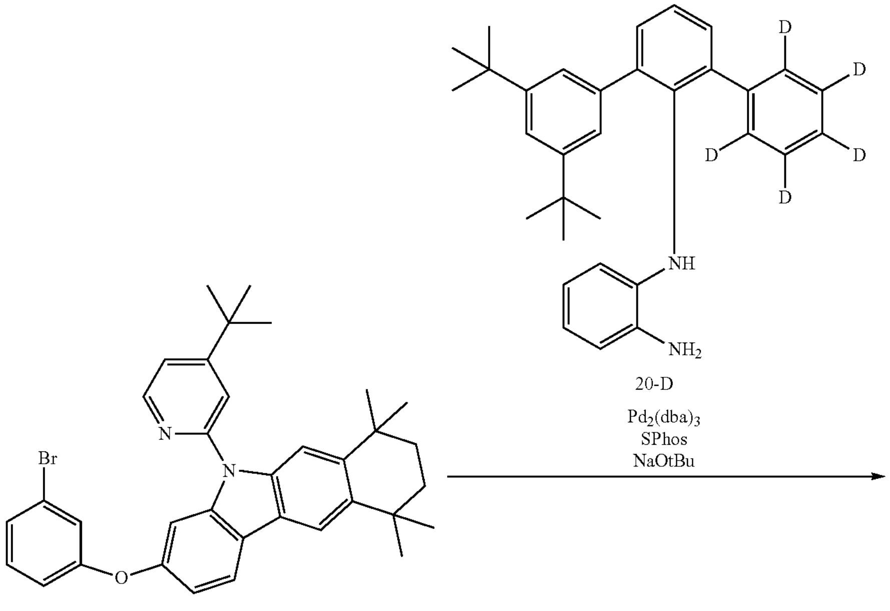
20-D
58-E
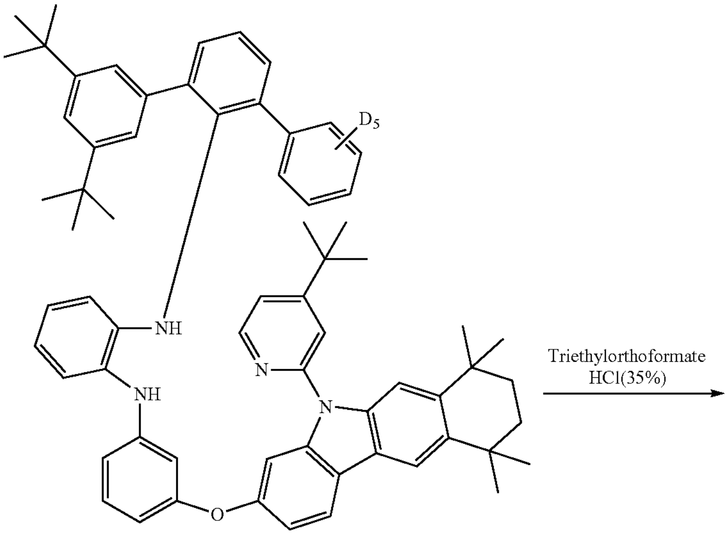
58-F

-continued

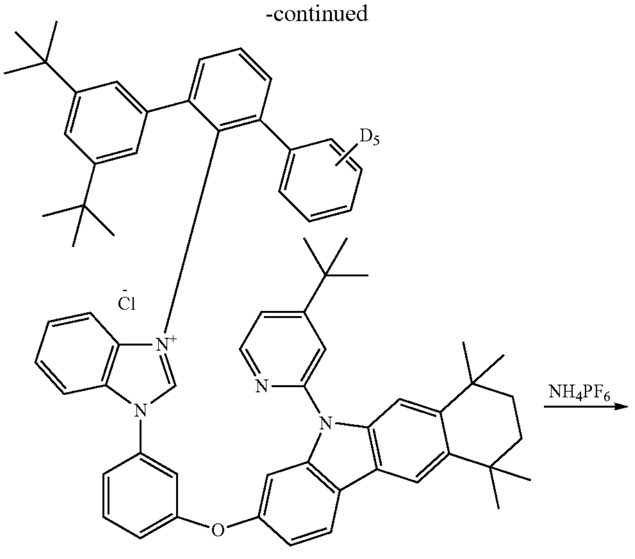

58-G

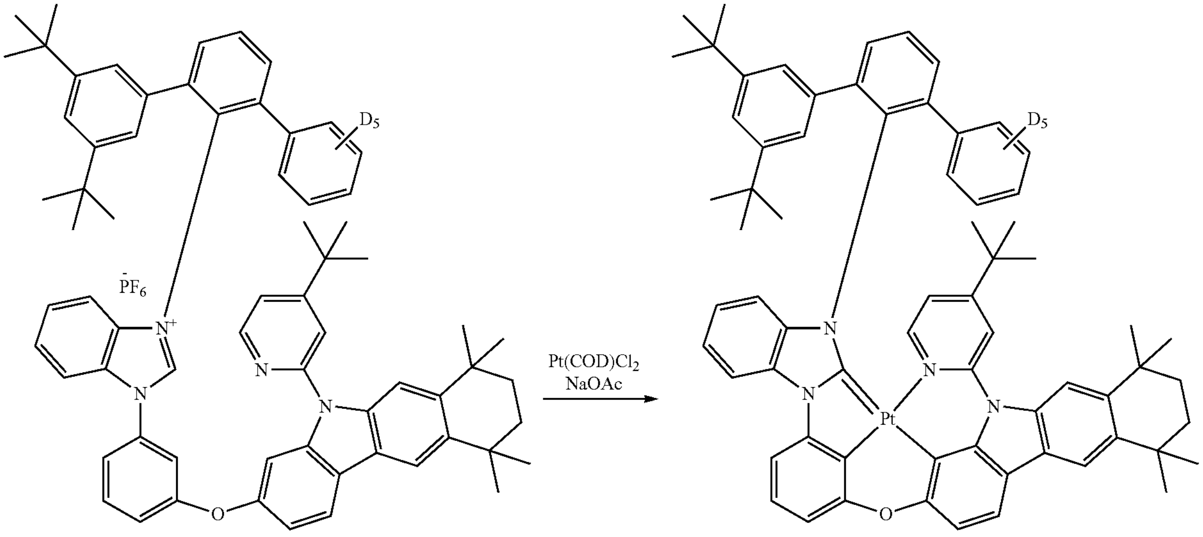

58-H

58

1) Synthesis of Intermediate [58-A]

Intermediate [58-A] (yield: 73%) was obtained in the same manner as in the Synthesis Example of Intermediate [20-E], except that (5,5,8,8-tetramethyl-5,6,7,8-tetrahydronaphthalen-2-yl)boronic acid was used instead of (5,6,7,8-tetrahydronaphthalen-2-yl)boronic acid.

2) Synthesis of Intermediate [58-B]

Intermediate [58-B] (yield: 47%) was obtained in the same manner as in the Synthesis Example of Intermediate [20-F], except that Intermediate [58-A] was used instead of Intermediate [20-E].

Synthesis of Intermediate [58-C]

Intermediate [58-B] (1.0 eq), 2-bromo-4-(tert-butyl)pyridine (1.5 eq), CuI (0.3 eq), trans-1,2-diaminocyclohexane (0.3 eq), and $K_3PO_4$ (2.0 eq) were placed in a reaction vessel and suspended in dioxane (0.1 M). The reaction mixture was heated to a temperature of 120° C. and stirred for 12 hours. Once the reaction was complete, the mixture was cooled to room temperature, and an extraction process was performed thereon by using distilled water and dichloromethane. Once the extracted organic layer was washed using saturated NaCl aqueous solution and dried using magnesium sulfate. The residue from which the solvent was removed was separated by using column chromatography to thereby obtain Intermediate [58-C] (yield: 80%).

3) Synthesis of Intermediate [58-D]

Intermediate [58-D] (yield: 72%) was obtained in the same manner as in the Synthesis Example of Intermediate [20-1], except that Intermediate [58-C] was used instead of Intermediate [20-H].

4) Synthesis of Intermediate [58-E]

Intermediate [58-D] (1.0 eq), 1-bromo-3-fluorobenzene (2.0 eq), and $K_3PO_4$ (2.0 eq) were put in a reaction vessel and suspended in DMF (0.1 M). The reaction mixture was heated, and stirred at 160° C. for 12 hours. After the reaction was terminated, the mixture was cooled to room temperature, and an organic layer was extracted by utilizing distilled water and dichloromethane. The extracted organic layer was washed by using a saturated NaCl aqueous solution and dried by using magnesium sulfate. The residue from which the solvent was removed was separated by using column chromatography to thereby obtain Intermediate [58-E] (yield: 82%).

5) Synthesis of Intermediate [58-F]

Intermediate [58-F] (yield: 83%) was obtained in the same manner as in the Synthesis Example of Intermediate [20-K], except that Intermediate [58-E] was used instead of Intermediate [20-J].

6) Synthesis of Intermediate [58-G]

Intermediate [58-G] (yield: 85%) was obtained in the same manner as in the Synthesis Example of Intermediate [20-L], except that Intermediate [58-F] was used instead of Intermediate [20-K].

7) Synthesis of Intermediate [58-H]

Intermediate [58-H] (yield: 94%) was obtained in the same manner as in the Synthesis Example of Intermediate [20-M], except that Intermediate [58-G] was used instead of Intermediate [20-L]. 8) Synthesis of Compound 58

Compound 58 (yield: 30%) was obtained in the same manner as in the Synthesis Example of Compound 20, except that Intermediate [58-H] was used instead of Intermediate [20-M].

Synthesis Example 3: Synthesis of Compound 68

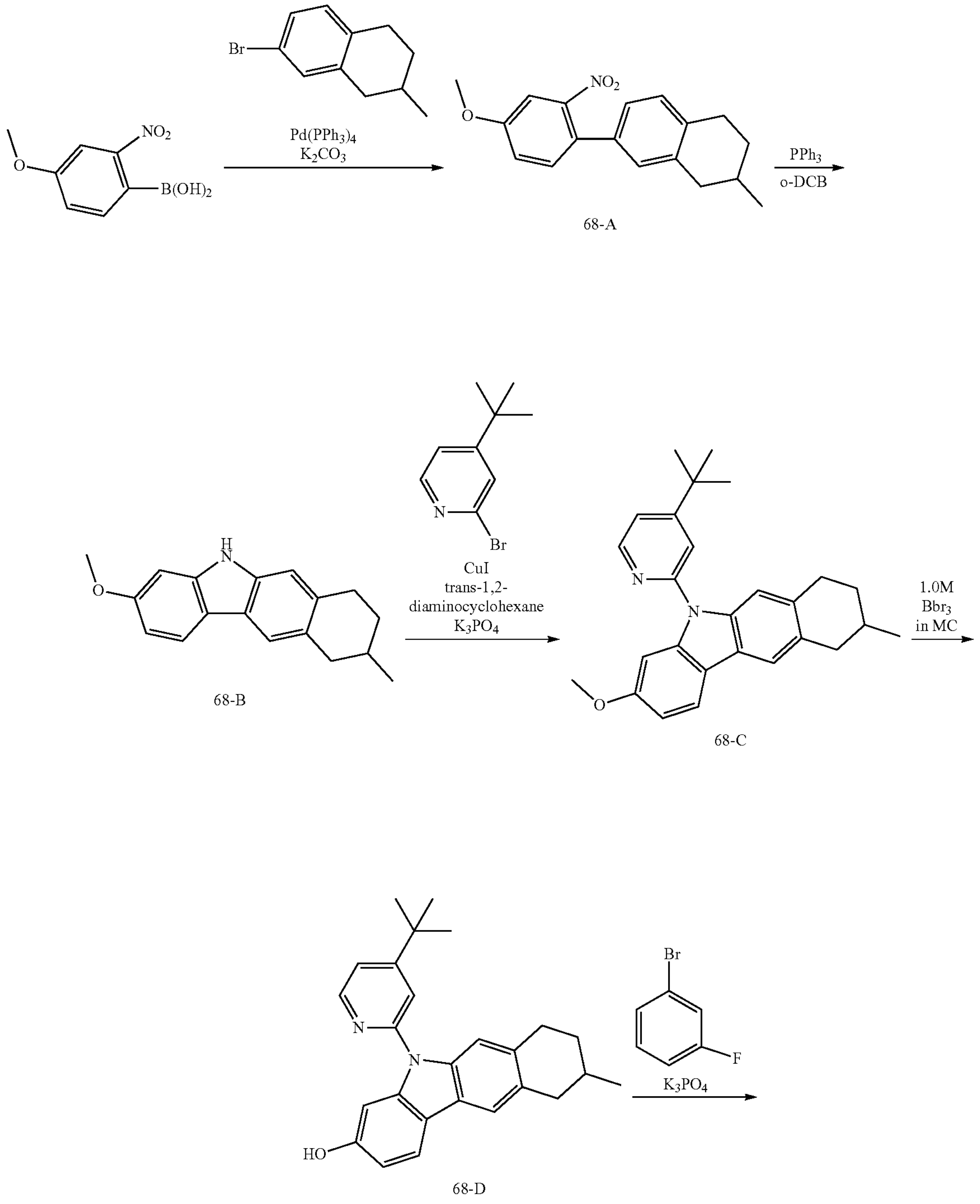

-continued
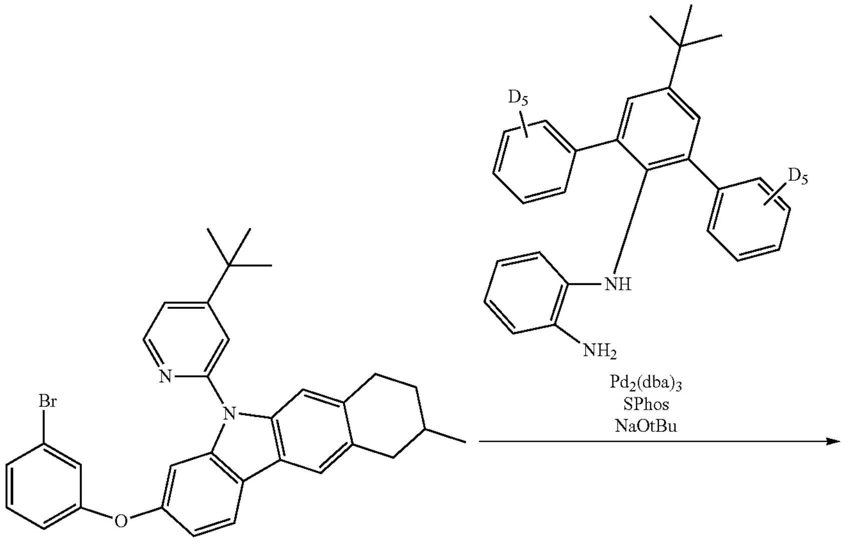
68-E
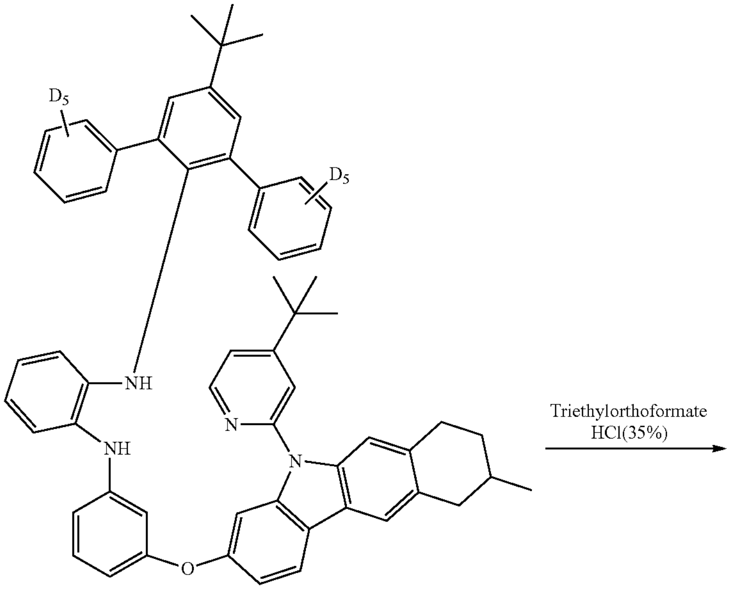
68-F

-continued
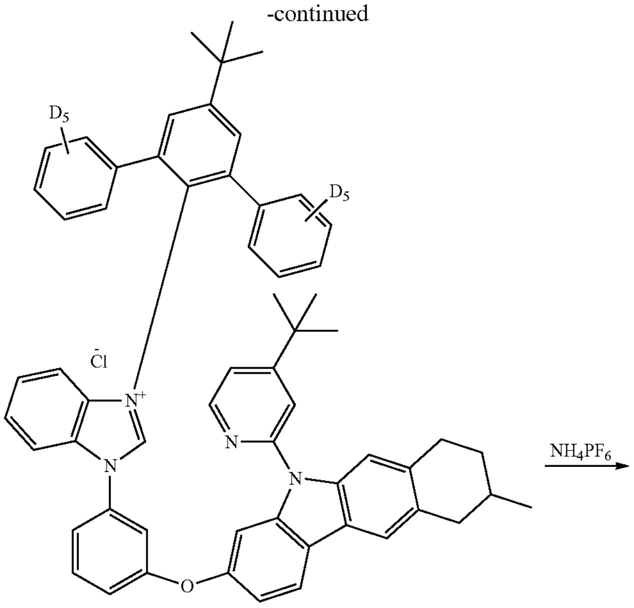
68-G
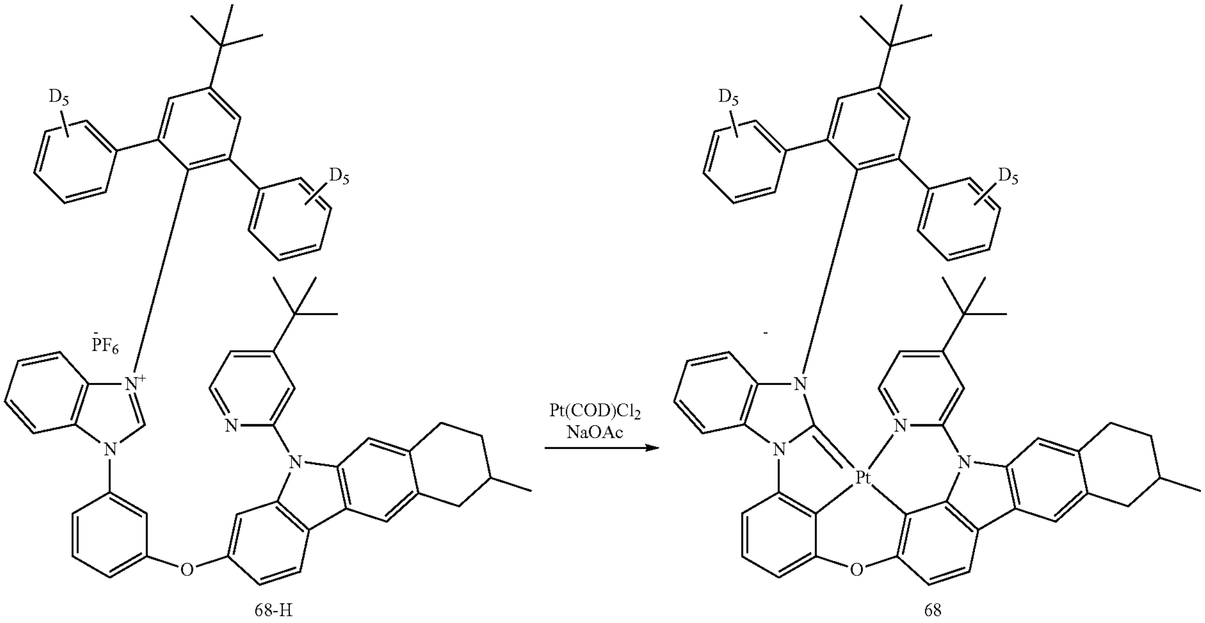
68-H
68

1) Synthesis of Intermediate [68-A]

(4-methoxy-2-nitrophenyl)boronic acid (1.5 eq), 7-bromo-2-methyl-1,2,3,4-tetrahydronaphthalene (1.0 eq), $Pd(PPh_3)_4$ (0.05 eq), and $K_2CO_3$ (2.0 eq) were suspended in $THF/H_2O$ (4:1, 0.1 M). The reaction mixture was heated and stirred at 80° C. for 12 hours. After the reaction was terminated, the solvent was removed therefrom under reduced pressure, and an organic layer was extracted by using distilled water and methylene chloride. The extracted organic layer was washed by using a saturated NaCl aqueous solution and dried by using magnesium sulfate. The residue from which the solvent was removed was separated by using column chromatography to thereby obtain Intermediate [68-A] (yield: 67%).

2) Synthesis of Intermediate [68-B]

Intermediate [68-B] (yield: 52%) was obtained in the same manner as in the Synthesis Example of Intermediate [20-F], except that Intermediate [68-A] was used instead of Intermediate [20-E].

3) Synthesis of Intermediate [68-C]

Intermediate [68-C] (yield: 77%) was obtained in the same manner as in the Synthesis Example of Intermediate [58-C], except that Intermediate [68-B] was used instead of Intermediate [58-B].

4) Synthesis of Intermediate [68-D]

Intermediate [68-D] (yield: 68%) was obtained in the same manner as in the Synthesis Example of Intermediate [20-1], except that Intermediate [68-C] was used instead of Intermediate [20-H].

5) Synthesis of Intermediate [68-E]

Intermediate [68-E] (yield: 82%) was obtained in the same manner as in the Synthesis Example of Intermediate [58-E], except that Intermediate [68-D] was used instead of Intermediate [58-D].

6) Synthesis of Intermediate [68-F]

Intermediate [68-F] (yield: 80%) was obtained in the same manner as in the Synthesis Example of Intermediate [20-K], except that N1-(5'-(tert-butyl)-[1,1':3',1"-terphenyl]-2'-yl-2,2",3,3",4,4",5,5",6,6"-d10)benzene-1,2-diamine was used instead of Intermediate [20-D] and Intermediate [68-E] was used instead of Intermediate [20-J].

7) Synthesis of Intermediate [68-G]

Intermediate [68-G] (yield: 81%) was obtained in the same manner as in the Synthesis Example of Intermediate [20-L], except that Intermediate [68-F] was used instead of Intermediate [20-K].

8) Synthesis of Intermediate [68-H]

Intermediate [68-H] (yield: 93%) was obtained in the same manner as in the Synthesis Example of Intermediate [20-M], except that Intermediate [68-G] was used instead of Intermediate [20-L].

9) Synthesis of Compound 68

Compound 68 (yield: 32%) was obtained in the same manner as in the Synthesis Example of Compound 20, except that Intermediate [68-H] was used instead of Intermediate [20-M].

$^1H$ NMR and MS/FAB of the compounds synthesized according to Synthesis Examples are shown in Table 1. Synthesis methods of other compounds in addition to the compounds synthesized in the Synthesis Examples may be readily recognized by those skilled in the art by referring to the synthesis paths and source materials.

TABLE 1

| Compound No. | $^1H$ NMR ($CDCl_3$, 400 MHz) | MS/FAB found | MS/FAB calc. |
|---|---|---|---|
| 20 | 9.08(s, 1H), 8.84(s, 1H), 8.20(d, 2H), 8.09(d, 1H), 8.01(s, 1H), 7.74(s, 2H), 7.59(s, 1H), 7.55(s, 1H), 7.39-7.37(m, 3H), 7.30(m, 2H), 7.16-7.13(m, 4H), 6.95(m, 2H), 6.91(d, 1H), 6.65(d, 1H), 2.71(m, 4H), 1.74(m, 4H), 1.32-1.33(s, 27H) | 1193.54 | 1194.54 |
| 58 | 8.88(s, 1H), 8.74(d, 1H), 8.20(d, 2H), 8.08(d, 1H), 8.04(s, 1H), 7.74(s, 2H), 7.55(s, 1H), 7.38-7.42(m, 3H), 7.13-7.17(m, 4H), 6.90-6.96(m, 3H), 6.66(d, 1H), 1.48(s, 4H), 1.32(s, 27H),, 0.92(s, 12H) | 1156.54 | 1157.43 |
| 68 | 8.85(s, 1H), 8.75(d, 1H), 8.08(d, 1H), 8.02(s, 1H), 7.98(s, 2H), 7.42(d, 1H), 7.40(s, 1H), 7.14-7.17(m, 4H), 6.90-6.96(m 3H), 6.67(d, 1H), 2.66-2.89(m, 4H), 1.42-1.67(m, 3H), 1.33(s, 18H), 0.94(d, 3H) | 1063.46 | 1064.28 |

Example 1

As an anode, a glass substrate (product of Corning Inc.) with a 15 Ω/$cm^2$ (1,200 Å) ITO formed thereon was cut to a size of 50 mm×50 mm×0.7 mm, sonicated using isopropyl alcohol and pure water each for 5 minutes, washed by irradiation of ultraviolet rays and exposure of ozone thereto for 30 minutes, and mounted on a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, referred as "NPB") was vacuum-deposited on the hole injection layer to form a hole transport layer having a thickness of 300 Å.

Compound 20 (first compound), Compound ETH66 (second compound), and Compound HTH29 (third compound) were vacuum-deposited on the hole transport layer to form an emission layer having a thickness of 400 Å. An amount of Compound 20 was 10 wt %, based on 100 wt % of the total weight of the emission layer, and a weight ratio of Compound ETH66 to Compound HTH29 was 3:7.

Compound ETH2 was vacuum-deposited on the emission layer to form a hole blocking layer having a thickness of 50 Å, $Alq_3$ was vacuum-deposited on the hole blocking layer to form an electron transport layer having a thickness of 300 Å, LiF was vacuum-deposited on the electron transport layer to form an electron injection layer having a thickness of 10 Å, and Al was vacuum-deposited thereon to form a cathode having a thickness of 3,000 Å, thereby completing manufacture of an organic light-emitting device.

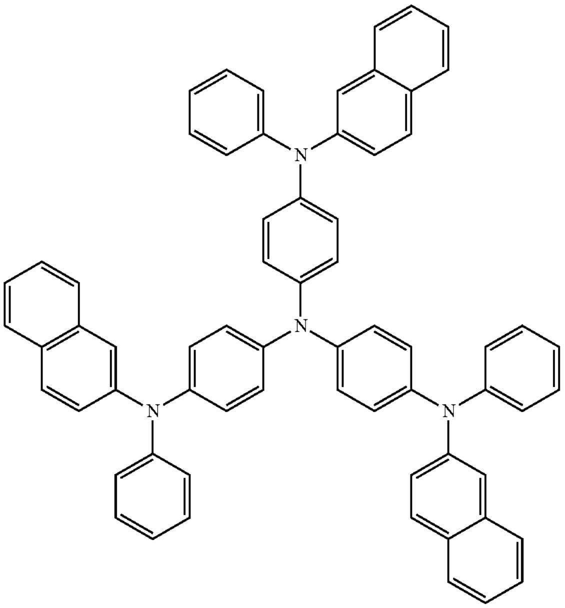

2-TNATA

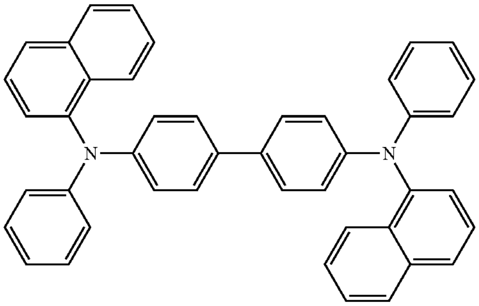

NPB

ETH66

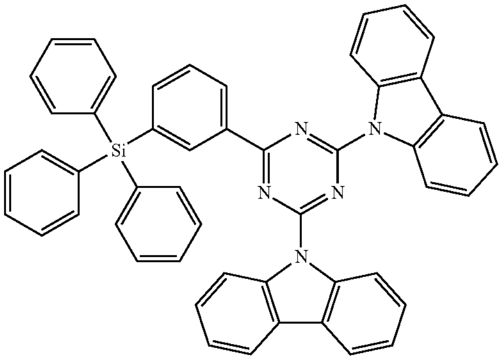

-continued

HTH29

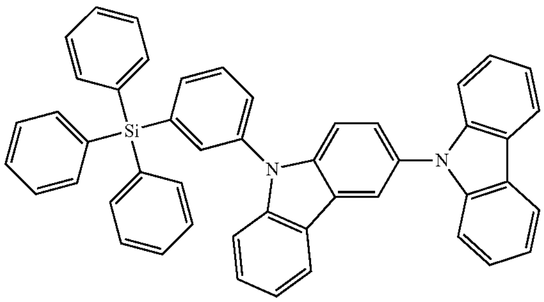

ETH2

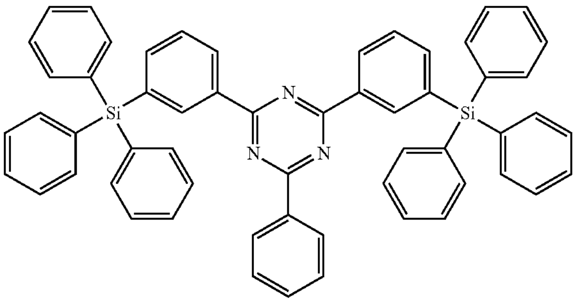

Examples 2 and 3 and Comparative Examples 1 and 2

Organic light-emitting devices were manufactured in the same manner as in Example 1, except that the first compound, the second compound, and the third compound as shown in Table 2 were used when forming the emission layer.

Evaluation Example 1

The driving voltage (V) at 1,000 cd/$m^2$, efficiency (cd/A), maximum emission wavelength (nm), and lifespan ($T_{95}$) of the light-emitting devices manufactured in Examples 1 to 3 and Comparative Examples 1 and 2 were each measured by using a Keithley MU 236 and a luminance meter PR650. The results are shown in Table 2. In Table 2, the lifespan (LT95) indicates a time (hour) for the luminance of each light-emitting device to decline to 95% of its initial luminance.

TABLE 2

| | Dopant | Host | | | | | Emission | |
|---|---|---|---|---|---|---|---|---|
| | First compound | Second compound | Third compound | Luminance (cd/$m^2$) | Driving voltage (V) | Efficiency (cd/A) | wavelength (nm) | Lifespan ($LT_{95}$) (hours) |
| Example 1 | BD20 | ETH66 | HTH29 | 1000 | 4.3 | 20.5 | 462 | 52 |
| Example 2 | BD58 | ETH66 | HTH29 | 1000 | 4.4 | 22.8 | 461 | 68 |
| Example 3 | BD68 | ETH66 | HTH29 | 1000 | 4.3 | 24.1 | 462 | 61 |

TABLE 2-continued
| | Dopant | Host | | | | | Emission | |
|---|---|---|---|---|---|---|---|---|
| | First compound | Second compound | Third compound | Luminance (cd/m$^2$) | Driving voltage (V) | Efficiency (cd/A) | wavelength (nm) | Lifespan ($LT_{95}$) (hours) |
| Comparative Example 1 | CE1 | ETH66 | HTH29 | 1000 | 4.5 | 17.6 | 464 | 9 |
| Comparative Example 2 | CE2 | ETH66 | HTH29 | 1000 | 4.7 | 15.4 | 495 | 16 |
20
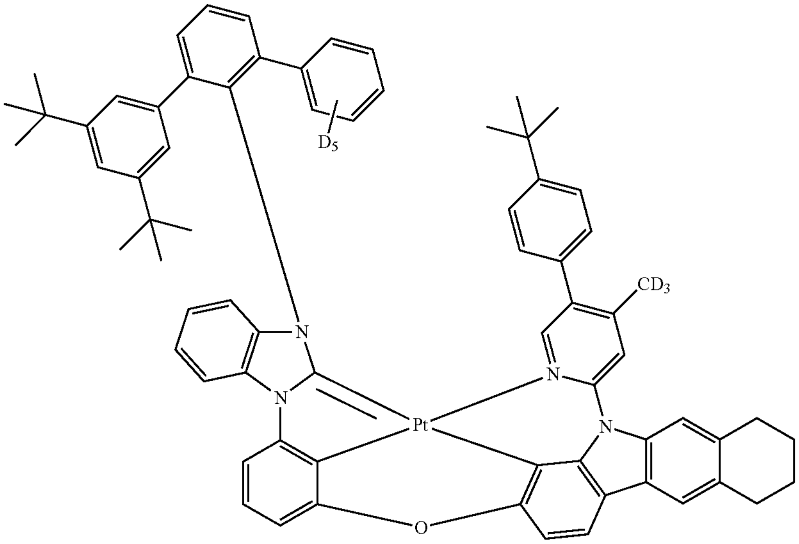
58
68
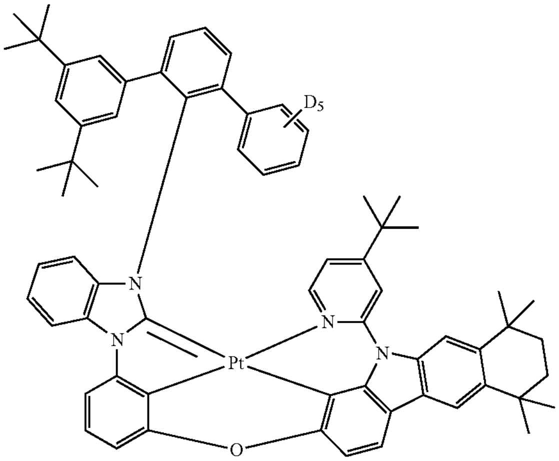
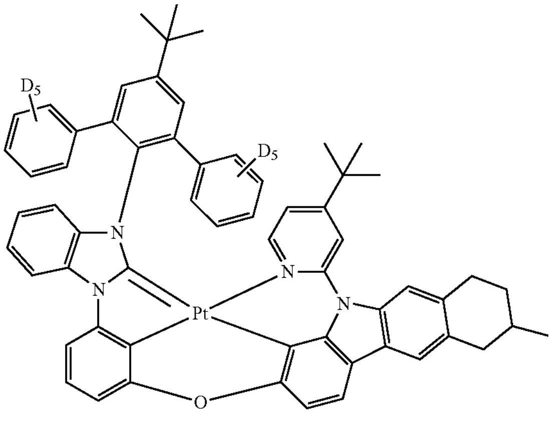
CE1
CE2
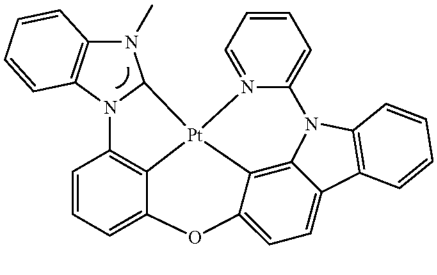
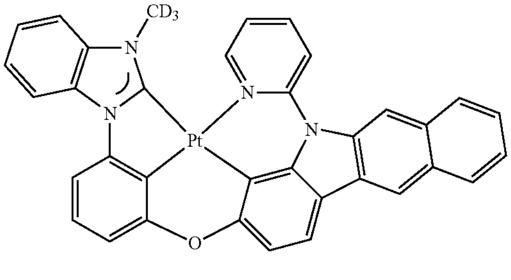

From Table 2, it was confirmed that the organic light-emitting devices according to Examples 1 to 3 had superior efficiency and device lifespan, compared to those of the organic light-emitting devices according to Comparative Examples 1 and 2.

According to the embodiments, a light-emitting device having high efficiency and a long lifespan and a high-quality electronic apparatus including the same may be manufactured by using the organometallic compound.

Embodiments have been disclosed herein, and although terms are employed, they are used and are to be interpreted in a generic and descriptive sense only and not for the purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:

a first electrode;

a second electrode facing the first electrode;

an interlayer between the first electrode and the second electrode and including an emission layer; and an organometallic compound represented by Formula 1:

[Formula 1]

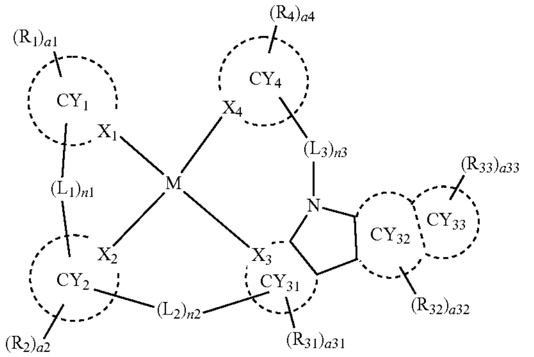

wherein in Formula 1,

M is platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $X_1$ to $X_4$ are each independently C or N, rings $CY_1$, $CY_2$, $CY_{31}$ to $CY_{33}$, and $CY_4$ are each independently a $C_5$-$C_{30}$ carbocyclic group or a $C_1$-$C_{30}$ heterocyclic group, ring $CY_{33}$ is a 5-membered or greater non-aromatic $C_4$-$C_8$ monocyclic group, rings $CY_{32}$ and $CY_{33}$ are condensed with each other to form a $C_5$-$C_{30}$ polycyclic group, $L_1$ to $L_3$ are each independently a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—*', *—N($R_{1a}$)—*', *—O—*', *—P($R_{1a}$)—*', *—Al($R_{1a}$)—*, *—Si($R_{1a}$)($R_{1b}$)—*', *—P(=O)($R_{1a}$)—*', *—S—*', *—S(=O)—*',

*—S(=O)$_2$—*', or *—Ge($R_{1a}$)($R_{1b}$)—*', and * and *' each indicate a binding site to an adjacent atom, n1 to n3 are each independently an integer from 1 to 5, $R_1$, $R_2$, $R_{31}$ to $R_{33}$, $R_4$, $R_{1a}$, and Rib are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), provided that at least one $R_1$ is a triphenylenyl group, a1, a2, a31 to a33, and a4 are each independently an integer from 1 to 20, $R_{10a}$ is:

hydrogen, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O) ($Q_{11}$), —S(=O)$_2$ ($Q_{11}$), —P (=O) ($Q_{11}$) ($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O) ($Q_{21}$), —S(=O)$_2$ ($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$ ($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device of claim 1, wherein the emission layer comprises a host and a dopant, and the dopant comprises the organometallic compound.

3. The light-emitting device of claim 1, further comprising:

a second compound including at least one IT electron-deficient nitrogen-containing $C_1$-$C_{60}$ heterocyclic group, a third compound including a group represented by Formula 3, a fourth compound that is a delayed fluorescence compound, or a combination thereof, wherein the organometallic compound, the second compound, the third compound, and the fourth compound are different from each other:

[Formula 3]

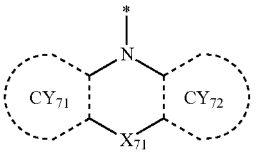

wherein in Formula 3, rings $CY_{71}$ and $CY_{72}$ are each independently a π electron-rich $C_3$-$C_{60}$ cyclic group or a pyridine group, $X_{71}$ is: a single bond; or a linking group including O, S, N, B, C, Si, or a combination thereof, and

* indicates a binding site to an atom included in the remaining portion other than the group represented by Formula 3 in the third compound.

4. The light-emitting device of claim 3, wherein the second compound comprises a pyridine group, a pyrimidine group, a pyrazine group, a pyridazine group, a triazine group, or a combination thereof, and the fourth compound is a compound comprising at least one cyclic group comprising boron (B) and nitrogen (N) as ring-forming atoms.

5. The light-emitting device of claim 3, wherein the emission layer comprises:

the organometallic compound; and the second compound, the third compound, the fourth compound, or a combination thereof, and the emission layer emits blue light.

6. An electronic apparatus comprising the light-emitting device of claim 1.

7. The electronic apparatus of claim 6, further comprising:

a thin-film transistor, wherein the thin-film transistor comprises a source electrode and a drain electrode, and the first electrode of the light-emitting device is electrically connected to at least one of the source electrode and the drain electrode.

8. The electronic apparatus of claim 6, further comprising a color filter, a color conversion layer, a touch screen layer, a polarizing layer, or a combination thereof.

9. An electronic equipment comprising the light-emitting device of claim 1.

10. The electronic equipment of claim 9, wherein the electronic equipment is a flat panel display, a curved display, a computer monitor, a medical monitor, a television, a billboard, an indoor light, an outdoor light, a signal light, a head-up display, a fully transparent display, a partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a microdisplay, a three-dimensional (3D) display, a virtual reality display, an augmented reality display, a vehicle, a video wall with multiple displays tiled together, a theater screen, a stadium screen, a phototherapy device, or a signboard.

11. An organometallic compound represented by Formula 1:

[Formula 1]

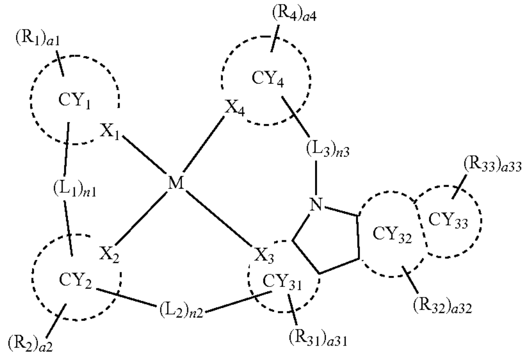

wherein in Formula 1,

M is platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $X_1$ to $X_4$ are each independently C or N, rings $CY_1$, $CY_2$, $CY_{31}$ to $CY_{33}$, and $CY_4$ are each independently a $C_5$-$C_{30}$ carbocyclic group or a $C_1$-$C_{30}$ heterocyclic group, ring $CY_{33}$ is a 5-membered or greater non-aromatic $C_4$-$C_8$ monocyclic group, rings $CY_{32}$ and $CY_{33}$ are condensed with each other to form a $C_5$-$C_{30}$ polycyclic group, $L_1$ to $L_3$ are each independently a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—*', *—N($R_{1a}$)—*', *—O—*', *—P($R_{1a}$)—*', *—Al($R_{1a}$)—*, *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and * and *' each indicate a binding site to an adjacent atom, n1 to n3 are each independently an integer from 1 to 5, $R_1$, $R_2$, $R_{31}$ to $R_{33}$, $R_4$, $R_{1a}$, and $R_{1b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O) ($Q_1$), —S(=O)$_2$($Q_1$), or —P(=O)($Q_1$)($Q_2$), provided that at least one $R_1$ is a triphenylenyl group, a1, a2, a31 to a33, and a4 are each independently an integer from 1 to 20, $R_{10a}$ is:

hydrogen, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-Coo arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-Coo aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

12. The organometallic compound of claim 11, wherein $X_1$ is a carbon atom of a carbene moiety.

13. The organometallic compound of claim 11, wherein ring $CY_{33}$ is a cyclopropane group, a cyclobutane group, a cyclopentane group, a cyclohexane group, a cycloheptane group, a cyclooctane group, a cyclobutane group, a cyclopentene group, a cyclohexene group, a cycloheptane group, a tetrahydrofuran group, a tetrahydropyran group, a tetrahydrothiophene group, a tetrahydrothiopyran group, a pyrrolidine group, or a piperidine group.

14. The organometallic compound of claim 11, wherein $R_1$, $R_2$, $R_{31}$ to $R_{33}$, and $R_4$ are each independently:

hydrogen, deuterium, a cyano group, or a $C_1$-$C_{20}$ alkyl group;

a $C_1$-$C_{20}$ alkyl group substituted with deuterium, —$CD_3$, —$CD_2H$, —$CDH_2$, a cyano group, a $C_1$-$C_{10}$ alkyl group, a cyclopentyl group, a cyclohexyl group, a cycloheptyl group, a cyclopentenyl group, a cyclohexenyl group, a cycloheptenyl group, a phenyl group, a biphenyl group, a naphthyl group, or a combination thereof;

a cyclopentyl group, a cyclohexyl group, a cycloheptyl group, a cyclopentenyl group, a cyclohexenyl group, a cycloheptenyl group, a phenyl group, a biphenyl group, a $C_1$-$C_{10}$ alkylphenyl group, or a naphthyl group, each unsubstituted or substituted with deuterium, —$CD_3$, —$CD_2H$, —$CDH_2$, a cyano group, a $C_1$-$C_{20}$ alkyl group, a cyclopentyl group, a cyclohexyl group, a cycloheptyl group, a cyclopentenyl group, a cyclohexenyl group, a cycloheptenyl group, a phenyl group, a biphenyl group, a $C_1$-$C_{10}$ alkylphenyl group, a naphthyl group, —Si($Q_{31}$)($Q_{32}$)($Q_{33}$), or a combination thereof; or —C($Q_1$)($Q_2$)($Q_3$), —Si($Q_1$)($Q_2$)($Q_3$), and $Q_1$ to $Q_3$ and $Q_{31}$ to $Q_{33}$ are each independently: hydrogen; deuterium; a cyano group; a $C_1$-$C_{60}$ alkyl group; a $C_2$-$C_{60}$ alkenyl group; a $C_2$-$C_{60}$ alkynyl group; or a $C_3$-$C_{60}$ carbocyclic group unsubstituted or substituted with deuterium, a cyano group, a $C_1$-$C_{60}$ alkyl group, a phenyl group, a biphenyl group, or a combination thereof.

15. The organometallic compound of claim 11, wherein $R_{33}$ is hydrogen, deuterium, —$CH_3$, —$CDH_2$, —$CD_2H$, or —$CD_3$.

16. The organometallic compound of claim 11, wherein in Formula 1, a moiety represented by

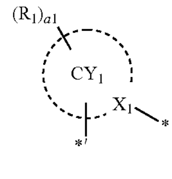

is a moiety represented by one of Formulae CY1-1 to CY1-7, a moiety represented by

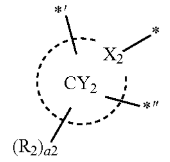

is a moiety represented by one of Formulae CY2-1 to CY2-6, a moiety represented by

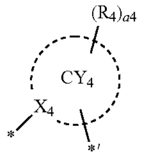

is a moiety represented by one of Formulae CY4-1 to CY4-6, and $R_{11}$ in Formulae CY1-1 to CY1-7 is —$CD_3$ or a group represented by Formula S1:

CY1-1

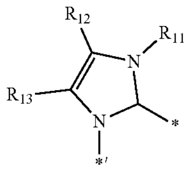

CY1-2

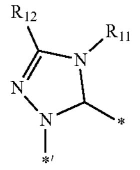

-continued
CY1-3
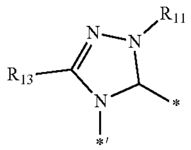
CY1-4
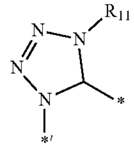
CY1-5
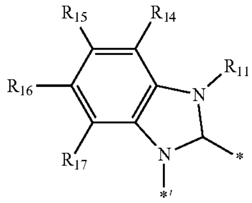
CY1-6
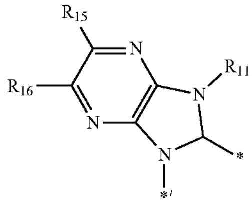
CY1-7
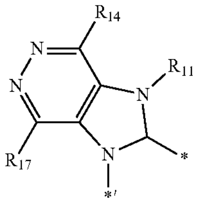
CY2-1
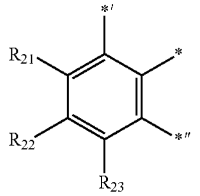
CY2-2
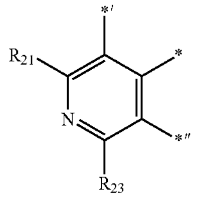
CY2-3
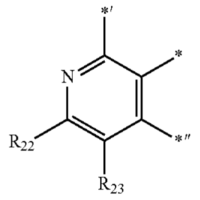
-continued
CY2-4
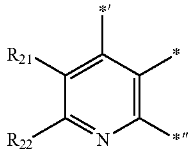
CY2-5
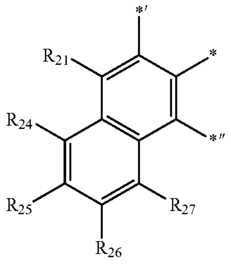
CY2-6
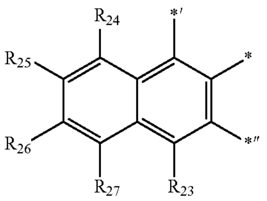
CY4-1
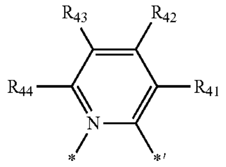
CY4-2
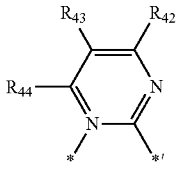
CY4-3
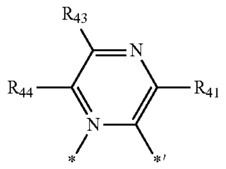
CY4-4
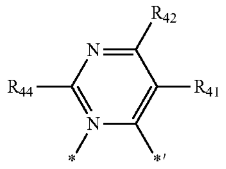
CY4-5
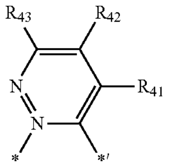

-continued

CY4-6

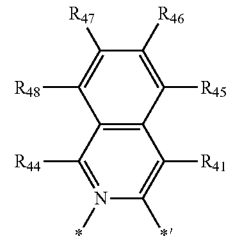

S1

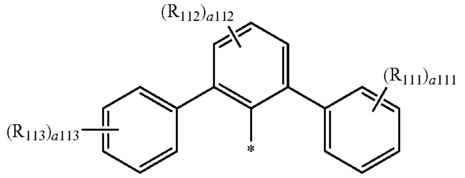

wherein in Formulae CY1-1 to CY1-7, $R_{11}$ to $R_{17}$ are each independently the same as defined for $R_1$ in Formula 1,

* indicates a binding site to M in Formula 1, and

*' indicates a binding site to $L_1$ in Formula 1, wherein in Formulae CY2-1 to CY2-6, $R_{21}$ to $R_{27}$ are each independently the same as defined for $R_2$ in Formula 1,

* indicates a binding site to M in Formula 1,

*' indicates a binding site to $L_1$ in Formula 1, and

*" indicates a binding site to $L_2$ in Formula 1, wherein in Formulae CY4-1 to CY4-6, $R_{41}$ to $R_{48}$ are each independently the same as defined for $R_4$ in Formula 1,

* indicates a binding site to M in Formula 1, and

*' indicates a binding site to $L_3$ in Formula 1, and wherein in Formula S1, $R_{111}$ to $R_{113}$ are each independently the same as defined for $R_1$ in Formula 1, a111 is an integer from 1 to 5, a112 is an integer from 1 to 3, a113 is an integer from 1 to 5, and

* indicates a binding site to N among groups represented by Formulae CY1-1 to CY1-7.

17. The organometallic compound of claim 11, wherein in Formula 1, a moiety represented by

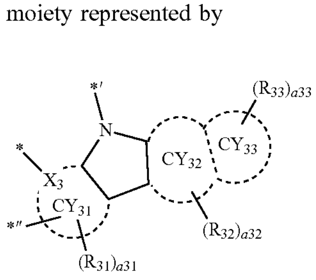

is a moiety represented by one of Formulae CY3-1 to CY3-12:

CY3-1

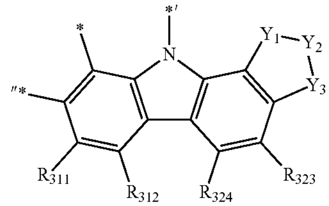

CY3-2

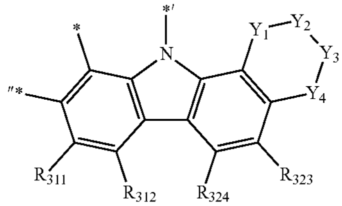

CY3-3

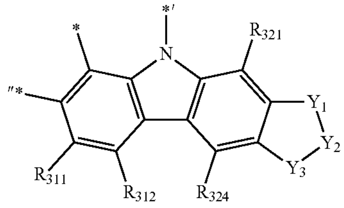

CY3-4

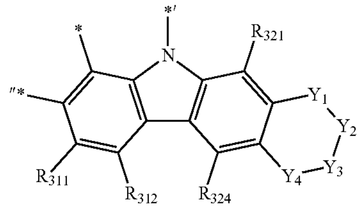

CY3-5

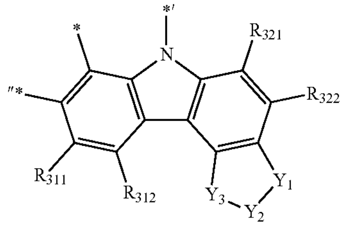

CY3-6

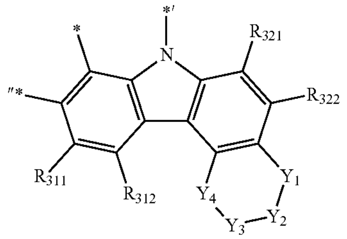

CY3-7

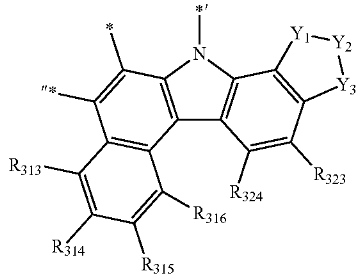

-continued

CY3-8

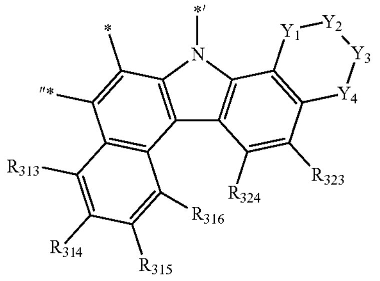

CY3-9

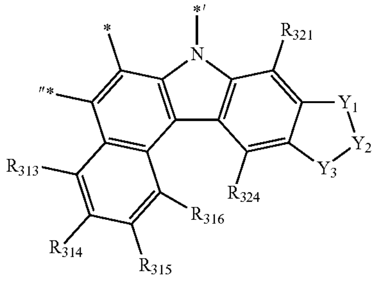

CY3-10

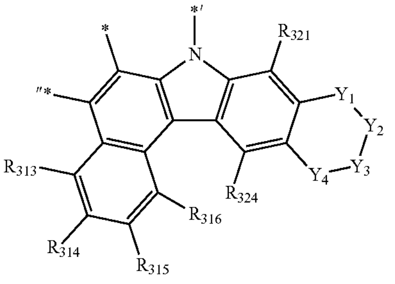

CY3-11

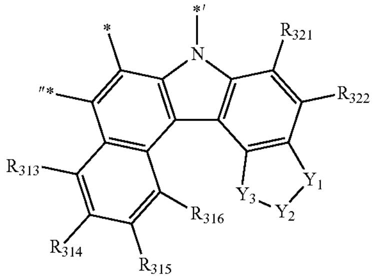

CY3-12

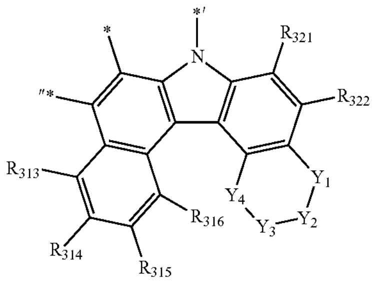

wherein in Formulae CY3-1 to CY3-12, $Y_1$ to $Y_4$ are each independently O, S, Se, $N(Z_1)$, $C(Z_1)(Z_2)$, or $Si(Z_1)(Z_2)$, $Z_1$ and $Z_2$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, $Q_1$ to $Q_3$ and $R_{10a}$ are each as defined in Formula 1, $R_{311}$ to $R_{316}$ are each independently the same as defined for $R_{31}$ in Formula 1, $R_{321}$ to $R_{327}$ are each independently the same as defined for $R_{32}$ in Formula 1,

* indicates a binding site to M in Formula 1,

*' indicates a binding site to $L_3$ in Formula 1, and

*" indicates a binding site to $L_2$ in Formula 1.

18. The organometallic compound of claim 17, wherein $Z_1$ and $Z_2$ are each independently hydrogen, deuterium, or —$CH_3$.

19. The organometallic compound of claim 17, wherein $Y_2$ to $Y_4$ are each independently $C(Z_1)(Z_2)$.

20. The organometallic compound of claim 11, wherein the organometallic compound is represented by Formula 1-1:

[Formula 1-1]

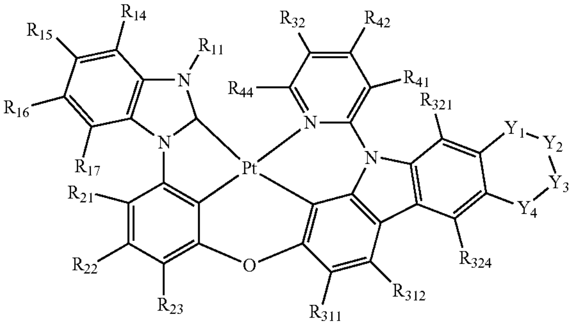

wherein in Formula 1-1, $Y_1$ to $Y_4$ are each independently O, S, Se, $N(Z_1)$, $C(Z_1)(Z_2)$, or $Si(Z_1)(Z_2)$, $Z_1$ and $Z_2$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, $Q_1$ to $Q_3$ and $R_{10a}$ are each as defined in Formula 1, $R_{11}$ and $R_{14}$ to $R_{17}$ are each independently the same as defined for $R_1$ in Formula 1, $R_{21}$ to $R_{23}$ are each independently the same as defined for $R_2$ in Formula 1, $R_{311}$ and $R_{312}$ are each independently the same as defined for $R_{31}$ in Formula 1, $R_{321}$ and $R_{324}$ are each independently the same as defined for $R_{32}$ in Formula 1, and $R_{41}$ to $R_{44}$ are each independently the same as defined for $R_4$ in Formula 1.

* * * * *